(12) United States Patent
Mizuki et al.

(10) Patent No.: US 10,566,541 B2
(45) Date of Patent: *Feb. 18, 2020

(54) AROMATIC AMINE DERIVATIVE, MATERIAL FOR ORGANIC ELECTROLUMINESCENT ELEMENT, AND ORGANIC ELECTROLUMINESCENT ELEMENT

(71) Applicant: IDEMITSU KOSAN CO., LTD., Tokyo (JP)

(72) Inventors: Yumiko Mizuki, Sodegaura (JP); Hirokatsu Ito, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 162 days.

This patent is subject to a terminal disclaimer.

(21) Appl. No.: 15/717,471

(22) Filed: Sep. 27, 2017

(65) Prior Publication Data

US 2018/0019398 A1    Jan. 18, 2018

Related U.S. Application Data

(63) Continuation of application No. 14/360,559, filed as application No. PCT/JP2012/080319 on Nov. 22, 2012, now Pat. No. 9,818,953.

(30) Foreign Application Priority Data

Nov. 25, 2011  (JP) .................. 2011-258305
Oct. 1, 2012   (JP) .................. 2012-219880

(51) Int. Cl.
| | | |
|---|---|---|
| *H01L 51/00* | (2006.01) | |
| *C09K 11/06* | (2006.01) | |
| *H01L 51/50* | (2006.01) | |
| *H05B 33/10* | (2006.01) | |

(52) U.S. Cl.
CPC ............ *H01L 51/006* (2013.01); *C09K 11/06* (2013.01); *H01L 51/0054* (2013.01);
(Continued)

(58) Field of Classification Search
CPC ............ C09K 11/06; C09K 2211/1007; C09K 2211/1011; C09K 2211/1014;
(Continued)

(56) References Cited

U.S. PATENT DOCUMENTS

| | | |
|---|---|---|
| 8,431,250 B2 | 4/2013 | Mizuki |
| 8,518,560 B2 | 8/2013 | Mizuki |
| 9,166,179 B2 | 10/2015 | Mizuki |

(Continued)

FOREIGN PATENT DOCUMENTS

| | | |
|---|---|---|
| JP | 2011-121940 | 6/2011 |
| JP | 2011-231108 | 11/2011 |
| WO | 2009/084512 | 7/2009 |
| WO | 2010/122810 | 10/2010 |

OTHER PUBLICATIONS

International Search Report for corresponding International Application No. PCT/JP2012/080319, dated Jan. 22, 2013.
Written Opinion for corresponding International Application No. PCT/JP2012/080319, dated Jan. 22, 2013.

*Primary Examiner* — Dawn L Garrett
(74) *Attorney, Agent, or Firm* — Oblon, McClelland, Maier & Neustadt, L.L.P.

(57) ABSTRACT

An aromatic amine derivative is represented by the following formula (1). In the formula (1), $R_2$ to $R_5$, $R_7$ to $R_9$ and $R_{10}$ are each independently a hydrogen atom or a substituent. $R_1$ and $R_6$ in the formula (1) are each represented by the following formula (2), in which $L_1$ to $L_3$ are each independently, for instance, a single bond. $Ar_1$ in the formula (2) is a monovalent residue derived from a ring structure of the following formula (4), in which X is an oxygen atom or a sulfur atom and at least one of $R_{11}$ to $R_{18}$ is a substituted aryl group. $Ar_1$ in the formula (1) is, for instance, an aryl group or a monovalent residue derived from the ring structure of the formula (4).

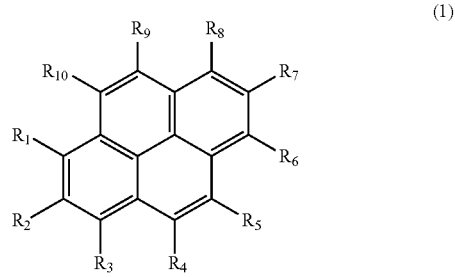

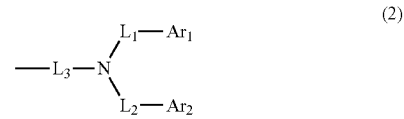

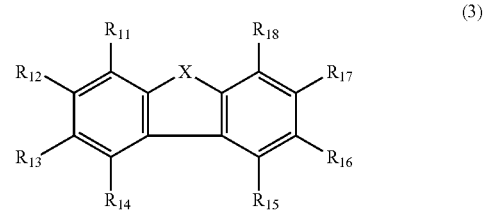

19 Claims, 1 Drawing Sheet

(52) U.S. Cl.
CPC ...... *H01L 51/0061* (2013.01); *H01L 51/0073* (2013.01); *H05B 33/10* (2013.01); *C09K 2211/1007* (2013.01); *C09K 2211/1011* (2013.01); *C09K 2211/1014* (2013.01); *C09K 2211/1088* (2013.01); *H01L 51/5012* (2013.01)

(58) Field of Classification Search
CPC ........ C09K 2211/1088; H01L 51/0054; H01L 51/006; H01L 51/0061; H01L 51/0073; H01L 51/5012; H05B 33/10
See application file for complete search history.

(56) References Cited

U.S. PATENT DOCUMENTS

| | | |
|---|---|---|
| 9,391,279 B2 | 7/2016 | Mizuki |
| 9,818,953 B2* | 11/2017 | Mizuki .................. C09K 11/06 |
| 2010/0314615 A1 | 12/2010 | Mizuki |
| 2012/0012169 A1 | 5/2012 | Mizuki |
| 2014/0326985 A1 | 11/2014 | Mizuki |
| 2014/0353646 A1 | 12/2014 | Mizuki |
| 2015/0014666 A1 | 1/2015 | Mizuki |

* cited by examiner

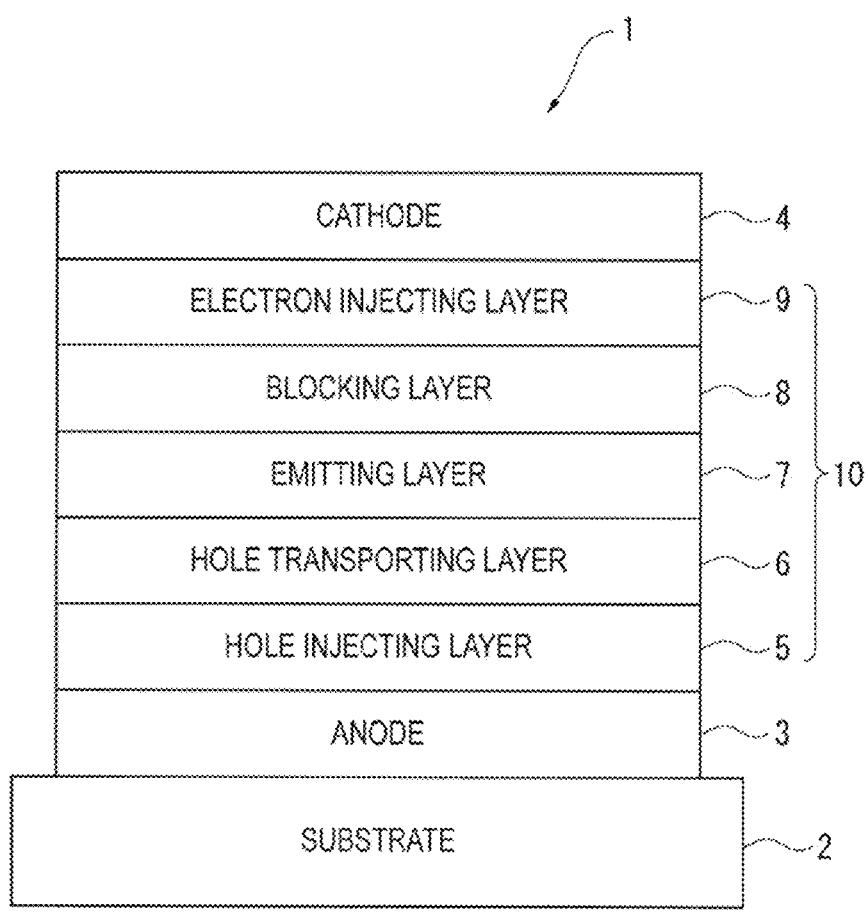

AROMATIC AMINE DERIVATIVE, MATERIAL FOR ORGANIC ELECTROLUMINESCENT ELEMENT, AND ORGANIC ELECTROLUMINESCENT ELEMENT

TECHNICAL FIELD

The present invention relates to an aromatic amine derivative, an organic-electroluminescence-device material and an organic electroluminescence device.

BACKGROUND ART

An organic electroluminescence device (hereinafter, occasionally abbreviated as "organic EL device") using an organic substance is expected to be used as a cost-friendly full-color display device (solid light-emitting device) with a large area and thus many developments thereof have been made. A general organic EL device includes an emitting layer and a pair of opposing electrodes between which the emitting layer is interposed. When an electric field is applied between the electrodes, electrons are injected from a cathode, while holes are injected from an anode. Subsequently, the electrons are recombined with the holes in the emitting layer to generate an excited state and energy generated when the excited state returns to a ground state is emitted in the form of light.

The performance of an organic EL device has been gradually improved by improving an organic-EL-device material. In particular, improvement in the color purity of a blue-emitting organic EL device (i.e., shortening of an emission wavelength) is considered as an important technique for improving the color reproducibility of a display.

Patent Literature 1 discloses that a fused aromatic hydrocarbon group having two amino groups as substituents is used as a dopant material.

Patent Literature 2 discloses a diaminopyrene dopant containing dibenzofuran and a combination of such a dopant material and an anthracene host material.

Patent Literature 3 discloses a diaminopyrene dopant having such a structure that a nitrogen atom is directly bonded to the 2-position or 4-position of each of dibenzofuran and dibenzothiophene.

CITATION LIST

Patent Literatures

Patent Literature 1: WO 2009/084512
Patent Literature 2: WO 2010/122810
Patent Literature 3: JP-A-2011-231108

SUMMARY OF THE INVENTION

Problems to be Solved by the Invention

An object of the present invention is to provide: an organic electroluminescence device with a luminous efficiency that is enhanced while a color purity is maintained or improved an aromatic amine derivative usable for an organic thin-film layer in the organic electroluminescence device; and an organic-electroluminescence-device material containing the aromatic amine derivative.

Means for Solving the Problems

According to aspects of the invention, the following aromatic amine derivative, organic-electroluminescence-device material and organic electroluminescence device are provided.

[1] An aromatic amine derivative of a formula (1) below.

[Formula 1]

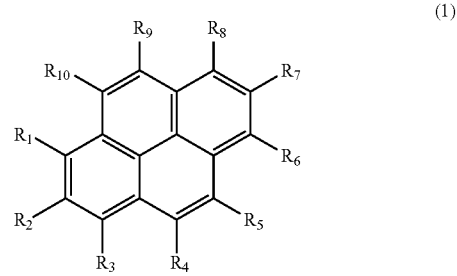

In the formula (1), $R_2$, $R_3$, $R_4$, $R_5$, $R_7$, $R_8$, $R_9$ and $R_{10}$ are each independently a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms.

$R_1$ and $R_6$ are each represented by a formula (2) below.

[Formula 2]

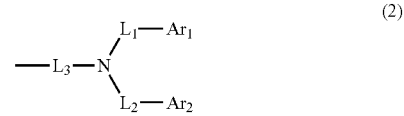

In the formula (2), $L_1$, $L_2$ and $L_3$ are each independently a single bond, a divalent residue of a substituted or unsubstituted aryl group having 6 to 30 ring carbon atoms, or a divalent residue of a substituted or unsubstituted heterocyclic group having 5 to 30 ring atoms.

In the formula (2), $Ar_1$ is a monovalent residue derived from a ring structure of a formula (4) below.

[Formula 3]

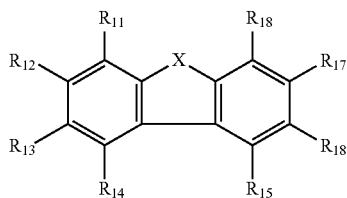

(4)

In the formula (4), X is an oxygen atom or a sulfur atom.

In the formula (4), $R_{11}$ to $R_{18}$ are each independently a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms.

In the formula (4), at least one of $R_{11}$ to $R_{18}$ is a substituted aryl group having 6 to 30 ring carbon atoms.

One of $R_{11}$ to $R_{18}$ is a single bond to $L_1$.

In the formula (4), at least one combination of $R_{11}$ and $R_{12}$, $R_{12}$ and $R_{13}$, $R_{13}$ and $R_{14}$, $R_{15}$ and $R_{16}$, $R_{17}$, and $R_{17}$, and $R_{18}$ optionally forms a saturated or unsaturated ring.

$Ar_2$ in the formula (2) is a substituted or unsubstituted aryl group having 6 to 30 ring carbon atoms, a substituted or unsubstituted heterocyclic group having 5 to 30 ring atoms, or a monovalent residue derived from the ring structure of the formula (4).

One of $R_{11}$ to $R_{18}$ is a single bond to $L_2$ when $Ar_2$ is a monovalent residue derived from the ring structure of the formula (4).

[2] In the aromatic amine derivative, $R_{11}$ in $Ar_1$ is bonded to $L_1$ via a single bond.

[3] In the aromatic amine derivative, $R_{18}$ in $Ar_1$ is a substituted aryl group having 6 to 30 ring carbon atoms.

[4] In the aromatic amine derivative, $Ar_2$ is a substituted or unsubstituted aryl group having 6 to 30 ring carbon atoms.

[5] In the aromatic amine derivative, at least one of $R_{11}$ to $R_{18}$ in the formula (4) is an aryl group having 6 to 30 ring carbon atoms that has an alkyl group having 1 to 30 carbon atoms as a substituent.

[6] In the aromatic amine derivative, $R_{18}$ in $Ar_1$ is a substituted phenyl group.

[7] In the aromatic amine derivative, $R_{18}$ in $Ar_1$ is a phenyl group having a substituent in an ortho position.

[8] In the aromatic amine derivative, $R_{18}$ in $Ar_1$ is a phenyl group having an alkyl group having 1 to 30 carbon atoms as a substituent in an ortho position.

[9] In the aromatic amine derivative, $R_{18}$ in $Ar_1$ is a phenyl group having a substituent selected from among a methyl group, an ethyl group and a propyl group in an ortho position.

[10] In the aromatic amine derivative, $Ar_2$ is an unsubstituted phenyl group.

[11] In the aromatic amine derivative, $Ar_2$ is a phenyl group having an alkyl group having 1 to 30 carbon atoms as a substituent.

[12] In the aromatic amine derivative, $Ar_2$ is a phenyl group having an alkyl group having 1 to 30 carbon atoms as a substituent in an ortho position.

[13] In the aromatic amine derivative, $Ar_2$ is a phenyl group having a methyl group or an ethyl group as a substituent in an ortho position.

[14] In the aromatic amine derivative, $L_1$, $L_2$ and $L_3$ in the formula (2) are each a single bond.

[15] An organic-electroluminescence-device material containing the aromatic amine derivative of any one of [1] to [14].

[16] An organic electroluminescence device including: a cathode; an organic compound layer; and an anode, the cathode, the organic compound layer and the anode being arranged in this sequence, in which the organic compound layer contains the aromatic amine derivative of any one of [1] to [14].

[17] In the organic electroluminescence device, the organic compound layer includes a plurality of organic thin-film layers including an emitting layer, and at least one of the plurality of organic thin-film layers contains the aromatic amine derivative of any one of [1] to [14].

[18] In the organic electroluminescence device, at least one of the plurality of organic thin-film layers contains: the aromatic amine derivative of any one of [1] to [14]; and an anthracene derivative of a formula (20) below.

[Formula 4]

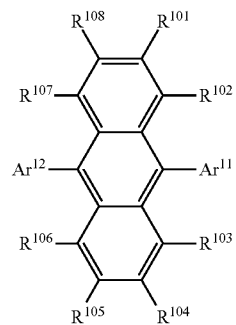

(20)

In the formula (20), $Ar^{11}$ and $Ar^{12}$ are each independently a substituted or unsubstituted monocyclic group having 5 to 30 ring atoms, a substituted or unsubstituted fused ring group having 10 to 30 ring atoms, or a group formed by combining the monocyclic group and the fused ring group.

In the formula (20), $R^{101}$ to $R^{108}$ are each independently a hydrogen atom, a halogen atom, a cyano group, a substituted or unsubstituted monocycle group having 5 to 30 ring atoms, a substituted or unsubstituted fused ring group having 10 to 30 ring atoms, a group formed by combining the monocyclic group and the fused ring group, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

[19] In the organic electroluminescence device, $Ar^{11}$ and $Ar^{12}$ in the formula (20) are each independently a substituted or unsubstituted fused ring group having 10 to 30 ring atoms.

[20] In the organic electroluminescence device, while one of $Ar^{11}$ and $Ar^{12}$ in the formula (20) is a substituted or unsubstituted monocyclic group having 5 to 30 ring atoms, the other of $Ar^{11}$ and $Ar^{12}$ is a substituted or unsubstituted fused ring group having 10 to 30 ring atoms.

[21] In the organic electroluminescence device, $Ar^{12}$ in the formula (20) is selected from among a naphthyl group, a phenanthryl group, a benzanthryl group and a dibenzofuranyl group, while $Ar^{11}$ is a substituted of unsubstituted phenyl group or a substituted or unsubstituted fluorenyl group.

[22] In the organic electroluminescence device, $Ar^{12}$ in the formula (20) is a substituted or unsubstituted fused ring group having 10 to 30 ring atoms, while $Ar^{11}$ is an unsubstituted phenyl group.

[23] In the organic electroluminescence device, $Ar^{11}$ and $Ar^{12}$ in the formula (20) are each independently a substituted or unsubstituted monocyclic group having 5 to 30 ring atoms.

[24] In the organic electroluminescence device, $Ar^{11}$ and $Ar^{12}$ in the formula (20) are each independently a substituted or unsubstituted phenyl group.

[25] In the organic electroluminescence device, $Ar^{11}$ in the formula (20) is an unsubstituted phenyl group, while $Ar^{12}$ is a phenyl group having at least one of the monocyclic group and the fused ring group as a substituent.

[26] In the organic electroluminescence device, $Ar^{11}$ and $Ar^{12}$ in the formula (20) are each independently a phenyl group having at least one of the monocyclic group and the fused ring group as a substituent.

According to the above aspects of the invention, there are provided: an organic EL device with a luminous efficiency that is enhanced while a color purity is maintained or improved; an aromatic amine derivative usable for an organic thin-film layer in the organic EL device; and an organic-EL-device material containing the aromatic amine derivative.

BRIEF DESCRIPTION OF DRAWINGS

The FIGURE shows an example of an organic EL device according to a first exemplary embodiment of the invention.

DESCRIPTION OF EMBODIMENT(S)

Aromatic Amine Derivative

An aromatic amine derivative according to the invention is represented by the above formula (1).

$R_2$, $R_3$, $R_4$, $R_7$, $R_8$, $R_9$ and $R_{19}$ in the formula (1) will be described below.

In the formula (1), $R_2$, $R_3$, $R_4$, $R_5$, $R_7$, $R_8$, $R_9$ and $R_{10}$ are each independently a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms.

Examples of the aryl group having 6 to 30 ring carbon atoms in the formula (1) are a phenyl group, biphenyl group, terphenyl group, naphthyl group, anthryl group, phenanthryl group, fluorenyl group, pyrenyl group, chrysenyl group, fluoranthenyl group, benzo[a]anthryl group, benzo[c]phenanthryl group, triphenylenyl group, benzo[k]fluoranthenyl group, benzo[g]chrysenyl group, benzo[b]triphenylenyl group, picenyl group and perylenyl group.

The aryl group in the formula (1) preferably has 6 to 20 ring carbon atoms, more preferably 6 to 12 ring carbon atoms. Among the above examples of the aryl group, a phenyl group, biphenyl group, naphthyl group, phenanthryl group, terphenyl group and fluorenyl group are particularly preferable. In a 1-fluorenyl group, 2-fluorenyl group, 3-fluorenyl group and 4-fluorenyl group, it is preferable that a carbon atom in the 9-position is substituted with a substituted or unsubstituted alkyl group having 1 to 30 carbon atoms and it is more preferable that a carbon atom in the 9-position is substituted with two methyl groups.

Examples of the heterocyclic group having 5 to 30 ring atoms in the formula (1) are a pyridyl group, pyrimidinyl group, pyrazinyl group, pyridazinyl group, triazinyl group, quinolyl group, isoquinolyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group and phenoxazinyl group.

The number of the ring atoms of the heterocyclic group in the formula (1) is preferably 5 to 20, more preferably 5 to 14. Among the above examples of the heterocyclic group, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group and 9-carbazolyl group are preferable. In a 1-carbazolyl group, 2-carbazolyl group, 3-carbazolyl group and 4-carbazolyl group, it is preferable that a nitrogen atom in the 9-position is substituted with the substituted or unsubstituted aryl group having 6 to 30 ring carbon atoms or the substituted or unsubstituted heterocyclic group having 5 to 30 ring atoms in the formula (1).

The alkyl group having 1 to 30 carbon atoms in the formula (1) may be linear, branched or cyclic. Examples of the linear or branched alkyl group are a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, amyl group, isoamyl group, 1-methylpentyl group, 2-methylpentyl group, 1-pentylhexyl group, 1-butylpentyl group, 1-heptyloctyl group and 3-methylpentyl group.

The number of the carbon atoms of the linear or branched alkyl group in the formula (1) is preferably 1 to 10, more preferably 1 to 6. Among the above examples of the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neo-pentyl group are preferable.

The number of the ring carbon atoms of the cycloalkyl group in the formula (1) is preferably 3 to 10, more preferably 5 to 8. Among the above examples of the cycloalkyl group, a cyclopentyl group and a cyclohexyl group are preferable.

An example of a halogenated alkyl group obtained by substituting an alkyl group with a halogen atom is one obtained by substituting the above alkyl group having 1 to 30 carbon atoms with one or more halogen group(s). Specific examples of the halogenated alkyl group are a fluoromethyl group, difluoromethyl group, fluoroethyl group, trifluoroethyl group and pentafluoroethyl group.

The alkenyl group having 2 to 30 carbon atoms in the formula (1) may be linear, branched or cyclic and examples thereof are a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group and cyclohexadienyl group.

The alkynyl group having 2 to 30 carbon atoms in the formula (1) may be linear, branched or cyclic and examples thereof are ethynyl, propynyl and 2-phenylethynyl.

The alkylsilyl group having 3 to 30 carbon atoms in the formula (1) is exemplified by a trialkylsilyl group having an exemplary alkyl group listed for the above alkyl group having 1 to 30 carbon atoms. Specific examples of the alkylsilyl group are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butyl-silyl group, dimethyl-t-butylsityl group, diethylisopropylsilyl group, vinyldimethylsilyl group, propyldimethylsilyl group and triisopropylsilyl group. The three alkyl groups in the trialkylsilyl group may be mutually the same or different.

Examples of the arylsilyl group having 6 to 30 ring carbon atoms in the formula (1) are a dialkylarylsilyl group, alkyldiarylsilyl group and triarylsilyl group.

An example of the dialkylarylsilyl group is a dialkylarylsilyl group having two of the exemplary alkyl groups listed for the above alkyl group having 1 to 30 carbon atoms and one of the above aryl groups having 6 to 30 ring carbon atoms. The number of the carbon atoms of the dialkylarylsilyl group is preferably 8 to 30. The two alkyl groups may be mutually the same or different.

An example of the alkyldiarylsilyl group is an alkyldiarylsilyl group having one of the exemplary alkyl groups listed for the above alkyl group having 1 to 30 carbon atoms and two of the above aryl groups having 6 to 30 ring carbon atoms. The number of the carbon atoms of the alkyldiarylsilyl group is preferably 13 to 30. The two aryl groups may be mutually the same or different.

An example of the triarylsilyl group is a triarylsilyl group having three of the above aryl groups having 6 to 30 ring carbon atoms. The number of the carbon atoms of the triarylsilyl group is preferably 18 to 30. The three aryl groups may be mutually the same or different.

Examples of the trifluoroalkyl group having 1 to 20 carbon atoms in the formula (1) are a trifluoromethyl group and a trifluoroethyl group.

The alkoxy group having 1 to 30 carbon atoms in the formula (1) is represented by —OY. An example of Y is the above alkyl group having 1 to 30 carbon atoms. Examples of the alkoxy group are a methoxy group, ethoxy group, propoxy group, butoxy group, pentyloxy group and hexyloxy group.

An example of a halogenated alkoxy group obtained by substituting an alkoxy group with a halogen atom is one obtained by substituting the above alkoxy group having 1 to 30 carbon atoms with one or more halogen group(s).

The aralkyl group having 6 to 30 ring carbon atoms in the formula (1) is represented by —Y—Z. An example of Y is an alkylene group related to the above alkyl group having 1 to 30 carbon atoms. Examples of Z are the same as those of the above aryl group having 6 to 30 ring carbon atoms. The aralkyl group is preferably an aralkyl group having 7 to 30 carbon atoms, in which an aryl part has 6 to 30 carbon atoms, preferably 6 to 20 carbon atoms, more preferably 6 to 12 carbon atoms, while an alkyl part has 1 to 30 carbon atoms, preferably 1 to 20 carbon atoms, more preferably 1 to 10 carbon atoms, further more preferably 1 to 6 carbon atoms. Example of such an aralkyl group are a benzyl group, 2-phenylpropane-2-yl group, 1-phenylethyl group, 2-phenylehyl group, 1-phenylisopropyl group, 2-phenylisopropyl group, phenyl-t-butyl group, alpha-naphthylmethyl group, 1-alpha-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group and 2-beta-naphthylisopropyl group.

The aryloxy group having 6 to 30 ring carbon atoms in the formula (1) is represented by —OZ. Examples of Z are the above aryl group having 6 to 30 ring carbon atoms and later-described monocyclic group and fused ring group. An example of the aryloxy group is a phenoxy group.

Examples of the halogen atom in the formula (1) are fluorine, chlorine, bromine and iodine, among which a fluorine atom is preferable.

According to the invention, "ring carbon atoms (carbon atoms forming a ring)" means carbon atoms forming a saturated ring, unsaturated ring or aromatic ring. "Ring atoms (atoms forming a ring)" means carbon atoms and hetero atoms forming a hetero ring including a saturated ring, unsaturated ring and aromatic ring.

When the expression "substituted or unsubstituted" or "substituted" is used, examples of the intended substituent include an aryl group, heterocyclic group, alkyl group (e.g., a linear or branched alkyl group, cycloalkyl group and halogenated alkyl group), alkenyl group, alkynyl group, alkylsilyl group, arylsilyl group, alkoxy group, halogenated alkoxy group, aralkyl group, aryloxy group, halogen atom and cyano group as described above and further include a hydroxyl group, nitro group and carboxy group. Among the above examples of the substituent, an aryl group, heterocyclic group, alkyl group, halogen atom, alkylsilyl group, arylsilyl group and cyano group are preferable and specific preferable examples of these exemplary substituents are further preferable.

When a substance is "substituted or unsubstituted" "unsubstituted" means that the substance is not substituted with any of the above substituents but bonded to a hydrogen atom.

The above explanation of the expression "substituted or unsubstituted" or "substituted" is applicable to later-described compounds and moieties thereof.

According to the invention, a hydrogen atom includes isotopes with different neutron numbers (i.e., protium, deuterium and tritium).

$R_1$ and $R_6$ in the formula (1) are each represented by the above formula (2).

In the formula (2), $L_1$, $L_2$ and $L_3$ are each independently a single bond, a divalent residue of a substituted or unsubstituted aryl group having 6 to 30 ring carbon atoms, or a divalent residue of a substituted or unsubstituted heterocyclic group having 5 to 30 ring atoms and it is preferable that all of $L_1$, $L_2$ and $L_3$ are single bonds.

An example of the divalent residue of the aryl group having 6 to 30 ring carbon atoms is a divalent group derived from one of the aryl groups having 6 to 30 ring carbon atoms listed for $R_2$, $R_3$, $R_4$, $R_5$, $R_7$, $R_8$, $R_9$ and $R_{10}$ in the formula (1).

An example of the divalent residue of the heterocyclic group having 5 to 30 ring atoms is a divalent group derived from one of the heterocyclic groups having 5 to 30 ring atoms listed for $R_2$, $R_3$, $R_4$, $R_5$, $R_7$, $R_8$, $R_9$ and $R_{10}$ in the formula (1).

In the formula (2), $Ar_1$ is a monovalent residue derived from a ring structure of the above formula (4).

X in the formula (4) is an oxygen atom or a sulfur atom, preferably an oxygen atom.

$R_{11}$ to $R_{18}$ in the formula (4) are each independently any one of the examples listed for $R_2$, $R_3$, $R_4$, $R_5$, $R_7$, $R_8$, $R_9$ and $R_{10}$ in the formula (1).

$R_{18}$ in the formula (4) is preferably a substituted or unsubstitued aryl group having 6 to 30 ring carbon atoms, more preferably a substituted aryl group having 6 to 30 ring carbon atoms.

In the formula (4) at least one of to $R_{11}$ to $R_{18}$ is a substituted aryl group having 6 to 30 ring carbon atoms.

Examples of the aryl group having 6 to 30 ring carbon atoms are the same as ones listed for the $R_2$, $R_3$, $R_4$, $R_5$, $R_7$, $R_8$, $R_9$ and $R_{10}$ in the formula (1).

Examples of a substituent for the aryl group having 6 to 30 ring carbon atoms are the same as ones listed for the $R_2$, $R_3$, $R_4$, $R_5$, $R_7$, $R_8$, $R_9$ and $R_{10}$ in the formula (1). Among the examples of the substituent group, an alkyl group having 1 to 30 carbon atoms is preferable. Further, a methyl group, an ethyl group and isopropyl group are particularly preferable.

In $Ar^1$ represented by the formula (4), $R_{18}$ of $R_{11}$ to $R_{18}$ is preferably a substituted phenyl group, more preferably a phenyl group having a substituent in the ortho position, particularly preferably a phenyl group having an alkyl group having 1 to 30 carbon atoms as a substituent in the ortho position. Most preferably, $R_{18}$ is a phenyl group having a group selected from among a methyl group, an ethyl group and a propyl group as a substituent in the ortho position.

With the above arrangement, the vicinity of a portion represented by the formula (4) has an increased steric bulk, so that the emission wavelength of the aromatic amine derivative according to the invention tends to become short due to steric exclusion effect. Further, as the steric bulk of the portion represented by the formula (4) is increased, the luminous efficiency of the aromatic amine derivative according to the invention tends to be improved.

One of $R_{11}$ to $R_{18}$ is a single bond to $L_1$.

When one of $R_{11}$ to $R_{18}$ is a single bond as described above, the structure of the formula (4) is represented by, for instance, one of the following formulae (4A) to (4D). In the formula (4A), a portion as labeled by $R_{11}$ in the formula (4) is not a methyl group but a single bond. The same is applicable to the other formulae (4B) to (4D). Among the above formulae (4A) to (4D), the formula (4A) in which $R_{11}$ is replaced by a single bond is preferable.

Further, in the formula (4A), $R_{18}$ is preferably a substituted aryl group having 6 to 30 ring carbon atoms.

[Formula 5]

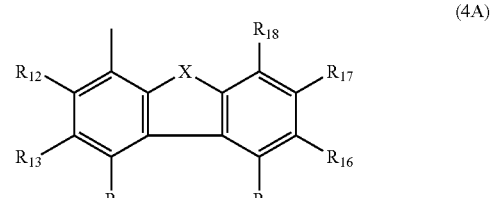

(4A)

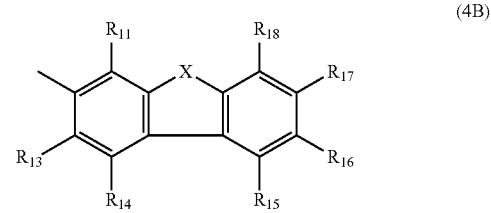

(4B)

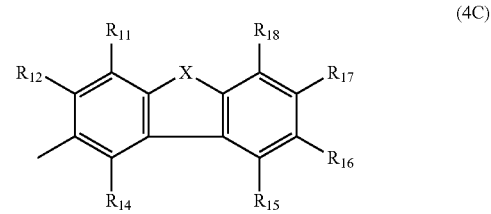

(4C)

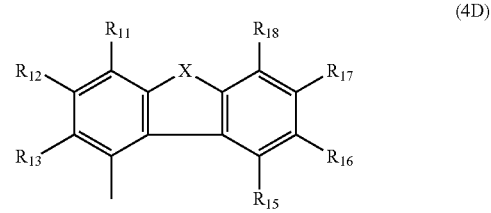

(4D)

In the formula (4), at least one combination of $R_{11}$ and $R_{12}$, $R_{12}$ and $R_{13}$, $R_{13}$ and $R_{14}$, $R_{15}$ and $R_{16}$, $R_{16}$ and $R_{17}$, and $R_{17}$ and $R_{18}$ may form a saturated or unsaturated ring. When such a ring is optionally formed, the structure of the formula (4) is represented by, for instance, one of the following formulae (4E), (4F) and (4G). In the formulae (4E), (4F) and (4G), $R_{11}$ to $R_{20}$ are each independently exemplified in the same manner as $R_2$ to $R_5$ and $R_7$ to $R_{10}$ in the formula (1). Incidentally, in the formulae (4E), (4F) and (4G), one of $R_{11}$ to $R_{20}$ is a single bond to $L_1$.

[Formula 6]

(4E)
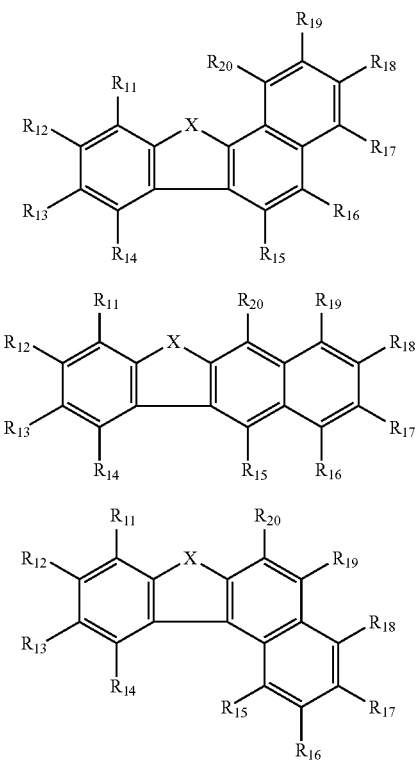

(4F)

(4G)

[Formula 7]
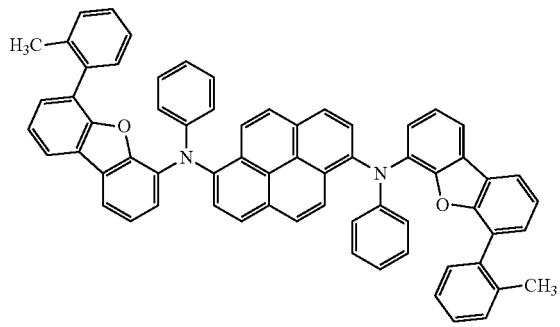
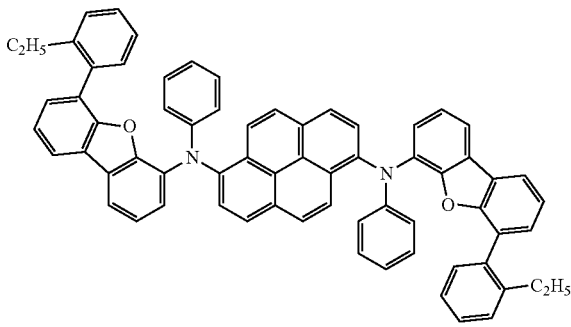

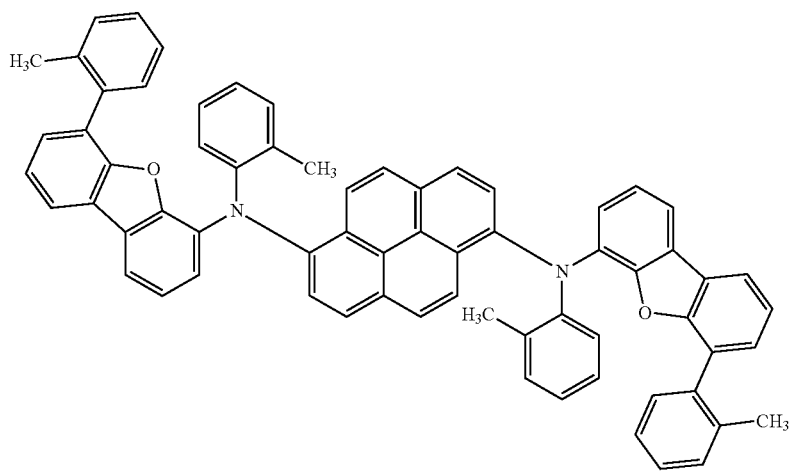

In the formula (2), $Ar_2$ is a substituted or unsubstituted aryl group having 6 to 30 ring carbon atoms, a substituted or unsubstituted heterocyclic group having 5 to 30 ring atoms or a monovalent residue derived from a ring structure represented by the formula (4), among which a substituted or unsubstituted aryl group having 6 to 30 ring carbon atoms is preferable.

Examples of the aryl group and heterocyclic group for $Ar_2$ are the same as ones listed for $R_2$, $R_3$, $R_4$, $R_5$, $R_7$, $R_8$, $R_9$ and $R_{10}$ in the formula (1).

One of $R_{11}$ to $R_{18}$ is a single bond to $L_2$ when $Ar_2$ is a monovalent residue derived from the ring structure of the formula (4). When $Ar_2$ is represented by the formula (4E), (4F) or (4G), one of $R_{11}$ to $R_{20}$ in the formula (4E), (4F) or (4G) is a single bond to $L_2$.

$Ar_2$ is preferably an unsubstituted phenyl group or a phenyl group substituted with an alkyl group having 1 to 30 carbon atoms. When $Ar_2$ is a phenyl group substituted with an alkyl group having 1 to 30 carbon atoms, $Ar_2$ is preferably a phenyl group substituted with the alkyl group having 1 to 30 carbon atoms in the ortho position, more preferably a phenyl group substituted with a methyl group or an ethyl group in the ortho position.

Specific examples of the structure of the aromatic amine derivative according to the invention are shown below. It should be understood that these examples of the structure of the aromatic amine derivative are not exhaustive.

-continued
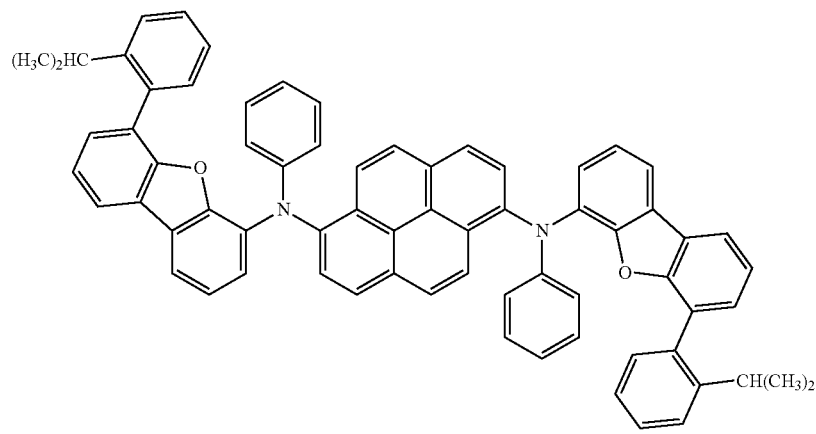
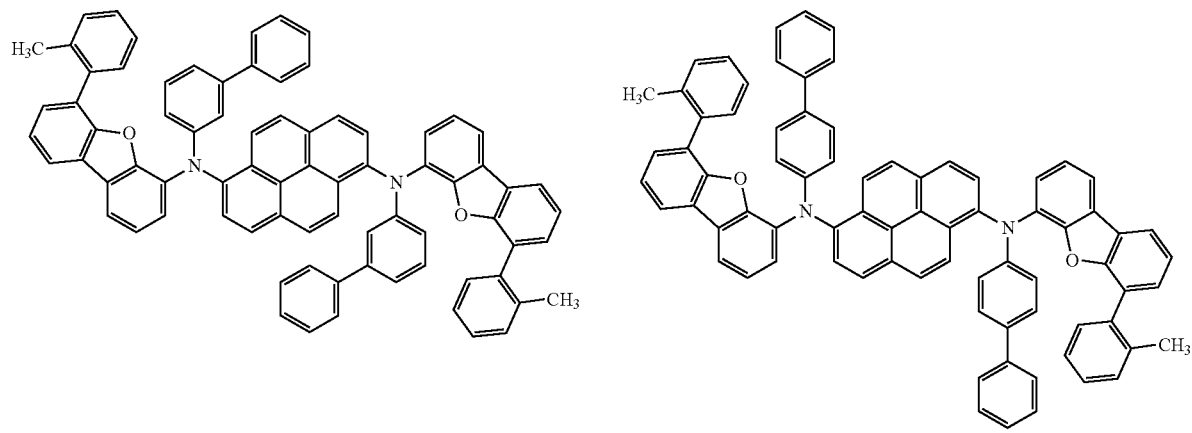
[Formula 8]
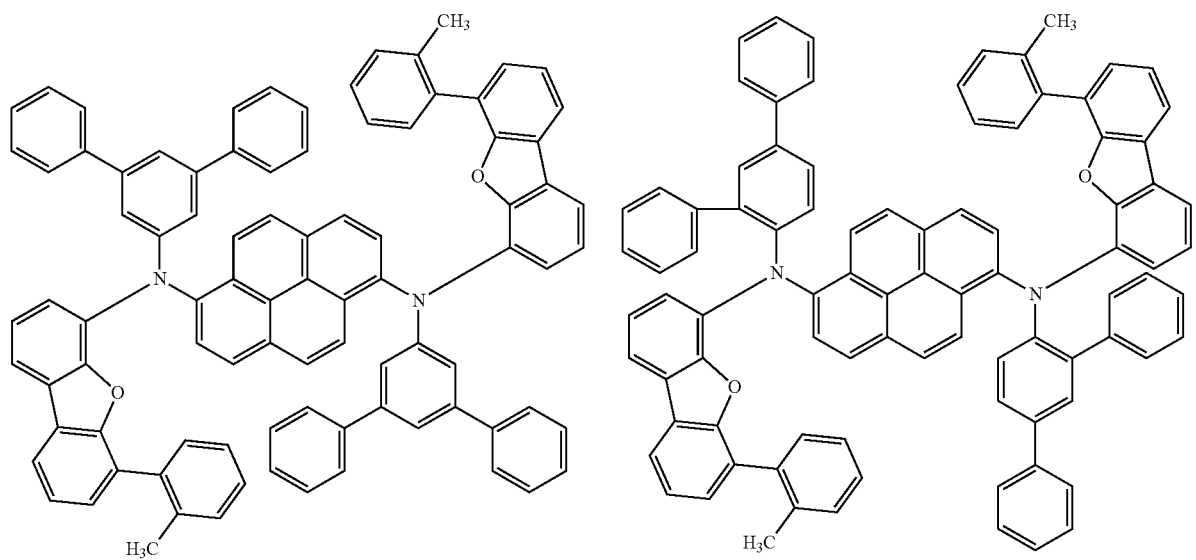

-continued
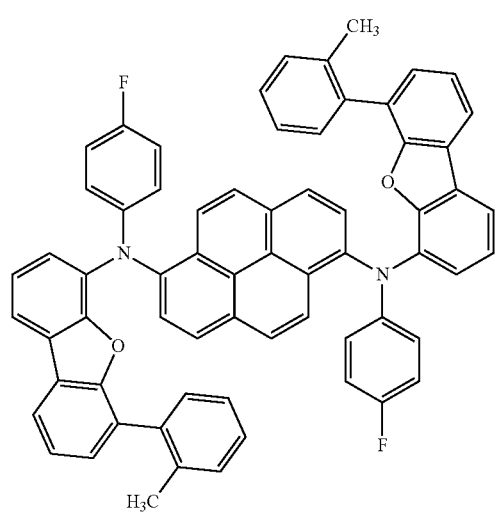
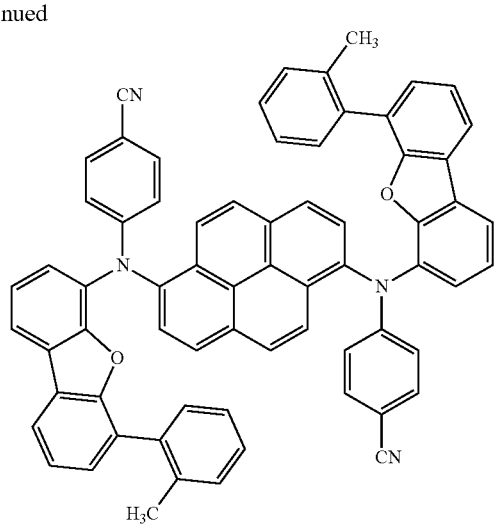
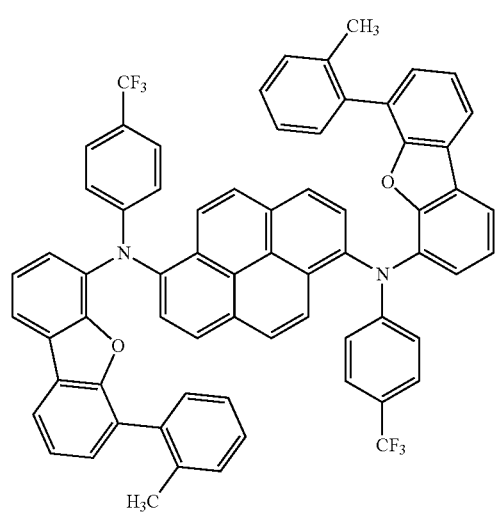
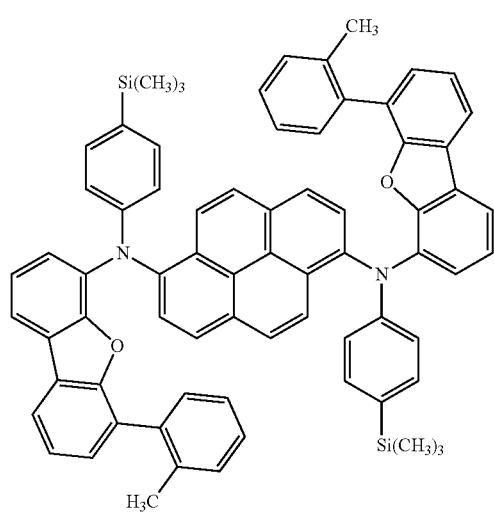
[Formula 9]
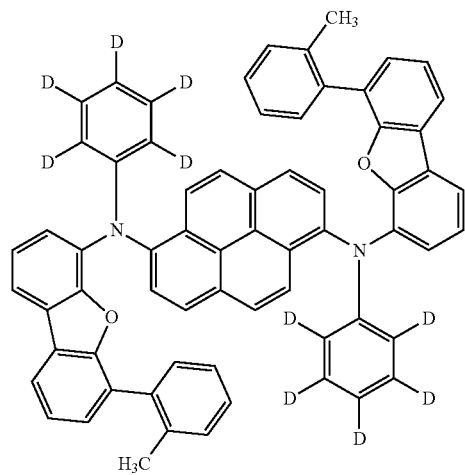
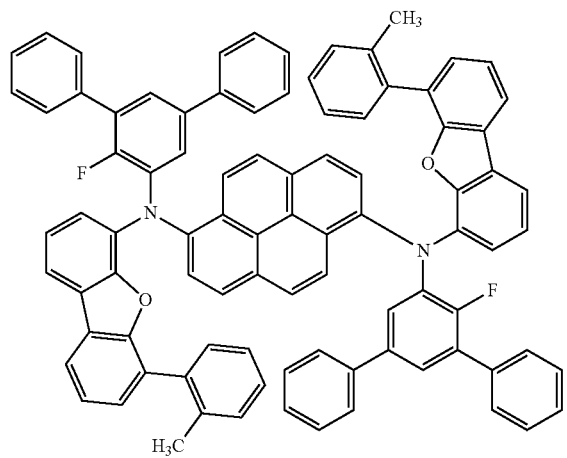

-continued
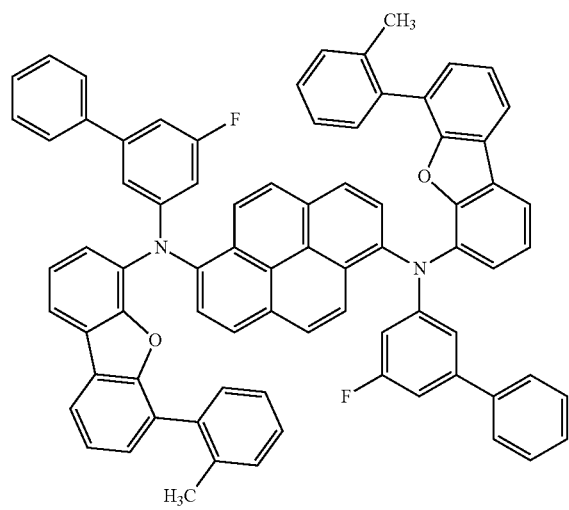
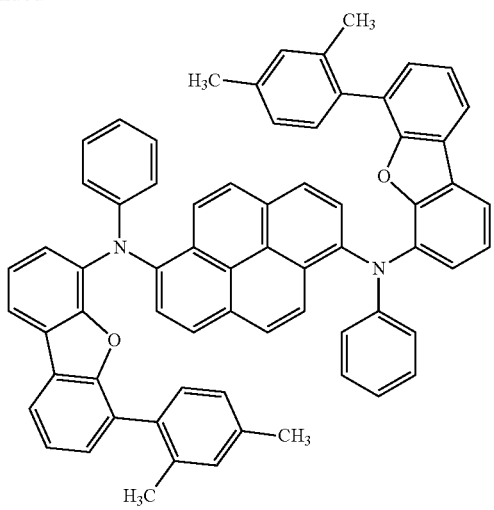
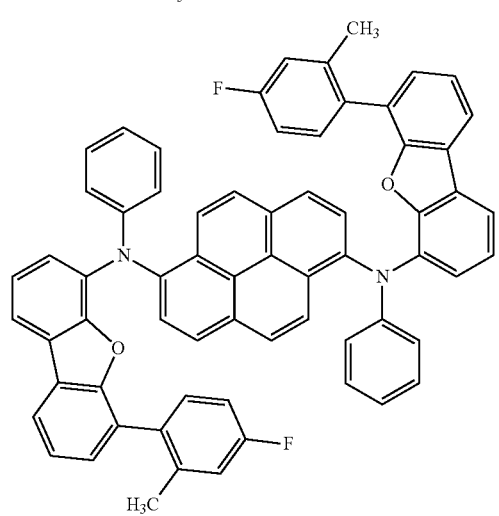
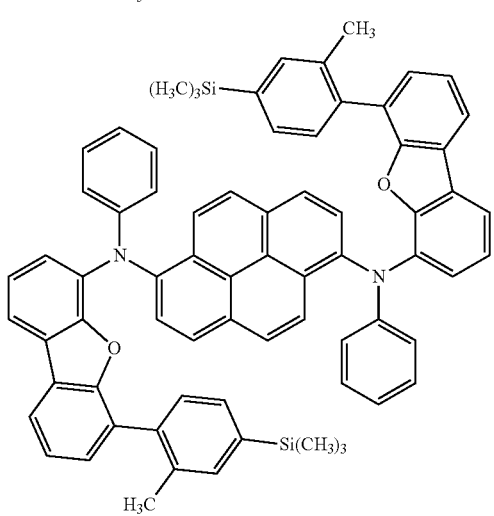
[Formula 10]
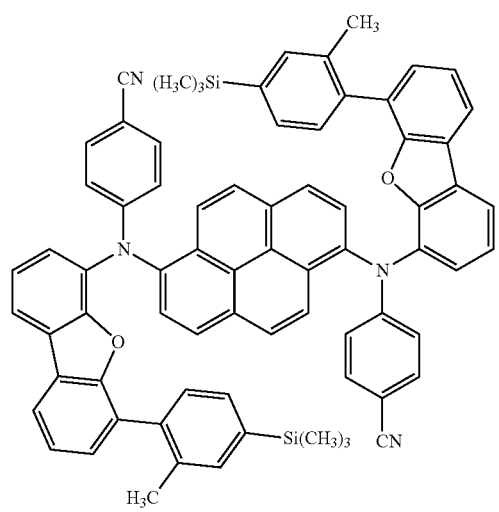
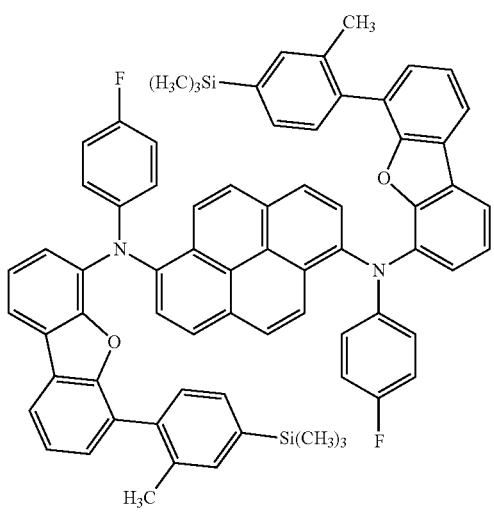

19 20
-continued
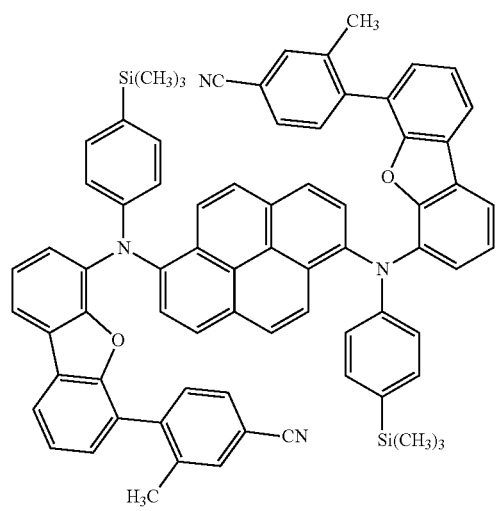 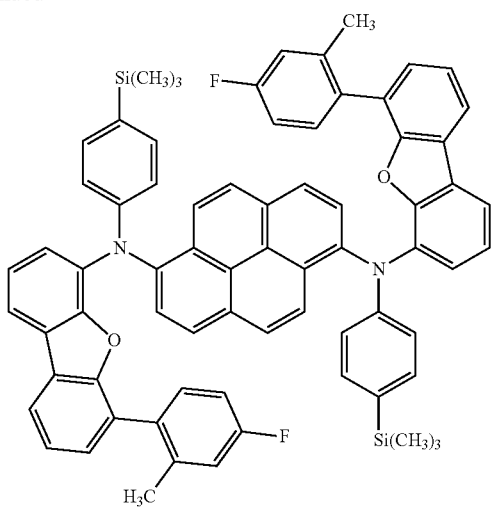
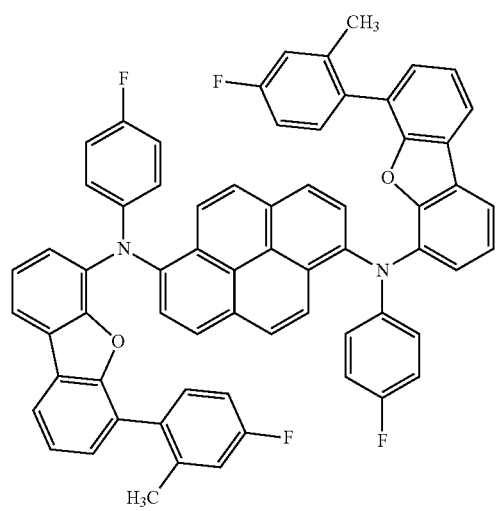 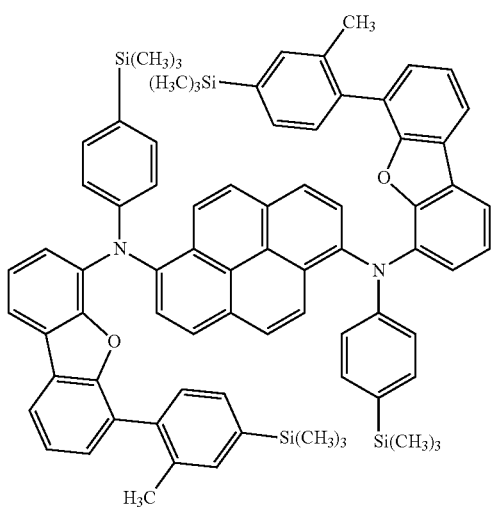
[Formula 11]
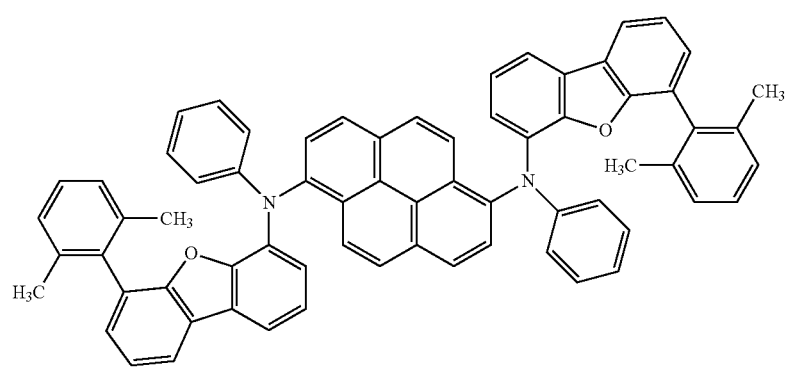

-continued
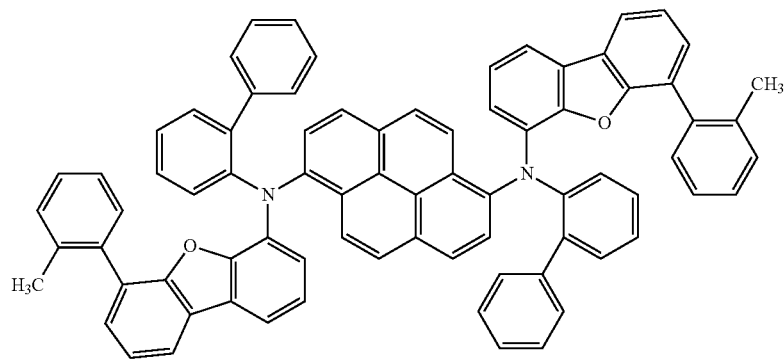
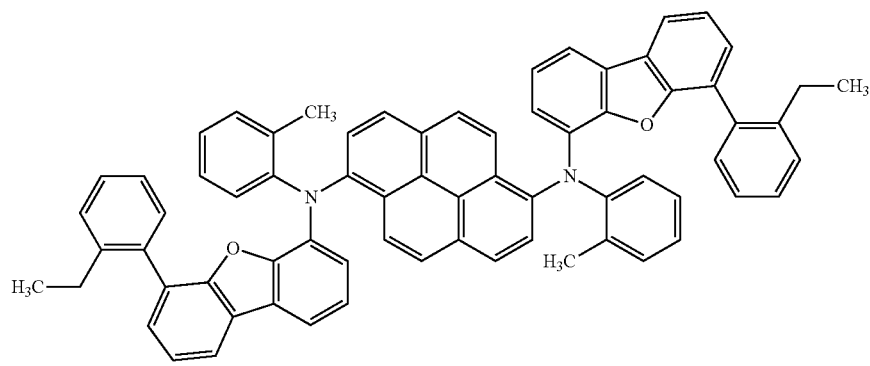
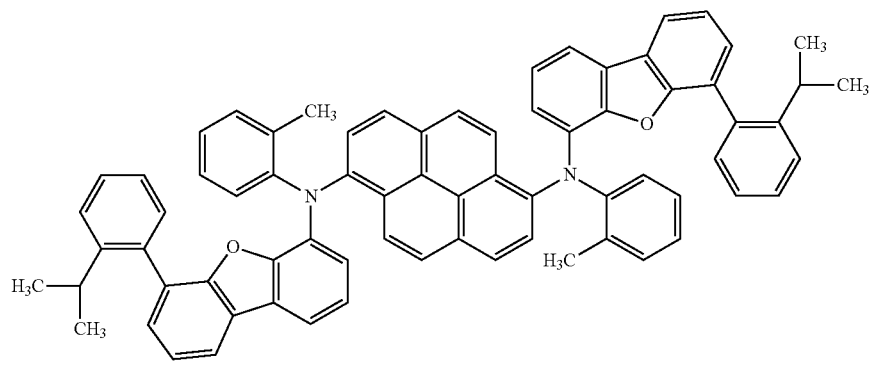
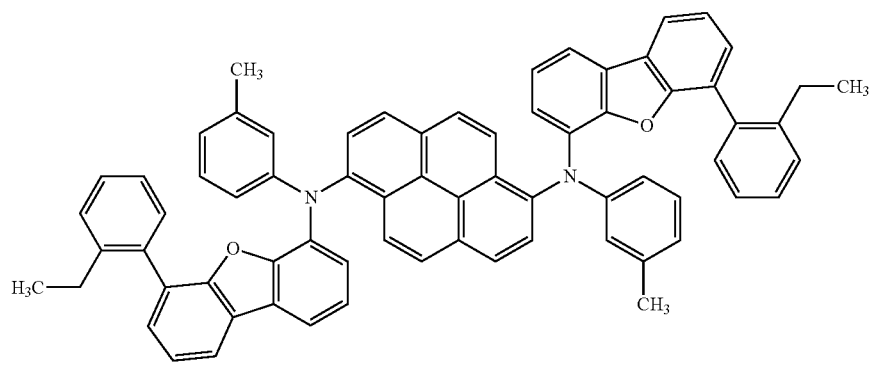

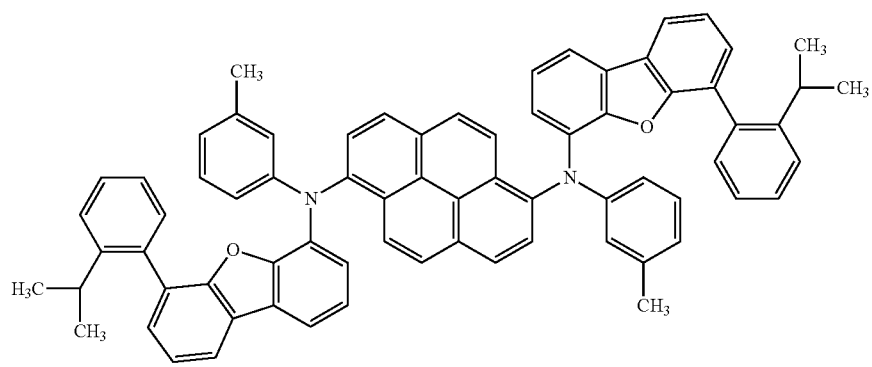
[Formula 12]
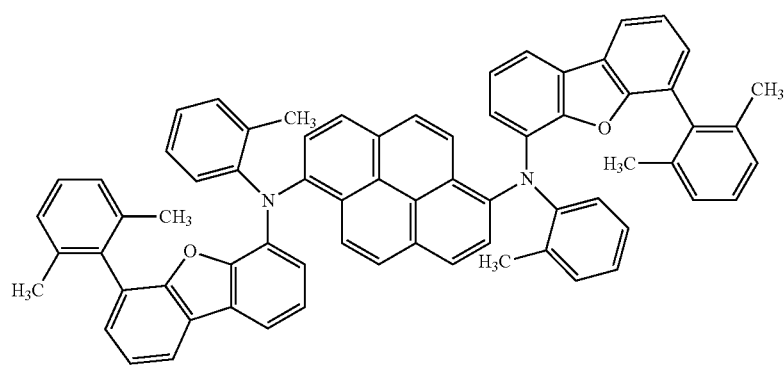
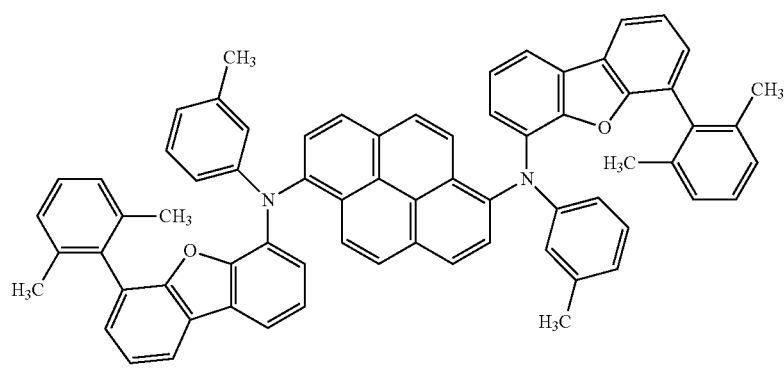
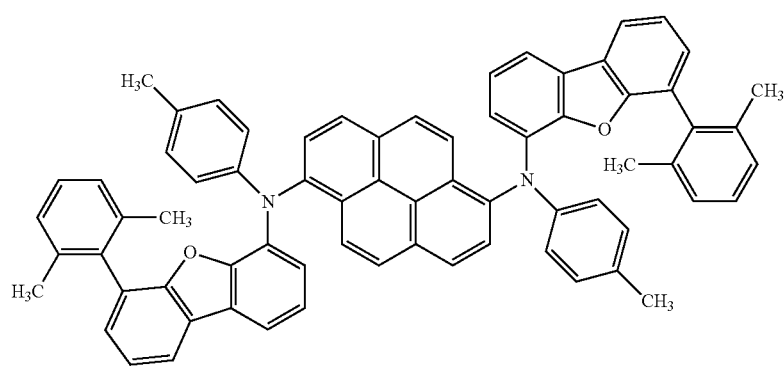

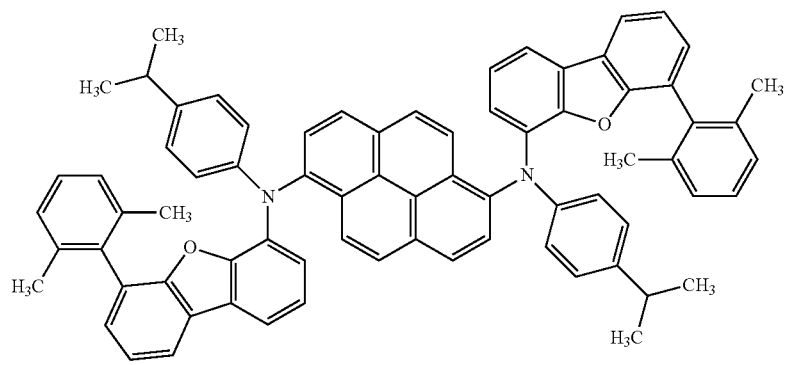
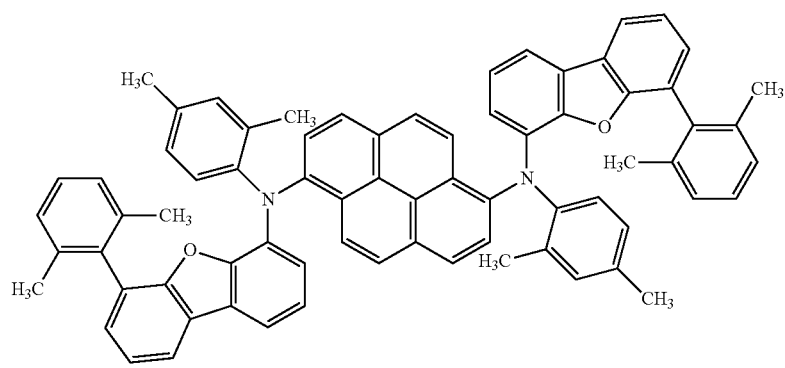
[Formula 13]
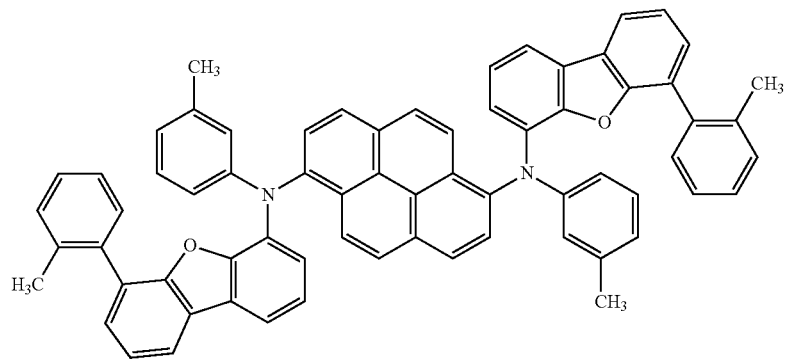

-continued
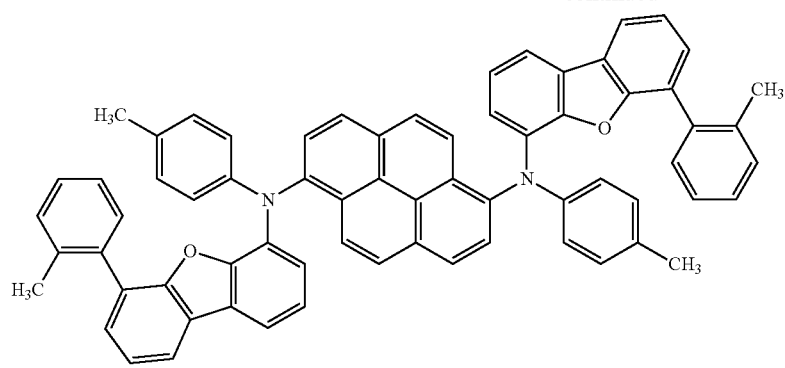
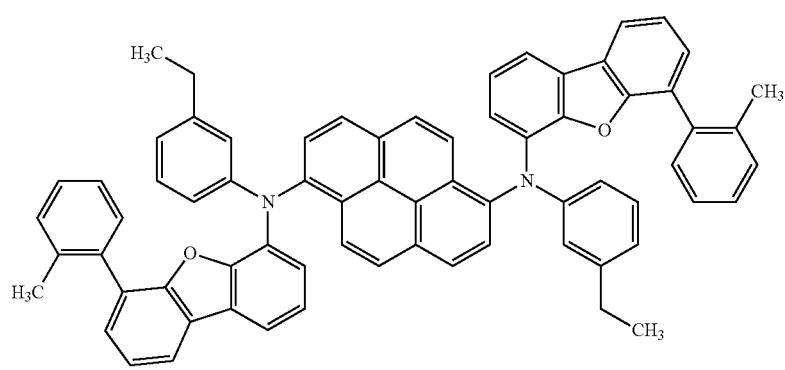
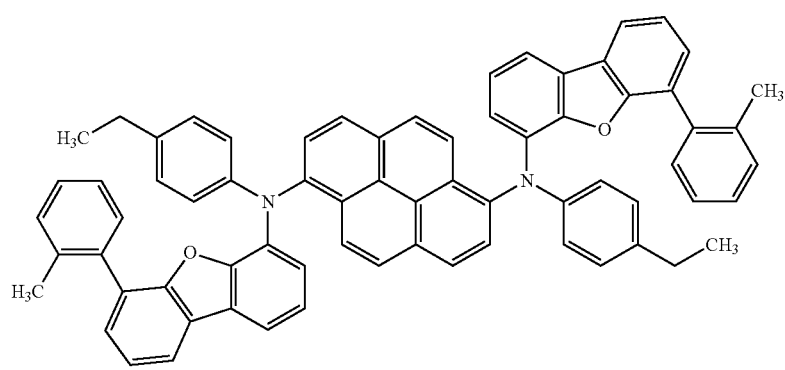
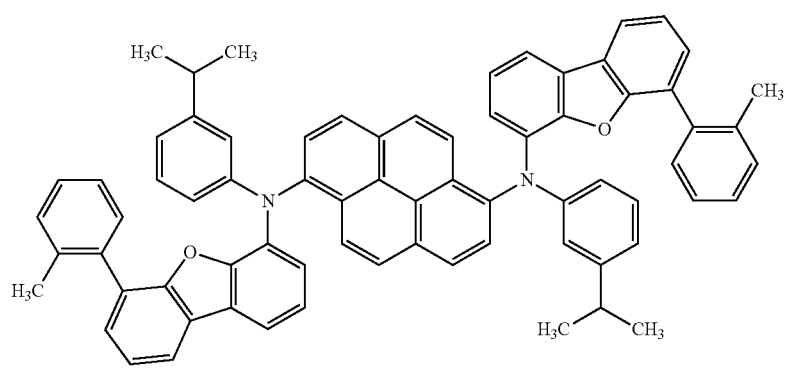

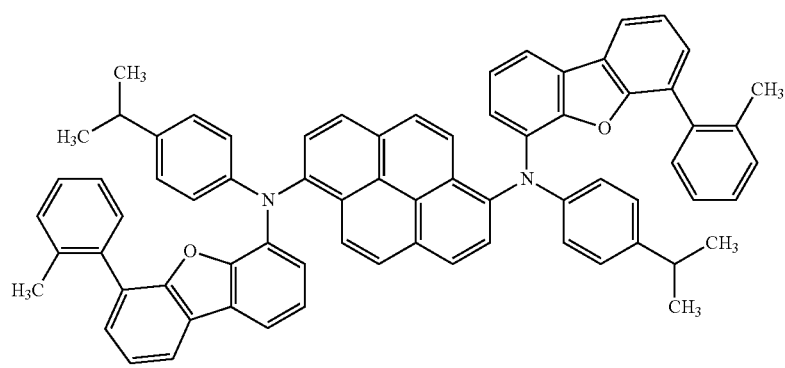
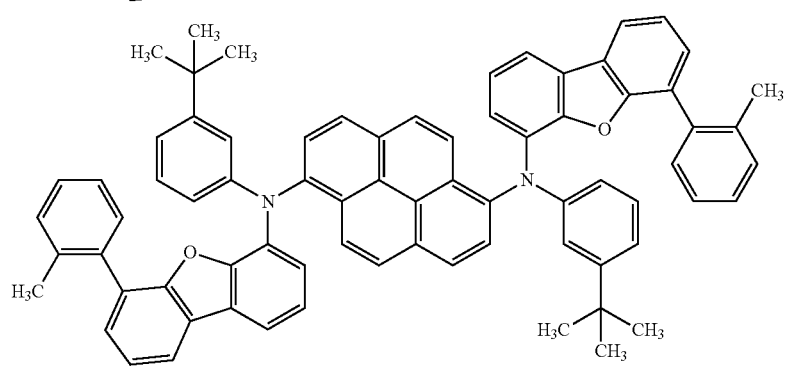
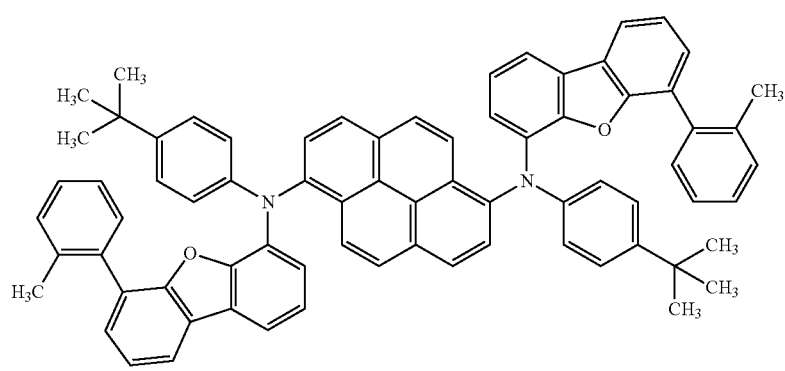
[Formula 14]
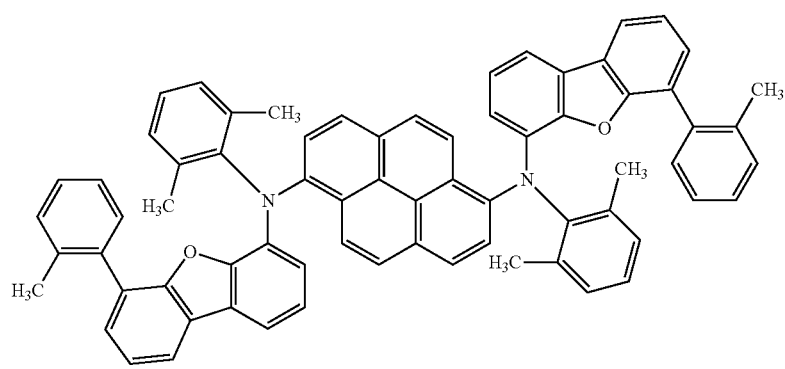

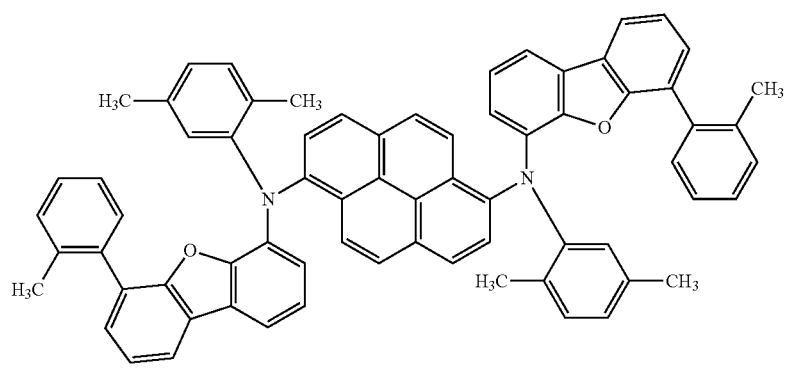
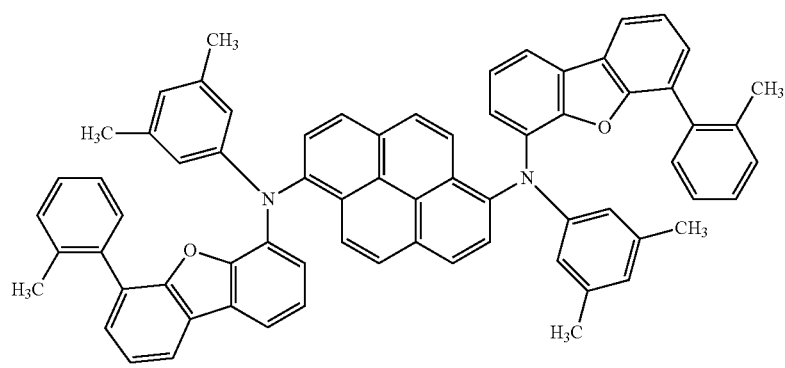
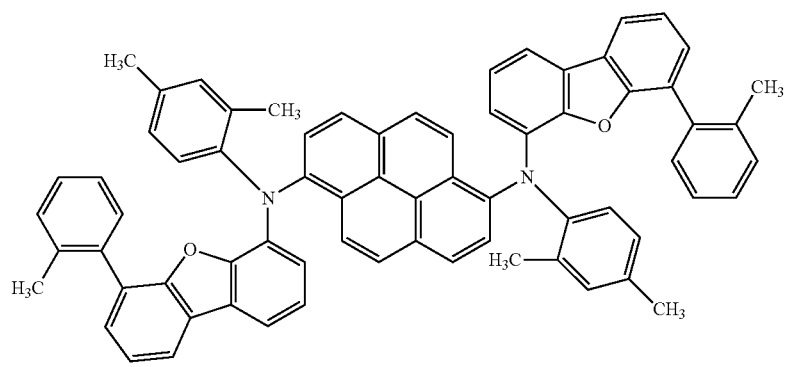
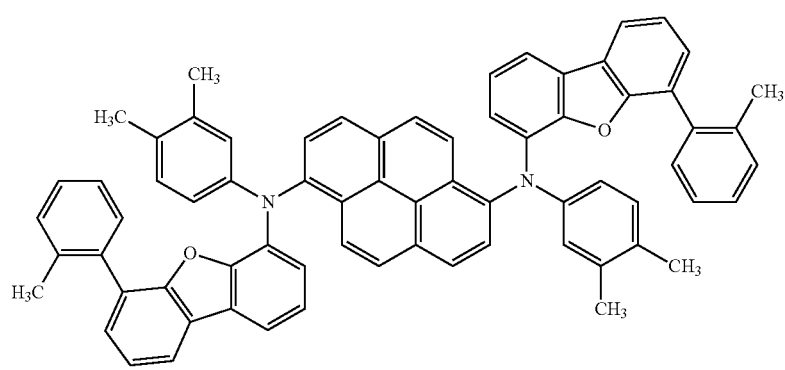

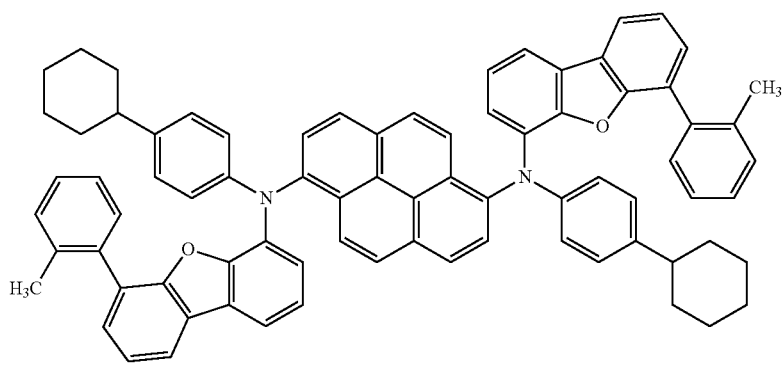
[Formula 15]
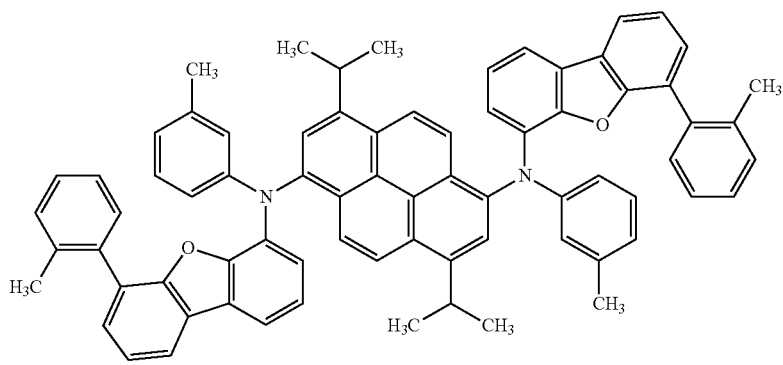
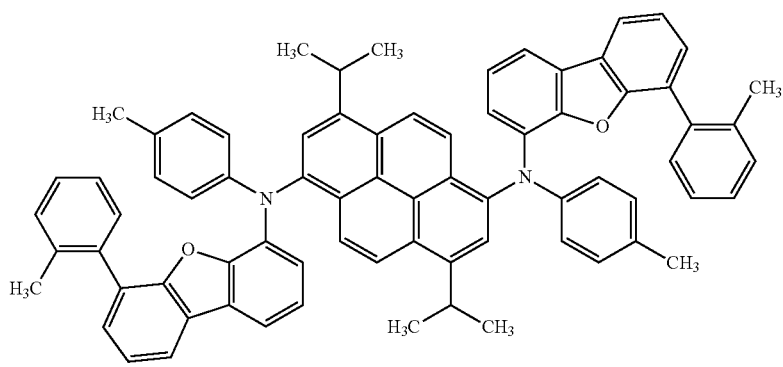
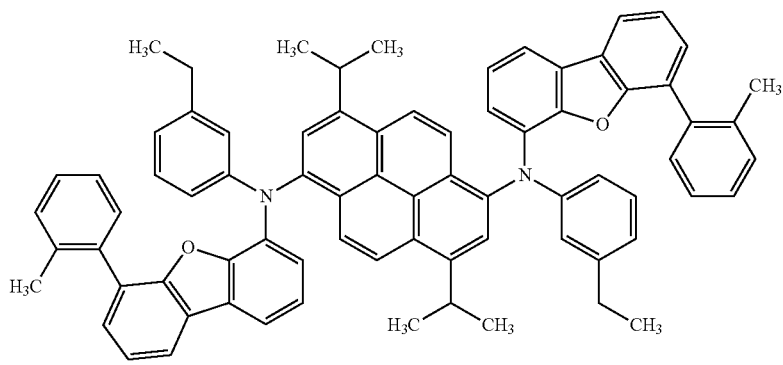

-continued
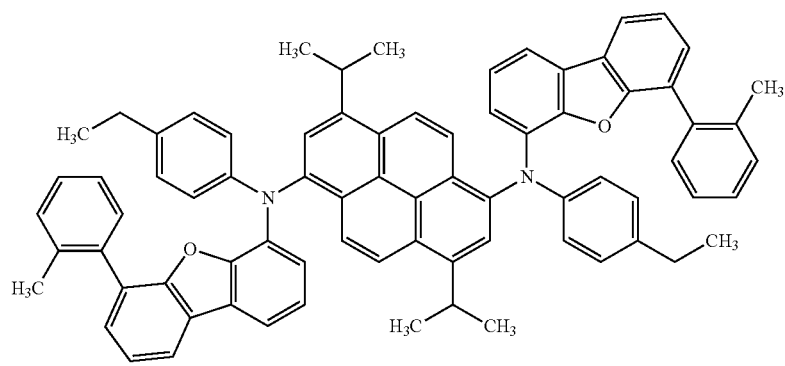
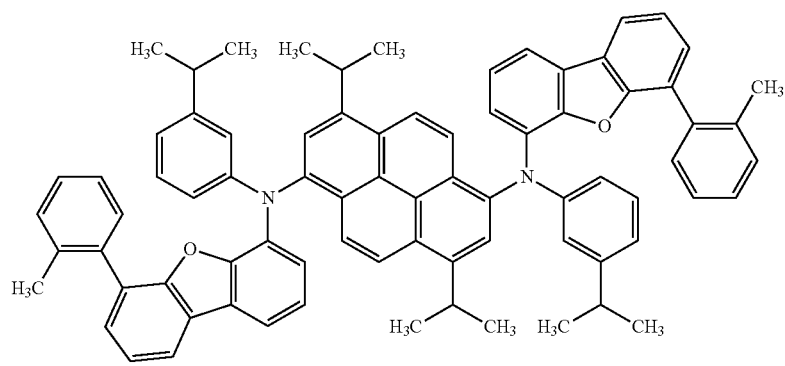
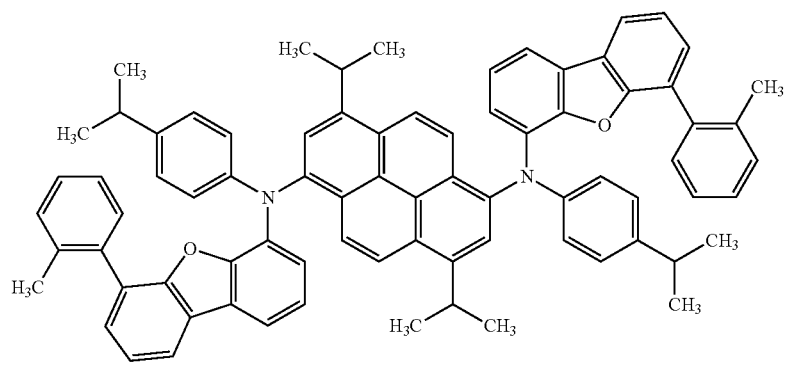
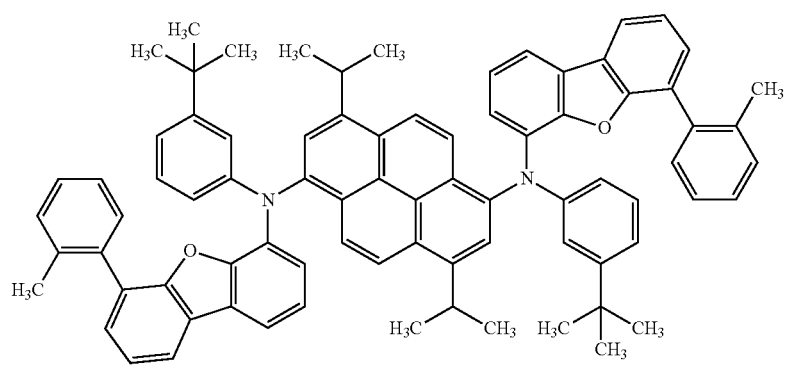

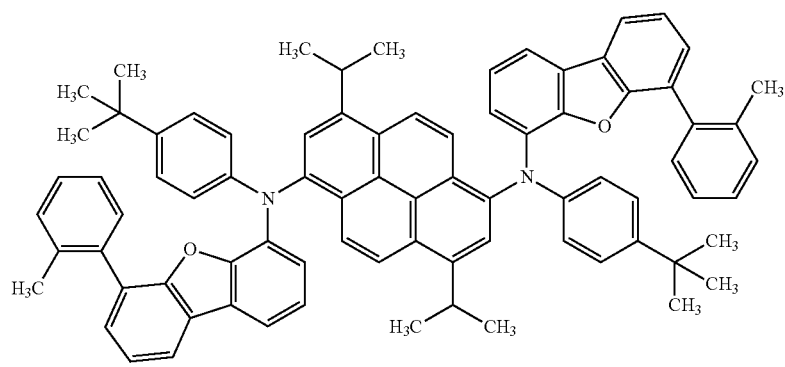
[Formula 16]
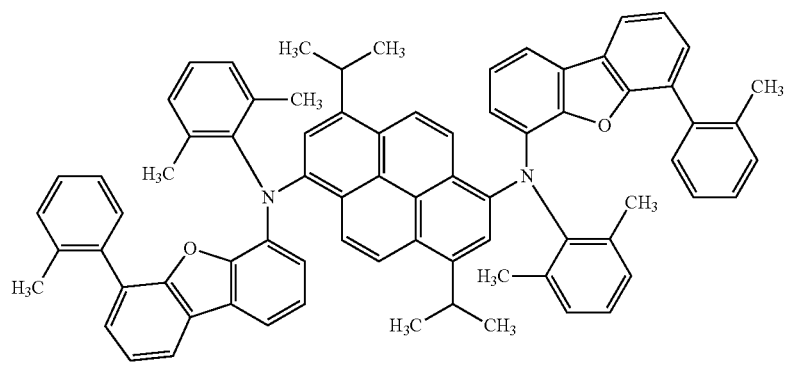
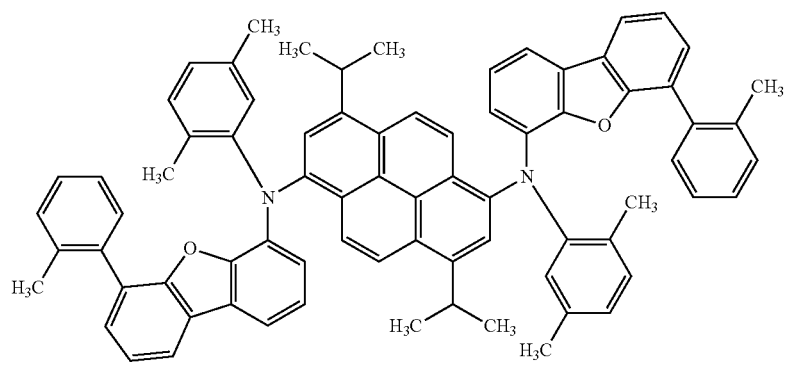
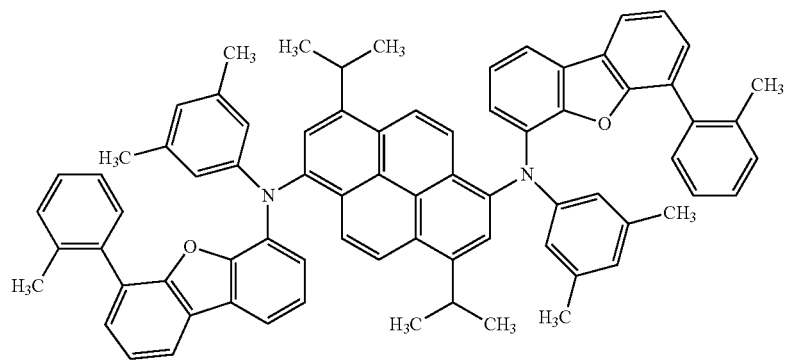

-continued
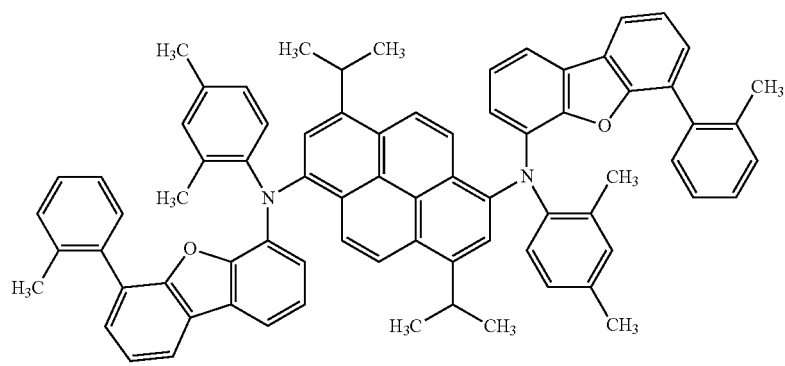
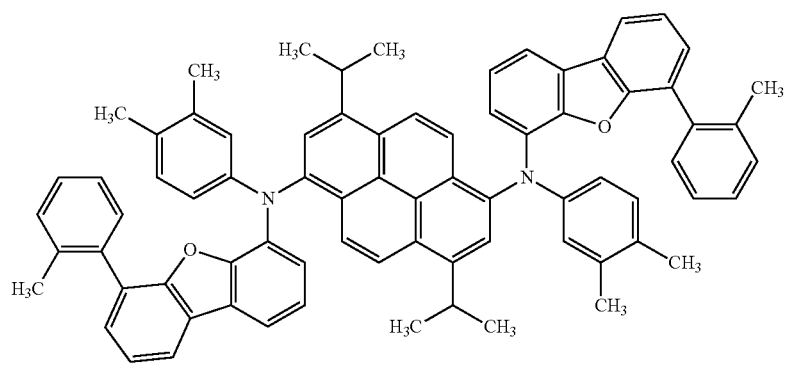
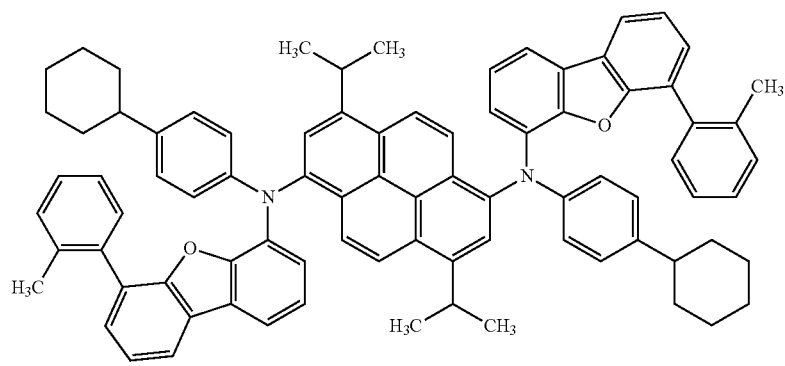
[Formula 17]
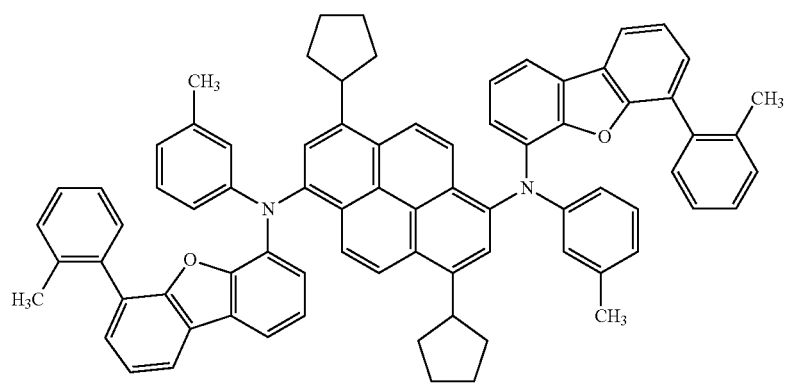

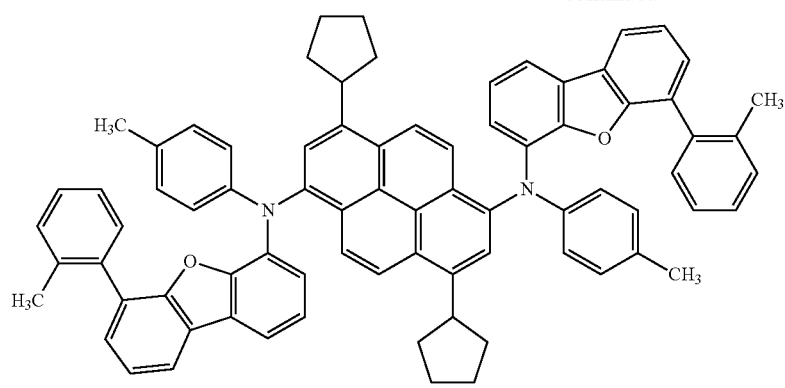
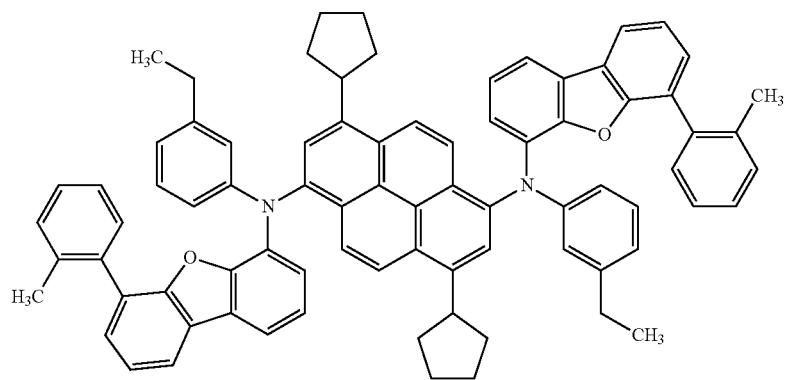
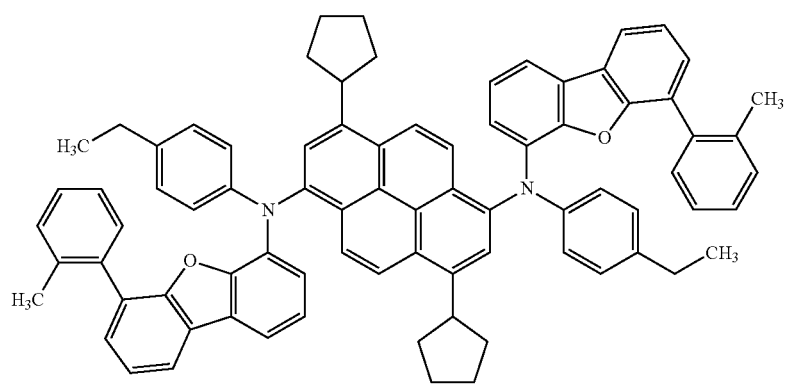
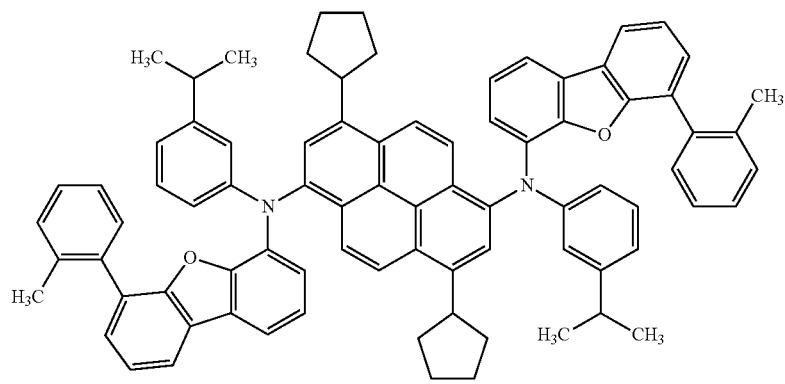

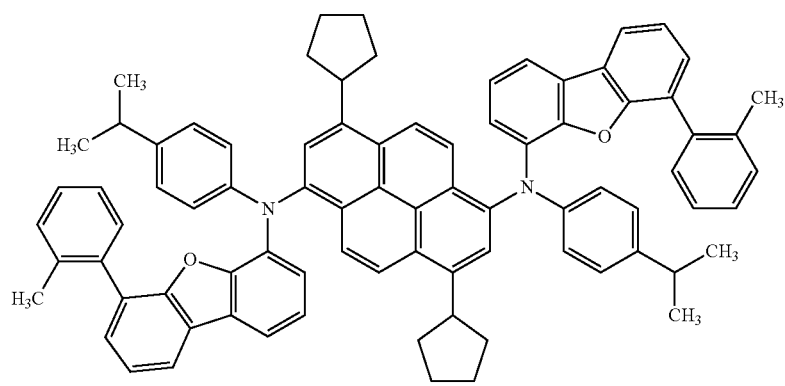
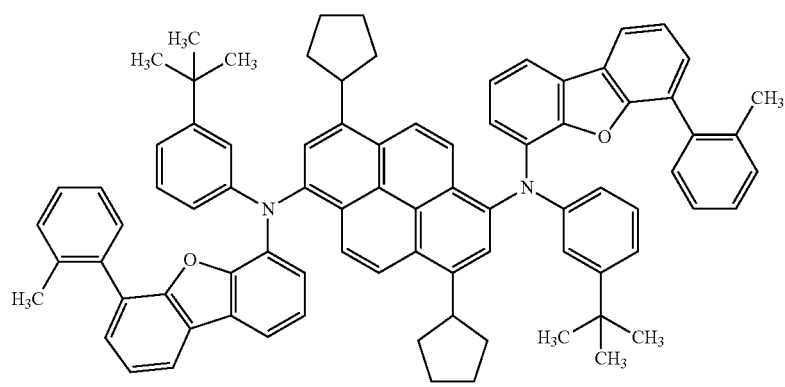
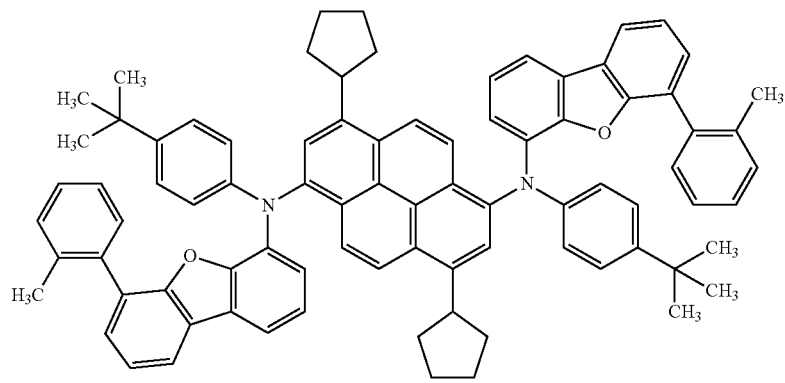
[Formula 18]
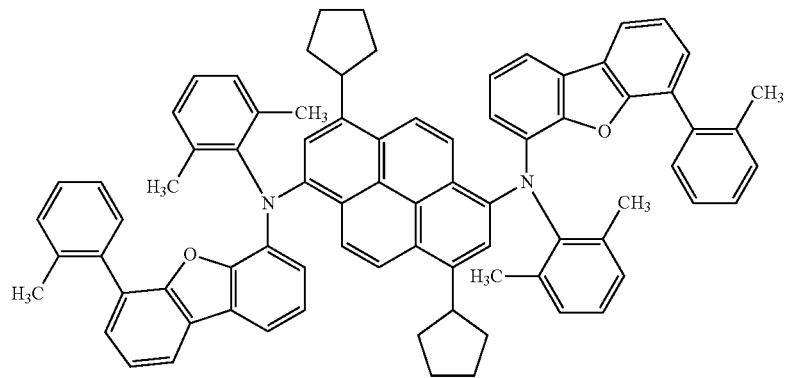

-continued
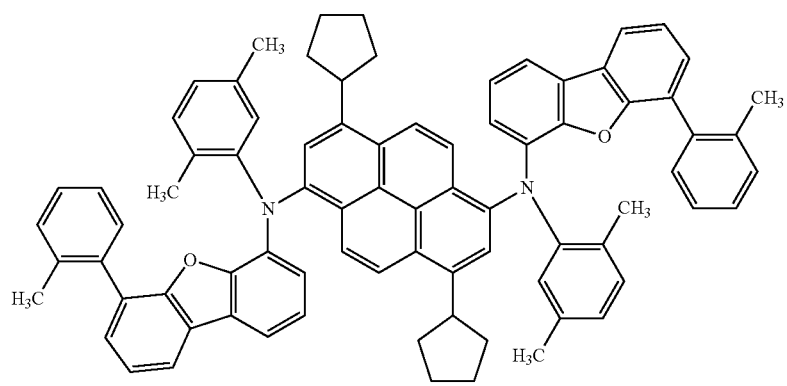
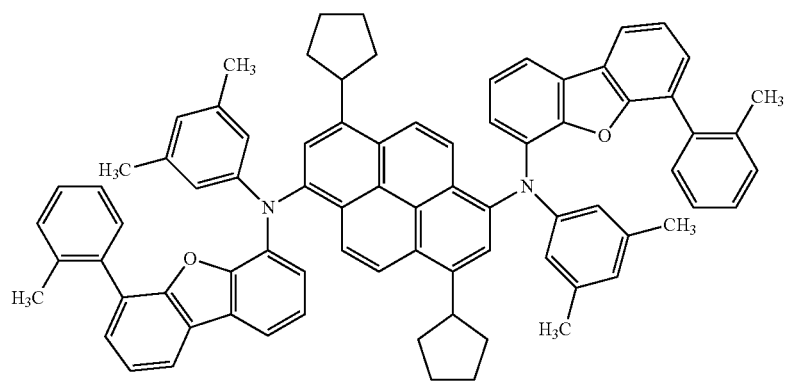
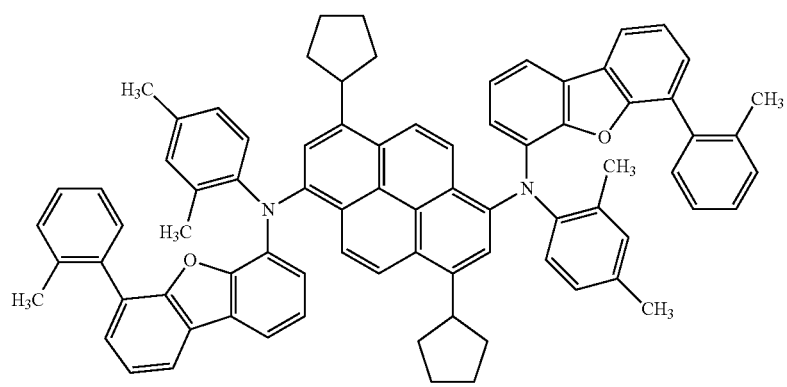
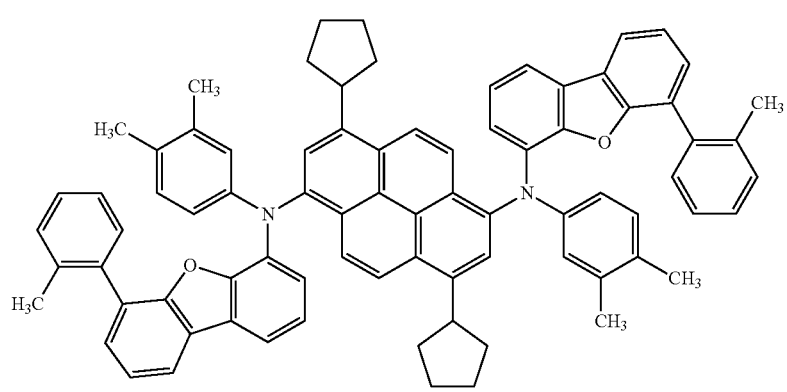

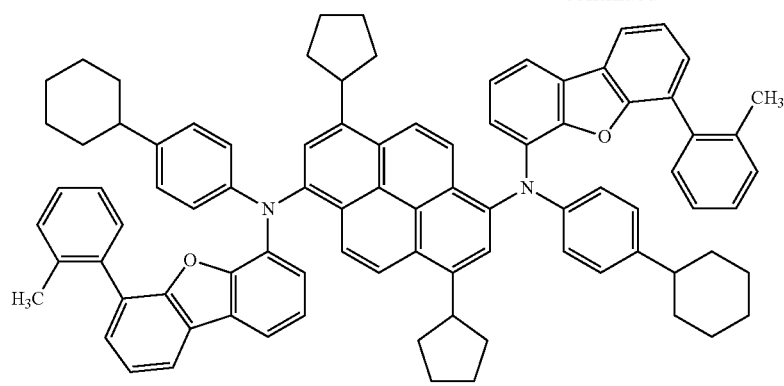
[Formula 19]
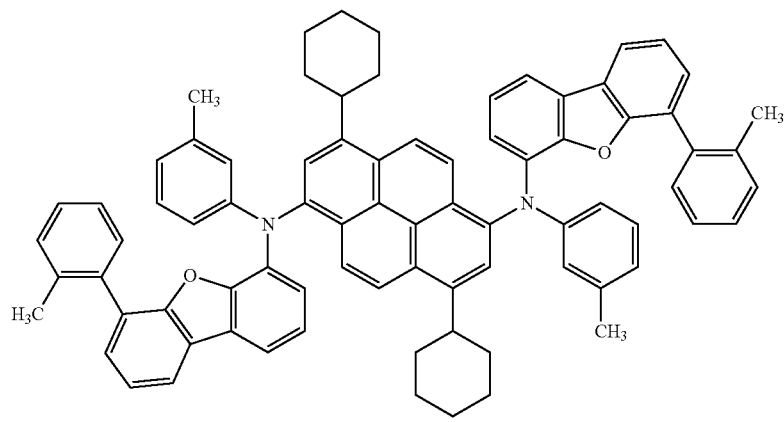
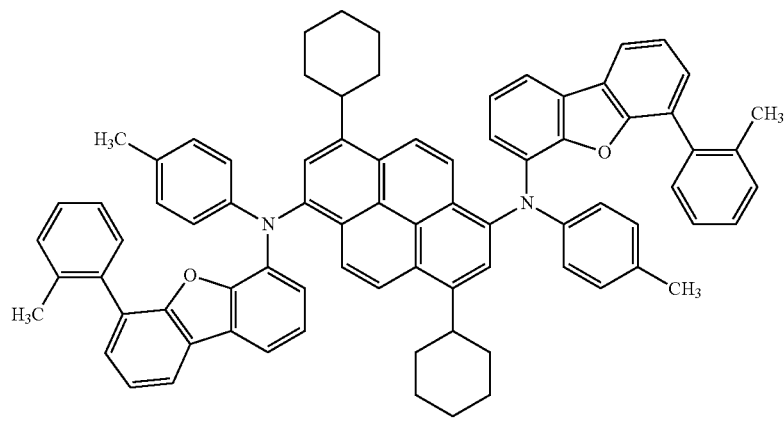
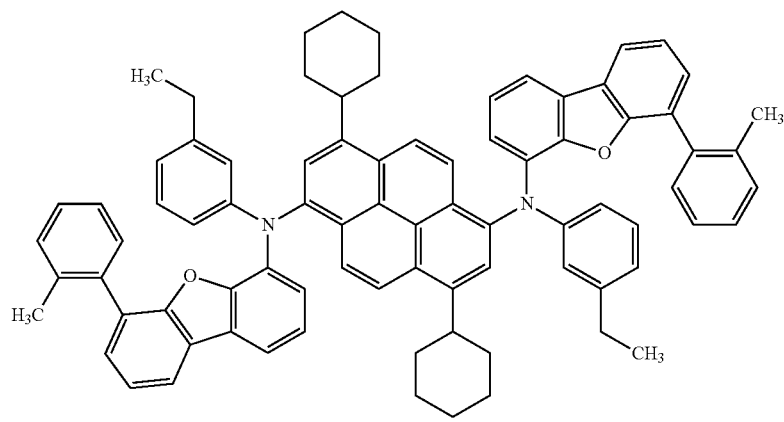

-continued
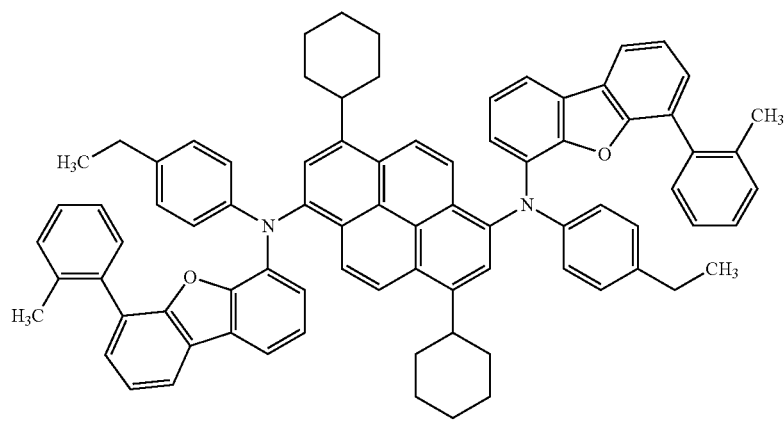
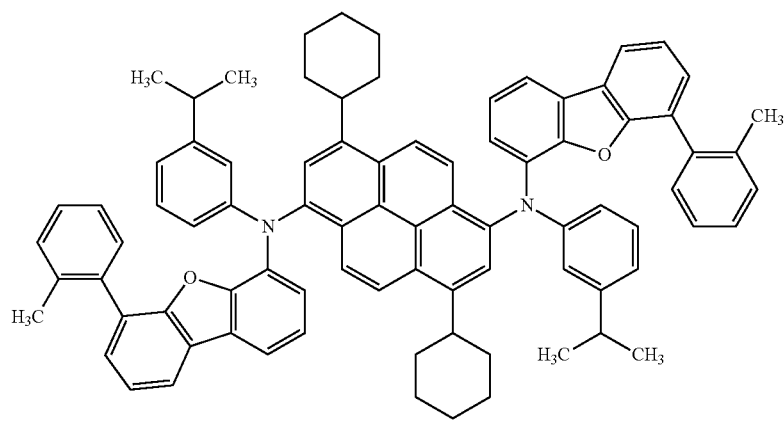
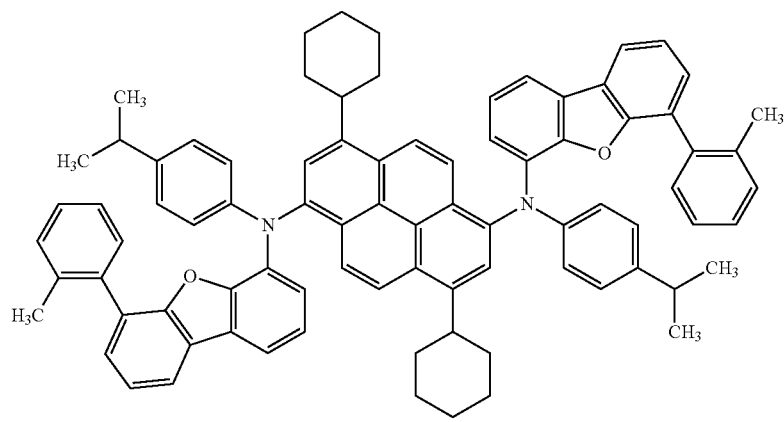
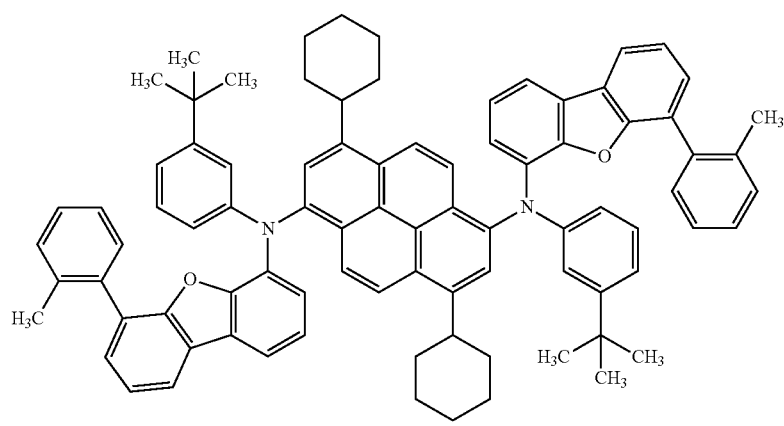

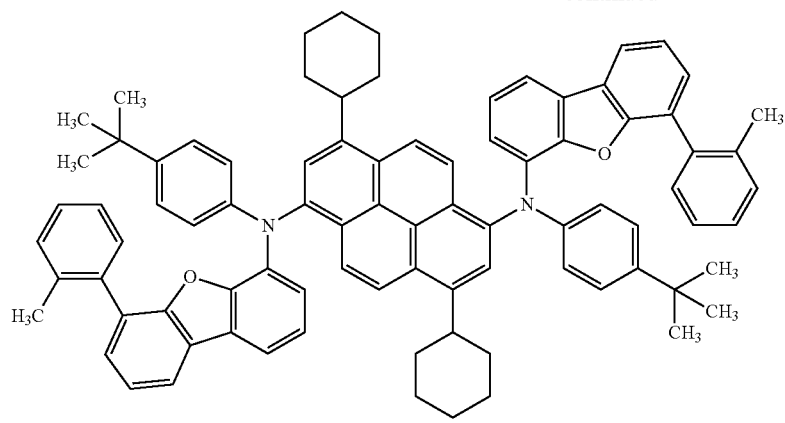
[Formula 20]
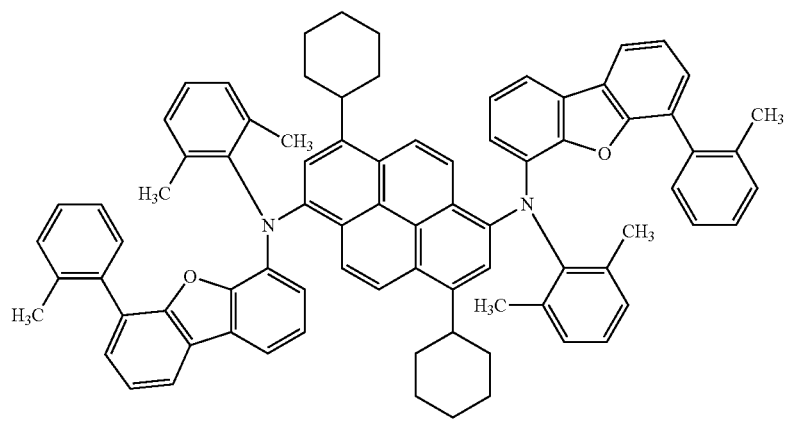
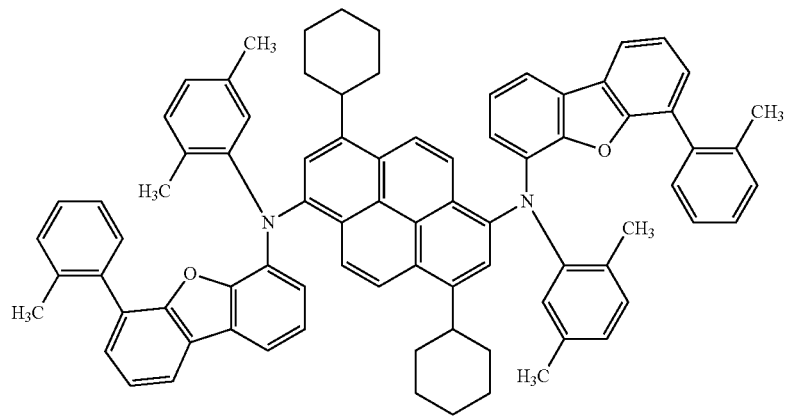
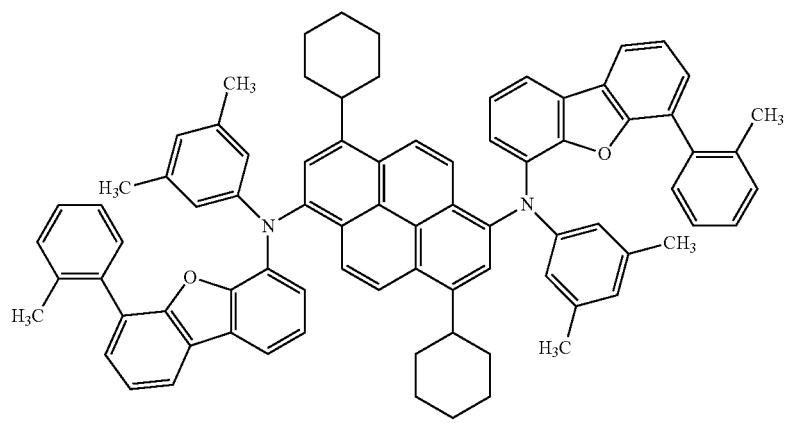

-continued
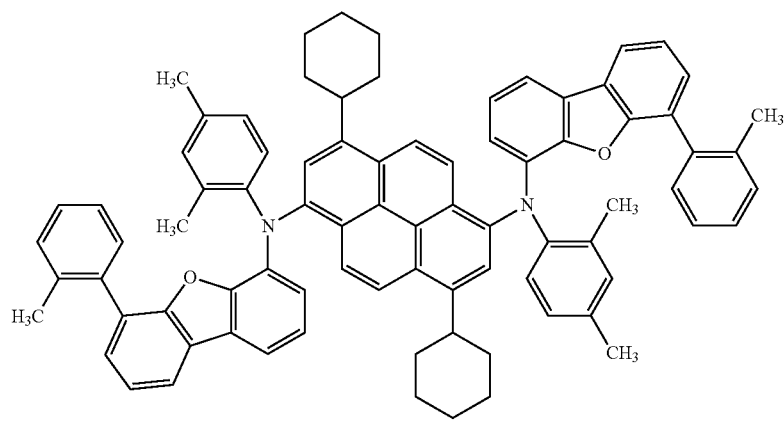
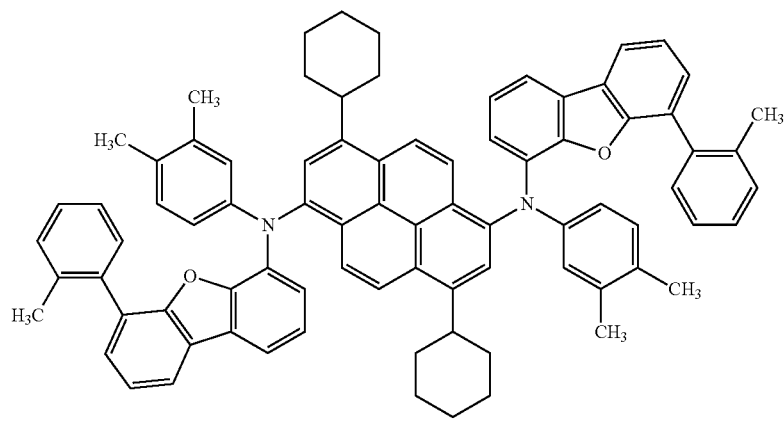
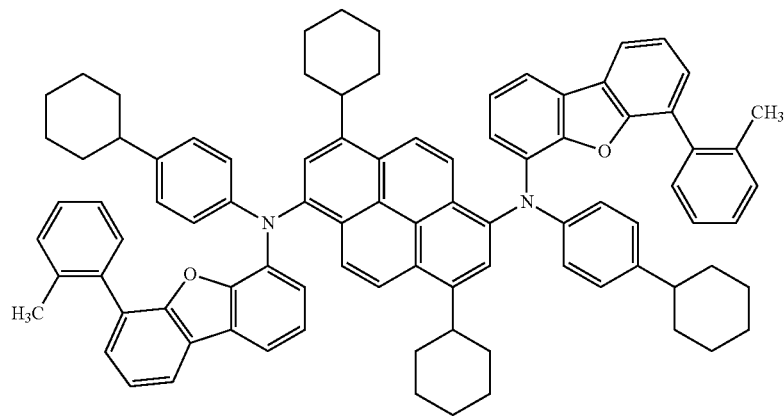
[Formula 21]
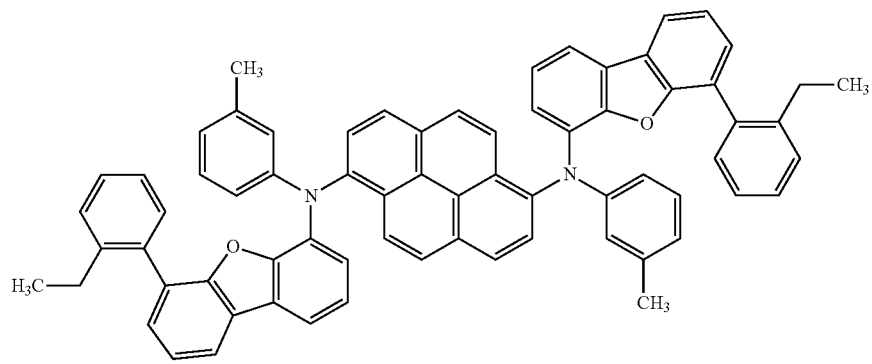

-continued
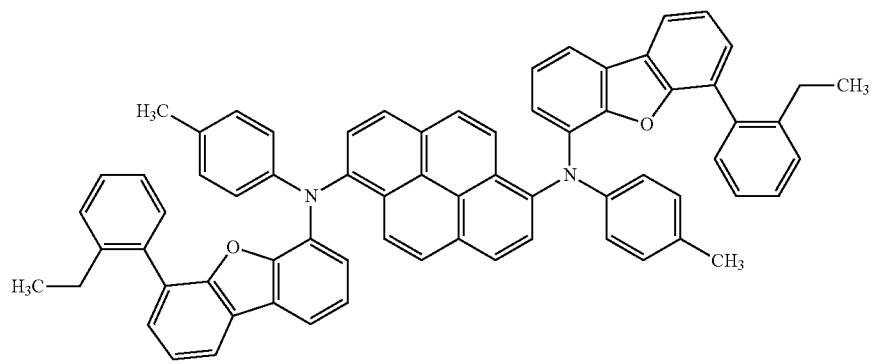
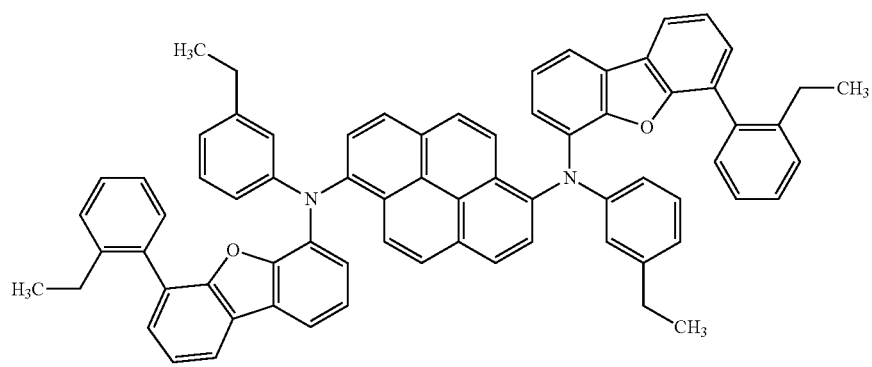
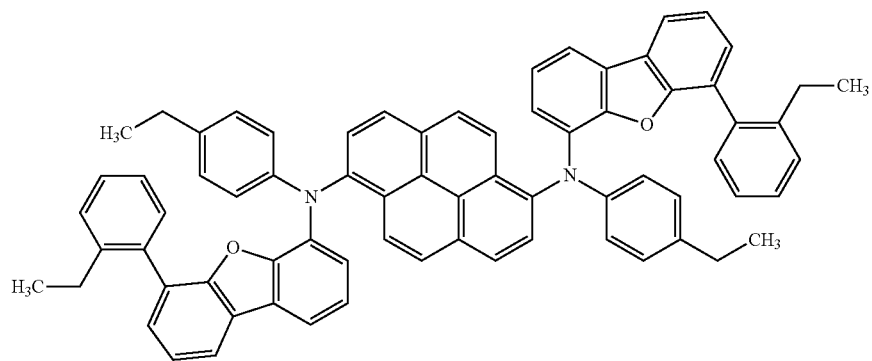
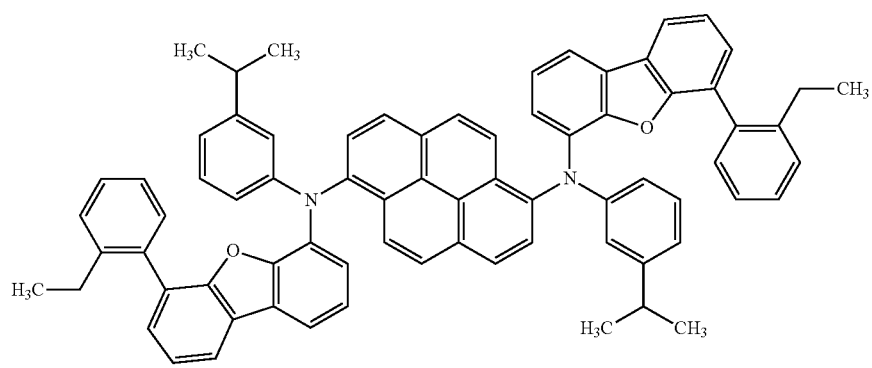

-continued
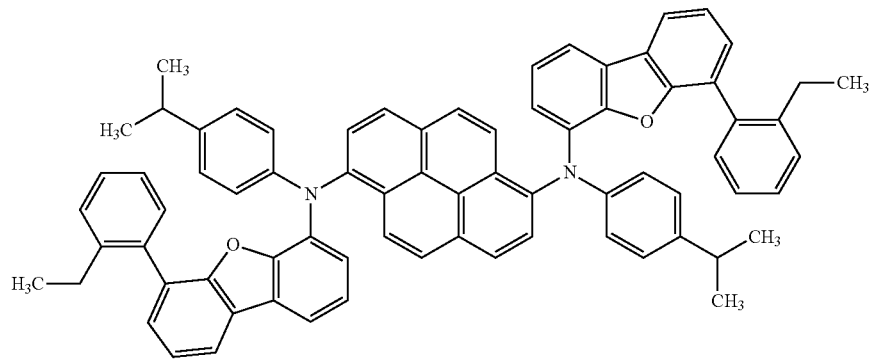
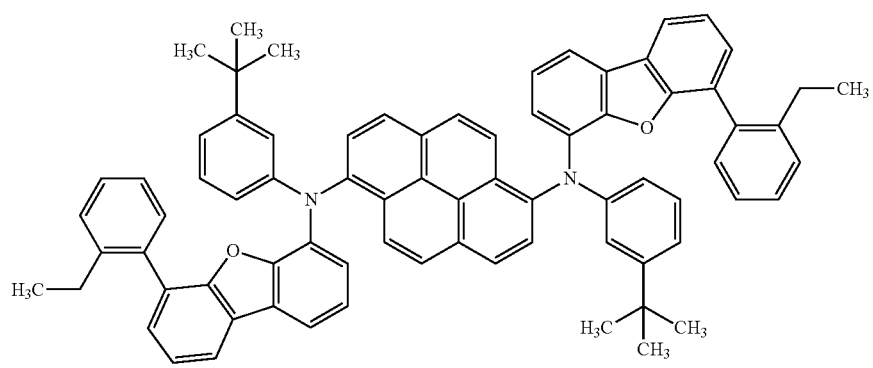
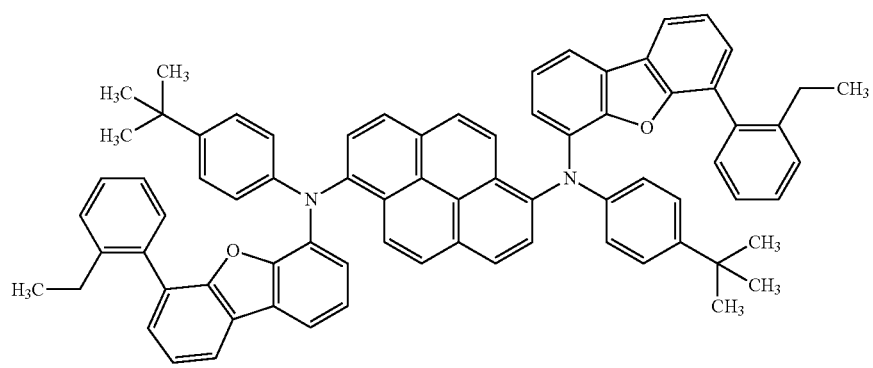
[Formula 22]
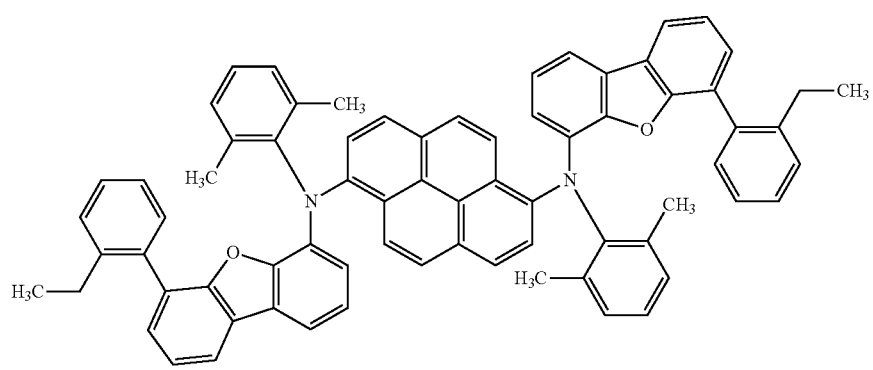

-continued
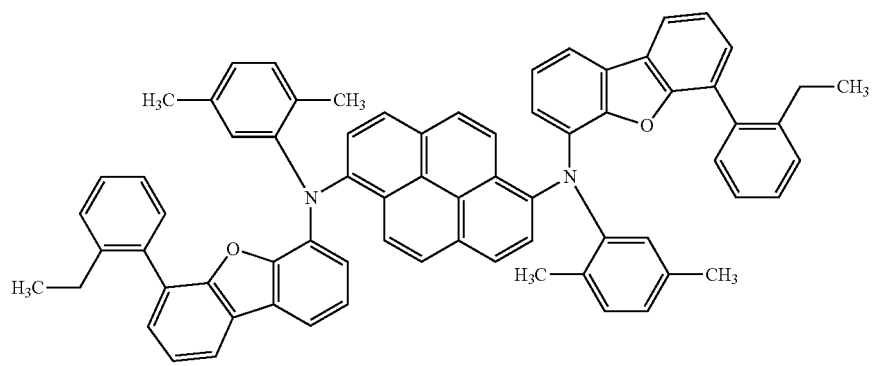
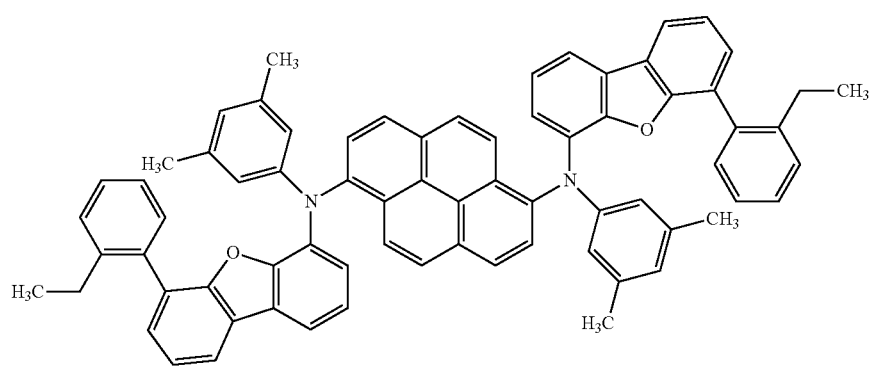
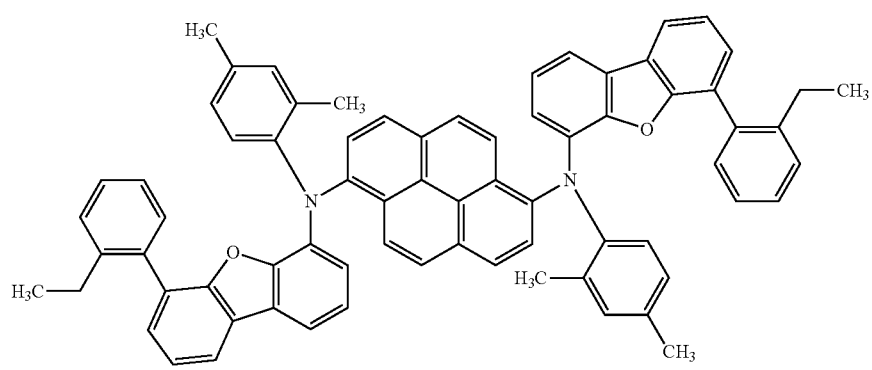
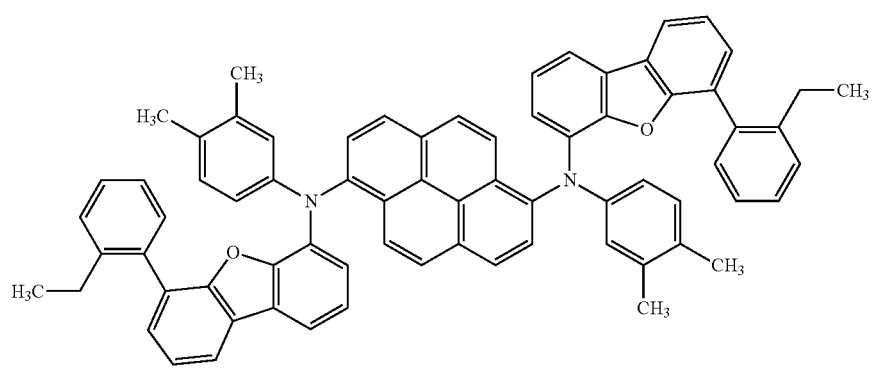

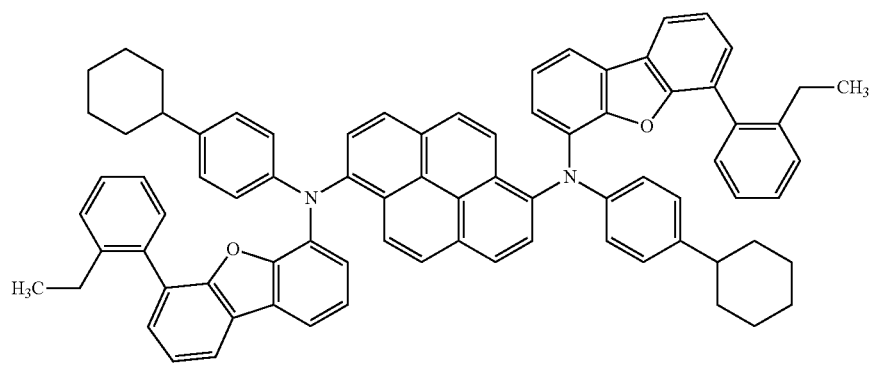
[Formula 23]
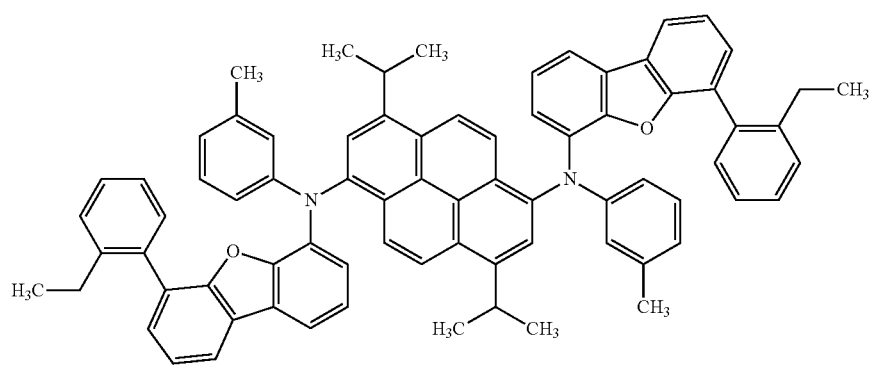
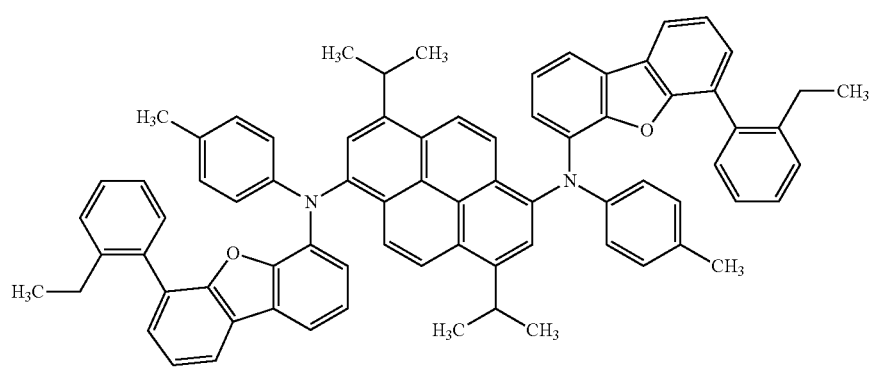
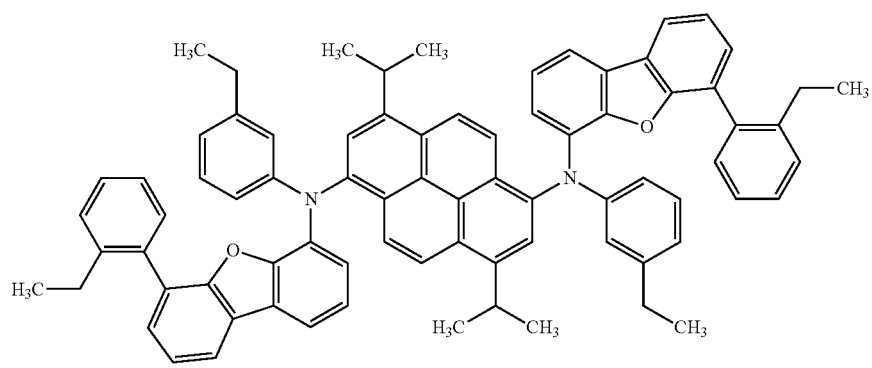

-continued
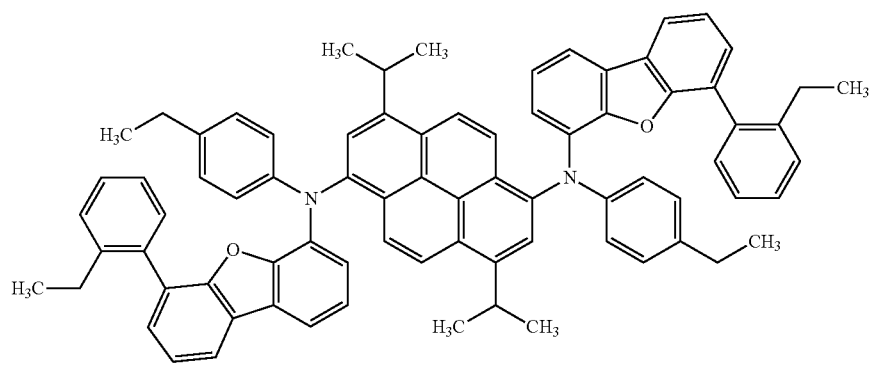
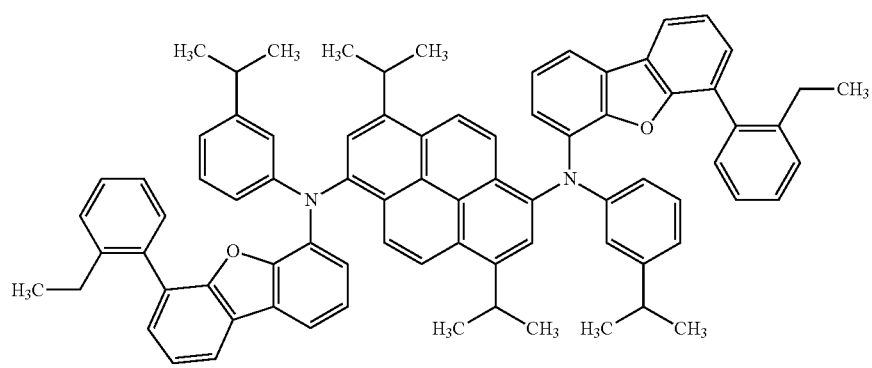
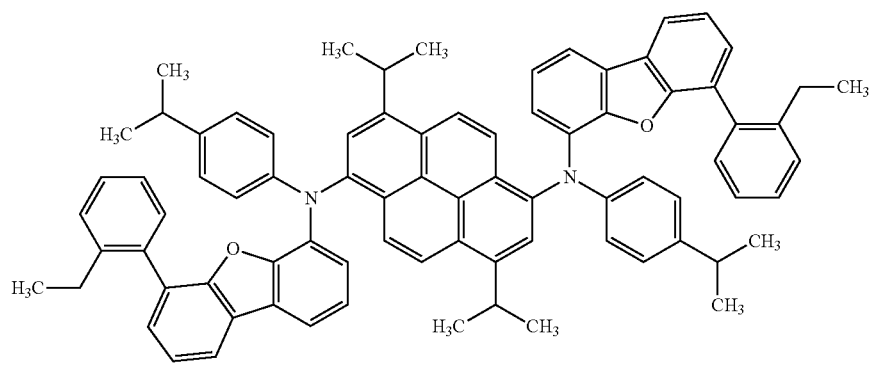
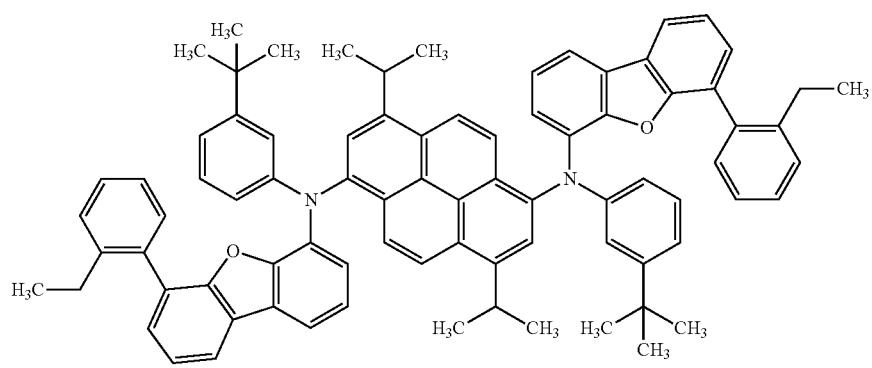

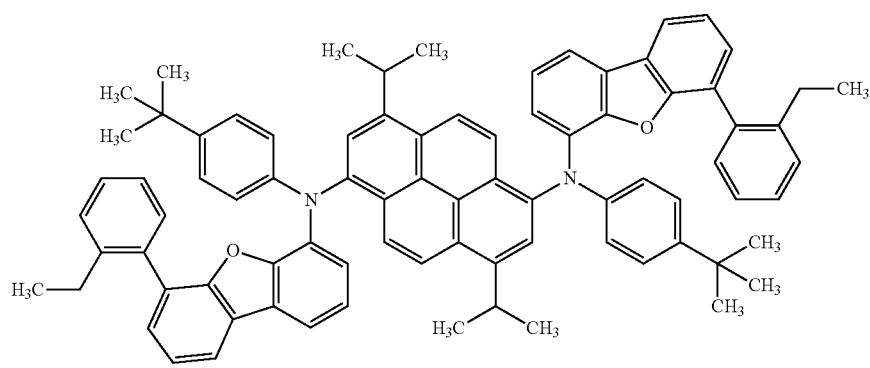
[Formula 24]
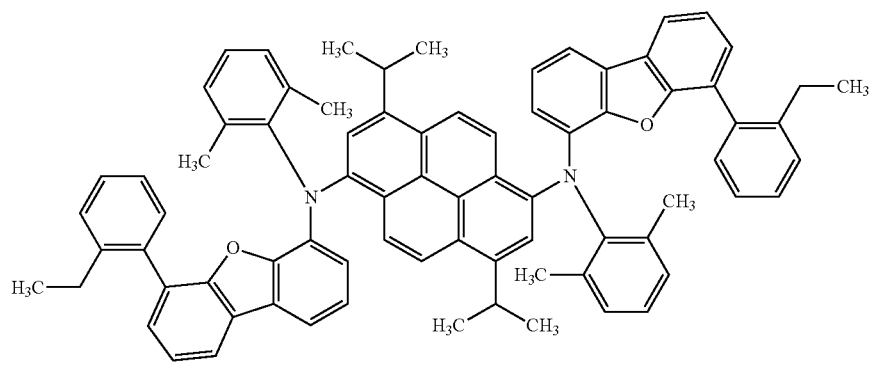
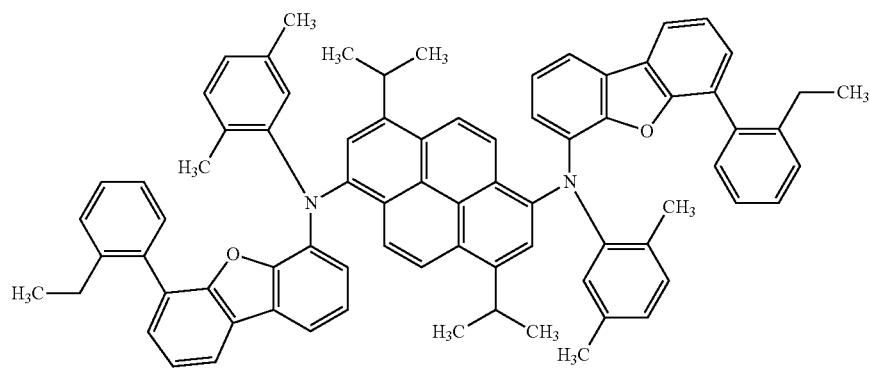
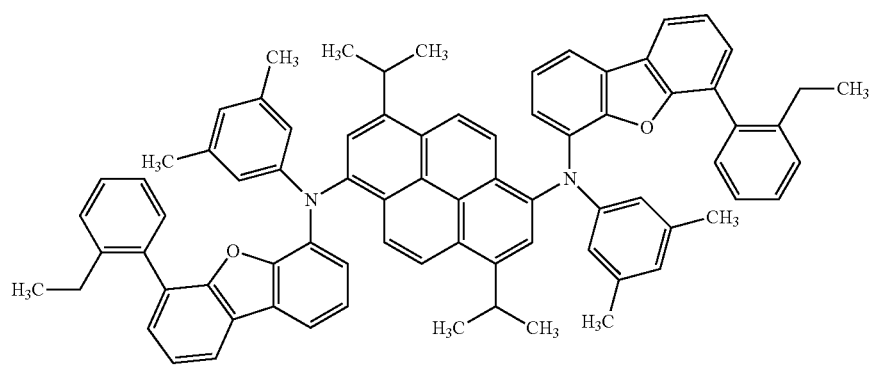

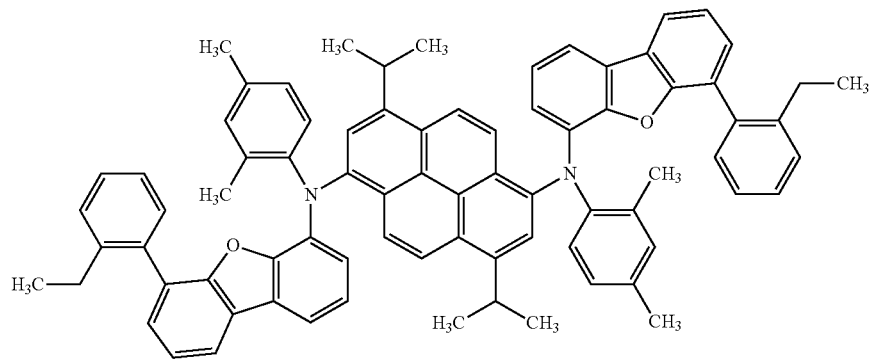
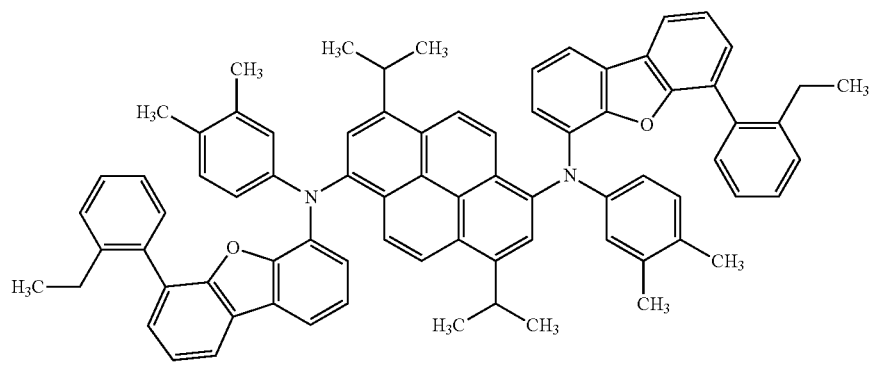
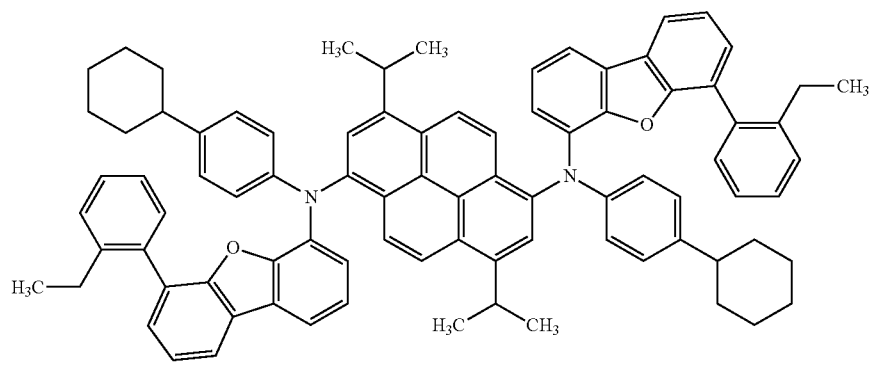
[Formula 25]
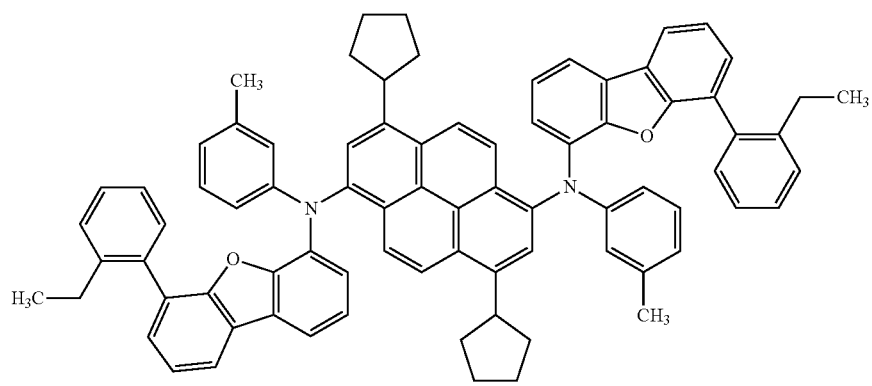

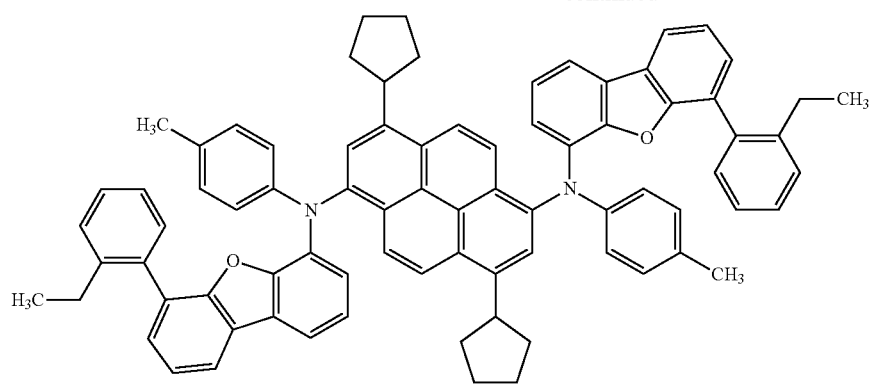
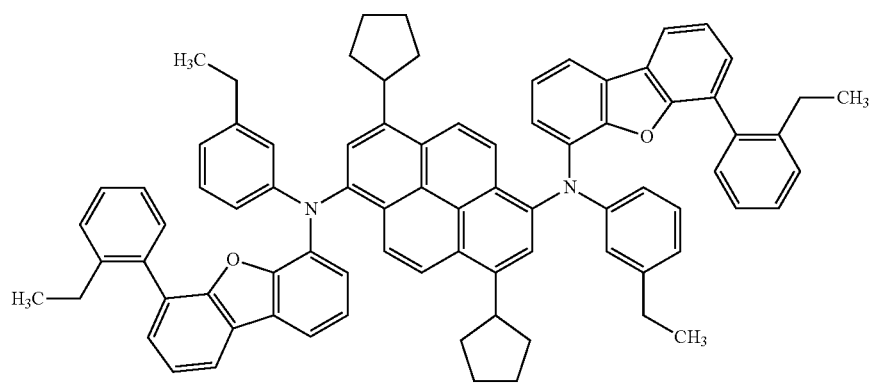
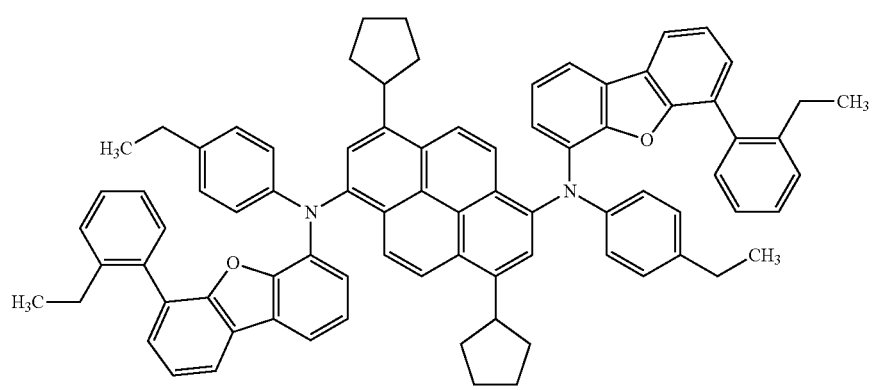
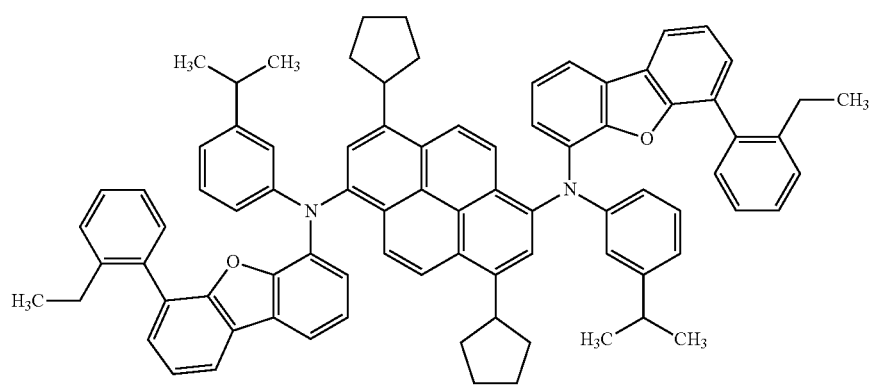

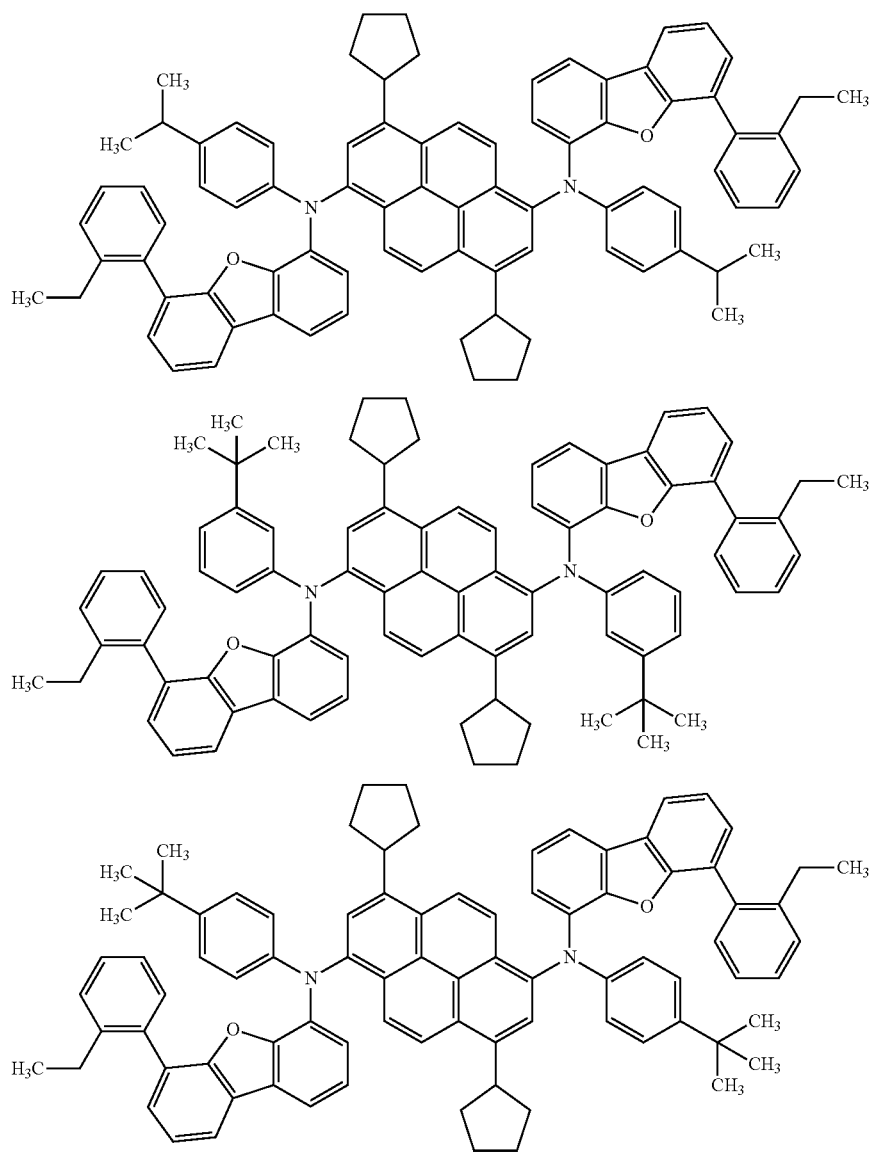
[Formula 26]
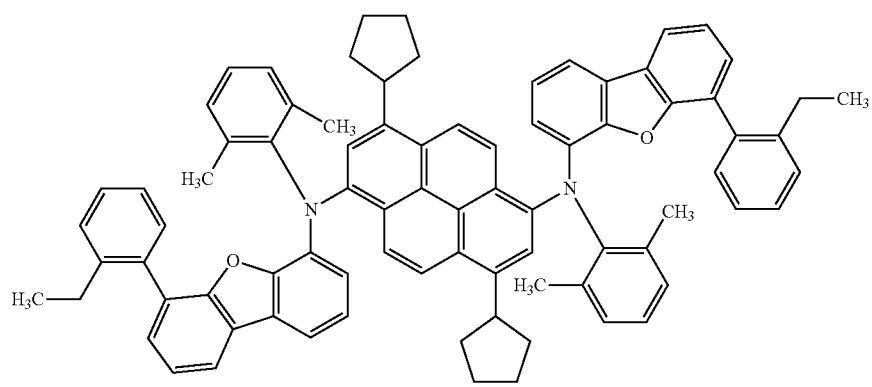

-continued
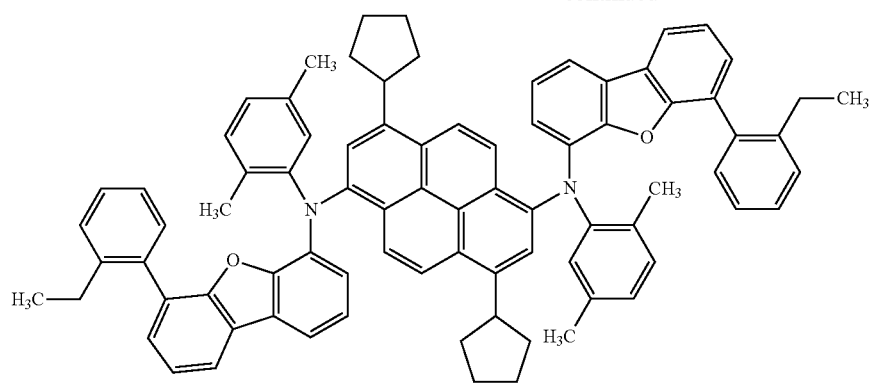
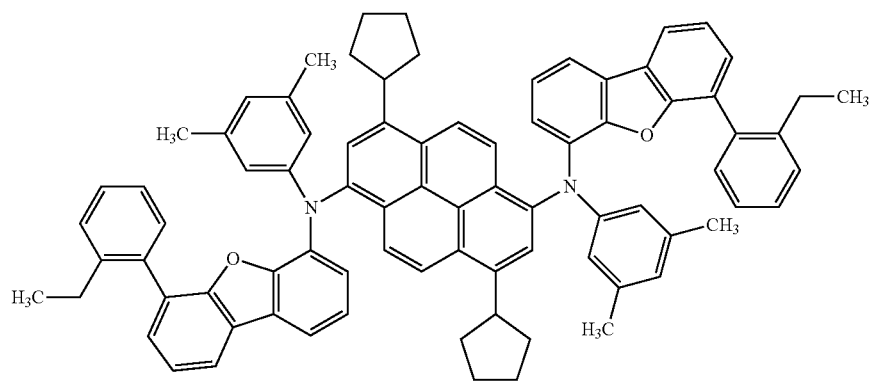
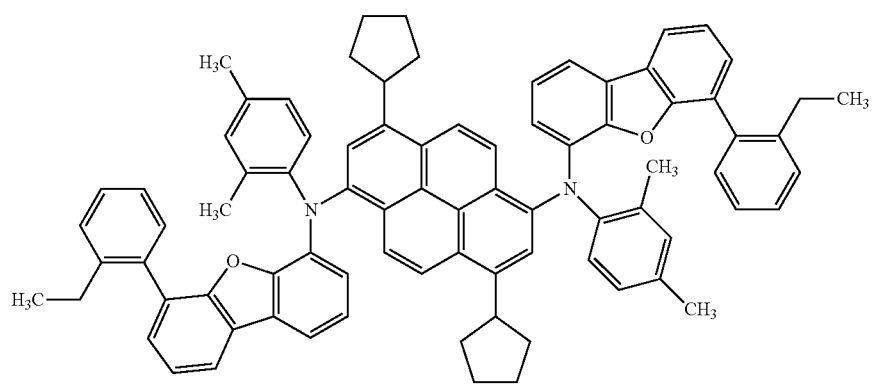
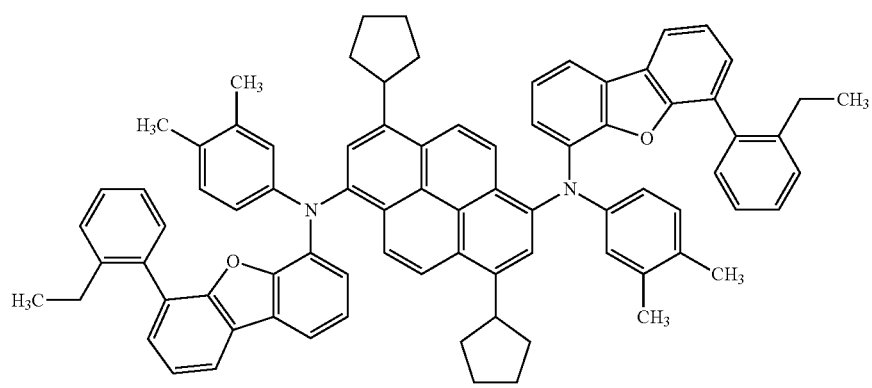

-continued
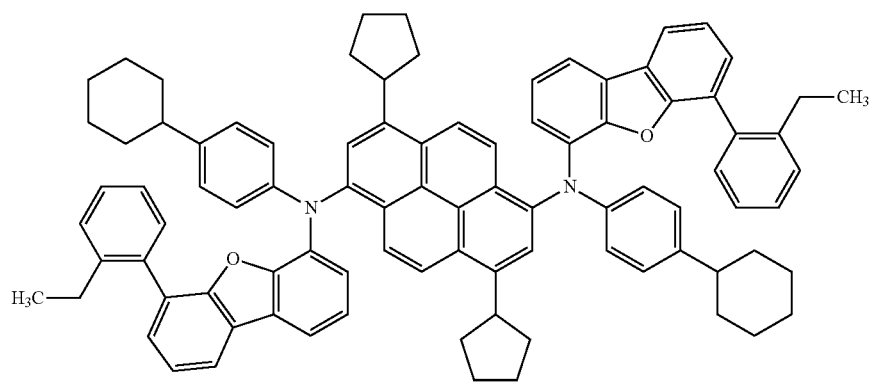
[Formula 27]
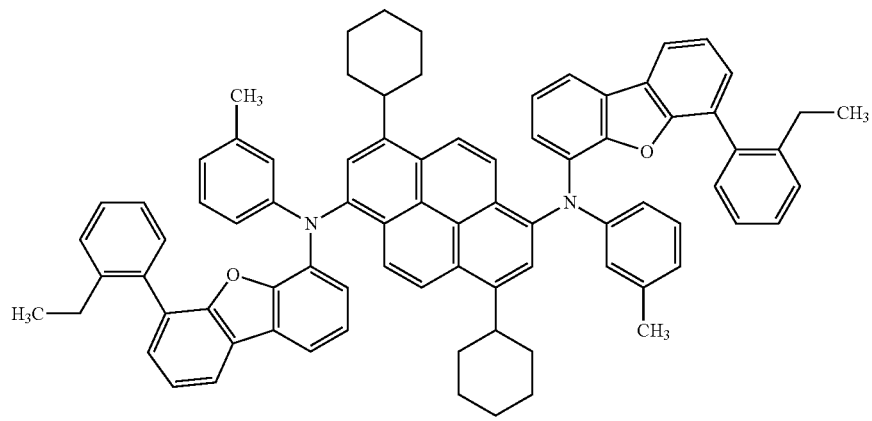
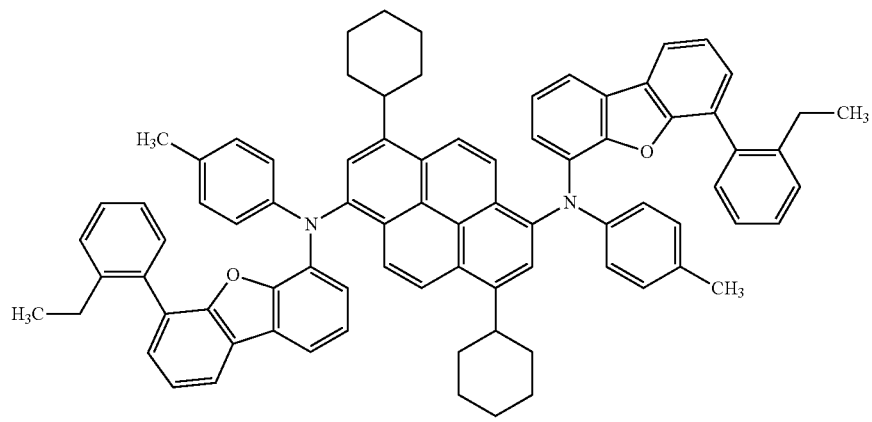
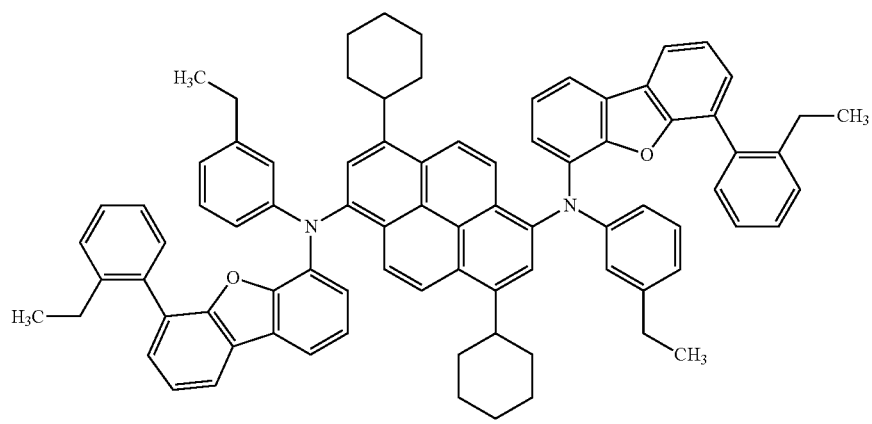

-continued
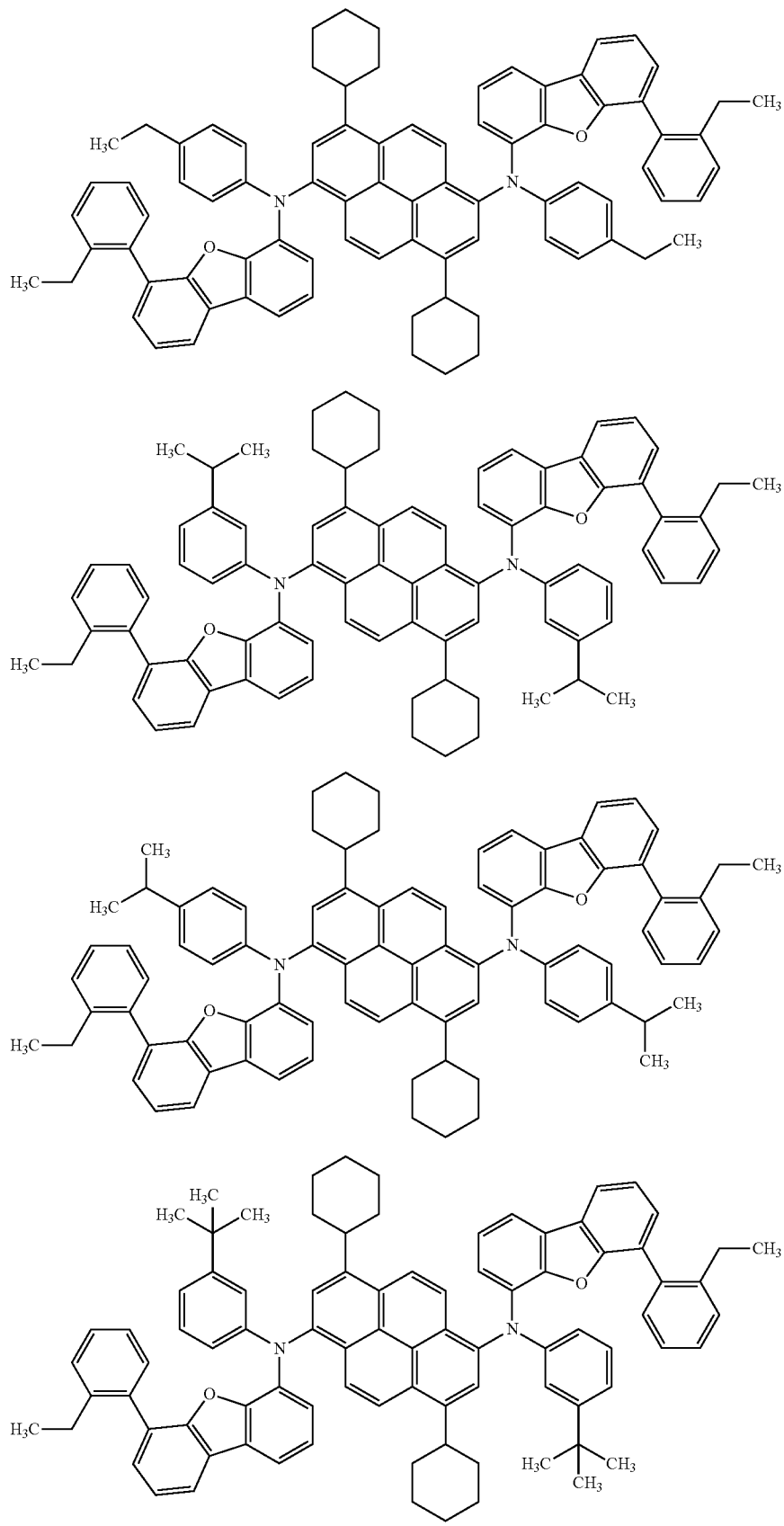

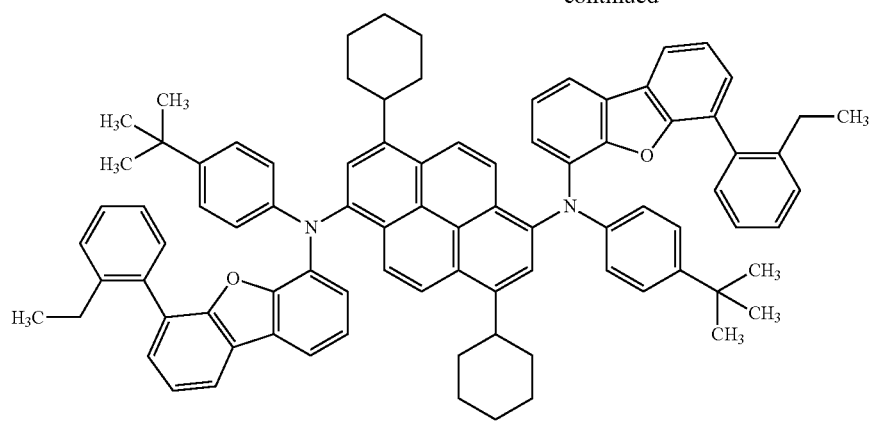
[Formula 28]
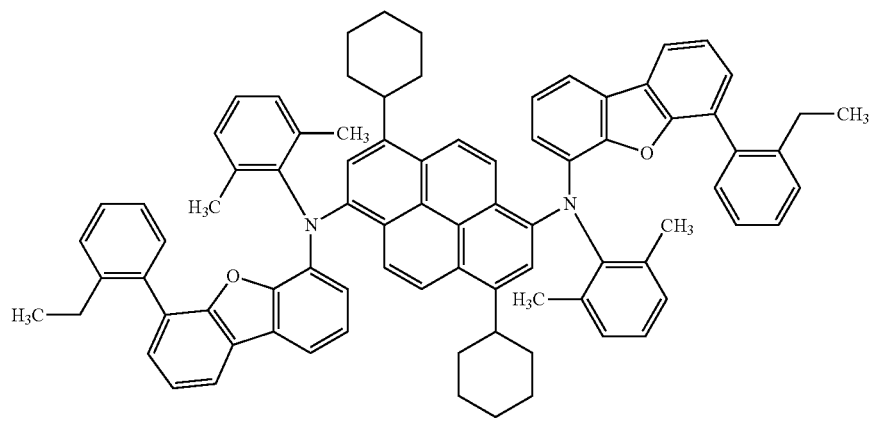
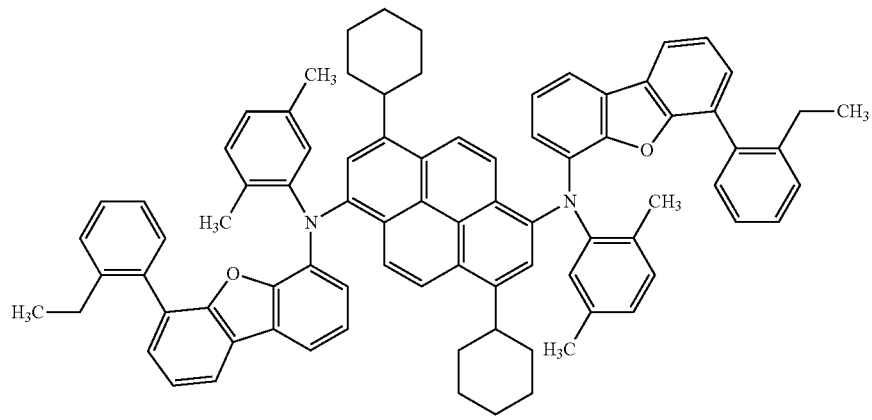
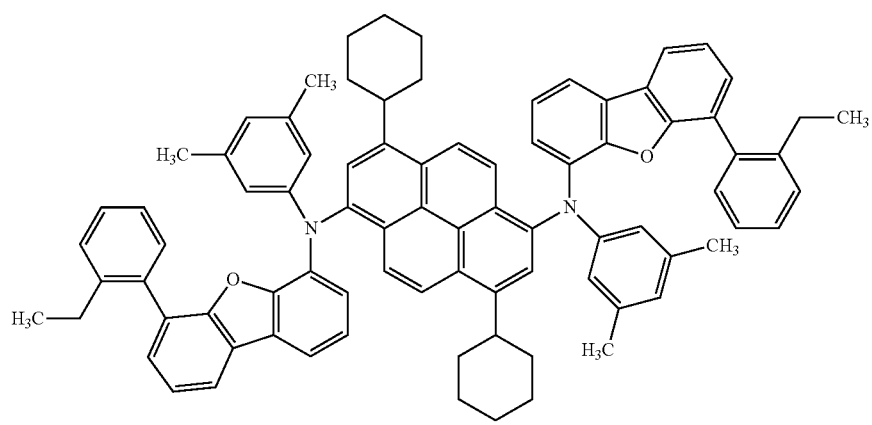

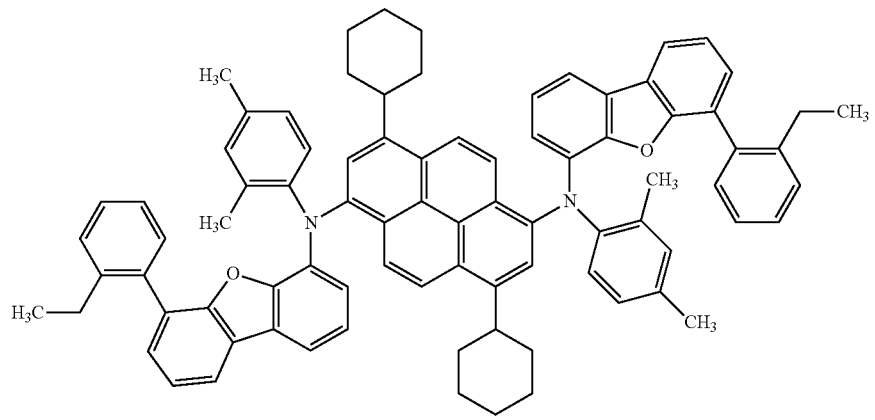
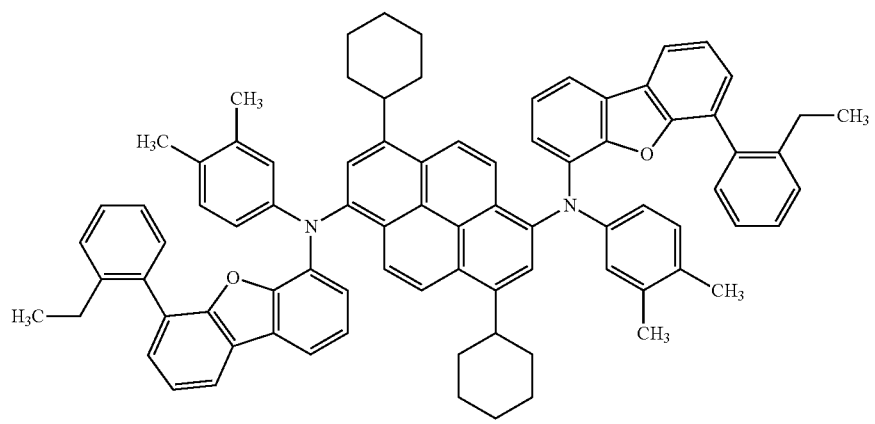
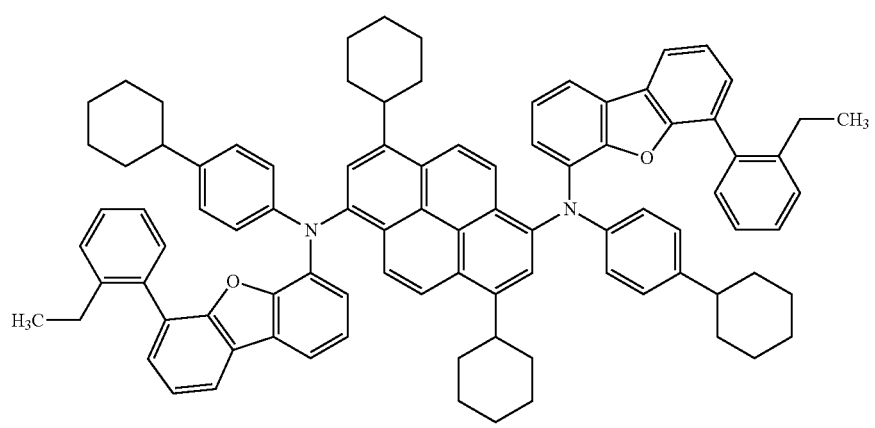
[Formula 29]
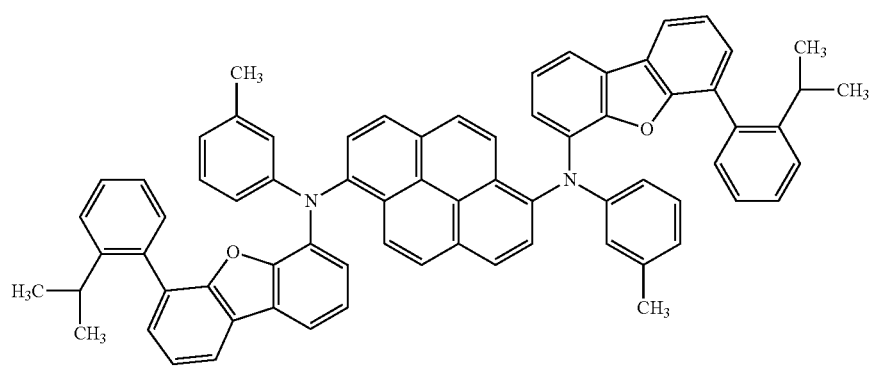

-continued
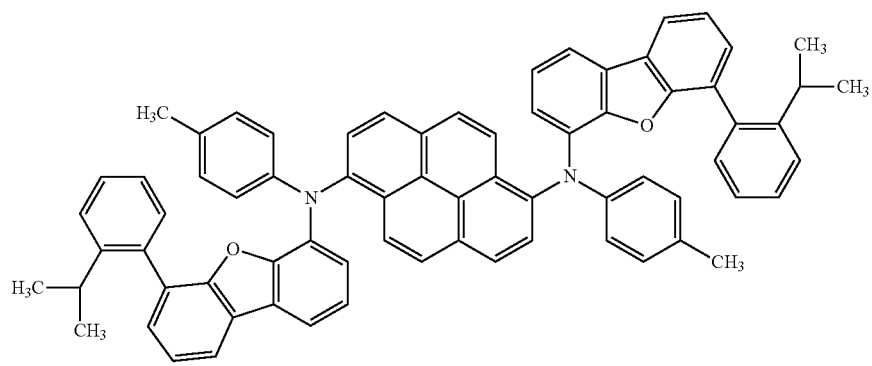
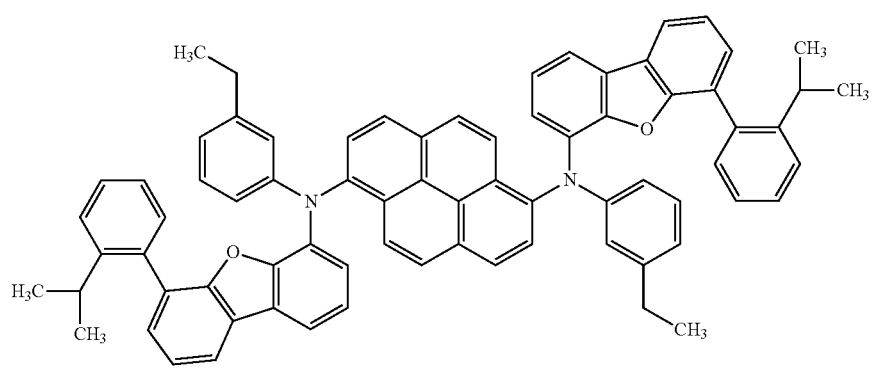
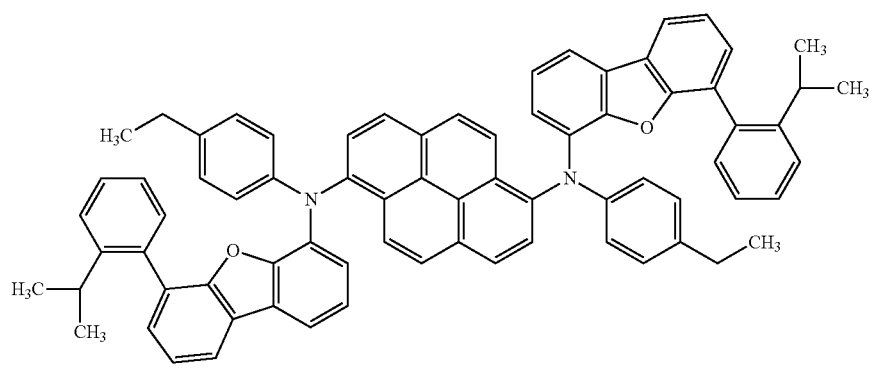
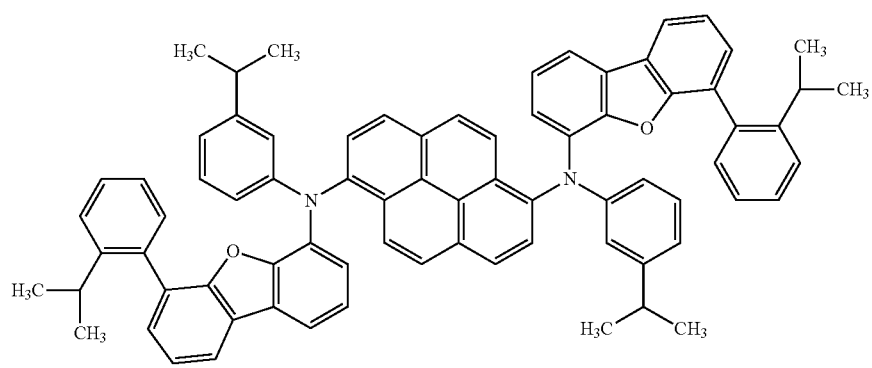

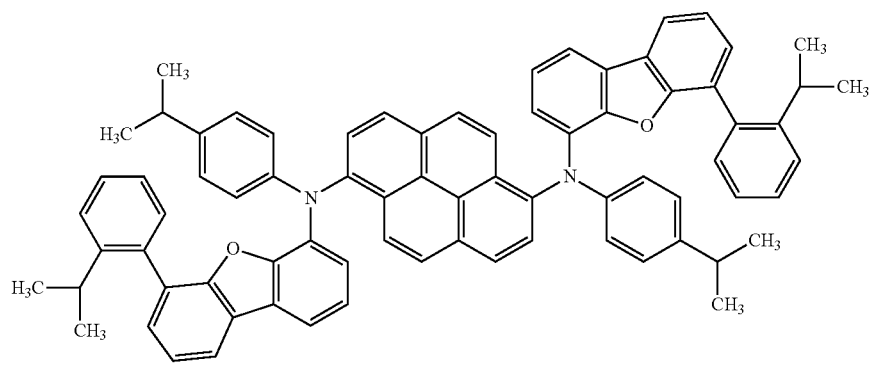
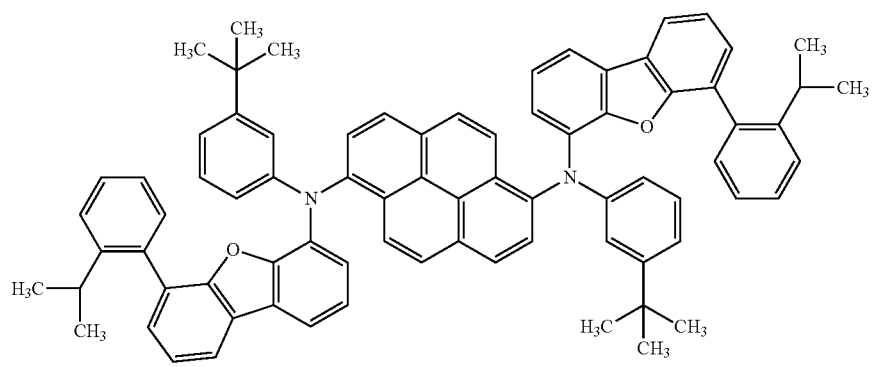
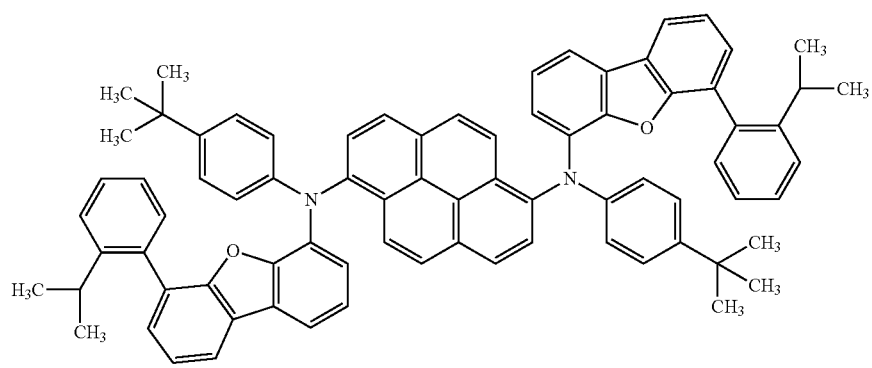
[Formula 30]
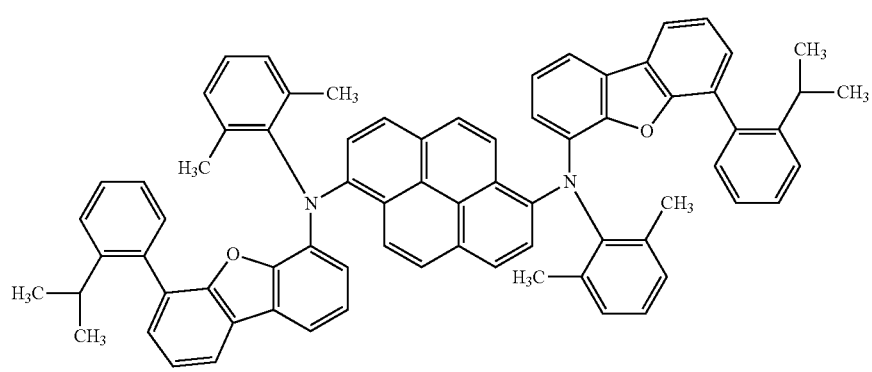

-continued
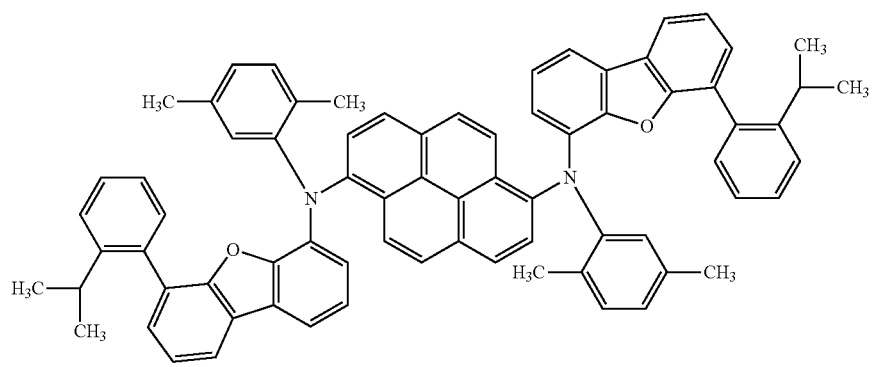
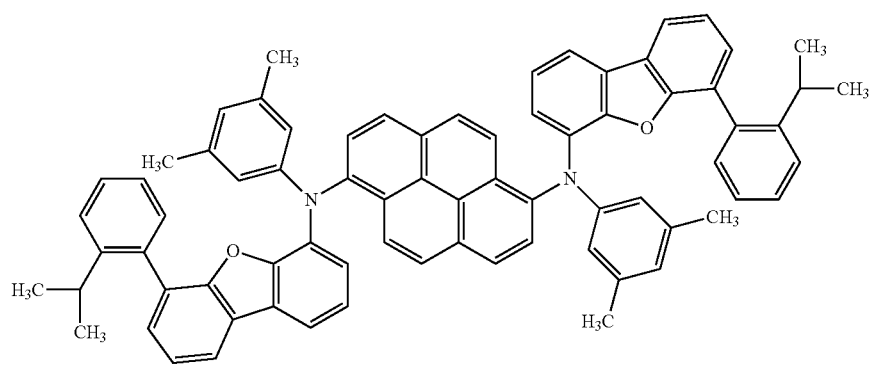
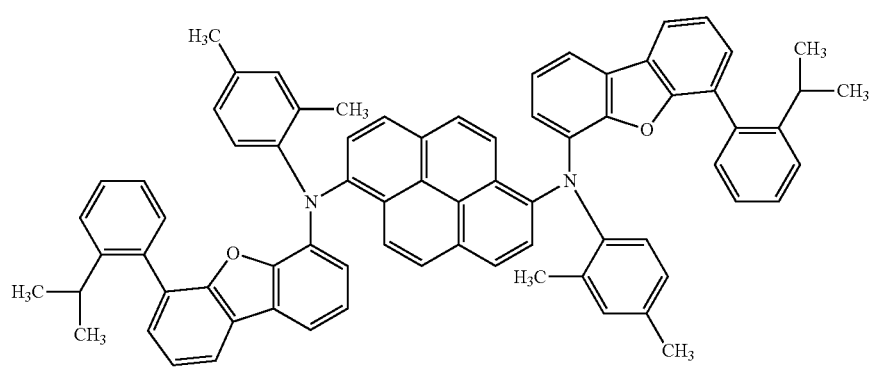
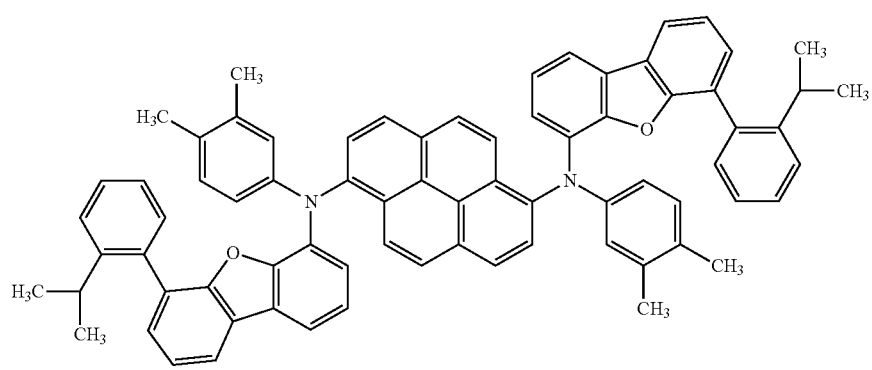

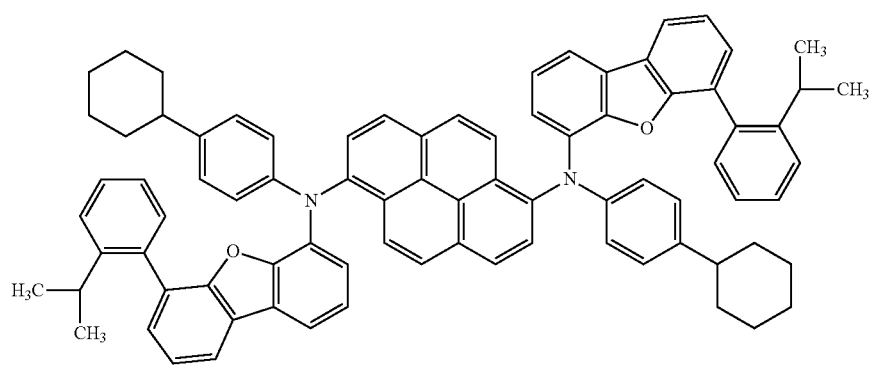
[Formula 31]
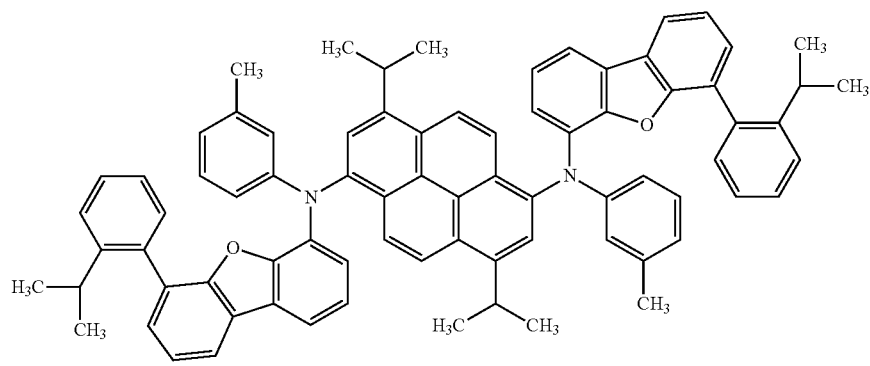
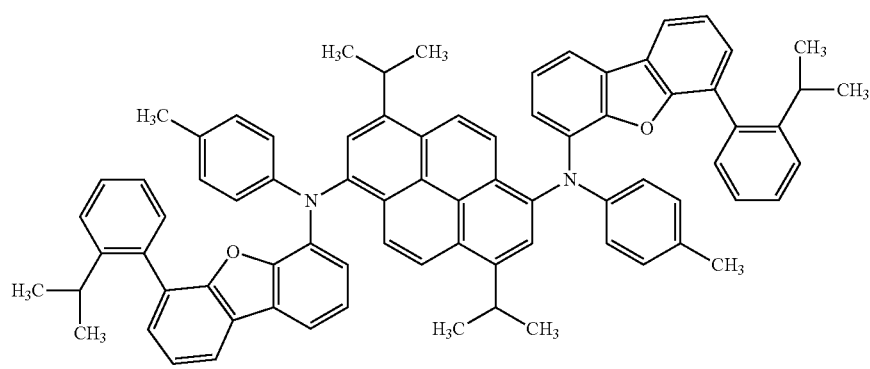
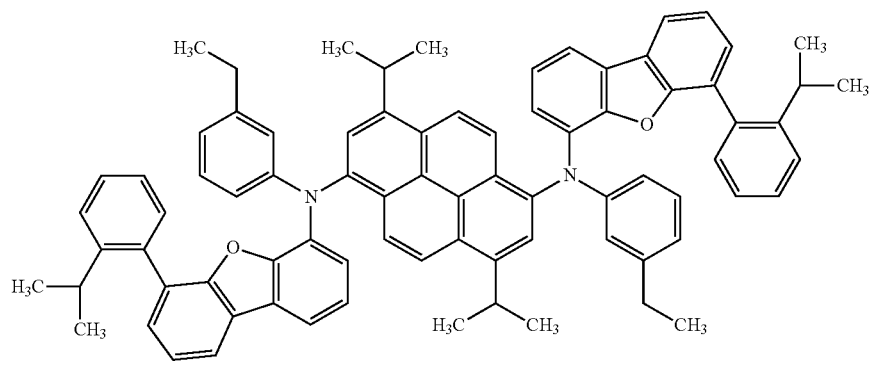

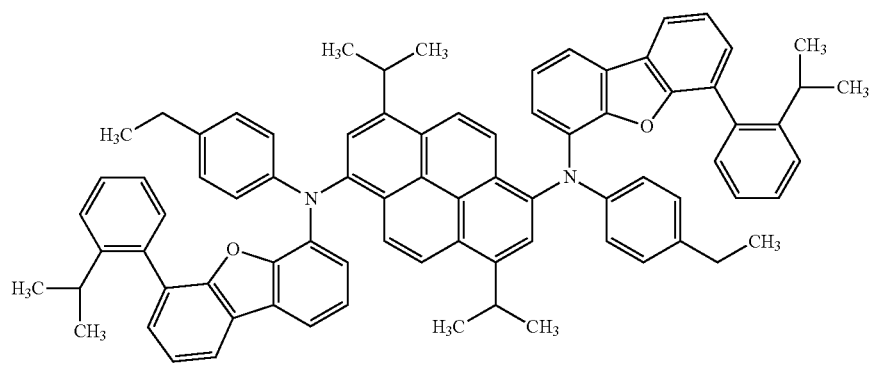
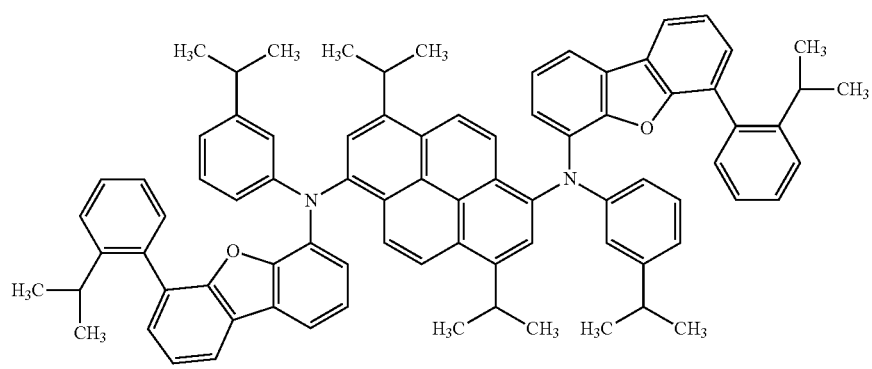
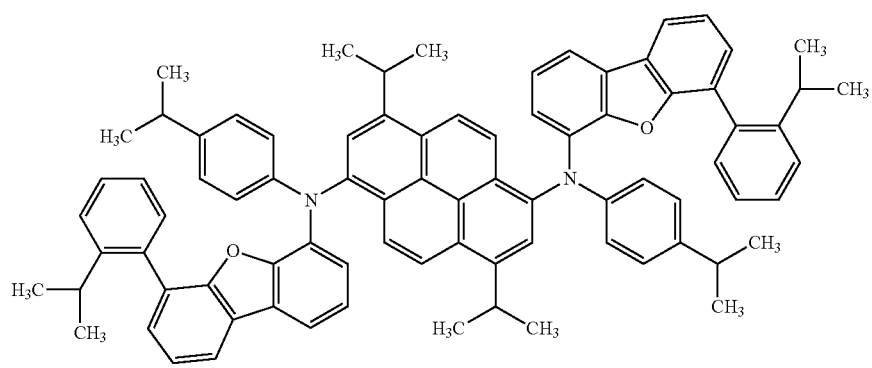
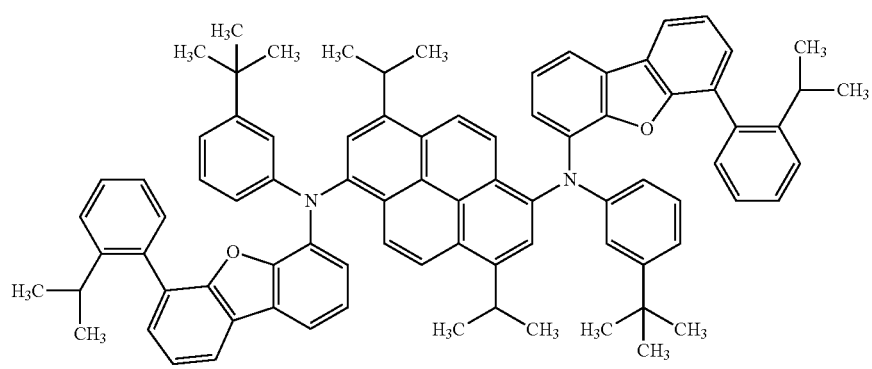

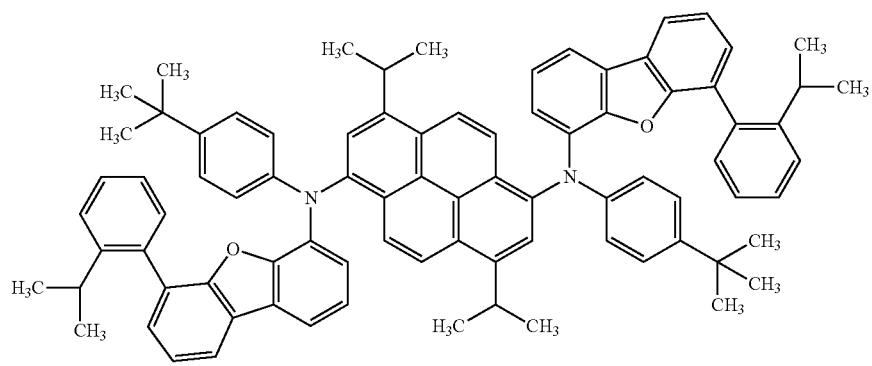
[Formula 32]
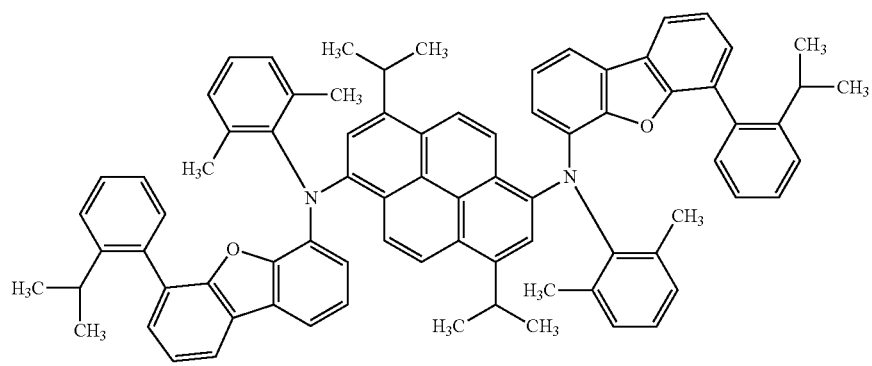
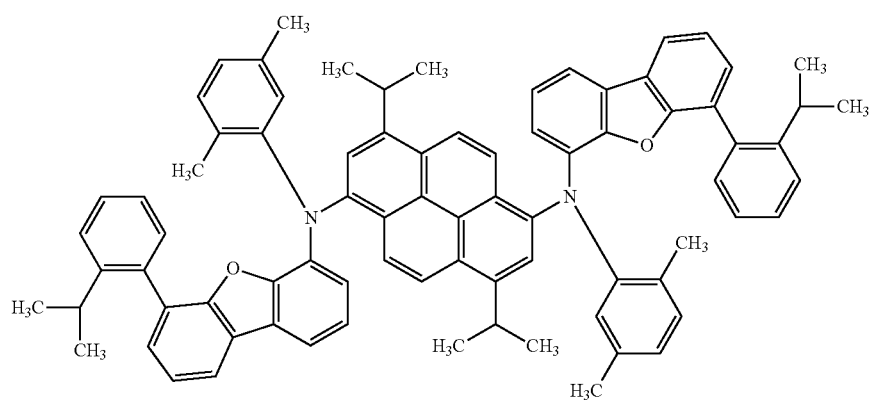
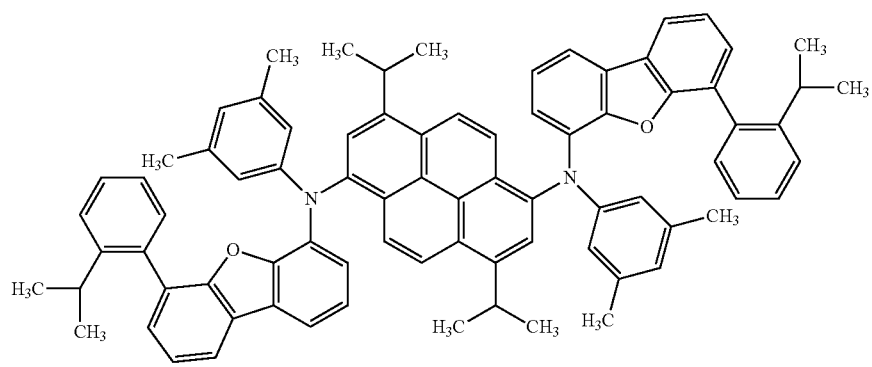

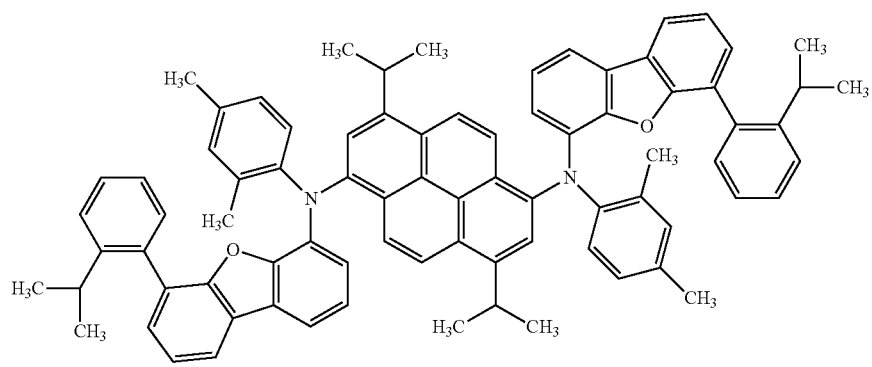
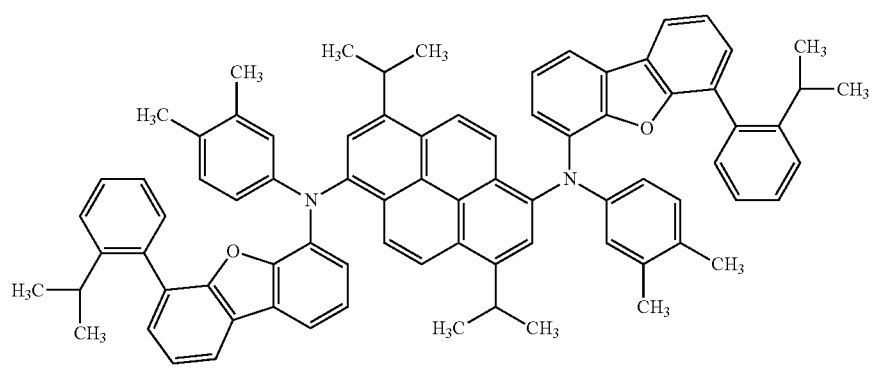
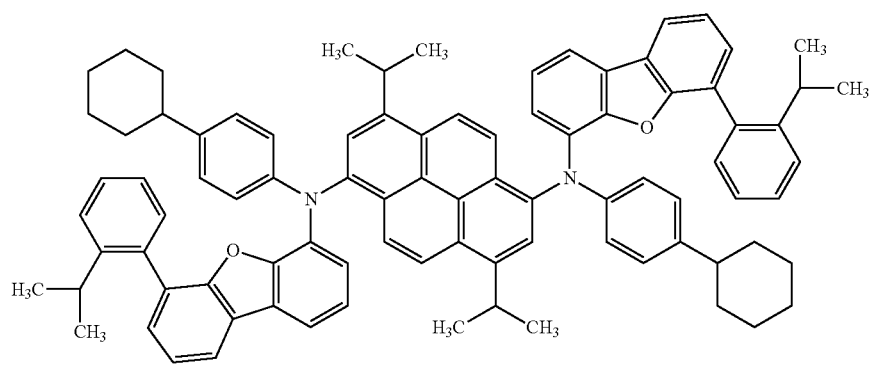
[Formula 33]
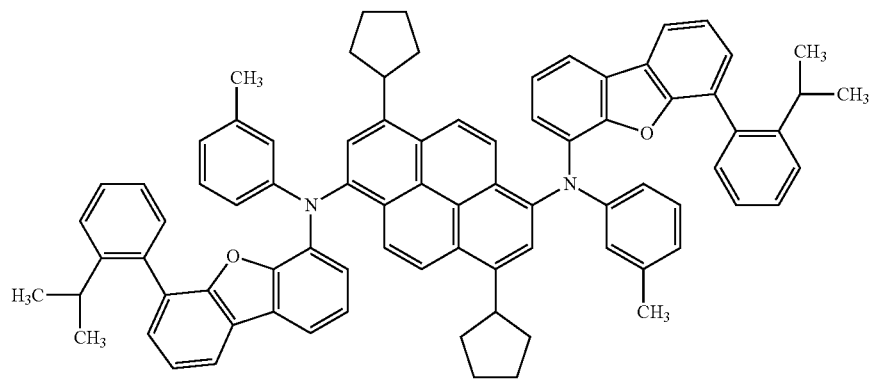

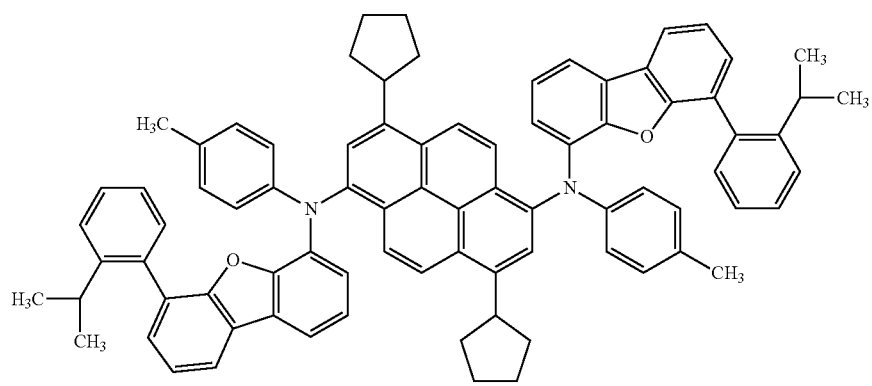
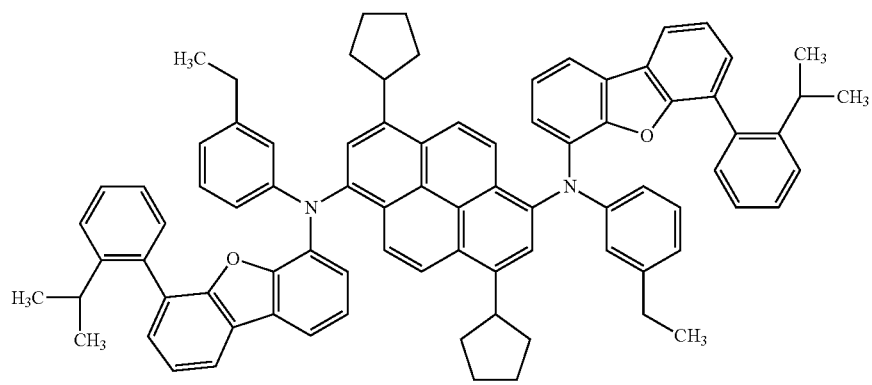
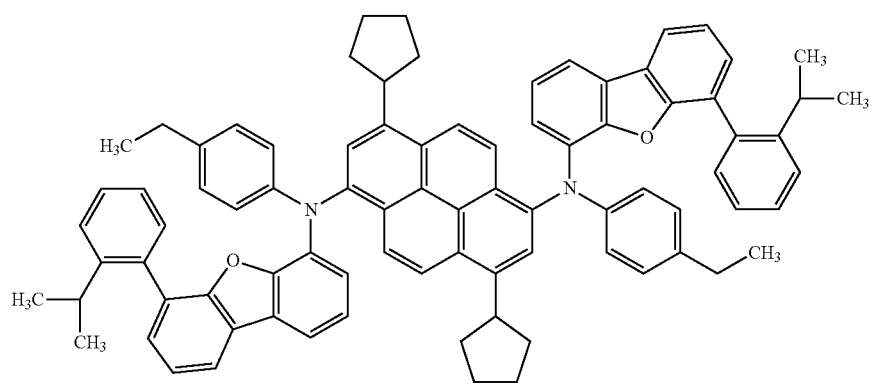
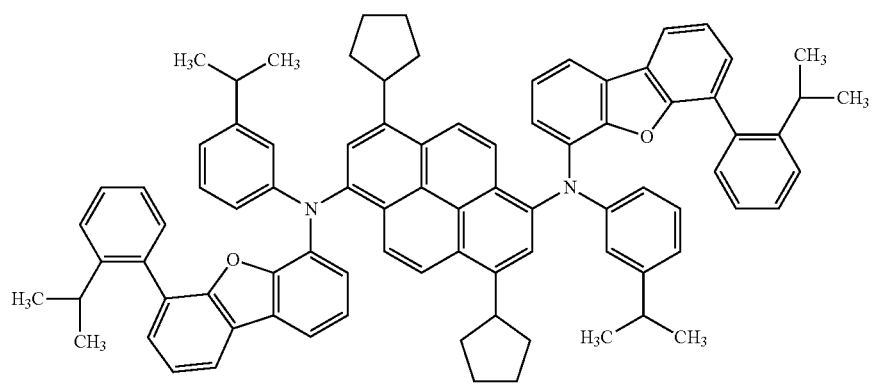

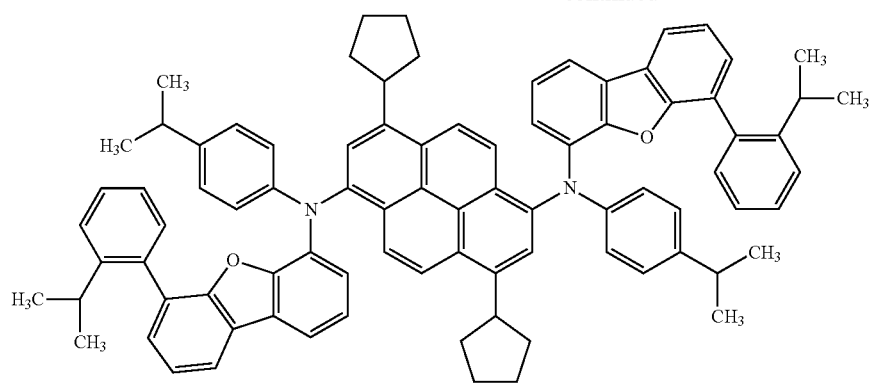
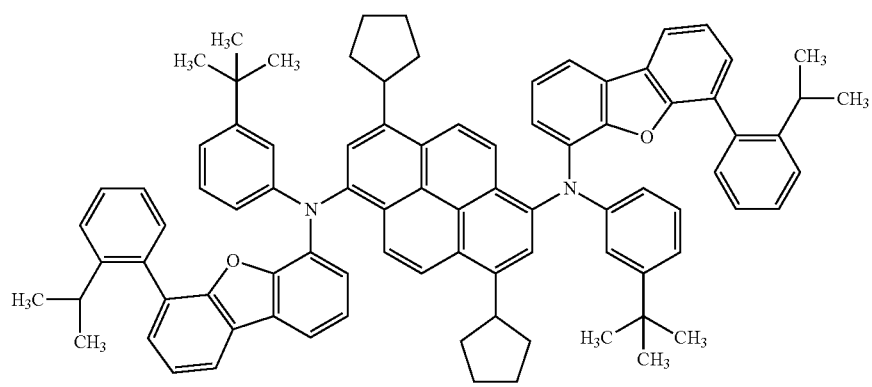
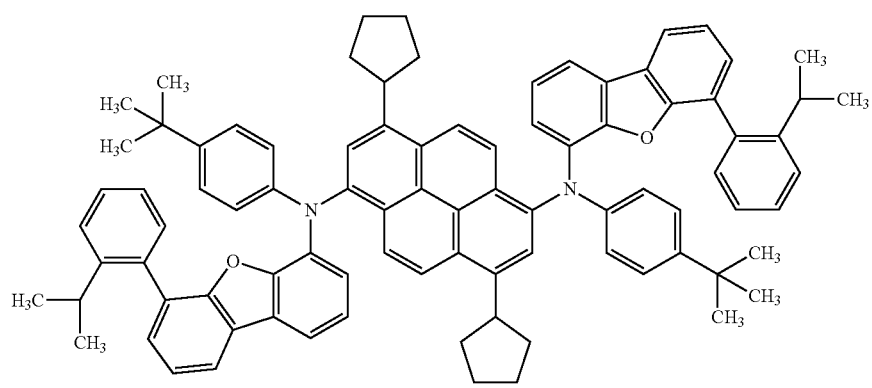
[Formula 34]
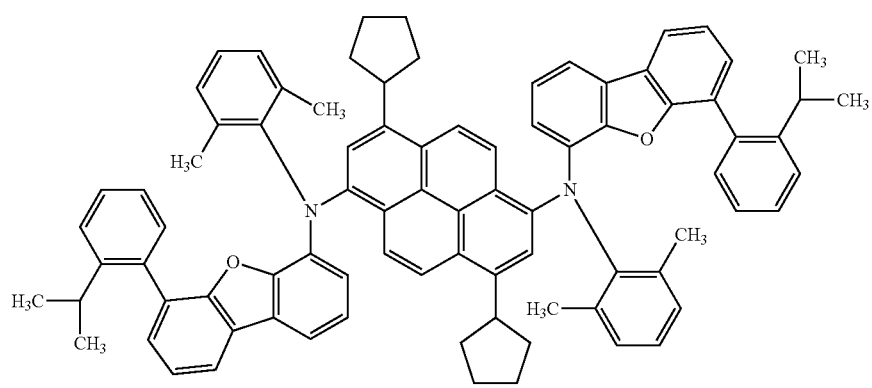

-continued
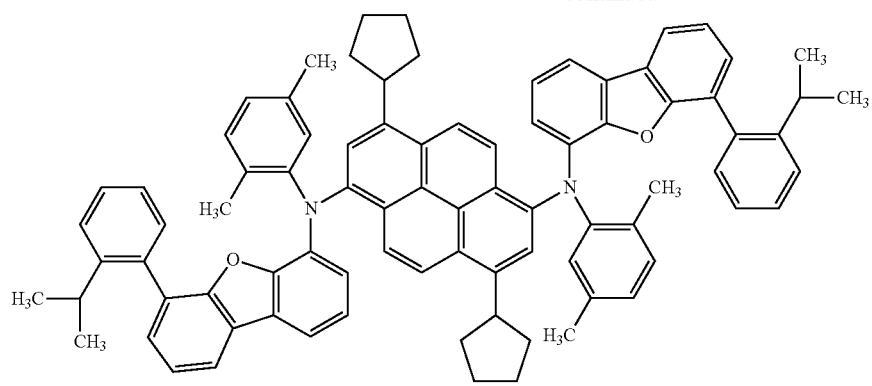
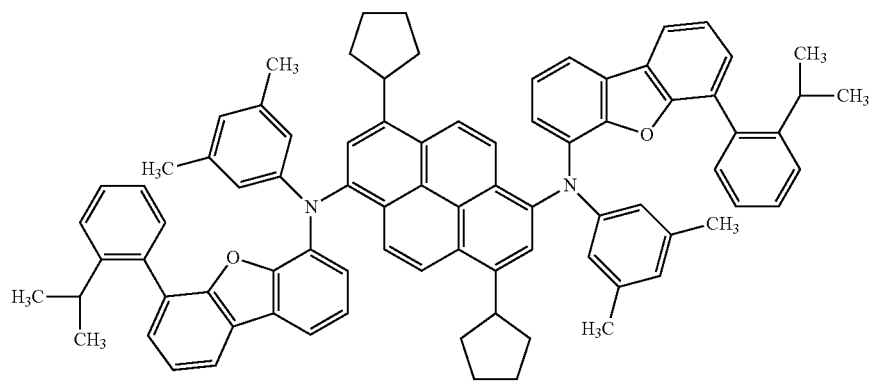
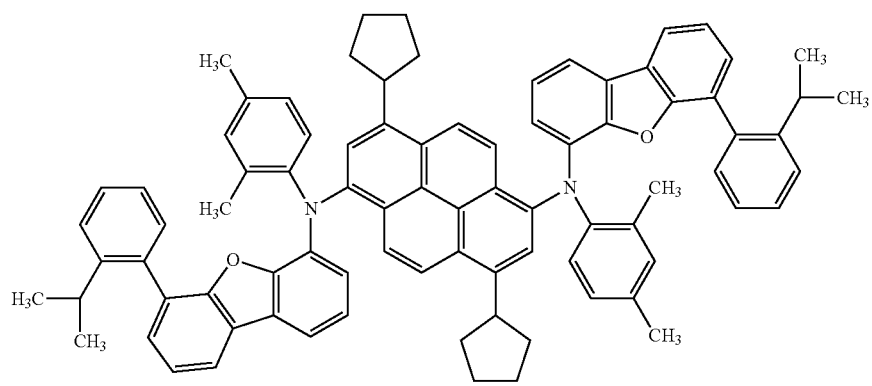
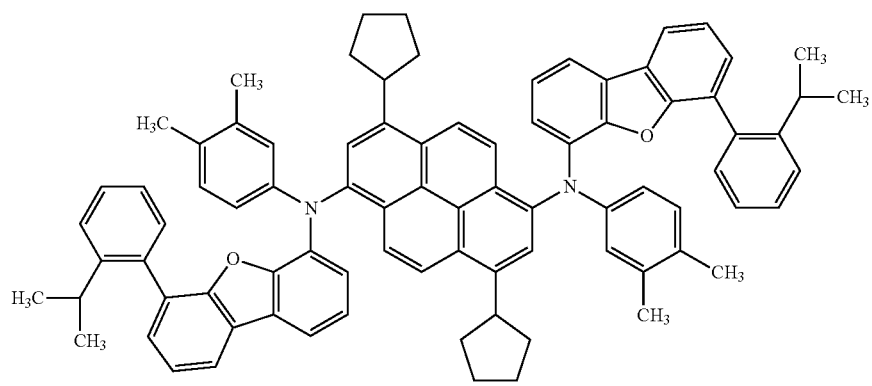

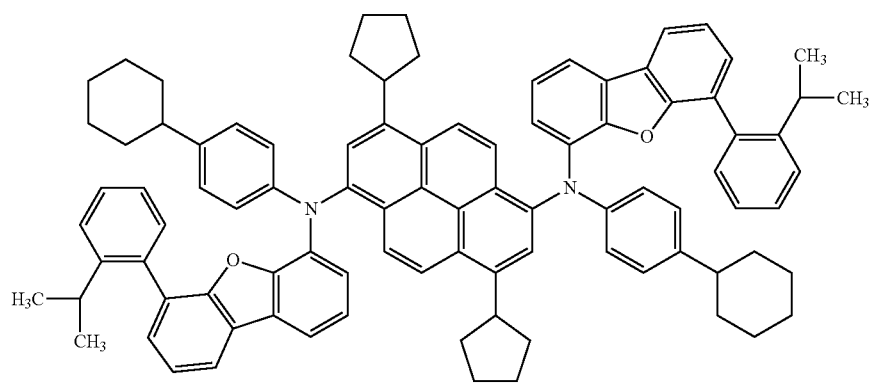
[Formula 35]
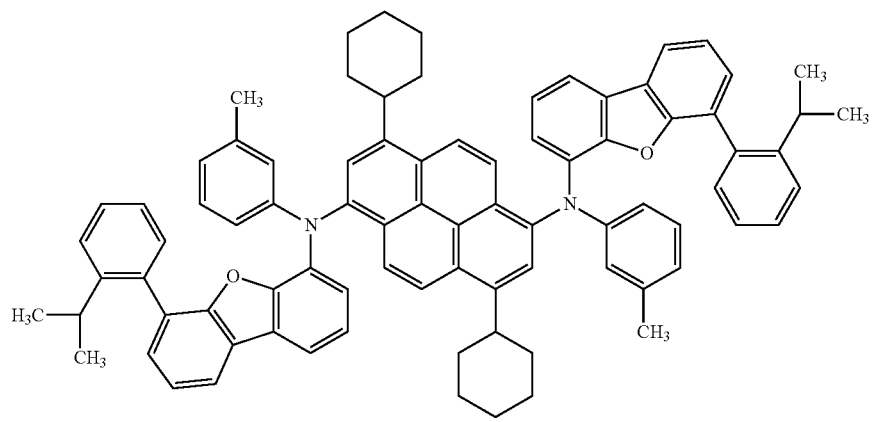
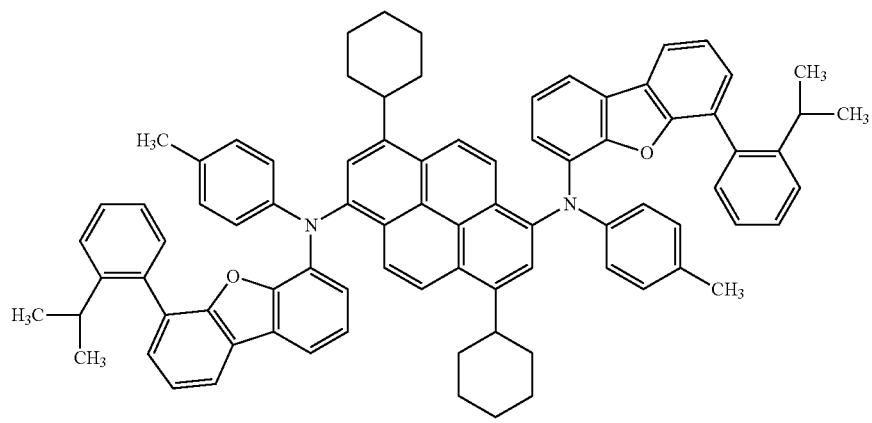
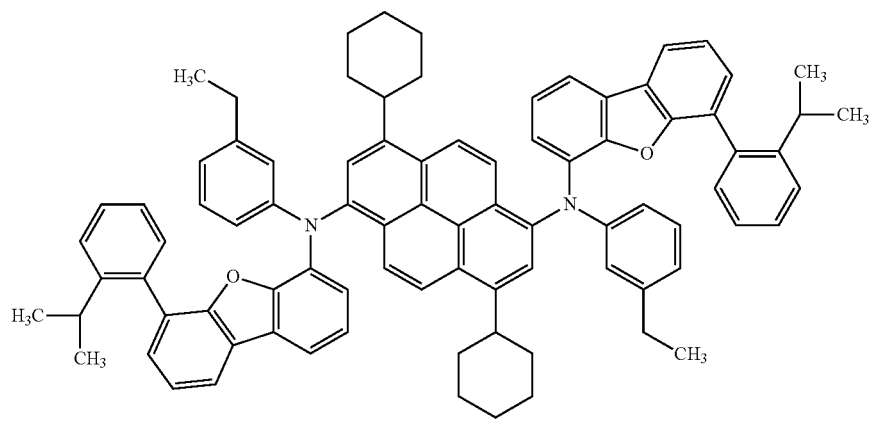

-continued
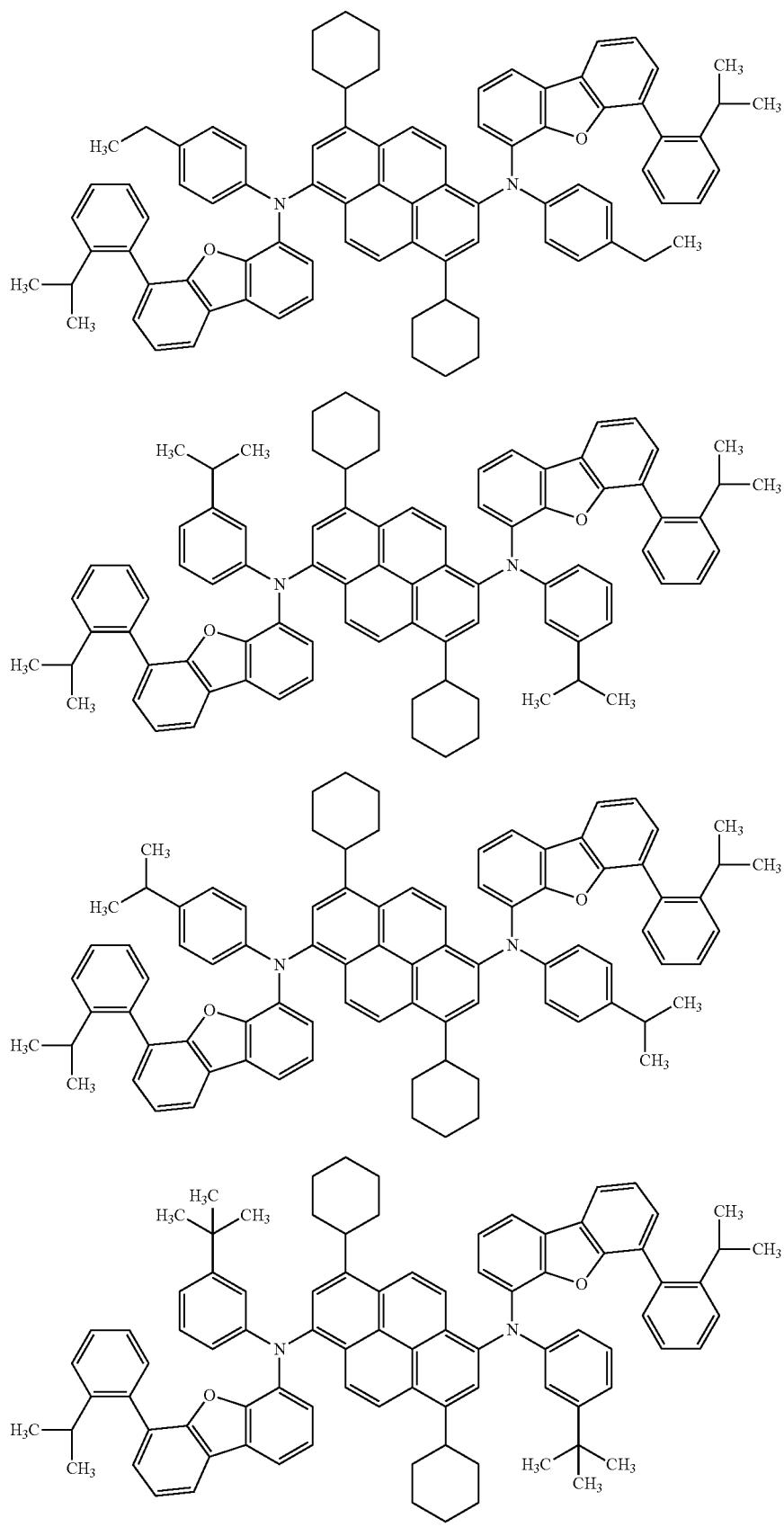

-continued
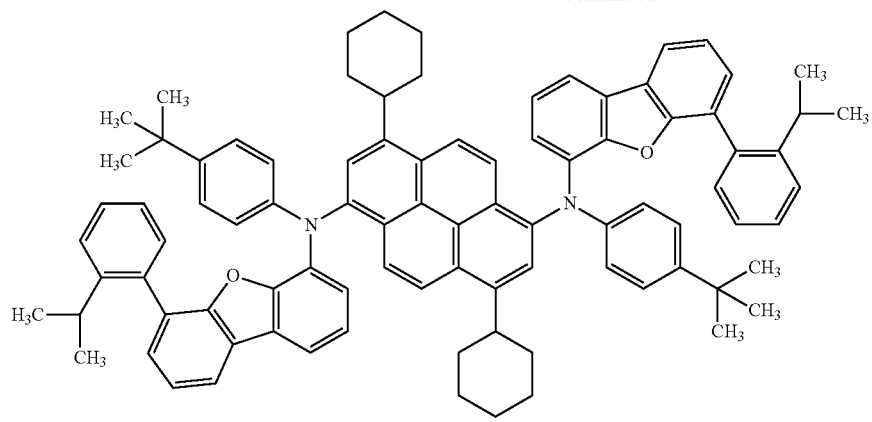
[Formula 36]
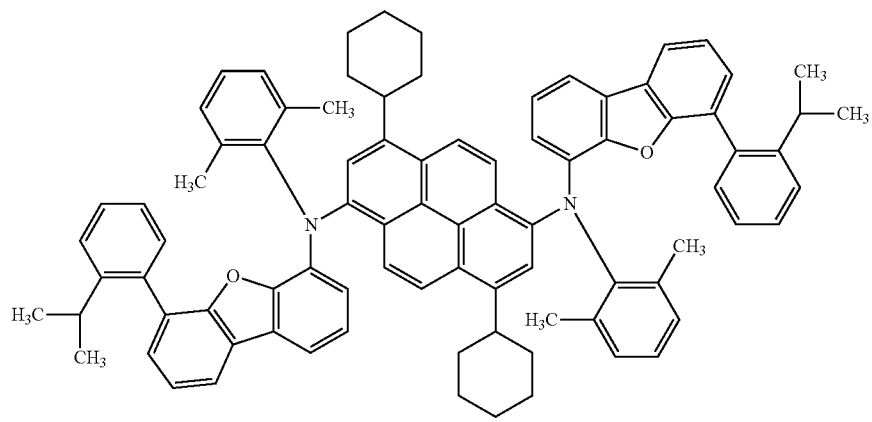
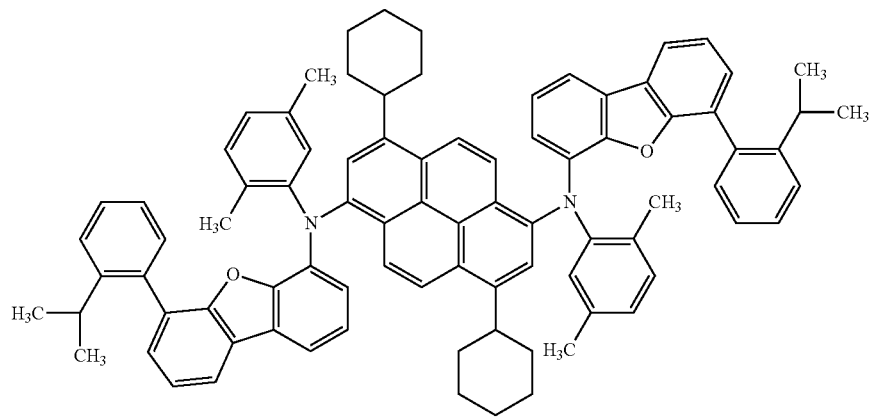
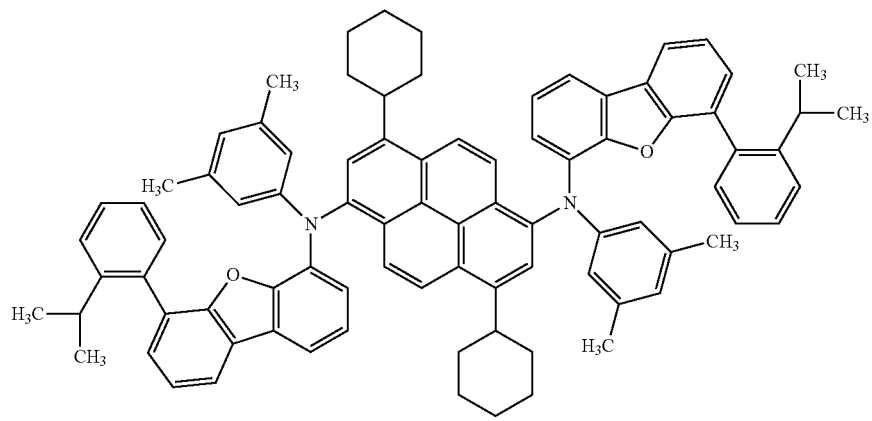

-continued
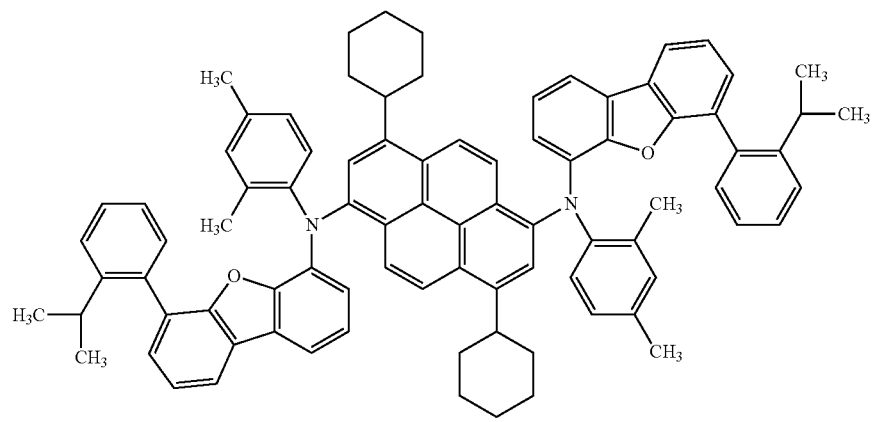
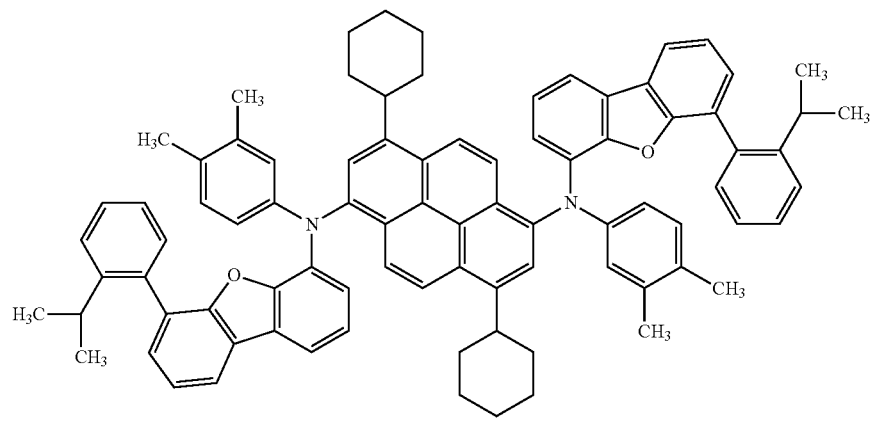
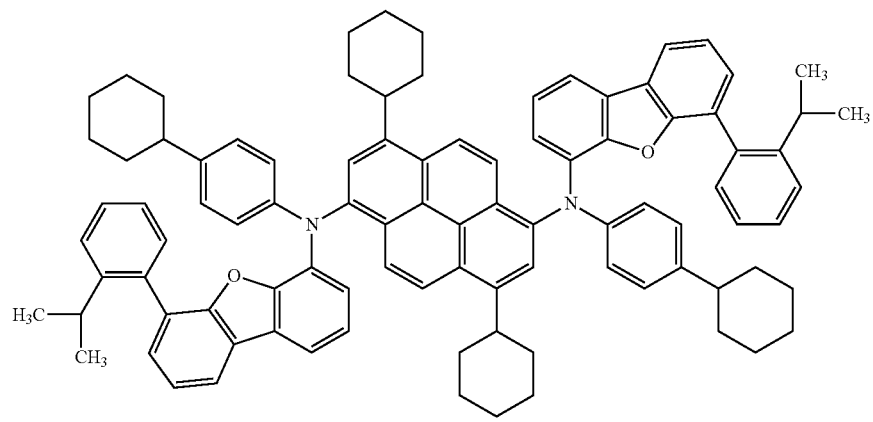
[Formula 37]
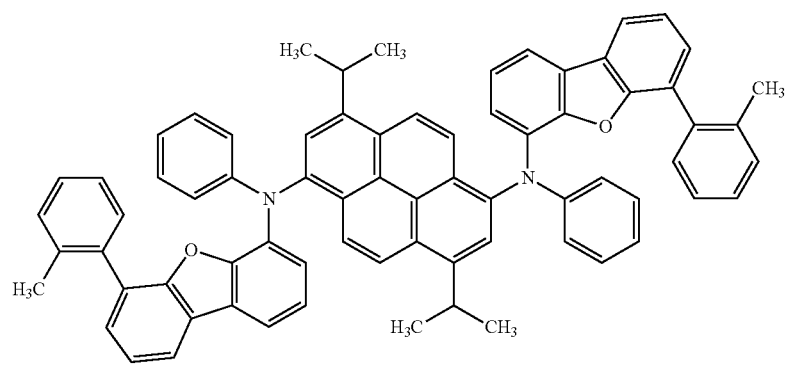

-continued
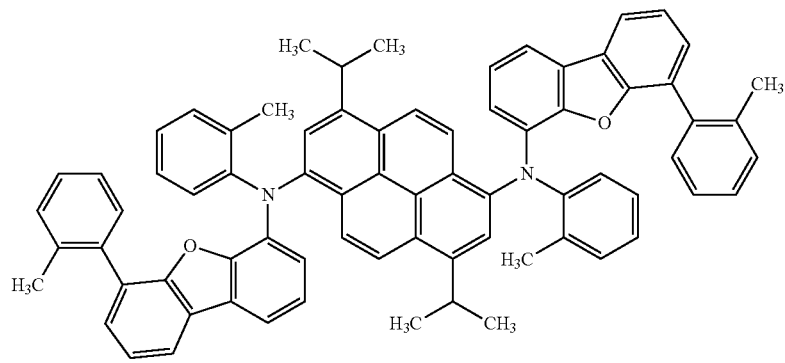
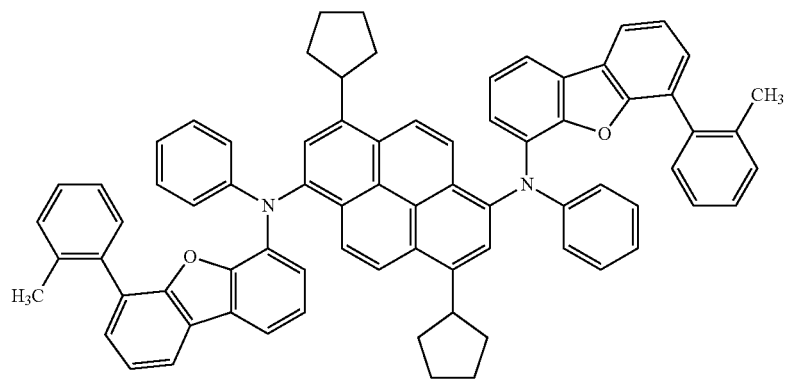
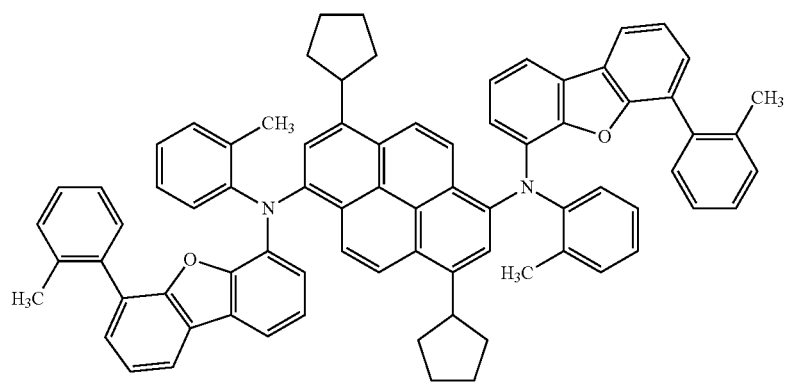
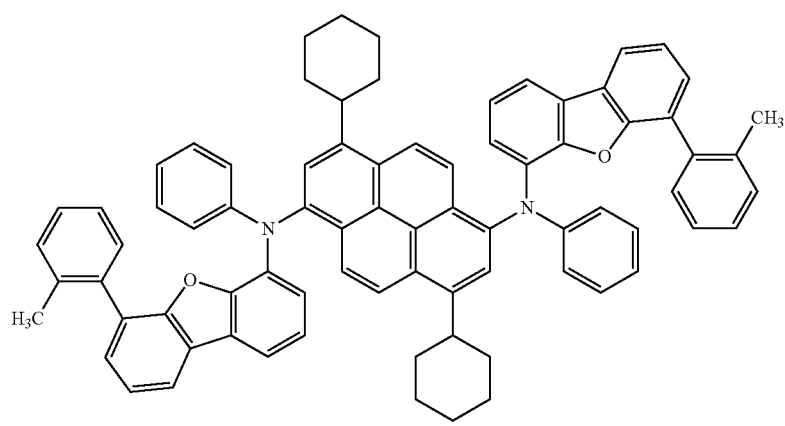

-continued

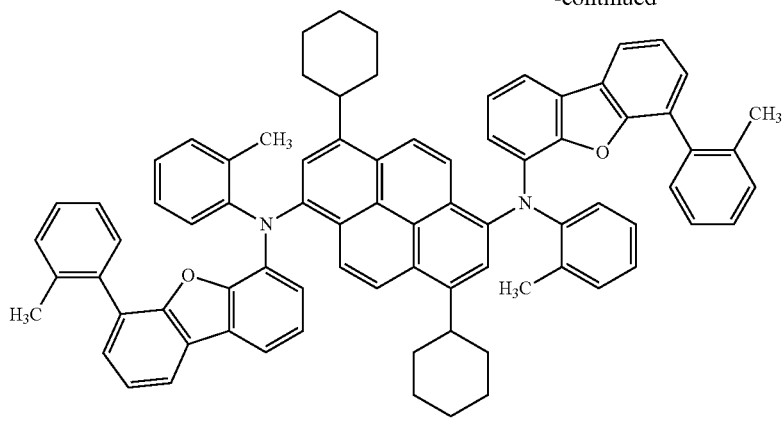

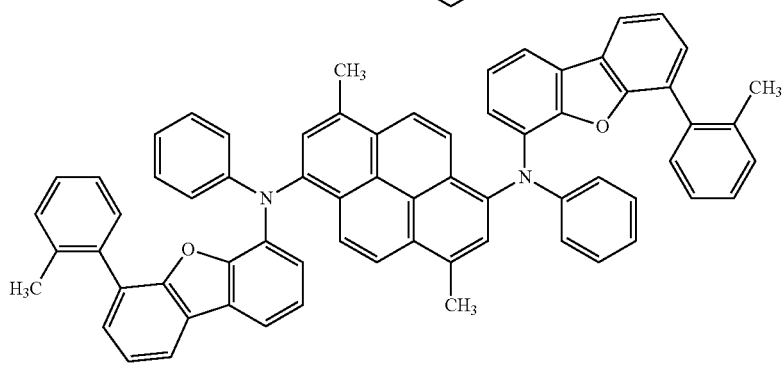

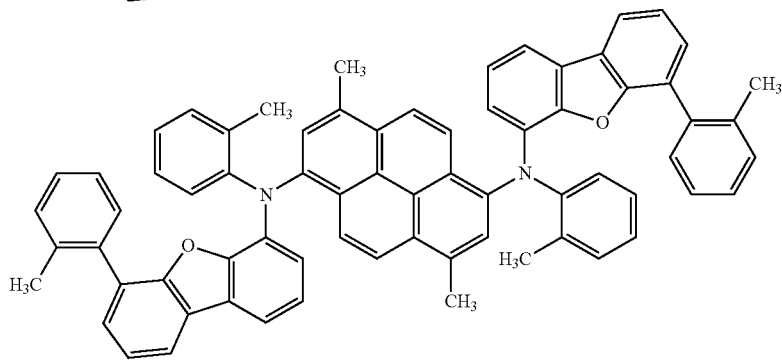

In the above specific examples of the aromatic amine derivative, $R_1$ and $R_6$ are exemplified by compounds having portions represented by the formula (2) that are mutually the same in structure but may be compounds having the portions represented by the formula (2) that are mutually different in structure.

Organic-EL-Device Material

The aromatic amine derivative according to the invention is usable as an organic-EL-device material. The organic-EL-device material may contain the aromatic amine derivative singularly or in combination with another compound. The organic-EL-device material containing the aromatic amine derivative according to the invention is usable as, for instance, a dopant material.

An example of the organic-EL-device material containing the aromatic amine derivative according to the invention in combination with another compound is an organic-EL-device material containing an anthracene derivative represented by the above formula (20).

Another example is an organic-EL-device material containing the aromatic amine derivative according to the invention in combination with a pyrene derivative represented by the following formula (30) in place of the anthracene derivative.

Still another example is an organic-EL-device material containing the aromatic amine derivative according to the invention in combination with the anthracene derivative represented by the formula (20) and the pyrene derivative represented by the formula (30).

Organic EL Device

According to the invention, an organic EL device includes a cathode, an anode, and an organic compound layer interposed between the cathode and the anode.

The aromatic amine derivative according to the invention may be contained in the organic compound layer. The organic compound layer is formed of the organic-EL-device material containing the aromatic amine derivative according to the invention.

The organic compound layer includes at least one organic thin-film layer formed of an organic compound. At least one layer forming the organic thin-film layer contains the aromatic amine derivative according to the invention singularly or as a component of a mixture. Incidentally, the organic thin-film layer may contain an inorganic compound.

At least one layer of the organic thin-film layer is an emitting layer. In other words, for instance, the organic compound layer may consist of a single emitting layer or may include another layer usable in a known organic EL device (e.g., a hole injecting layer, a hole transporting layer, an electron injecting layer, an electron transporting layer, a hole blocking layer and an electron blocking layer) as well as the emitting layer. When the organic thin-film layer consists of a plurality of layers, at least one of the layers contains the aromatic amine derivative according to the invention singularly or as a component of a mixture.

The aromatic amine derivative according to the invention is preferably contained in the emitting layer. In this case, the emitting layer may be formed of only the aromatic amine derivative or may contain the aromatic amine derivative as a host material or a dopant material.

Representative arrangement examples of the organic EL device are as follows:

(a) anode/emitting layer/cathode;
(b) anode/hole injecting•transporting layer/emitting layer/cathode;
(c) anode/emitting layer/electron injecting•transporting layer/cathode;
(d) anode/hole injecting•transporting layer/emitting layer/electron injecting•transporting layer/cathode; and
(e) anode/hole injecting•transporting layer/emitting layer/blocking, layer/electron injecting•transporting layer/cathode.

Among the non-exhaustive exemplary arrangements, the arrangement (e) is suitably used.

Incidentally, the "emitting layer", which is an organic layer having a luminescent function, contains a host material and a dopant material when the device employs a doping system. In this case, the host material has a function to promote recombination mainly of electrons and holes and to trap excitons generated by the recombination within the emitting layer, while the dopant material has a function to efficiently cause light emission of the excitons.

The term "hole injecting/transporting layer (or hole injecting•transporting layer)" means "at least one of hole injecting layer and hole transporting layer", while the term "electron injecting/transporting layer (or electron injecting•transporting layer)" means "at least one of electron injecting layer and electron transporting layer". When the hole injecting layer and the hole transporting layer are provided, the hole injecting layer is preferably disposed closer to the anode. When the electron injecting layer and the electron transporting layer are provided, the electron injecting layer is preferably disposed closer to the cathode. The hole injecting layer, the emitting layer and the electron injecting layer may each consist of two or more layers. In this case, regarding the hole injecting layer, a layer into which holes are injected from an electrode is referred to as the hole injecting layer, while a layer that receives the holes from the hole injecting layer and transports the holes to the emitting layer is referred to as the hole transporting layer. Similarly, regarding the electron injecting layer, a layer into which electrons are injected from an electrode is referred to as the electron injecting layer, while a layer that receives the electrons from the electron injecting layer and transports the electrons to the emitting layer is referred to as the electron transporting layer.

The "blocking layer" is adjacent to the emitting layer. The blocking layer has a function to prevent triplet excitons generated in the emitting layer from being dispersed into an electron transporting zone and to trap the triplet excitons within the emitting layer to increase the density of the triplet excitons, thereby efficiently causing the TTF (Triplet-Triplet Fusion) phenomenon (i.e., a phenomenon that singlet excitons generated are a result of collision and fusion of two triplet excitons).

The blocking layer also serves to efficiently inject the electrons to the emitting layer. When the electron injecting properties to the emitting layer are deteriorated, the density of the triplet excitons is decreased since the electron-hole recombination in the emitting layer is decreased. When the density of the triplet excitons is decreased, the frequency of collision of the triplet excitons is reduced, whereby the TTF phenomenon does not occur efficiently.

When the organic EL device includes the multilayered organic thin-film layer, a decrease in luminance and lifetime due to quenching can be avoided. A luminescent material, a doping material, a hole injecting material and an electron injecting material may be used in combination as needed. The doping material may help improve luminescence intensity and luminous efficiency.

These layers are selectively usable depending on properties of the materials such as energy level, heat resistance, and adhesiveness to an organic layer or a metallic electrode.

The FIGURE schematically shows an exemplary arrangement of an organic EL device according to an exemplary embodiment of the invention.

An organic EL device 1 includes a transparent substrate 2, an anode 3, a cathode 4 and an organic compound layer 10 provided between the anode 3 and the cathode 4.

The organic compound layer 10 includes a hole injecting layer 5, a hole transporting layer 6, an emitting layer 7, a blocking layer 8 and an electron injecting layer 9 that are arranged on the anode 3 in this sequence.

Emitting Layer

The emitting layer of the organic EL device has a function to provide conditions for recombination of the electrons and the holes to emit light.

In the organic EL device according to the exemplary embodiment, it is preferable that at least one layer forming the organic thin-film layer contains the aromatic amine derivative according to the invention and at least one of the anthracene derivative represented by the formula (20) and the pyrene derivative represented by the following formula (30). It is particularly preferable that the emitting layer contains the aromatic amine derivative according to the invention as a dopant material and the anthracene derivative represented by the formula (20) as a host material.

Anthracene Derivative

The anthracene derivative, which may be contained in the emitting layer as a host material, is represented by the formula (20).

In the formula (20), $Ar^{11}$ and $Ar^{12}$ are each independently a substituted or unsubstituted monocyclic group having 5 to 30 ring atoms, a substituted or unsubstituted fused ring group having 10 to 30 ring atoms, or a group formed by combining the monocyclic group and the fused ring group.

In the formula (20), the monocyclic group is a group that has only a ring structure without any fused structure.

The number of the ring atoms of the monocyclic group is 5 to 30, preferably 5 to 20. Examples of the monocyclic group are aromatic groups such as a phenyl group, biphenyl group, terphenyl group and quaterphenyl group and heterocyclic groups such as a pyridyl group, pyrazyl group, pyrimidyl group, triazinyl group, furyl group and thienyl group. Among the above, a phenyl group, a biphenyl group and a terphenyl group are preferable.

In the formula (20), the fused ring group is a group formed by fusing two or more ring structures.

The number of the ring atoms of the fused ring group is 10 to 30, preferably 10 to 20. Examples of the fused ring group are fused aromatic ring groups such as a naphthyl group, phenanthryl group, anthryl group, chrysenyl group, benzanthryl group, benzophenanthryl group, trihenylenyl group, benzochrysenyl group, indenyl group, fluorenyl group, 9,9-dimethylfluorenyl group, benzofluorenyl group, dibenzofluorenyl group, fluoranthenyl group and benzofluoranthenyl group, and fused heterocyclic groups such as a benzofuranyl group, benzothiophenyl group, indolyl group, dibenzofuranyl group, dibenzothiophenyl group, carbazolyl group, quinolyl group and phenanthrolinyl group. Among the above, a naphthyl group, a phenanthryl group, an anthryl group, a 9,9-dimethylfluorenyl group, a fluoranthenyl group, a benzanthryl group, a dibenzothiophenyl group, a dibenzofuranyl group and a carbazolyl group are preferable.

An example of the group formed by combining the monocyclic group and the fused ring group in the formula (20) is a group formed by combining a phenyl group, a naphthyl group and a phenyl group in this sequence next to an anthracene ring (see a compound EM50 and the like shown below).

Specific examples of the alkyl group, silyl group, alkoxy group, aryloxy group, aralkyl group and halogen atom for $R^{101}$ to $R^{108}$ in the formula (20) are the same as ones listed above for $R_2$, $R_3$, $R_4$, $R_5$, $R_7$, $R_8$, $R_9$ and $R_{10}$ in the formula (1) and the cycloalkyl group is likewise exemplified as above. Further, the above explanation of the expression "substituted or unsubstituted" is also applicable to these substituents.

Specific preferable examples of the structure of the formula (20) will be shown below.

Preferable examples of substituents (in the case of "substituted or unsubstituted") for $Ar^{11}$, $Ar^{12}$ and $R^{101}$ to $R^{108}$ in the formula (20) are a monocyclic group, fused ring group, alkyl group, cycloalkyl group, silyl group, alkoxy group, cyano group and halogen atom (in particular, fluorine). Among the above, a monocyclic group and a fused ring group are particularly preferable and specific preferable examples of the substituent are the same as those of each group listed above for the formula (20) and the formula (1).

The anthracene derivative of the formula (20) is preferably selected from among the following anthracene derivatives (A), (B) and (C) depending on an arrangement and a desired property of an organic EL device in which the anthracene derivative is to be used.

Anthracene Derivative (A)

In the anthracene derivative (A), $Ar^{11}$ and $Ar^{12}$ in the formula (20) are substituted or unsubstituted fused ring groups having 10 to 30 ring atoms. In the anthracene derivative (A), the substituted or unsubstituted fused ring groups for $Ar^{11}$ and $Ar^{12}$ may be mutually the same or different. When $Ar^{11}$ and $Ar^{12}$ are different from each other, the substitution sites may be different.

The anthracene derivative (A) is particularly preferably an anthracene derivative in which $Ar^{11}$ and $Ar^{12}$ in the formula (20) are different substituted or unsubstituted fused ring groups from each other.

When the anthracene derivative of the formula (20) is the anthracene derivative (A), specific preferable examples of the fused ring group for $Ar^{11}$ and $Ar^{12}$ in the formula (20) are the same as ones listed above. Among the examples, a naphthyl group, phenanthryl group, benzanthryl group, fluorenyl group, 9,9-dimethylfluorenyl group and dibenzofuranyl group are preferable.

In the anthracene derivative (A), it is preferable that, for instance, $Ar^{12}$ is selected from among a naphthyl group, a phenanthryl group, a benzanthryl group and a dibenzofuranyl group while $Ar^{11}$ is a substituted or unsubstituted fluorenyl group.

Anthracene Derivative (B)

In the anthracene derivative (B), while one of $Ar^{11}$ and $Ar^{12}$ in the formula (20) is a substituted or unsubstituted monocyclic group having 5 to 30 ring atoms, the other of $Ar^{11}$ and $Ar^{12}$ is a substituted or unsubstituted fused ring group having 10 to 30 ring atoms.

In the anthracene derivative (B), it is preferable that, for instance, $Ar^{12}$ is selected from among a naphthyl group, a phenanthryl group, a benzanthryl group, a fluorenyl group, a 9,9-dimethylfluorenyl group and a dibenzofuranyl group while $Ar^{11}$ is an unsubstituted phenyl group or a phenyl group substituted with at least one of the monocyclic group and the fused ring group.

When the anthracene derivative of the formula (20) is the anthracene derivative (B), specific preferable examples of the monocyclic group and the fused ring group are the same as ones listed above.

In the anthracene derivative (B), it is also preferable that, for instance, $Ar^{12}$ is a substituted or unsubstituted fused ring group having 10 to 30 ring atoms while $Ar^{11}$ is an unsubstituted phenyl group. In this case, the fused ring group is particularly preferably a phenanthryl group, a 9,9-dimethylfluorenyl group, a dibenzofuranyl group or a benzanthryl group.

Anthracene Derivative (C)

In the anthracene derivative (C), $Ar^{11}$ and $Ar^{12}$ in the formula (20) are each independently a substituted or unsubstituted monocyclic group having 5 to 30 ring atoms.

In the anthracene derivative (C), it is preferable that, for instance, $Ar^{11}$ and $Ar^{12}$ are each independently a substituted or unsubstituted phenyl group.

In the anthracene derivative (C), it is further preferable that, for instance, $Ar^{11}$ is an unsubstituted phenyl group while $Ar^{12}$ is a phenyl group having at least one of the monocyclic group and the fused ring group as a substituent, or, alternatively, $Ar^{11}$ and $Ar^{12}$ are each independently a phenyl group having at least one of the monocyclic group and the fused ring group as a substituent.

Specific preferable examples of the monocyclic group and the fused ring group (i.e., substituents) in $Ar^{11}$ and $Ar^{12}$ in the formula (20) are the same as ones listed above. The monocyclic group (i.e., substituent) is further preferably a phenyl group or a biphenyl group and the fused ring group (i.e., substituent) is further preferably a naphthyl group, a phenanthryl group, a 9,9-dimethylfluorenyl group, dibenzofuranyl group or a benzanthryl group.

Specific examples of the structure of the anthracene derivative represented by the formula (20) are shown below. Incidentally, these examples of the structure of the anthracene derivative are not exhaustive.

[Formula 38]

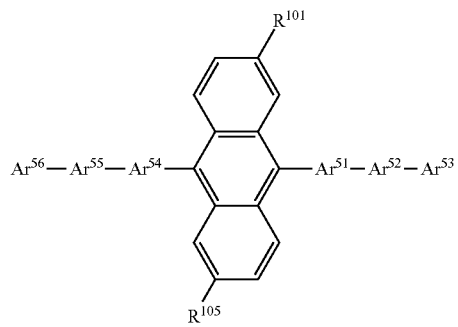

(20A)

In the formula (20A), $R^{101}$ and $R^{105}$ are each independently a hydrogen atom, a halogen atom, a cyano group, a substituted or unsubstituted monocyclic group having 5 to 30 ring atoms, a substituted or unsubstituted fused ring group having 10 to 30 ring atoms, a group formed by combining the monocyclic group and the fused ring group, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

In the formula (20A), $Ar^{51}$ and $Ar^{54}$ are each independently a substituted or unsubstituted monocyclic divalent residue having 5 to 30 ring atoms or a substituted or unsubstituted fused-cyclic divalent residue having 10 to 30 ring atoms.

In the formula (20A), $Ar^{52}$ and $Ar^{55}$ are each independently a single bond, a substituted or unsubstituted monocyclic divalent residue having 5 to 30 ring atoms or a substituted or unsubstituted fused-cyclic divalent residue having 10 to 30 ring atoms.

In the formula (20A), $Ar^{53}$ and $Ar^{56}$ are each independently a hydrogen atom, a substituted or unsubstituted monocyclic group having 5 to 30 ring atoms or a substituted or unsubstituted fused ring group having 10 to 30 ring atoms.

[Formula 39]

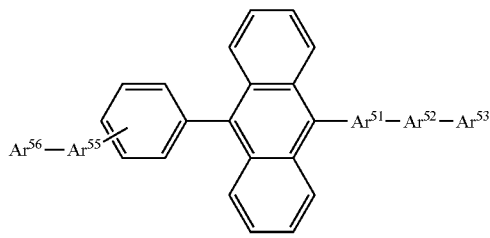

(20B)

In the formula (20B), $Ar^{51}$ is a substituted or unsubstituted monocyclic divalent residue having 5 to 30 ring atoms or a substituted or unsubstituted fused-cyclic divalent residue having 10 to 30 ring atoms.

In the formula (20B), $Ar^{52}$ and $Ar^{55}$ are each independently a single bond, a substituted or unsubstituted monocyclic divalent residue having 5 to 30 ring atoms or a substituted or unsubstituted fused-cyclic divalent residue having 10 to 30 ring atoms.

In the formula (20B), $Ar^{53}$ and $Ar^{56}$ are each independently a hydrogen atom, a substituted or unsubstituted monocyclic group having 5 to 30 ring atoms or a substituted or unsubstituted fused group having 10 to 30 ring atoms.

[Formula 40]

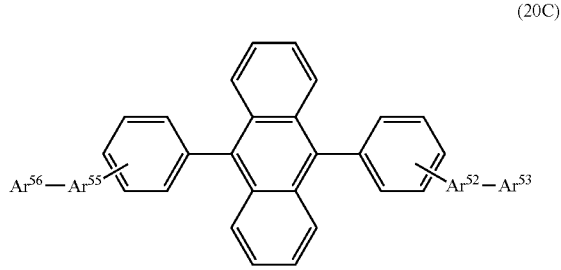

(20C)

In the formula (20C), $Ar^{52}$ is a substituted or unsubstituted monocyclic divalent residue having 5 to 30 ring atoms or a substituted or unsubstituted fused-cyclic divalent residue having 10 to 30 ring atoms.

In the formula (20C), $Ar^{55}$ is a single bond, a substituted or unsubstituted monocyclic divalent residue having 5 to 30 ring atoms or a substituted or unsubstituted fused-cyclic divalent residue having 10 to 30 ring atoms.

In the formula (20C), $Ar^{53}$ and $Ar^{56}$ are each independently a hydrogen atom, a substituted or unsubstituted monocyclic group having 5 to 30 ring atoms or a substituted or unsubstituted fused ring group having 10 to 30 ring atoms.

[Formula 41]

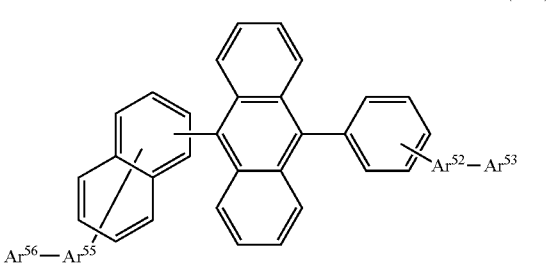

(20D)

In the formula (20D), $Ar^{52}$ is a substituted or unsubstituted monocyclic divalent residue having 5 to 30 ring atoms or a substituted or unsubstituted fused-cyclic divalent residue having 10 to 30 ring atoms.

In the formula (20D), $Ar^{55}$ is a single bond, a substituted or unsubstituted monocyclic divalent residue having 5 to 30 ring atoms or a substituted or unsubstituted fused-cyclic divalent residue having 10 to 30 ring atoms.

In the formula (20D), $Ar^{53}$ and $Ar^{56}$ are each independently a hydrogen atom, a substituted or unsubstituted monocyclic group having 5 to 30 ring atoms or a substituted or unsubstituted fused ring group having 10 to 30 ring atoms.

[Formula 42]

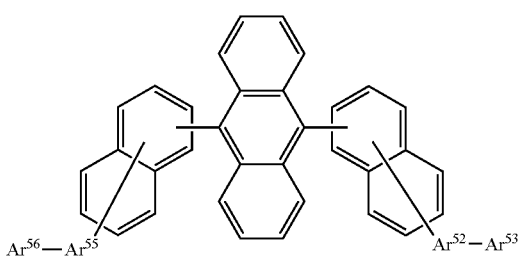

In the formula (20E) $Ar^{52}$ and $Ar^{55}$ are each independently a single bond, a substituted or unsubstituted monocyclic divalent residue having 5 to 30 ring atoms or a substituted or unsubstituted fused-cyclic divalent residue having 10 to 30 ring atoms.

In the formula (20E), $Ar^{53}$ and $Ar^{56}$ are each independently a hydrogen atom, a substituted or unsubstituted monocyclic group having 5 to 30 ring atoms or a substituted or unsubstituted fused ring group having 10 to 30 ring atoms.

Among the above examples of the anthracene derivative, such an example that $Ar^{12}$ in the formula (20) is selected from among a naphthyl group, a phenanthryl group, a benzanthryl group and a dibenzofuranyl group while $Ar^{11}$ is a substituted or unsubstituted phenyl group or a substituted or unsubstituted fluorenyl group is preferable.

Further specific examples of the anthracene derivative are shown below. It should be noted that these exemplary structures of the anthracene derivative are not intended to limit the scope of the invention.

Incidentally, in compounds EM36, EM44, EM77, EM85, EM86 and the like of the following specific structures of the anthracene derivative, a line extending from the 9-position of a fluorene ring stands for a methyl group, which means that this fluorene ring is a 9,9-dimethylfluorene ring.

In compounds EM151, EM154, EM157, EM161, EM163, EM166, EM169, EM173 and the like of the following specific structures of the anthracene derivative, a cross-shaped line extending outwardly from a ring structure stands for a tertiary butyl group.

In compounds EM152, EM155, EM158, EM164, EM167, EM170, EM171, EM180, EM181, EM182, EM183, EM184, EM185 and the like of the following specific examples of the anthracene derivative, a line extending from a silicon atom (Si) stands for a methyl group, which means that a substituent having this silicon atom is a trimethylsilyl group.

[Formula 43]

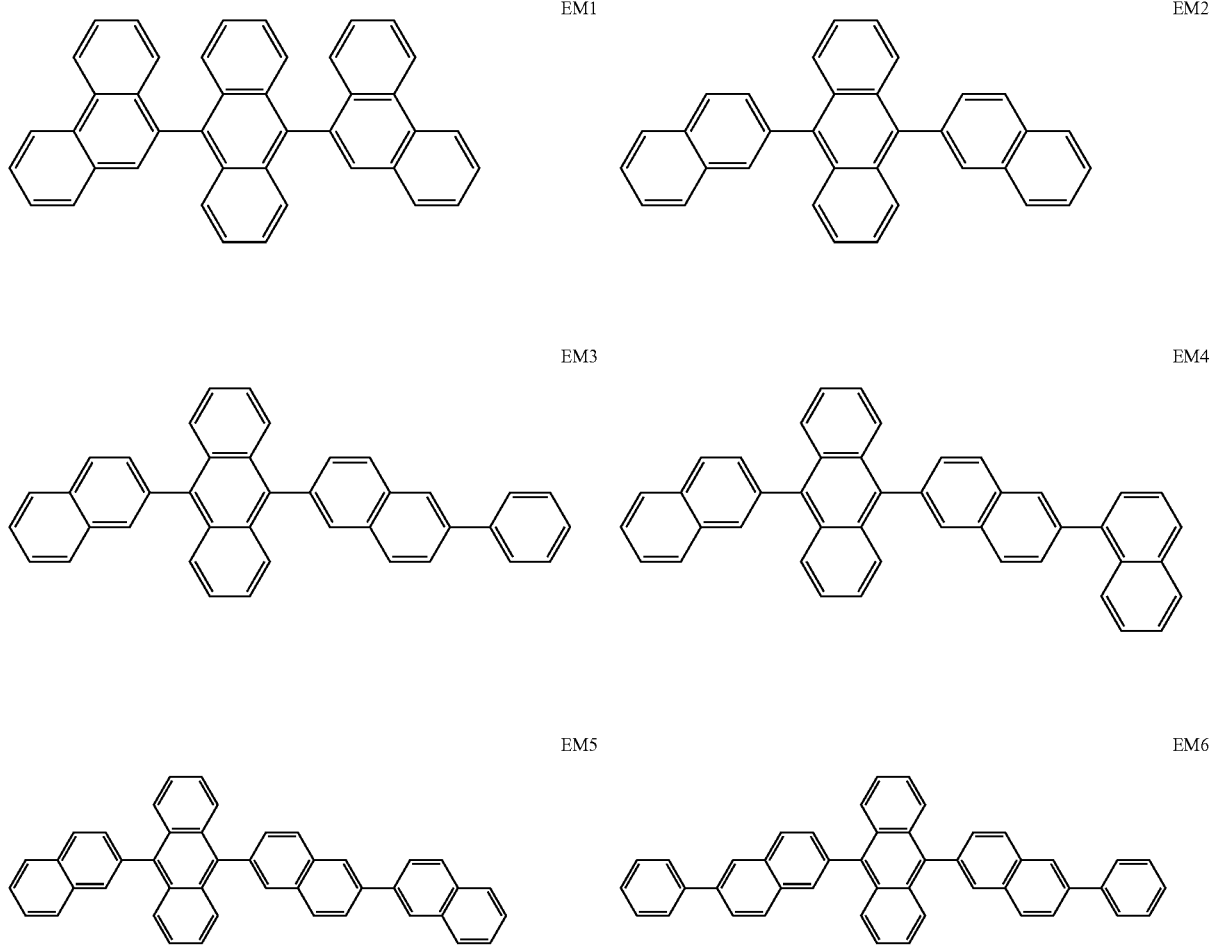

-continued
EM7
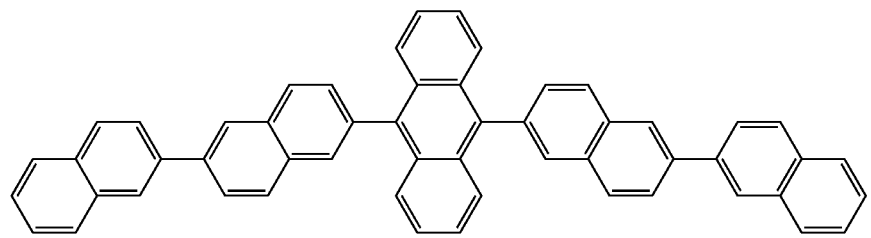
EM8
EM9
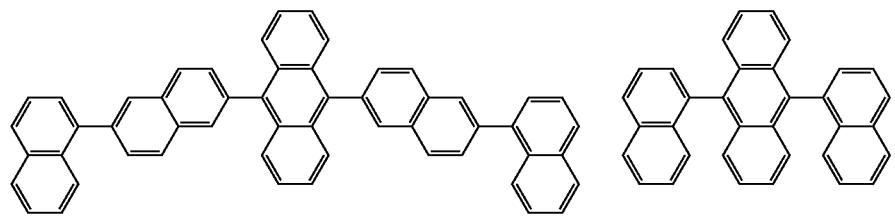
EM10
EM11
EM12
EM13
[Formula 44]
EM14
EM15
EM16

-continued
EM17
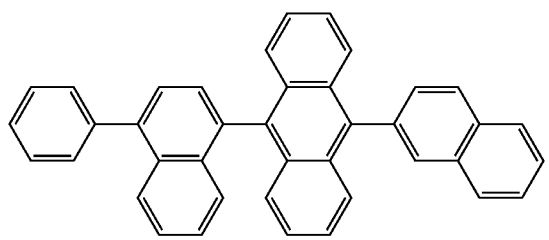
EM18
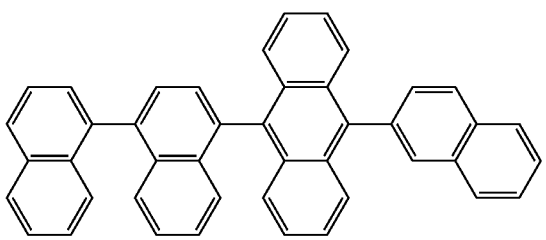
EM19
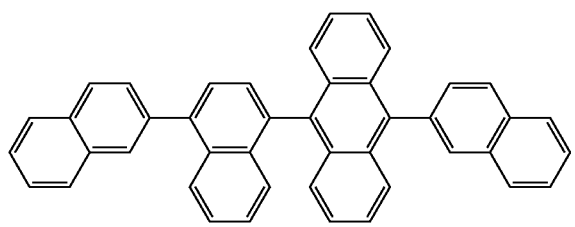
EM20
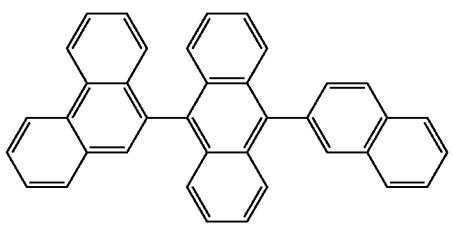
EM21
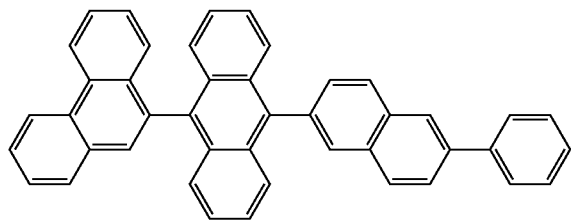
EM22
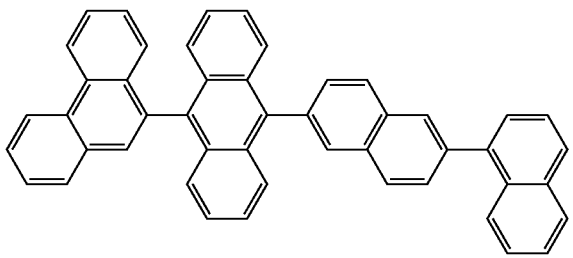
EM23
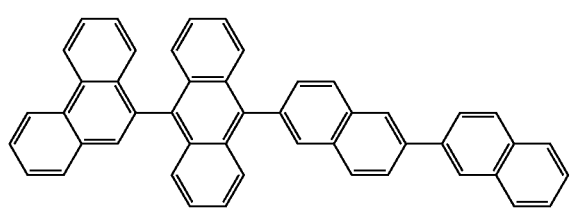
EM24
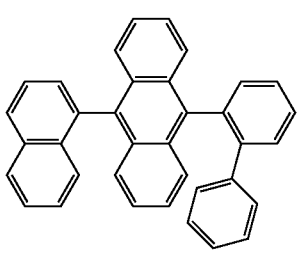
EM25
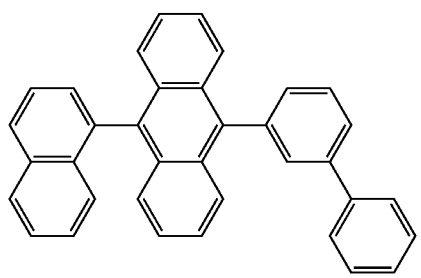
EM26
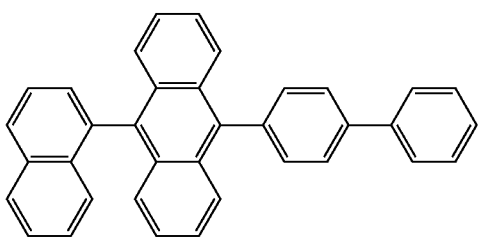
EM27
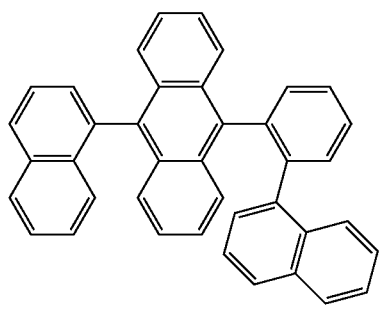
EM28
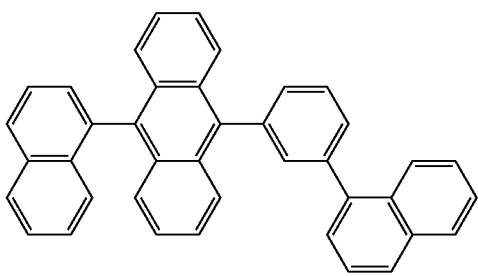

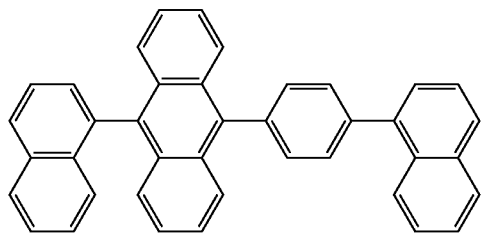
EM29
[Formula 45]
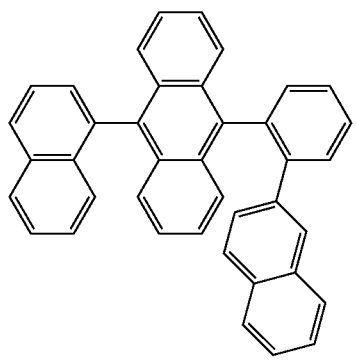
EM30
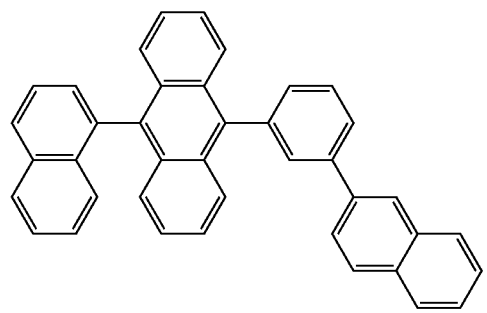
EM31
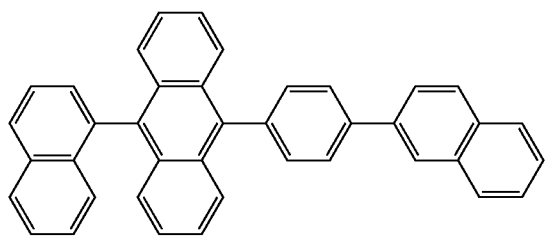
EM32
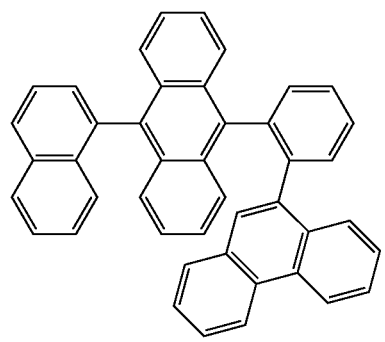
EM33
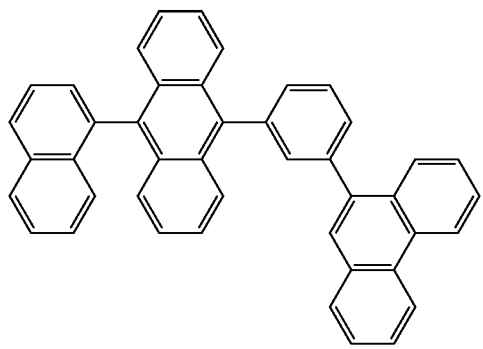
EM34
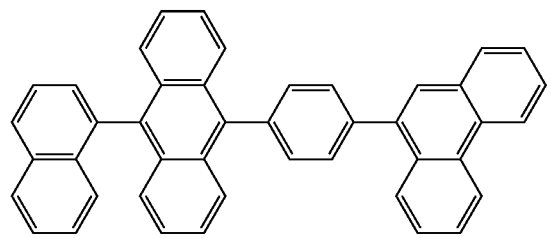
EM35
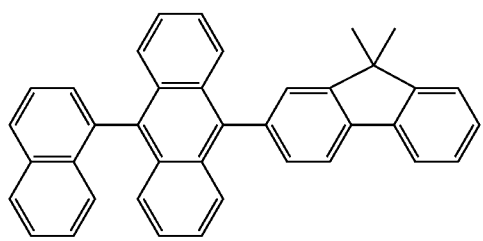
EM36
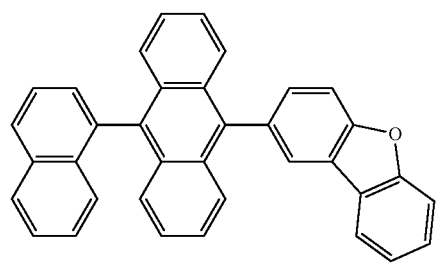
EM37

-continued
EM38
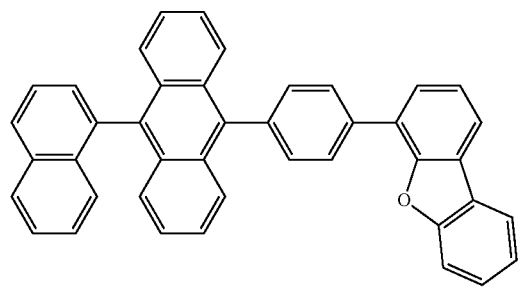
EM39
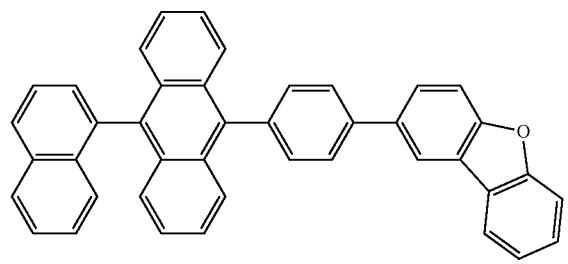
EM40
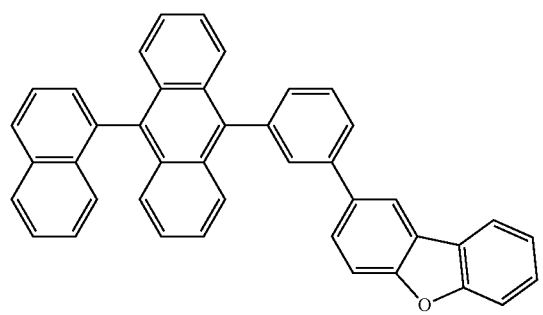
EM41
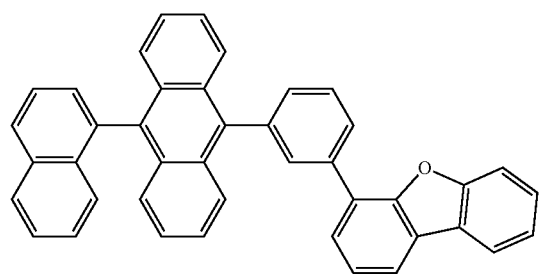
EM42
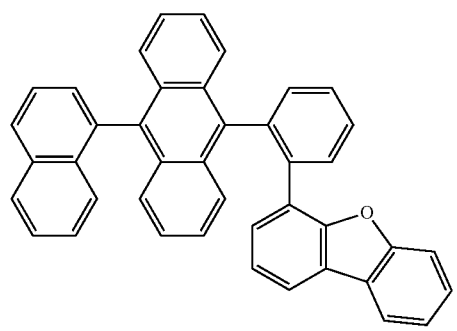
EM43
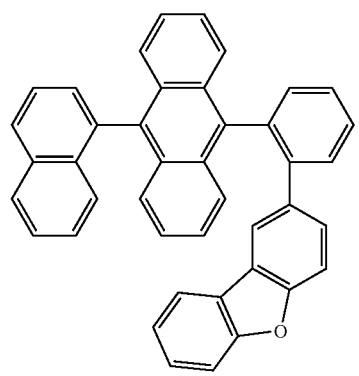
EM44
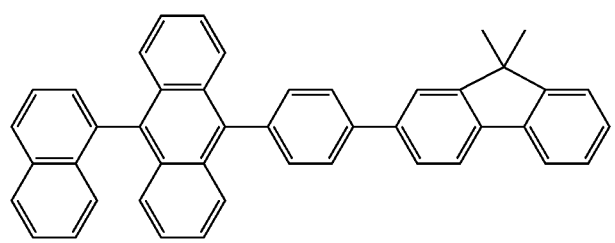

[Formula 46]
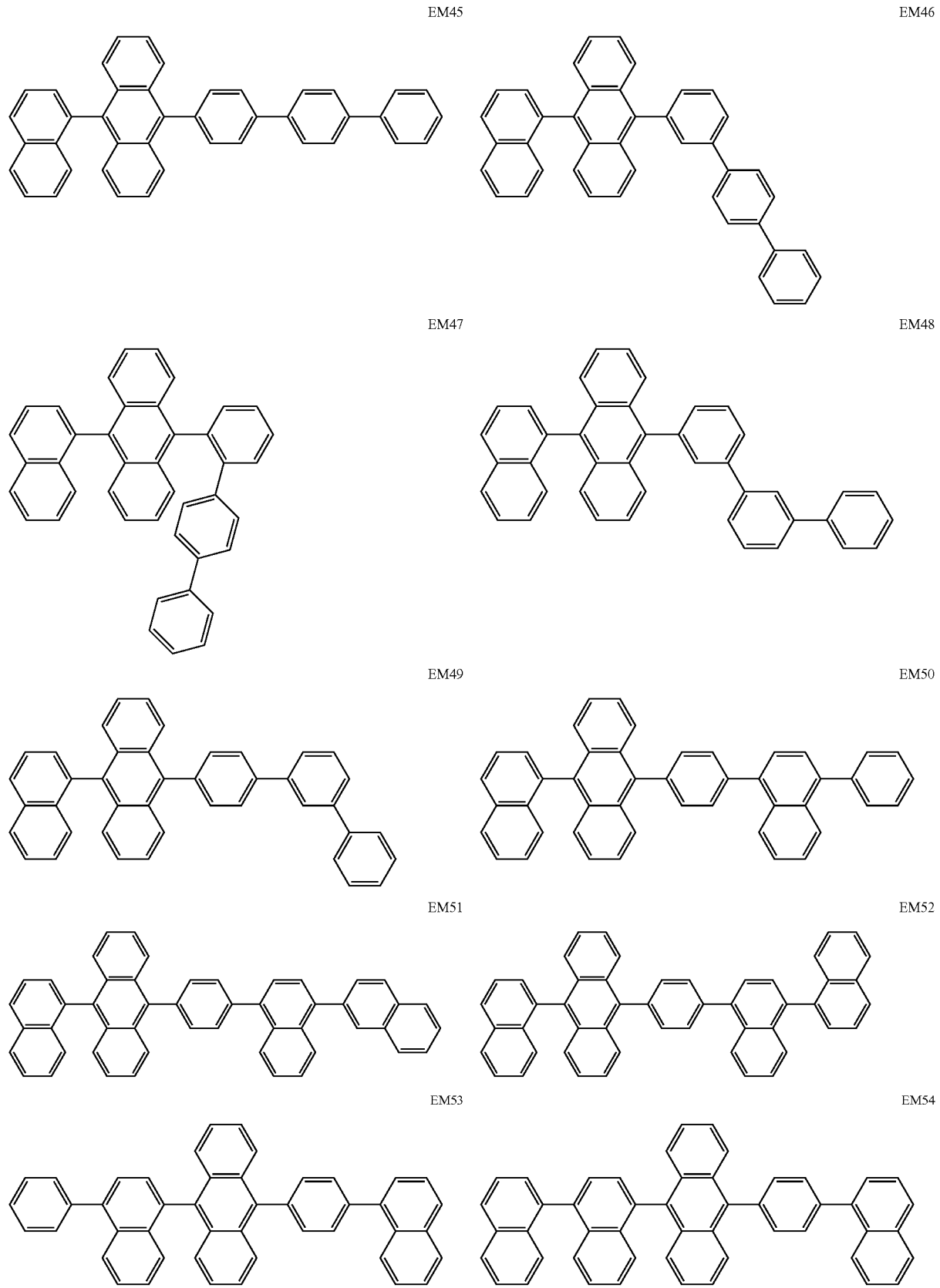

-continued
EM55
EM56
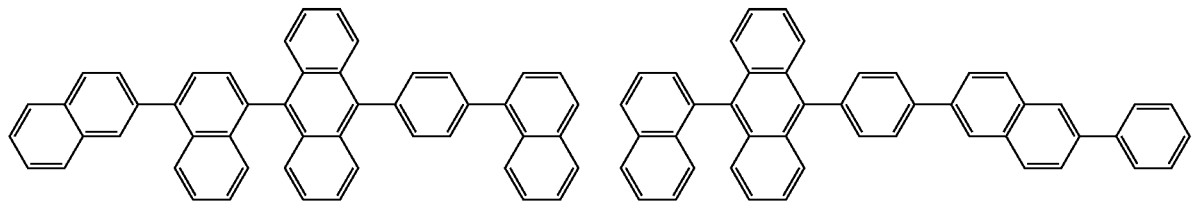
EM57
EM58
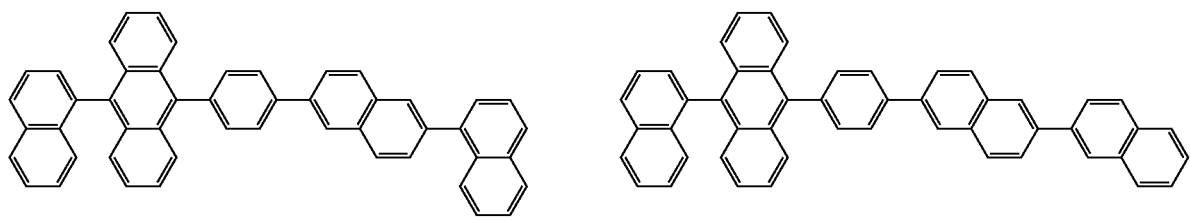
EM59
EM60
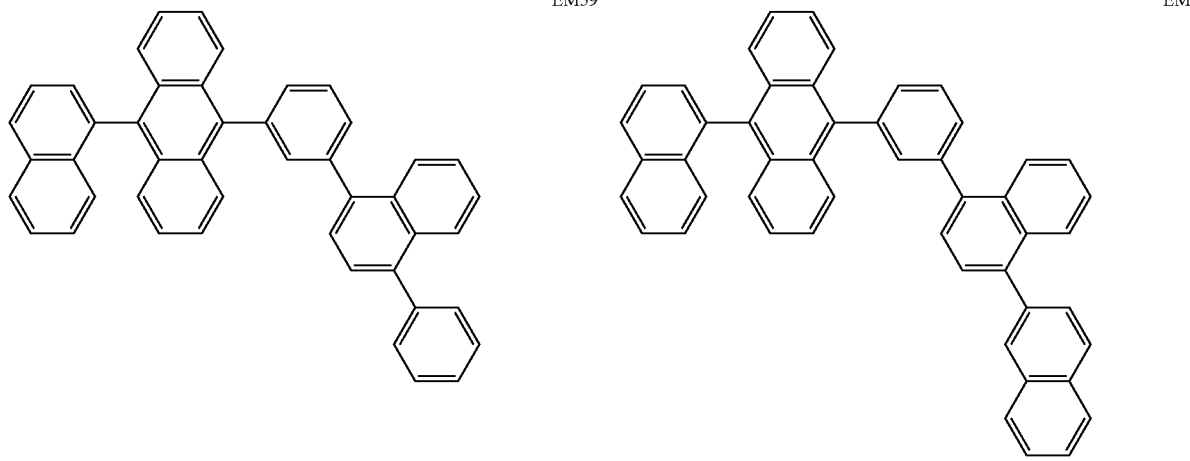
EM61
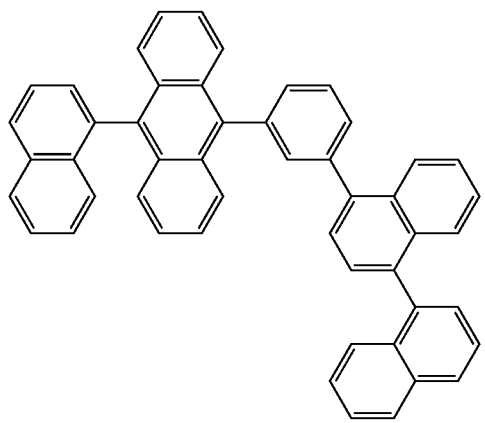

[Formula 47]
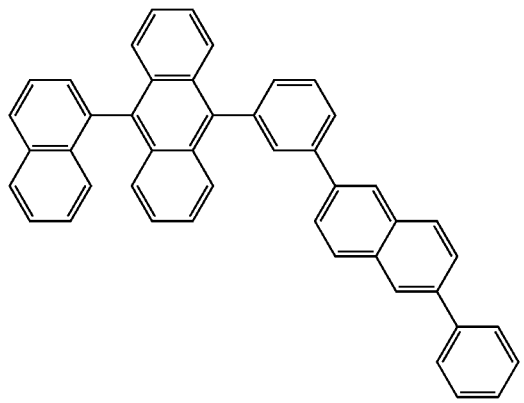

EM70
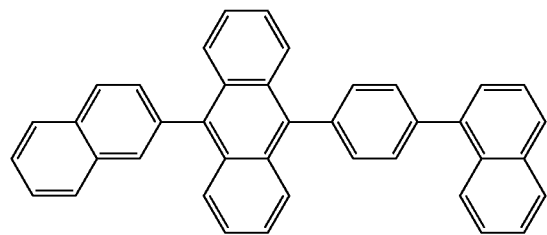
EM71
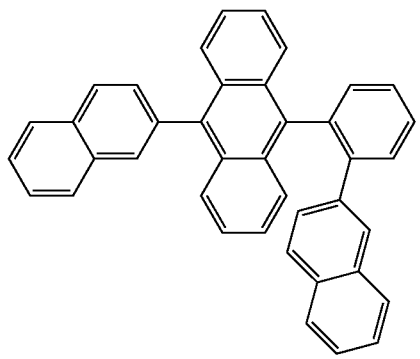
EM72
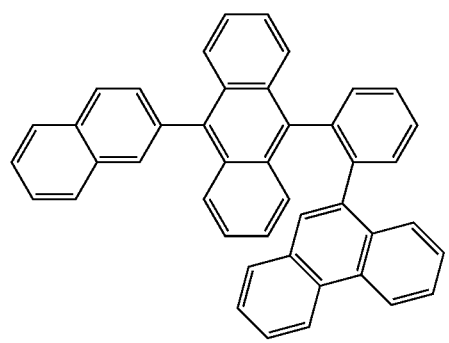
EM73
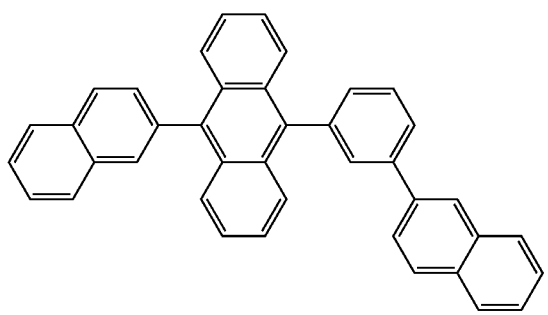
EM74
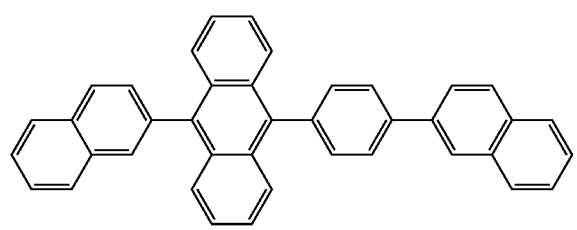
EM75
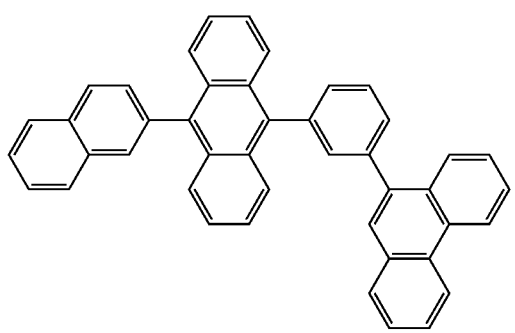
EM76
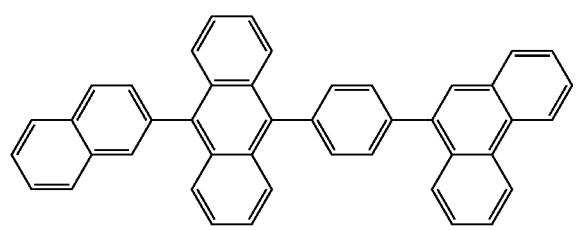
EM77
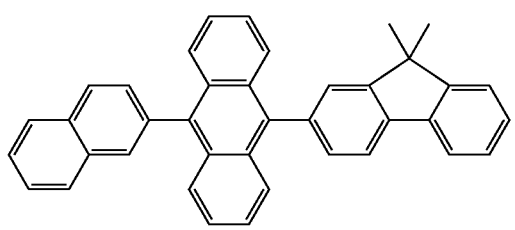
EM78
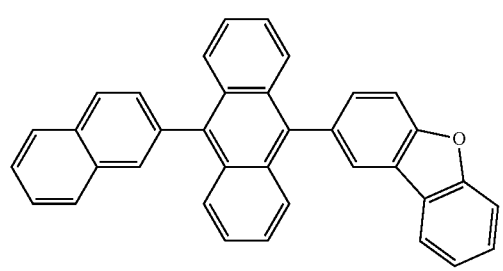

-continued
[Formula 48]
EM79
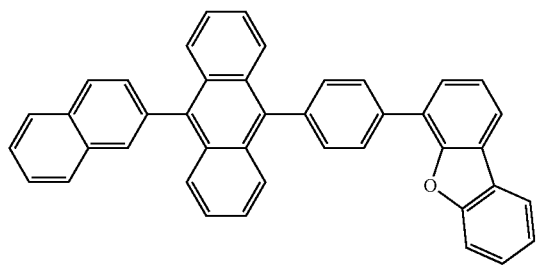
EM80
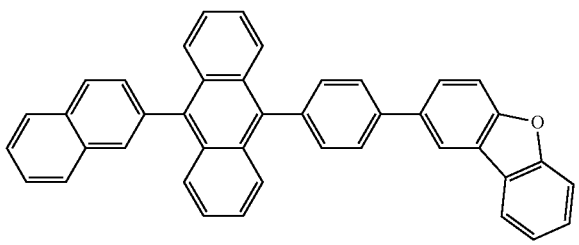
EM81
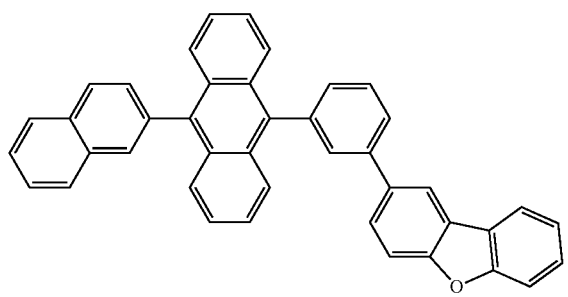
EM82
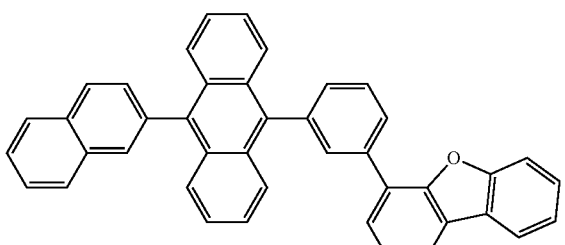
EM83
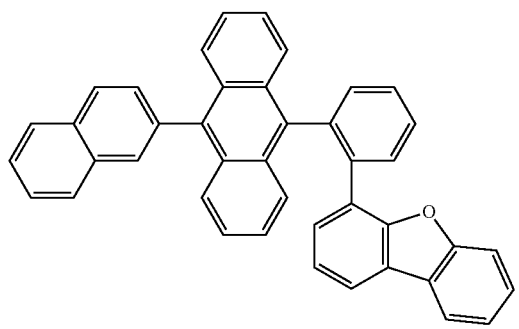
EM84
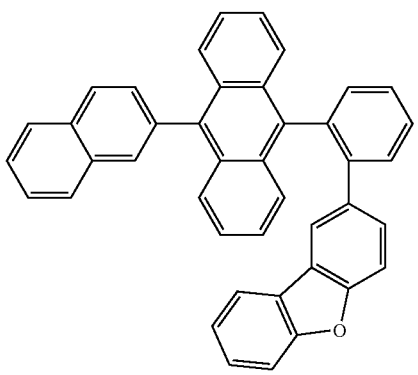
EM85
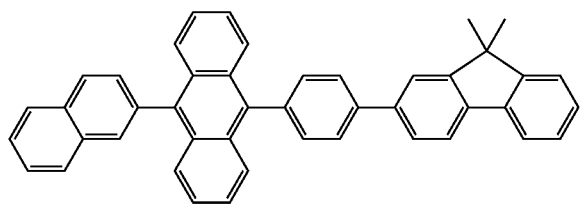
EM86
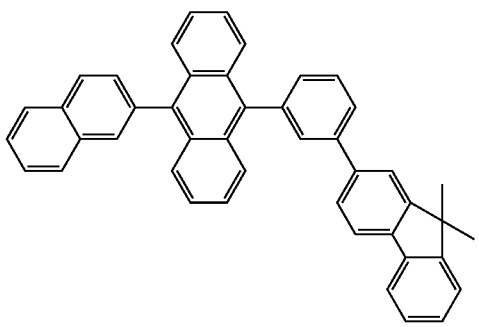

-continued
EM87
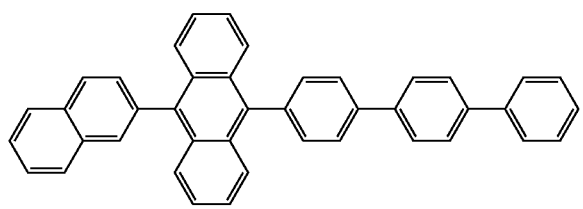
EM88
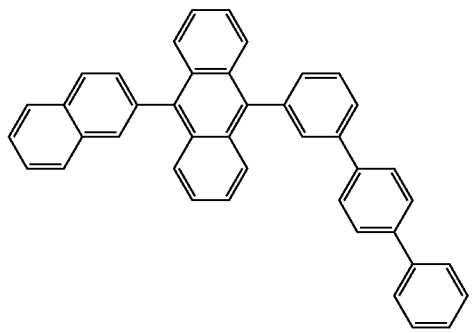
EM89
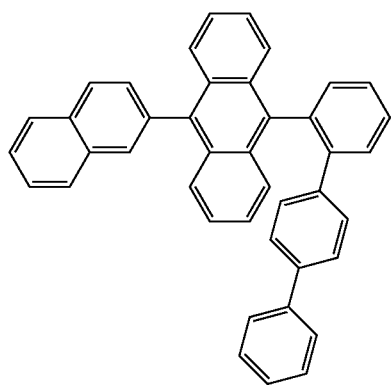
EM90
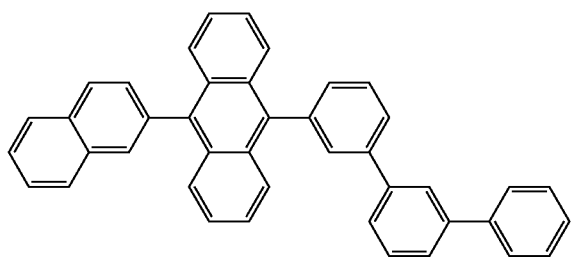
EM91
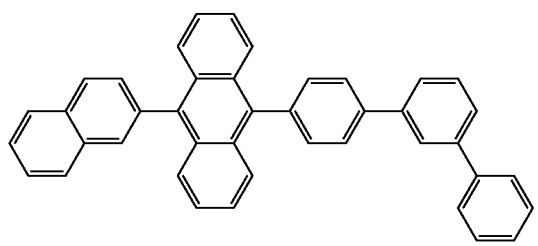
EM92
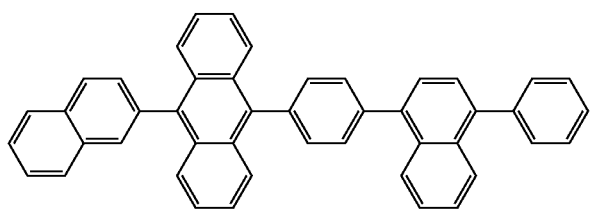
EM93
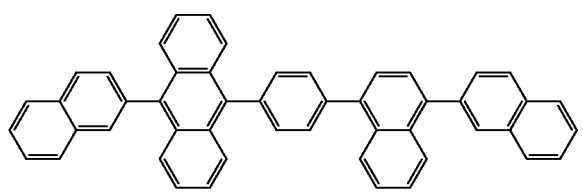
EM94
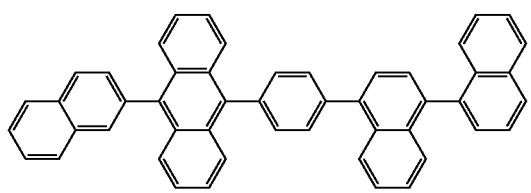
EM95
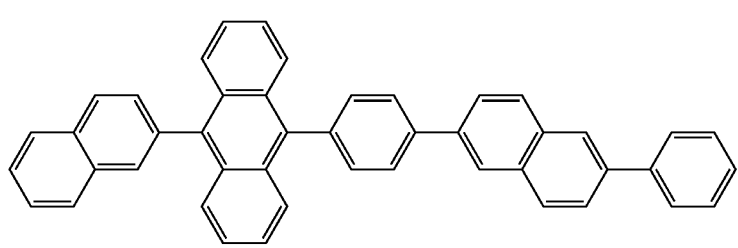

[Formula 49]
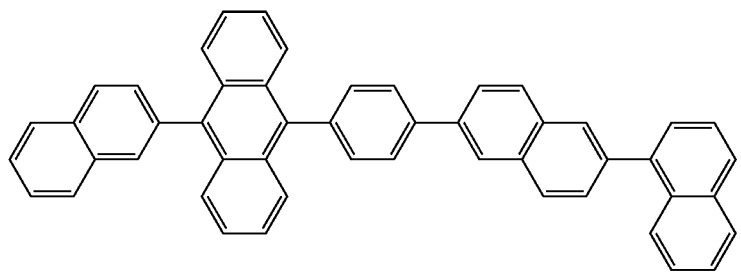
EM96
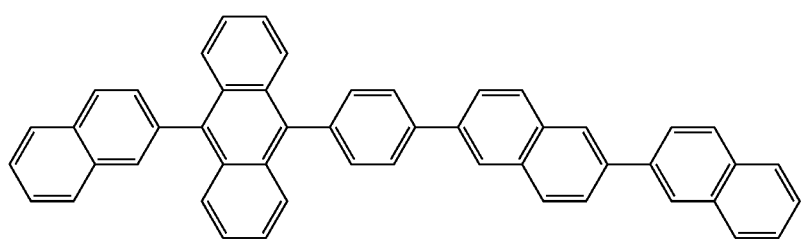
EM97
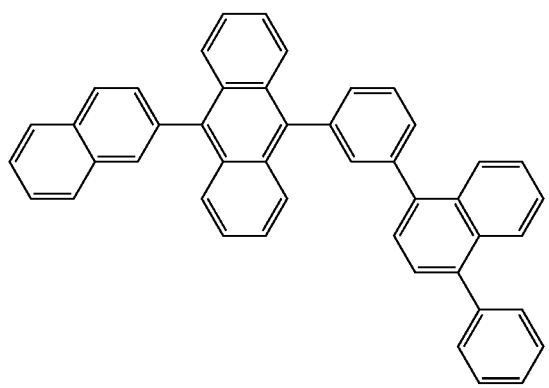
EM98
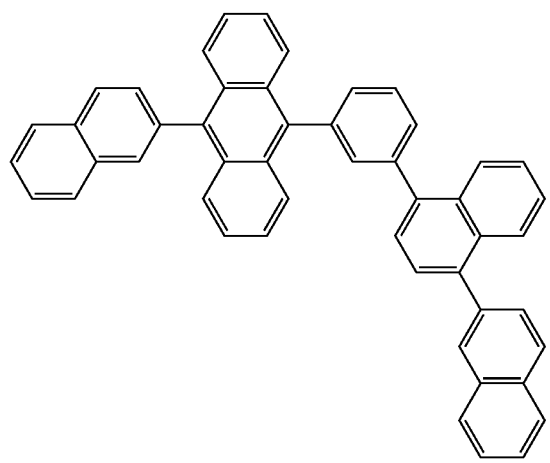
EM99
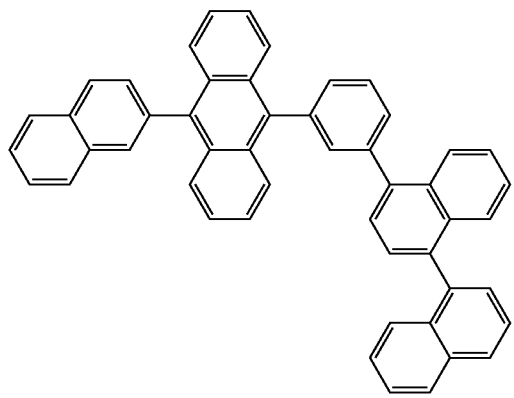
EM100
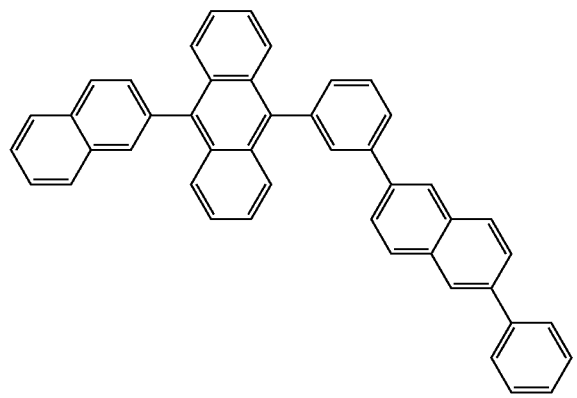
EM101

-continued
EM102
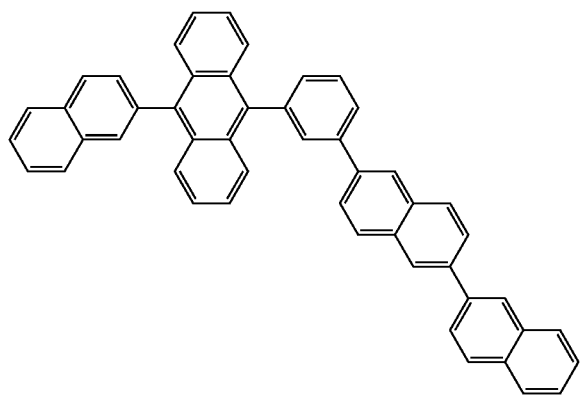
EM103
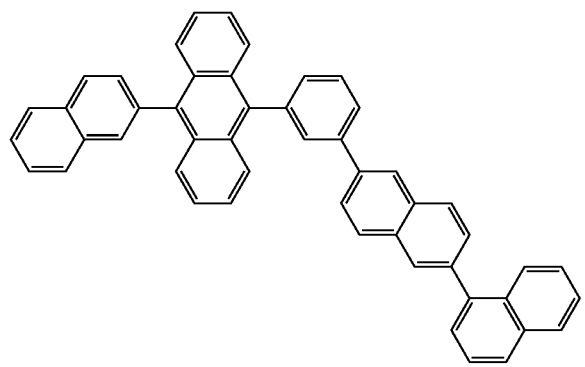
EM104
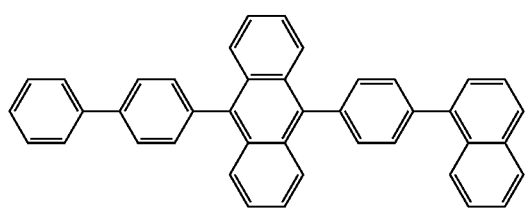
EM105
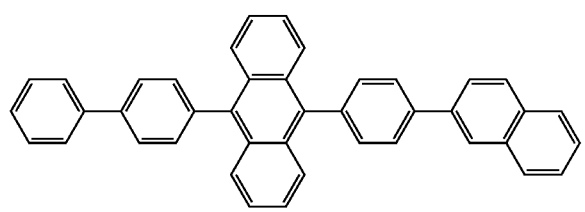
EM106
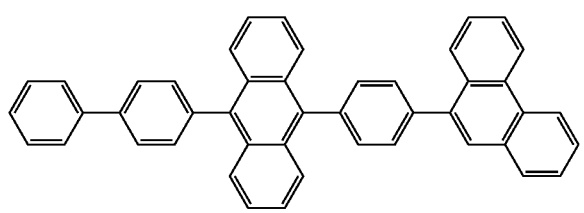
EM107
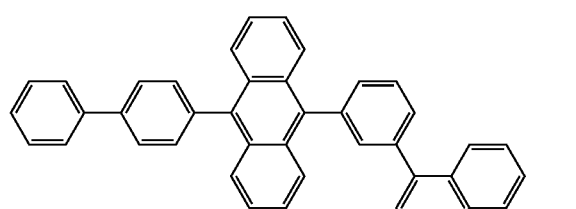
EM108
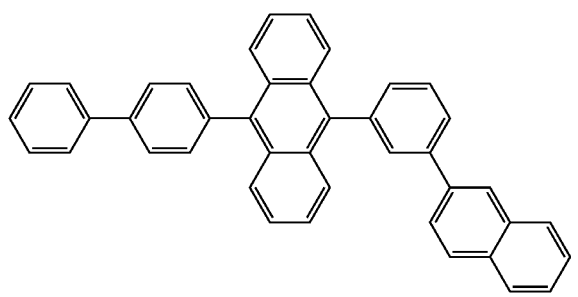
EM109
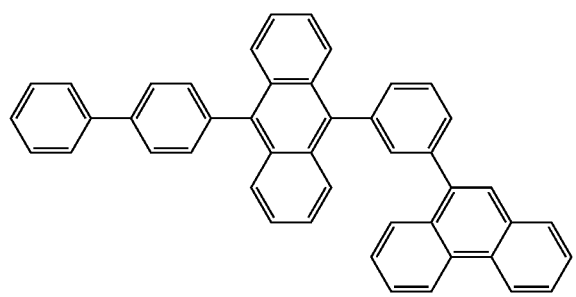
[Formula 50]
EM110
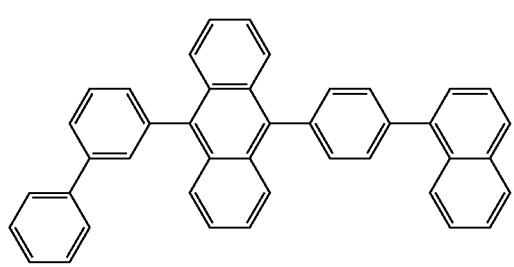
EM111

-continued
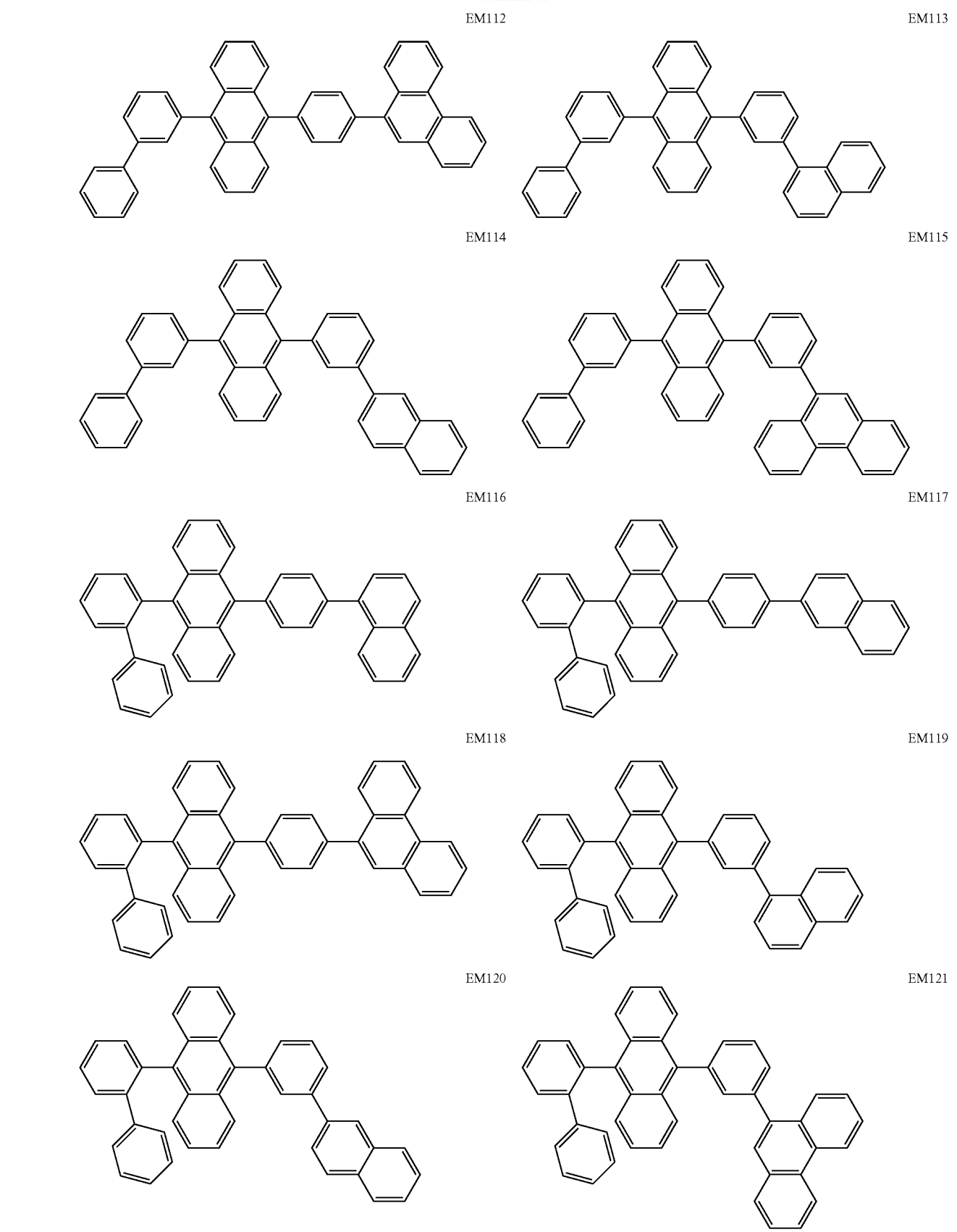

-continued
EM122
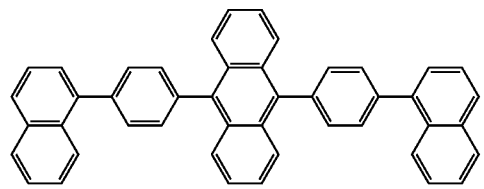
EM123
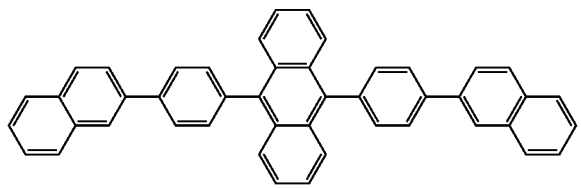
EM124
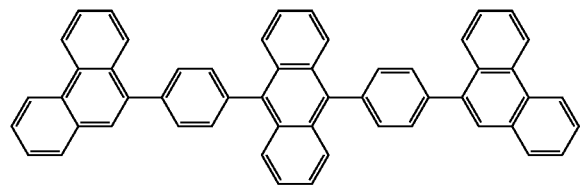
EM125
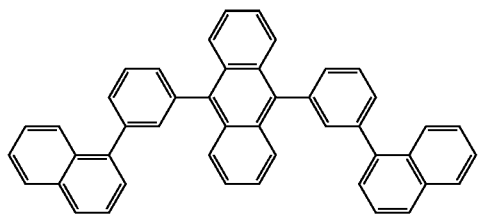
EM126
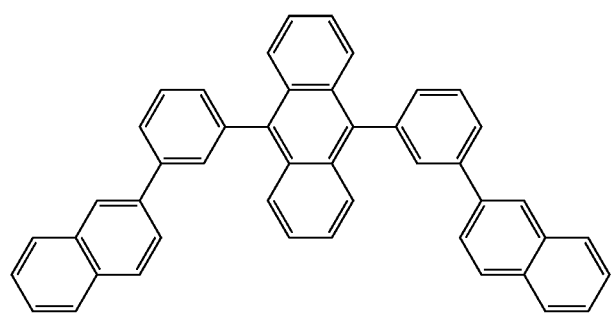
[Formula 51]
EM127
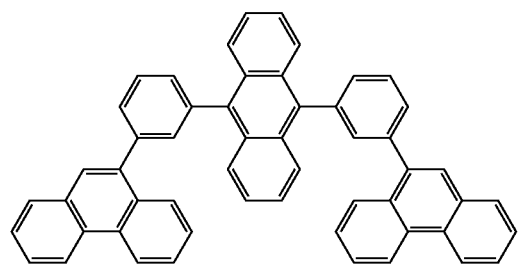
EM128
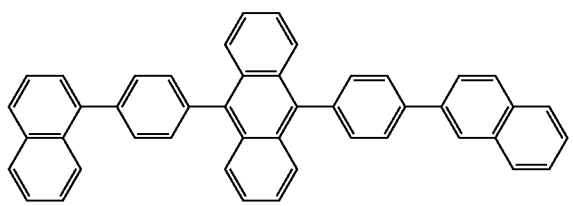
EM129
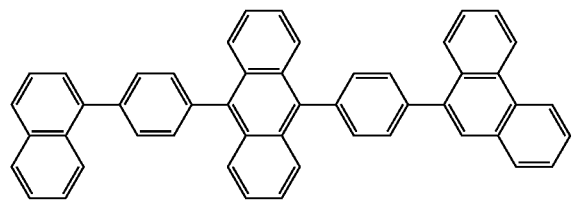
EM130
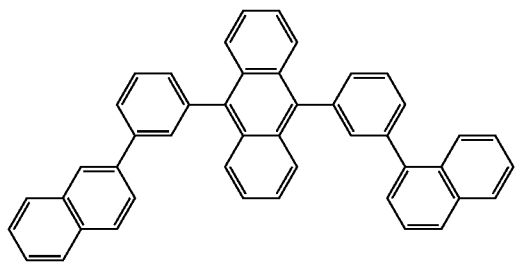

-continued
EM131
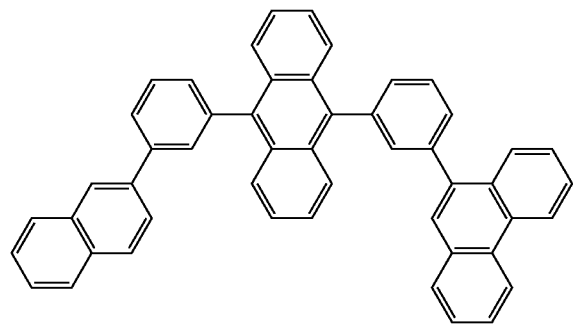
EM132
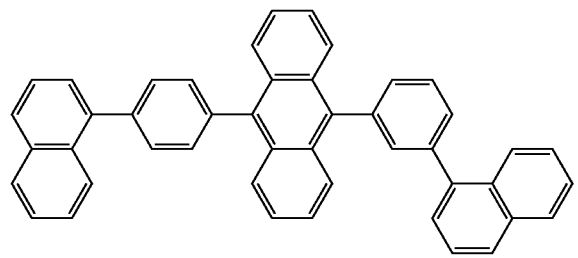
EM133
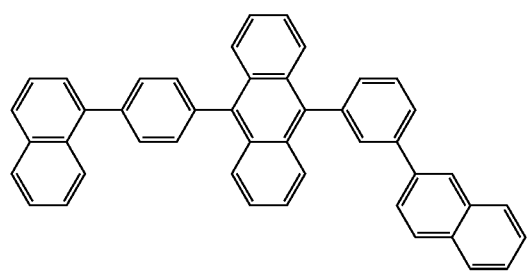
EM134
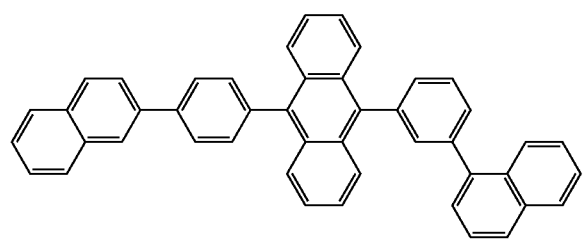
EM135
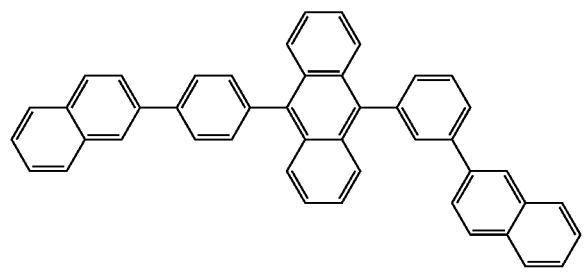
EM136
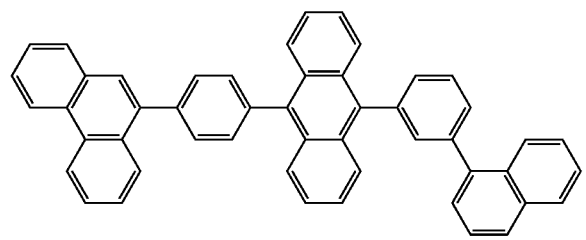
EM137
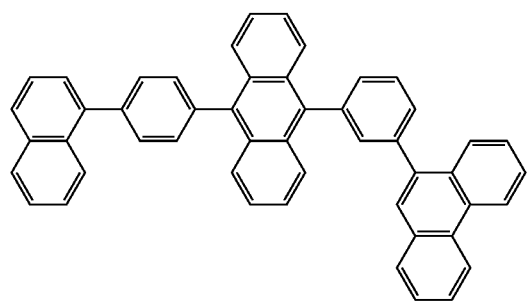
EM138
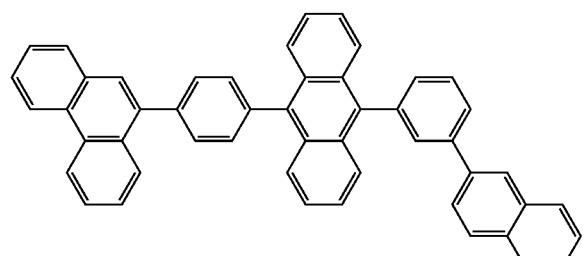
EM139
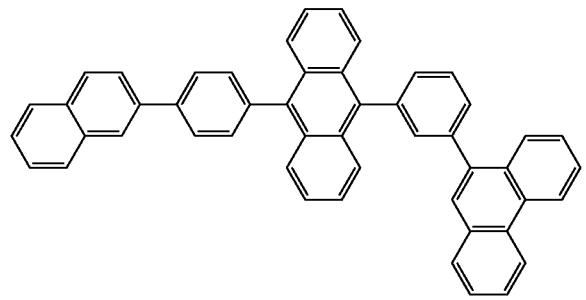
EM140
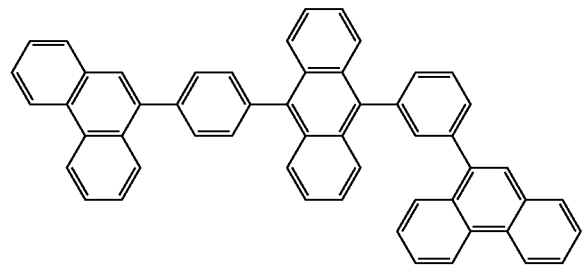

-continued
EM141
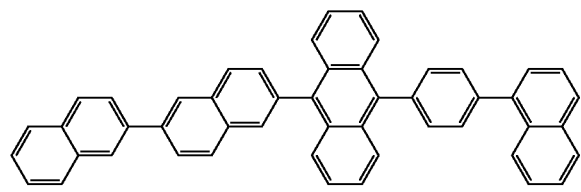
EM142
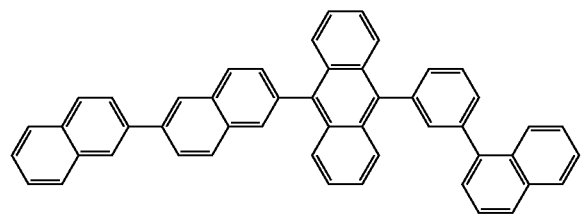
[Formula 52]
EM143
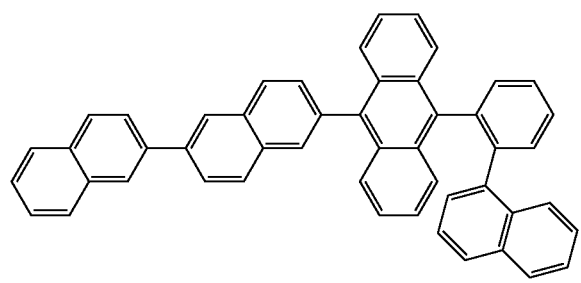
EM144
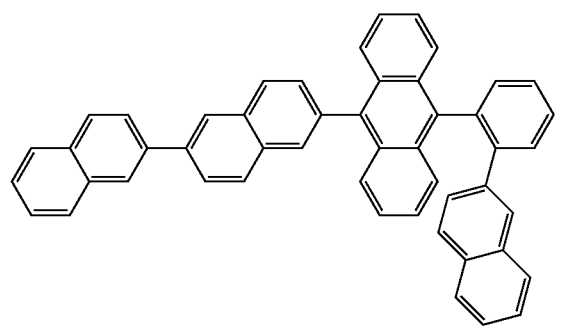
EM145
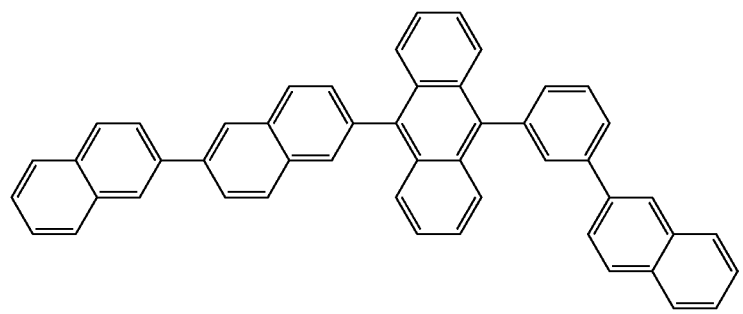
EM146
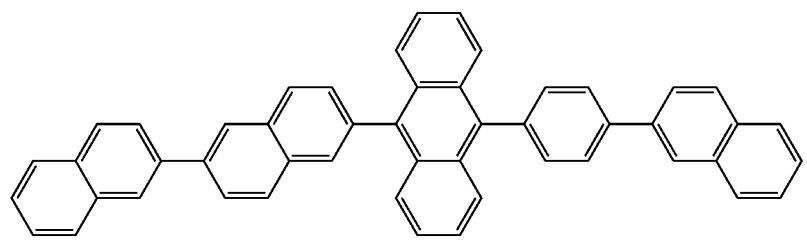
EM147
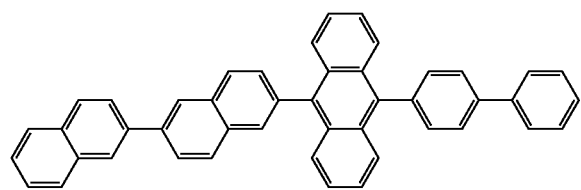
EM148
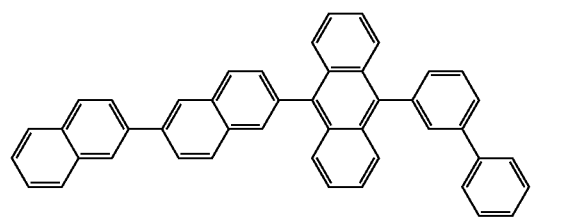

-continued
EM149
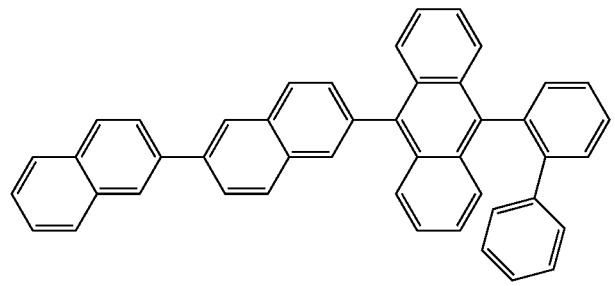
[Formula 53]
EM150
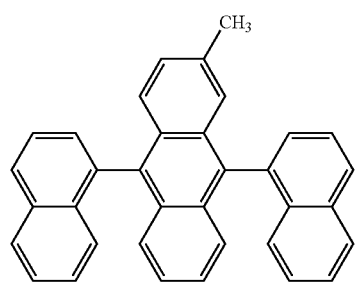
EM151
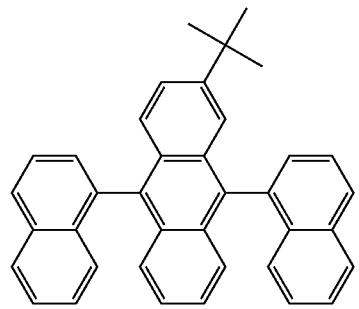
EM152
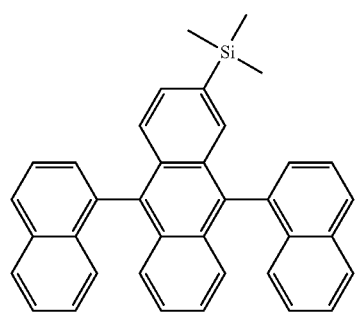
EM153
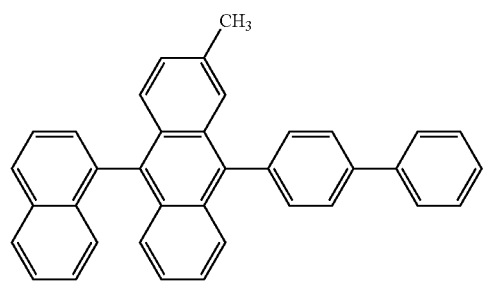
EM154
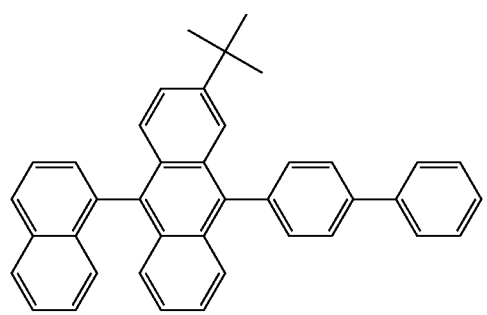
EM155
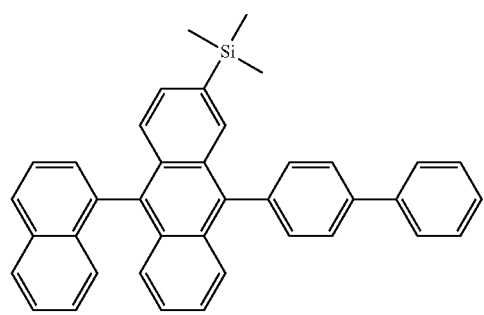
EM156
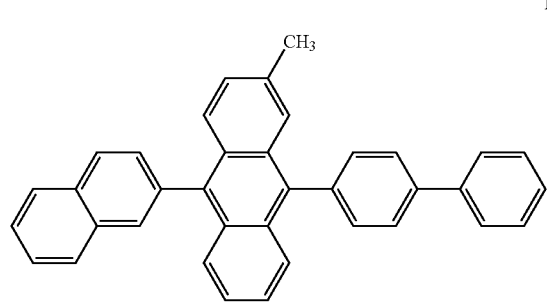
EM157
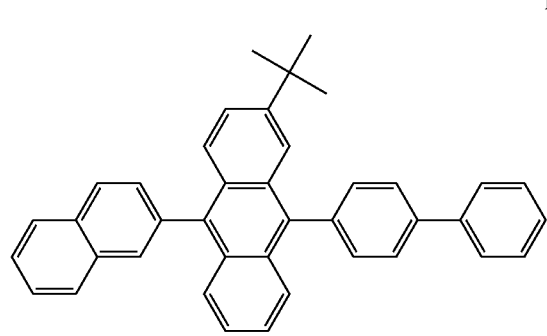

-continued
EM158
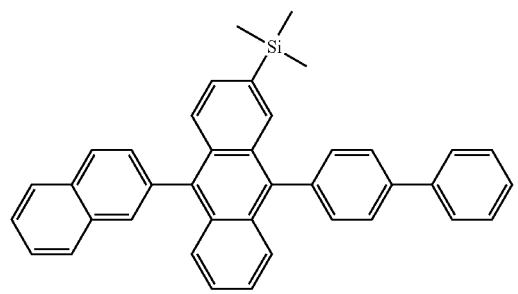
EM159
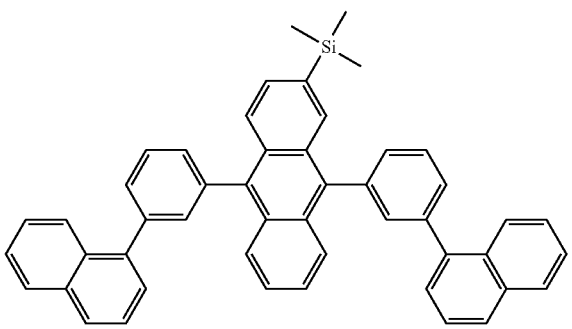
EM160
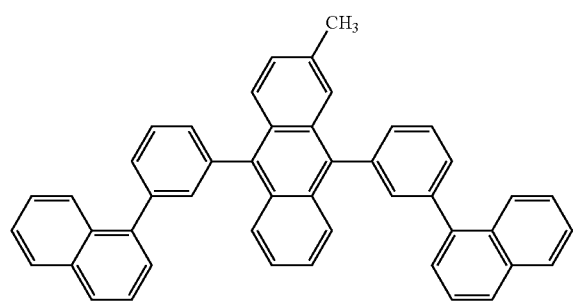
EM161
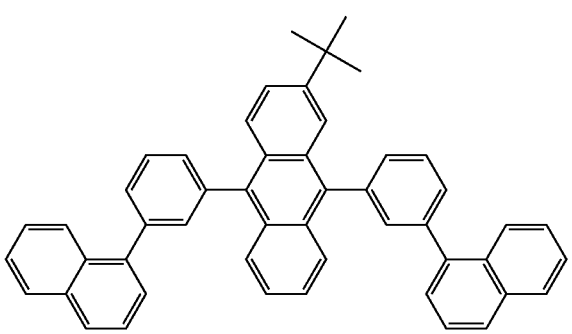
EM162
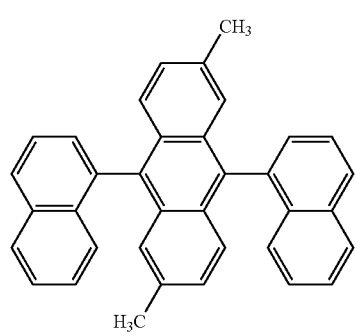
EM163
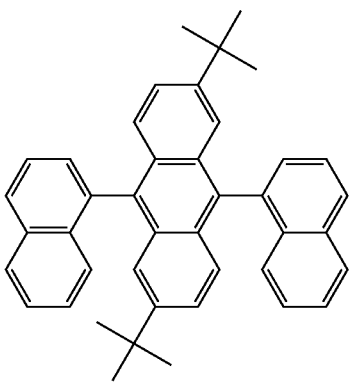
EM164
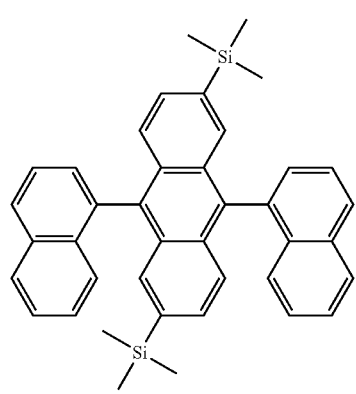

[Formula 54]
EM165
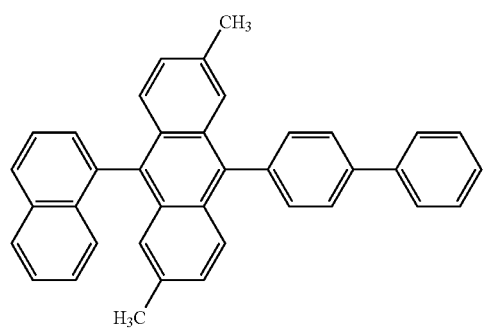
EM166
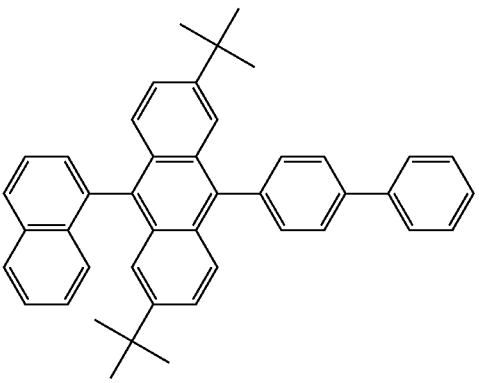
EM167
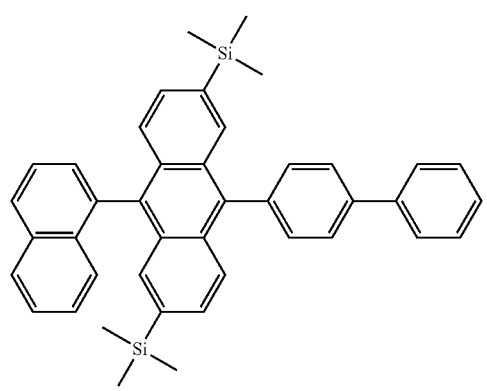
EM168
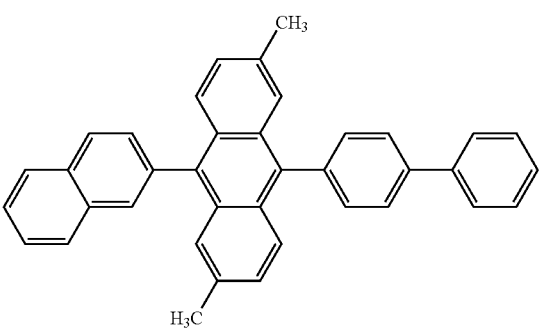
EM169
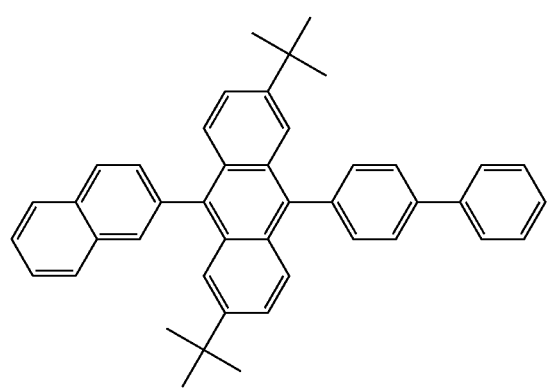
EM170
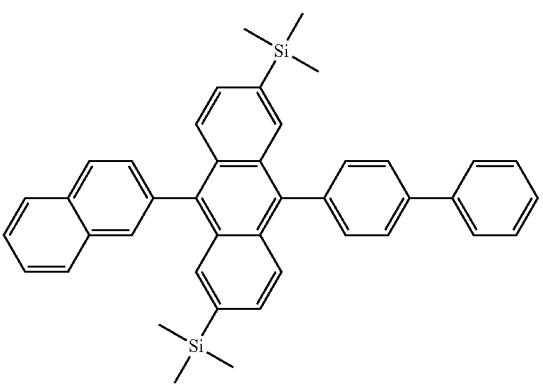
EM171
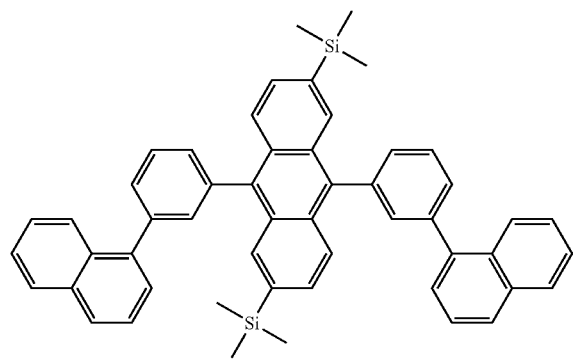
EM172
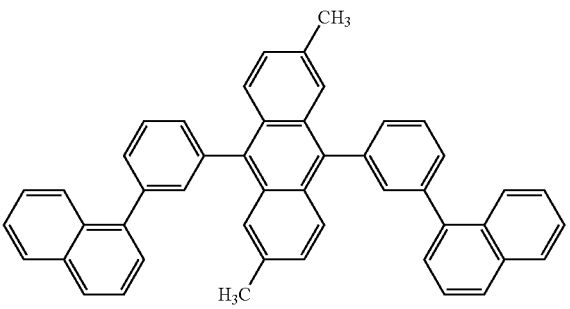

EM173
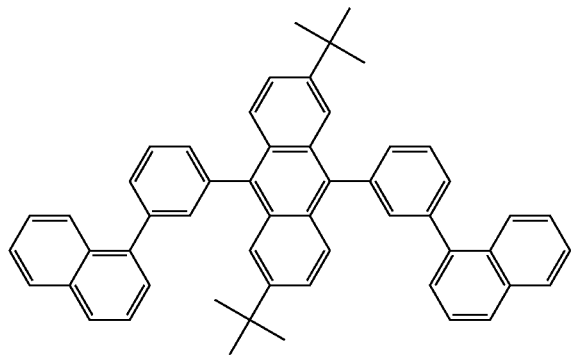
EM174
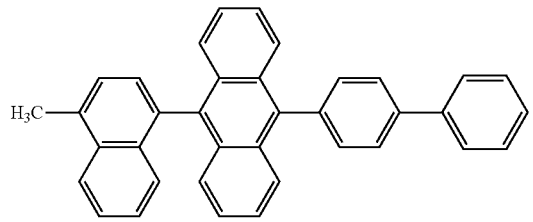
EM175
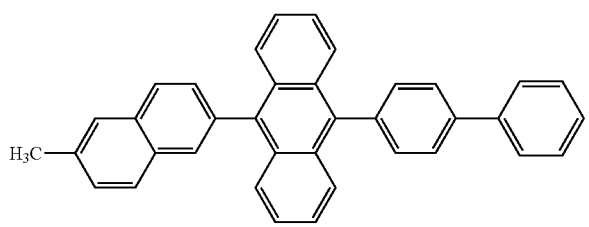
EM176
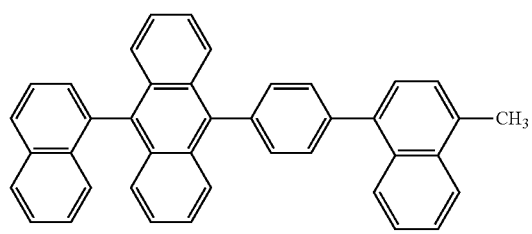
EM177
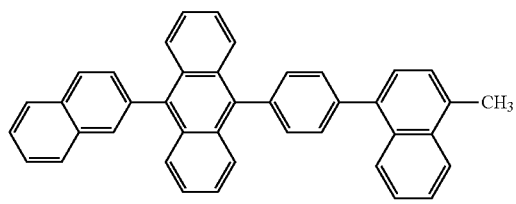
EM178
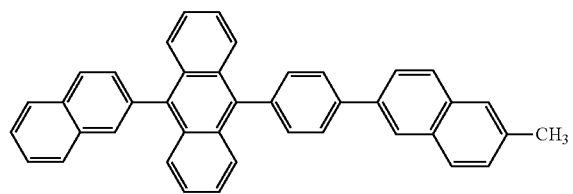
EM179
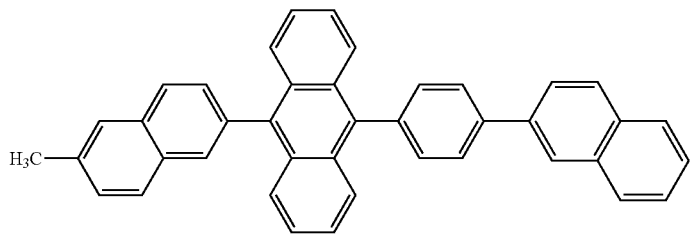
[Formula 55]
EM180
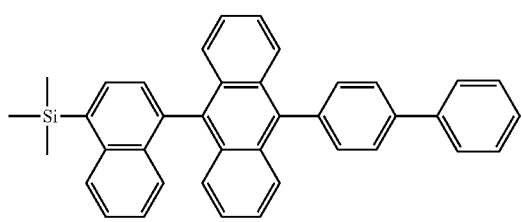
EM181
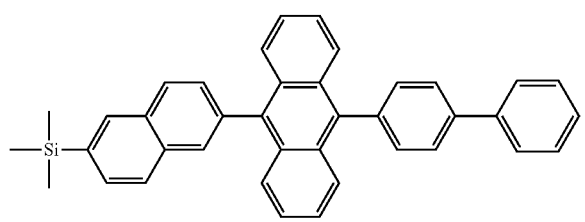
EM182
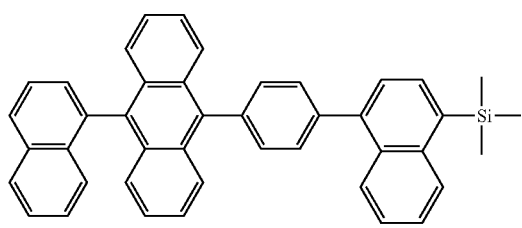
EM183
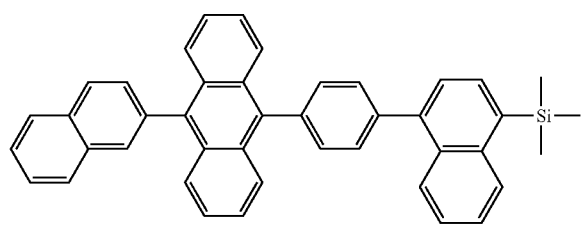

-continued
EM184
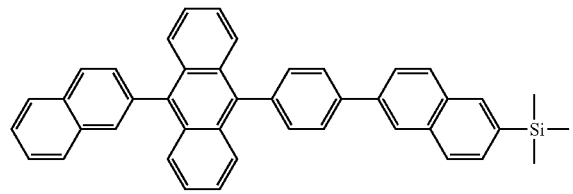
EM185
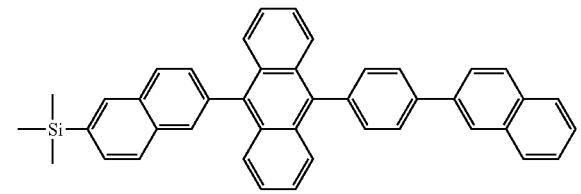
EM186
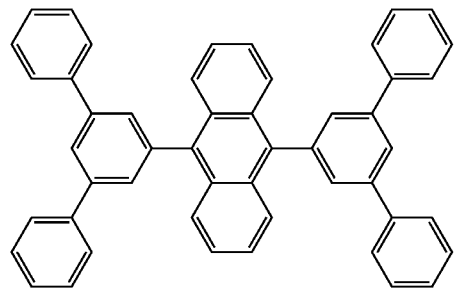
EM187
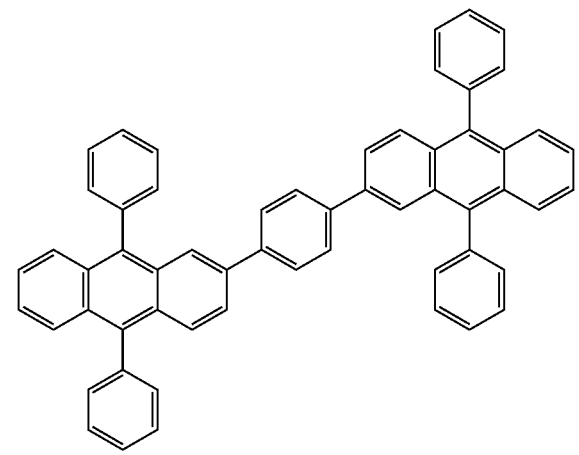
EM188
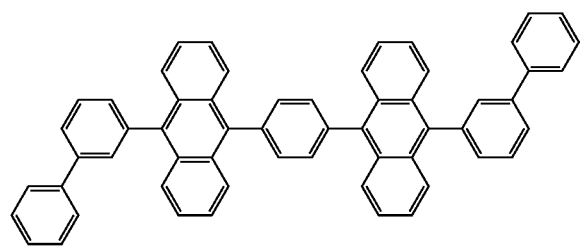
EM189
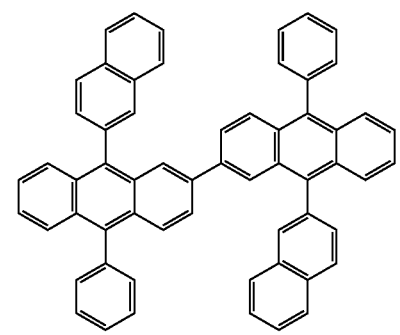
EM190
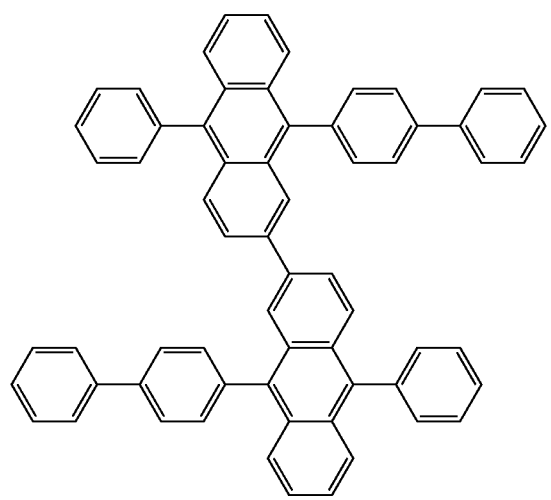
EM191
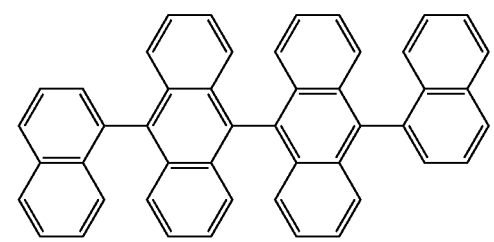

[Formula 56]
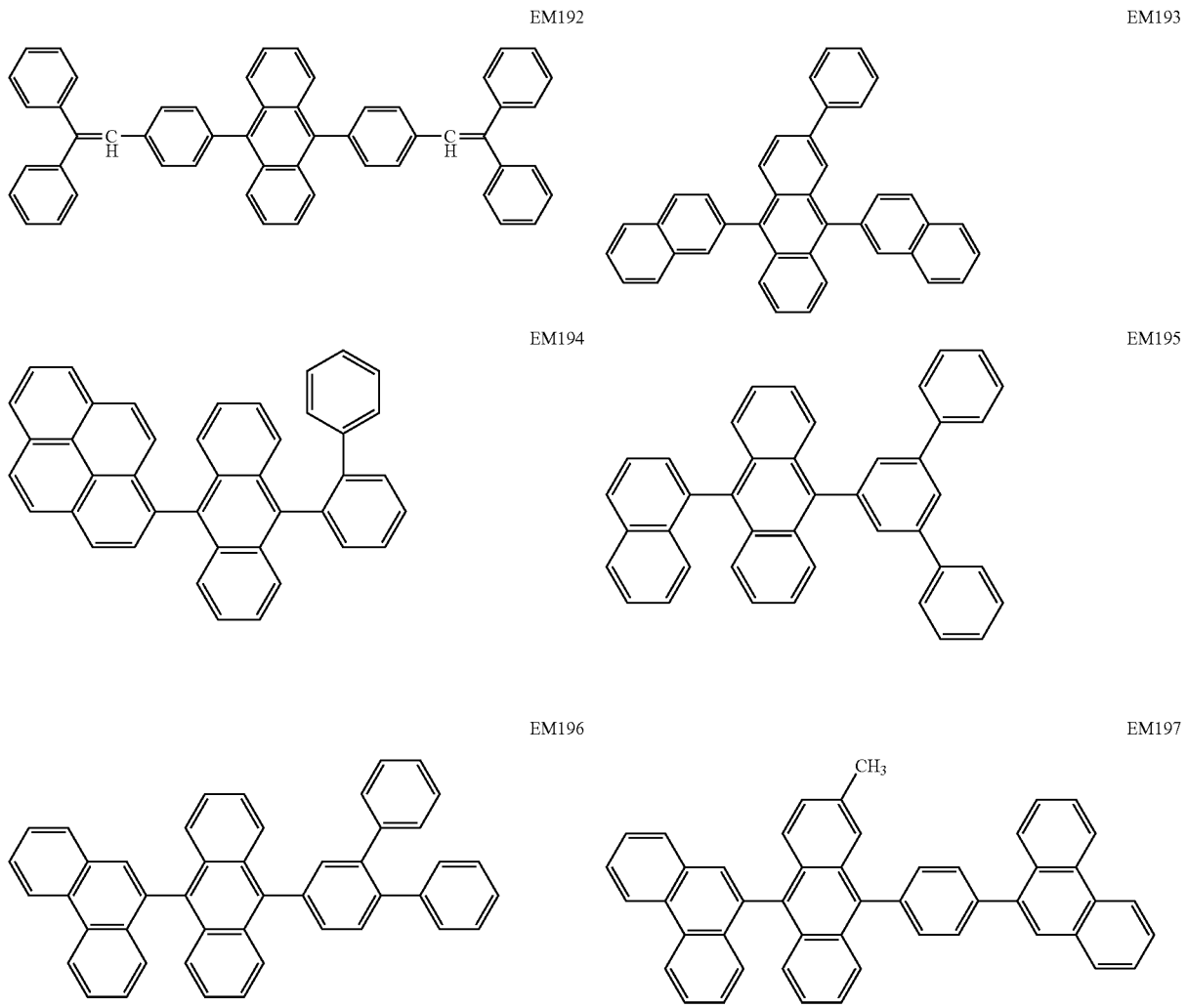
[Formula 57]

EM200
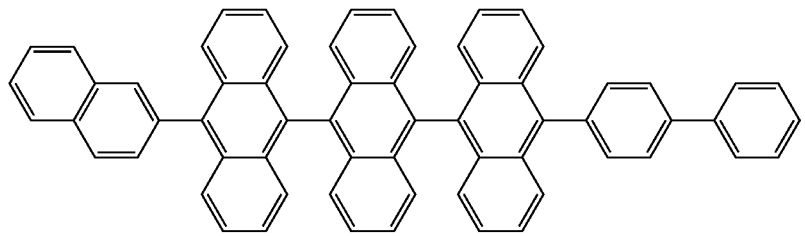
EM201
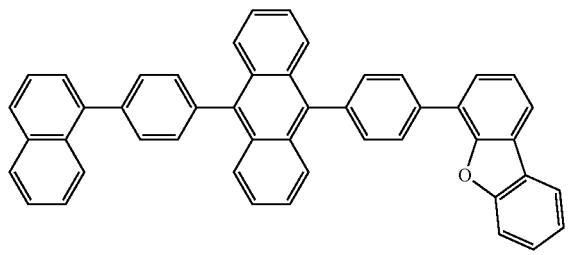
EM202
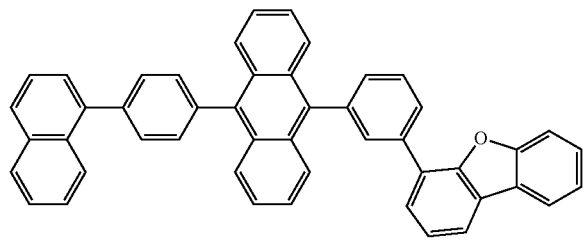
EM203
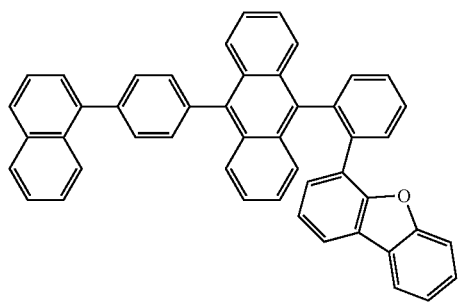
EM204
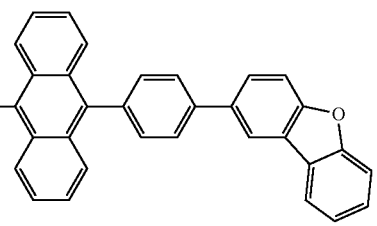
EM205
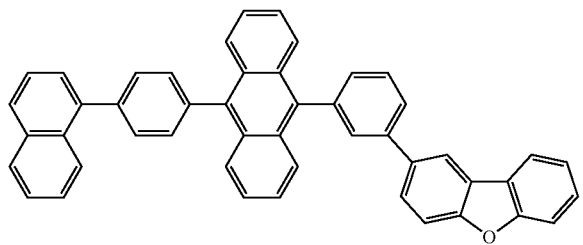
EM206
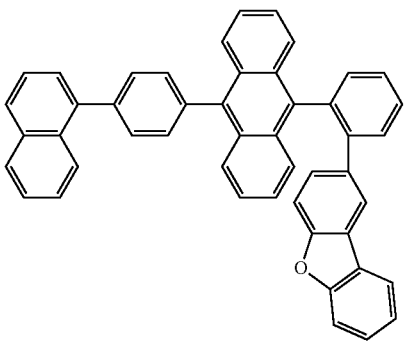
EM207
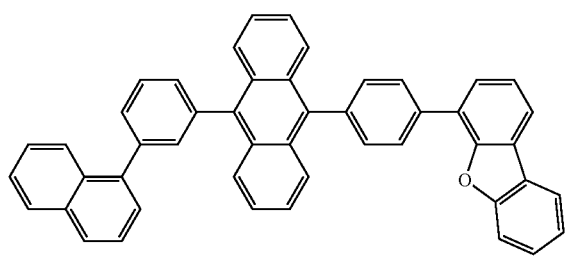
EM208
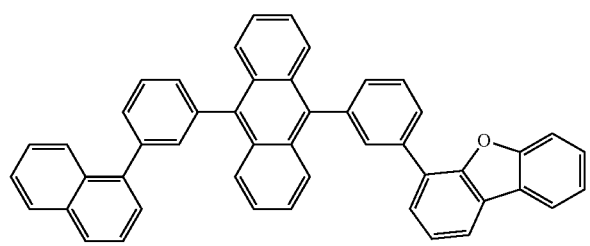

[Formula 58]
[Formula 59]
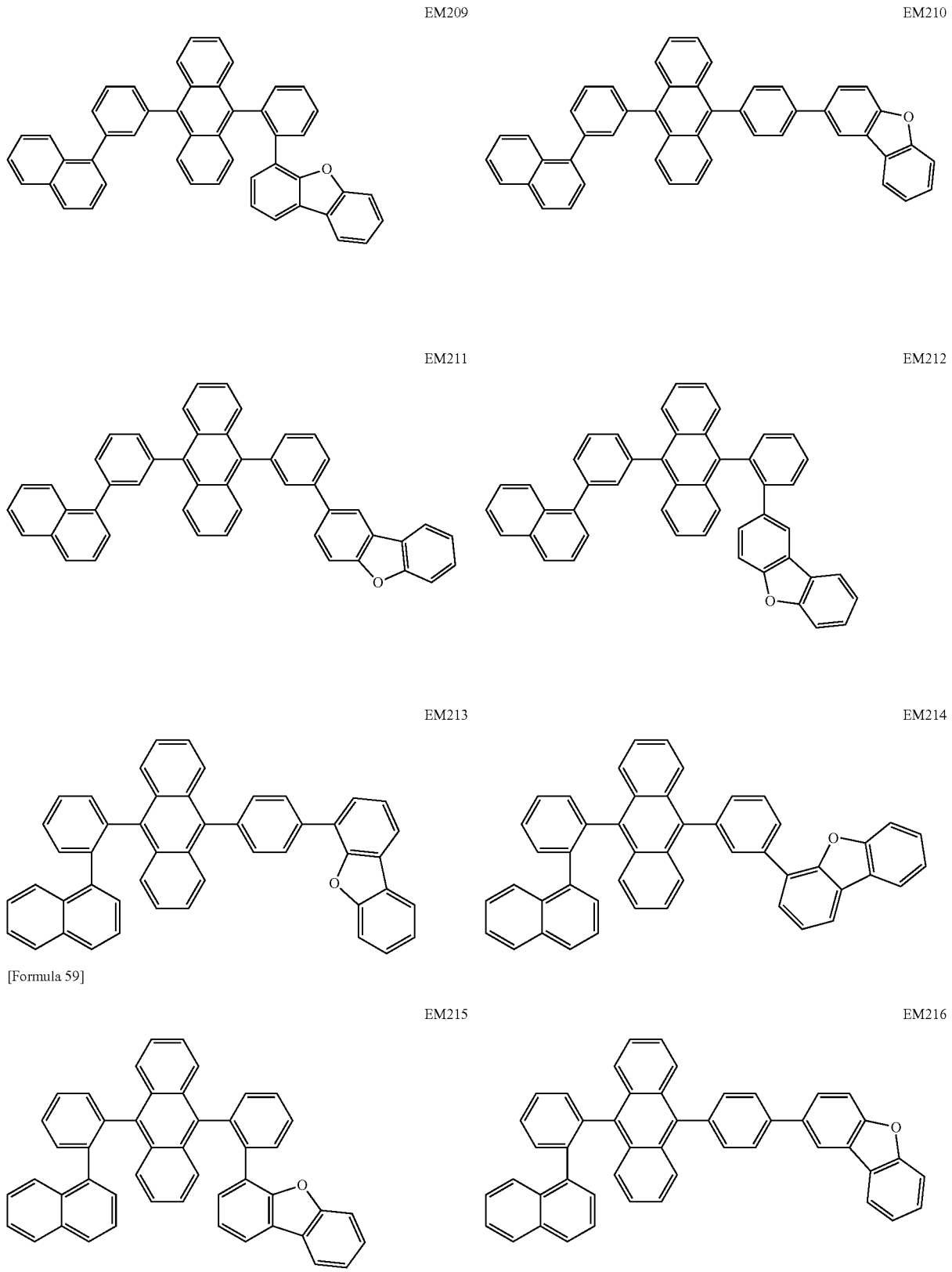

-continued
EM217
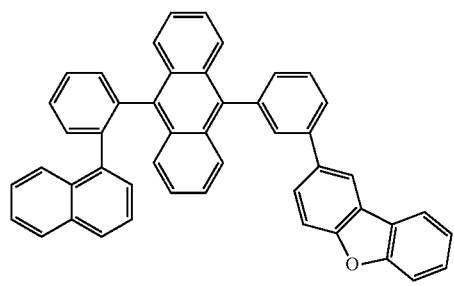
EM218
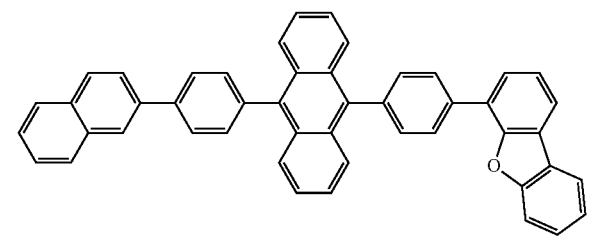
EM219
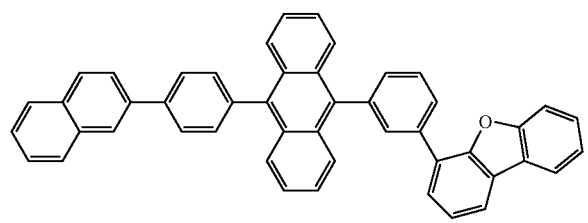
EM220
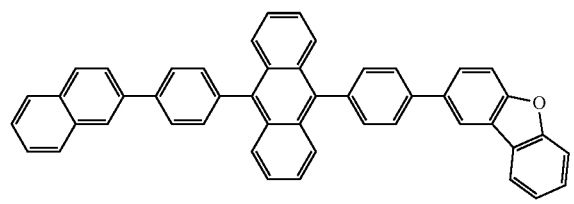
EM221
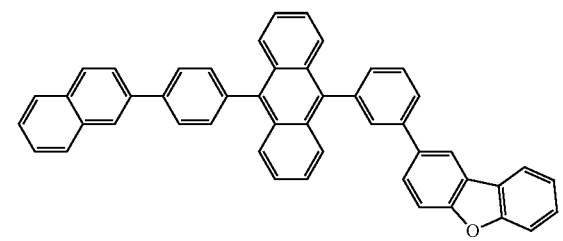
EM222
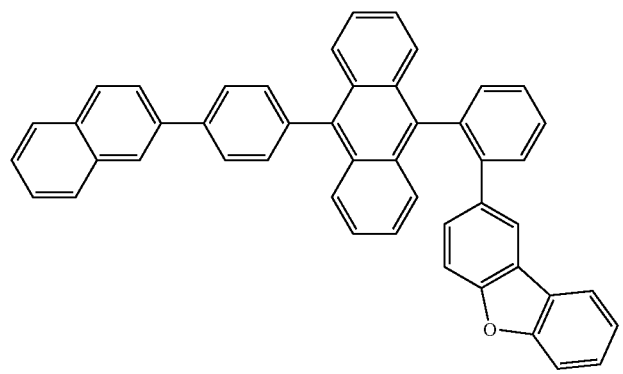
[Formula 60]
EM224
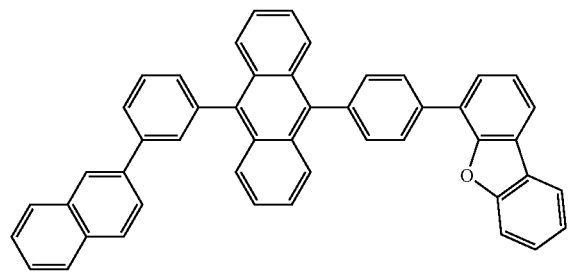
EM225
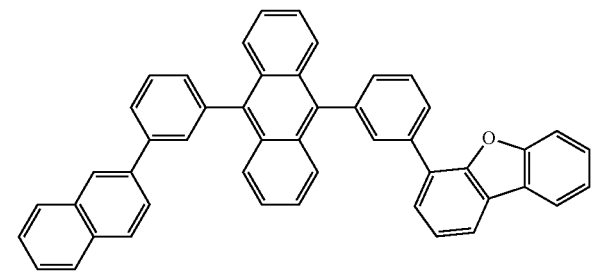

-continued
EM226
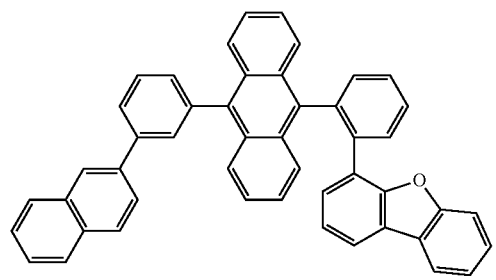
EM227
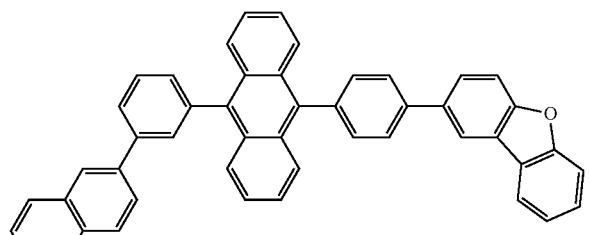
EM228
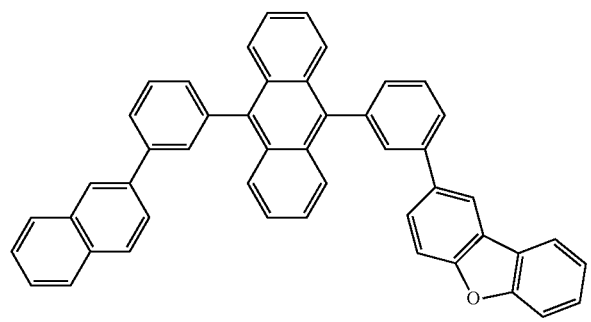
EM229
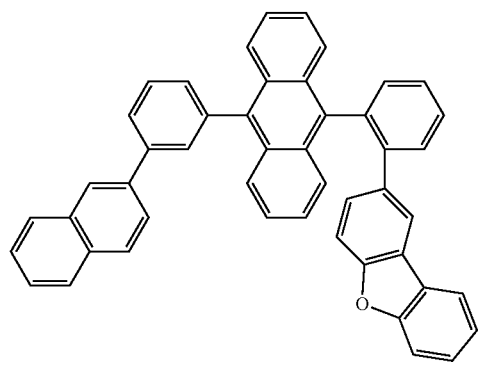
EM230
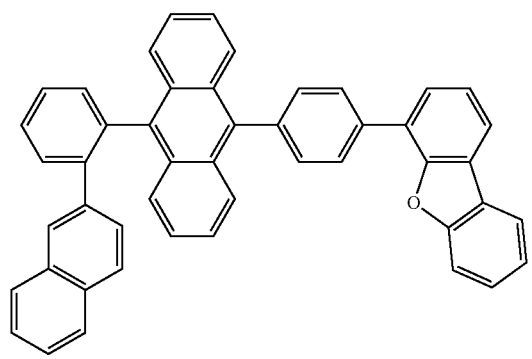
EM231
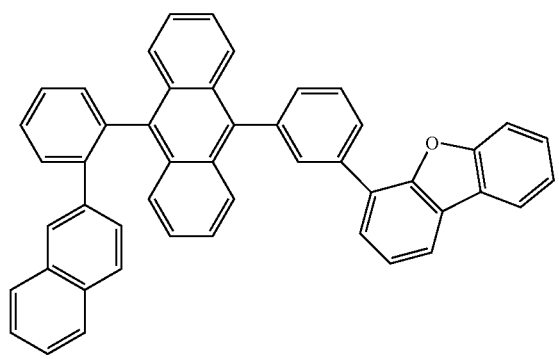
EM232
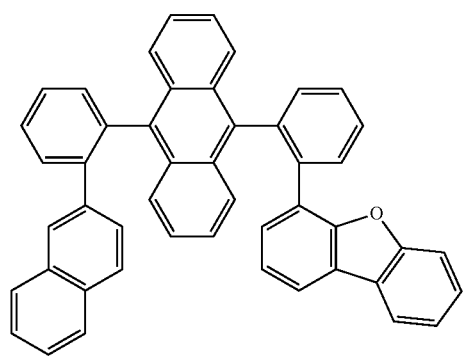

-continued
[Formula 61]
EM233
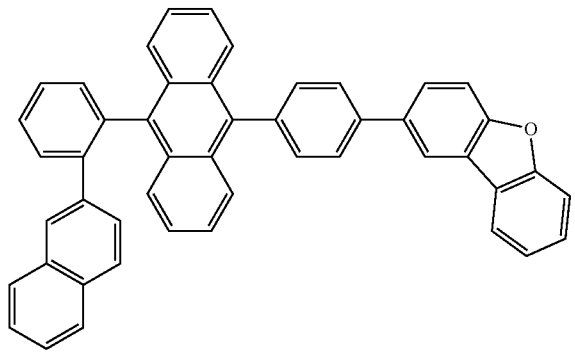
EM234
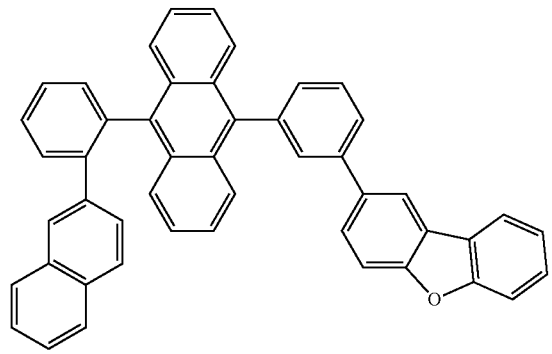
EM235
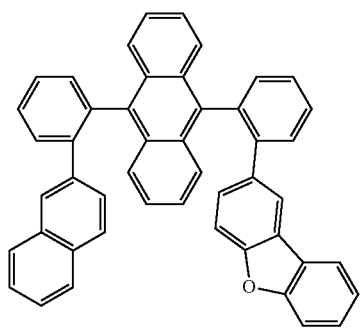
EM236
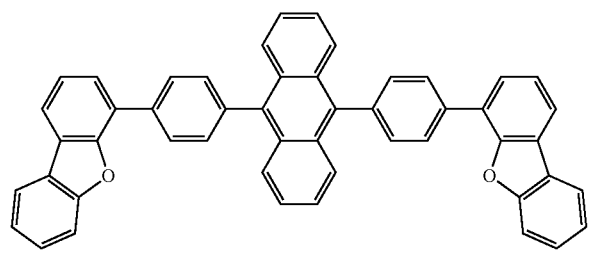
EM237
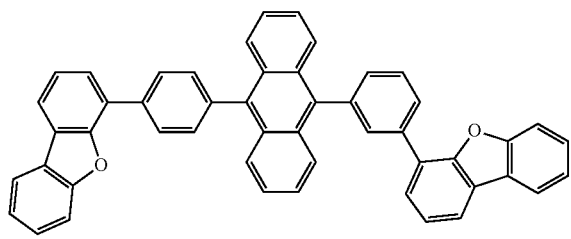
EM238
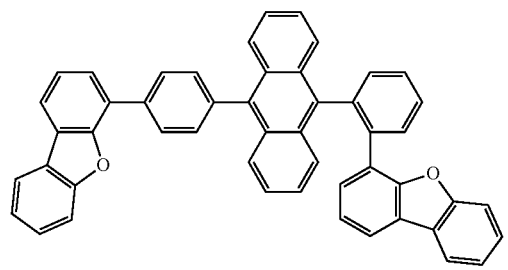
EM239
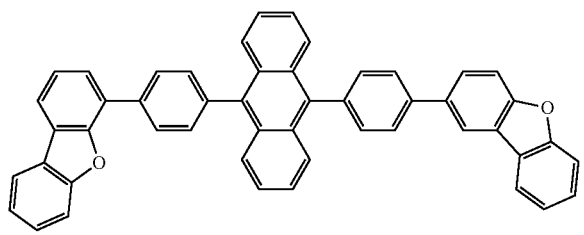
EM240
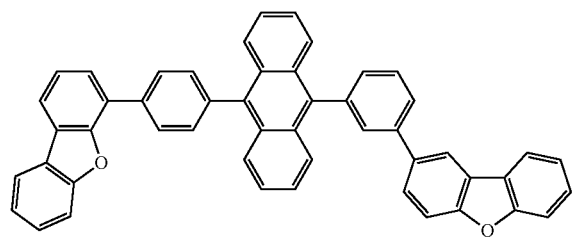
EM241
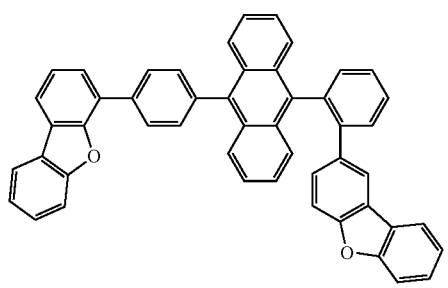
EM242
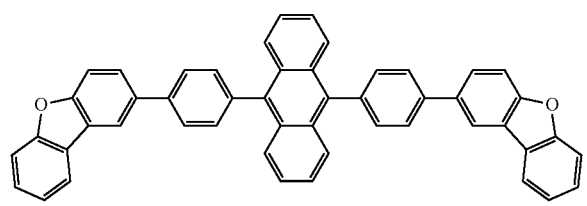

-continued
EM243
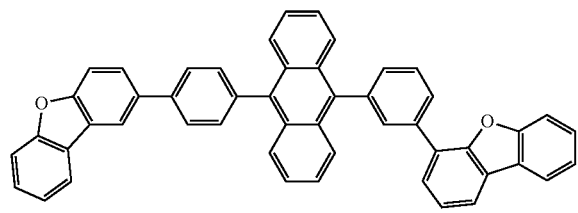
EM244
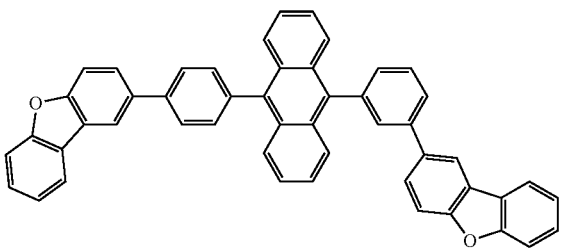
EM245
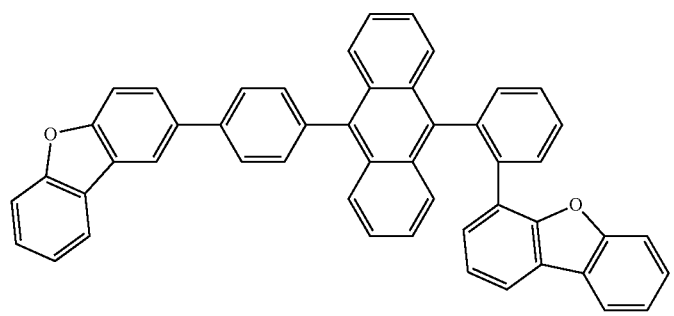
[Formula 62]
EM246
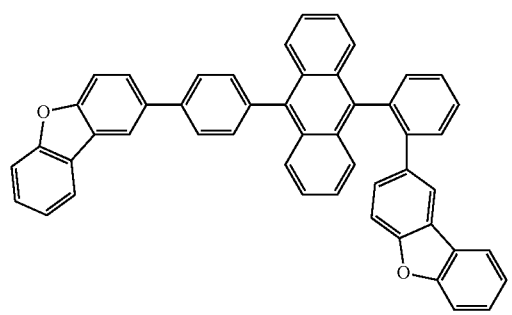
EM247
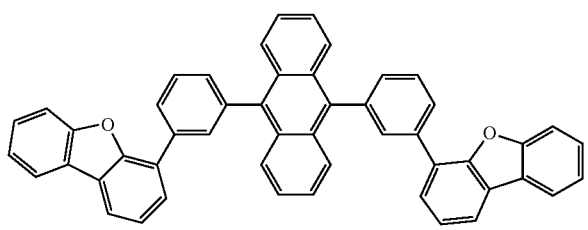
EM248
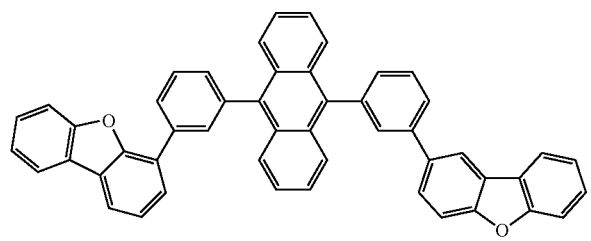
EM249
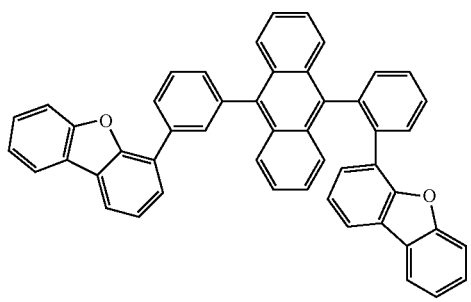
EM250
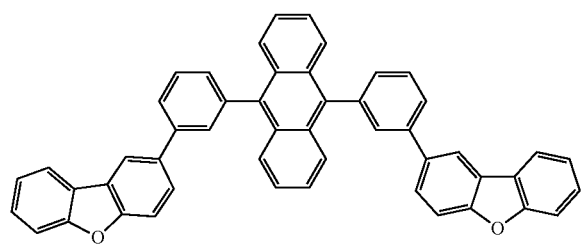
EM251
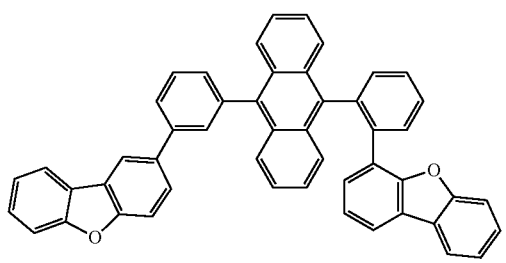

-continued
EM252
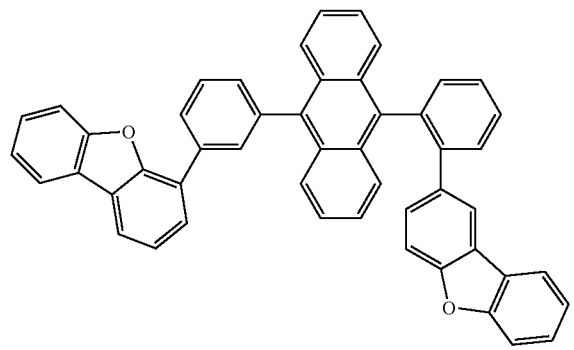
EM253
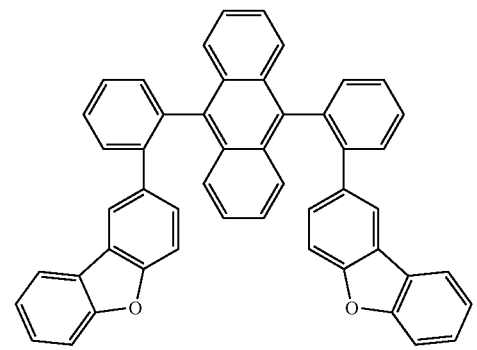
EM254
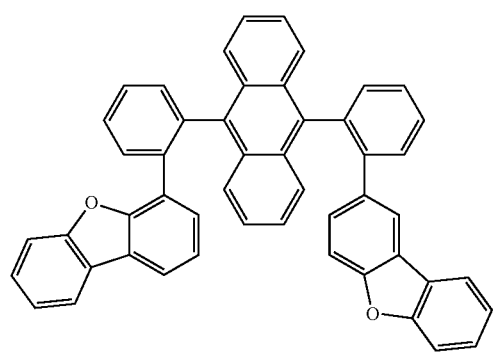
EM255
[Image continues]
EM256
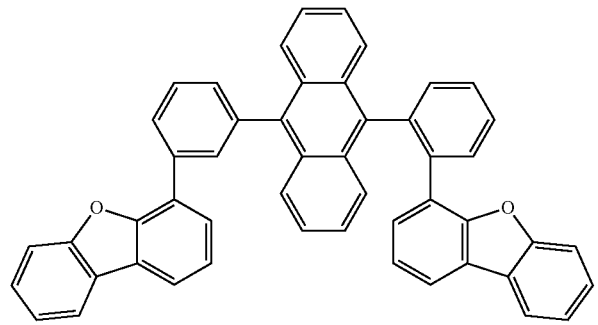
[Formula 63]
EM257
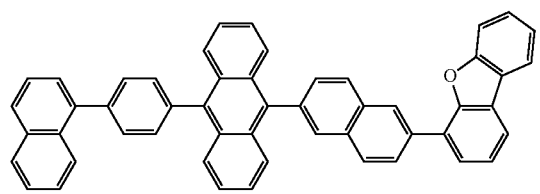
EM258
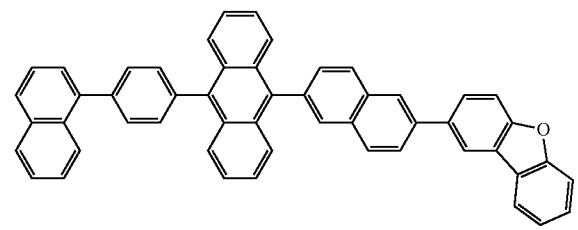
EM259
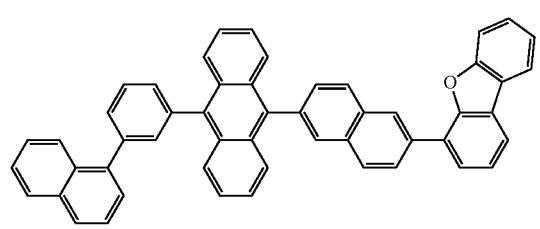
EM260
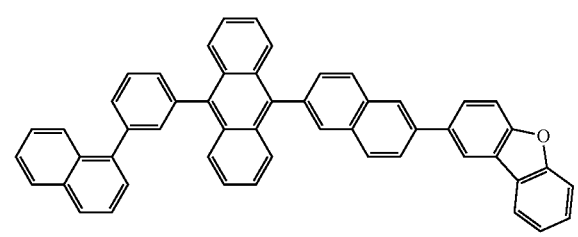

-continued
EM261
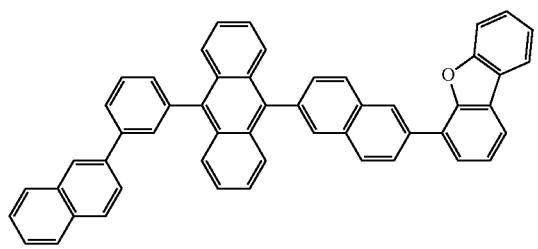
[Formula 64]
EM262
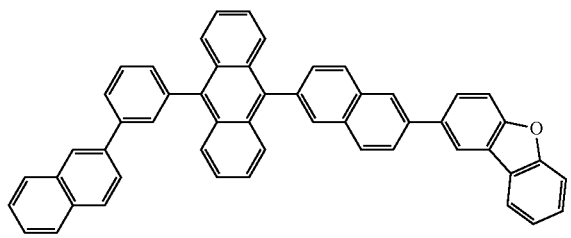
EM263
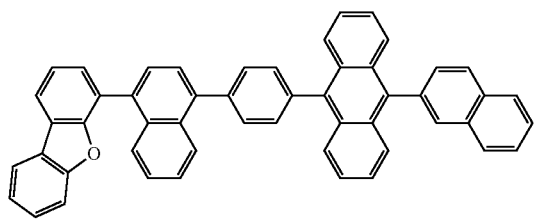
EM264
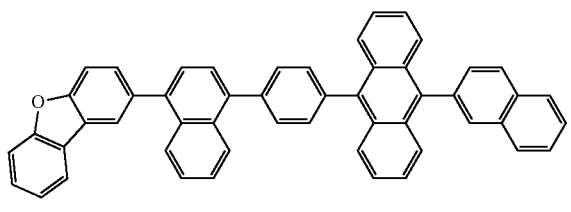
EM265
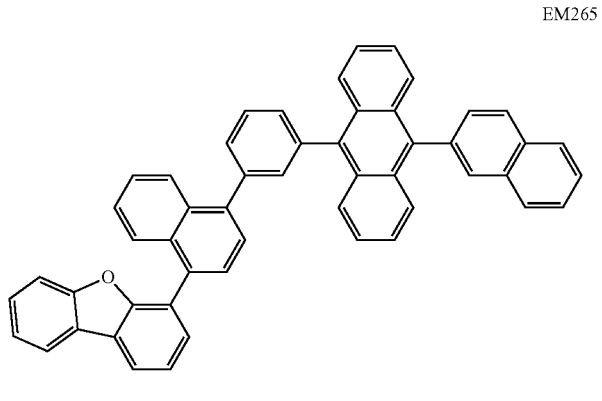
EM266
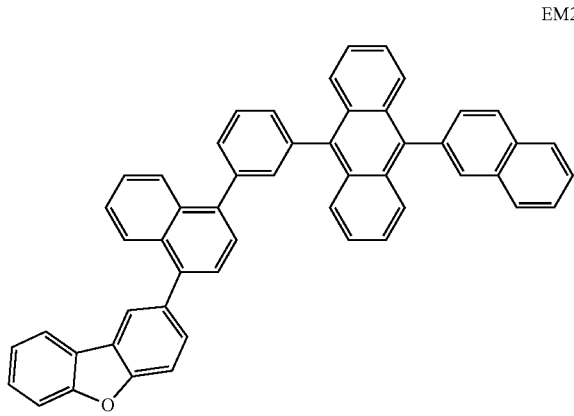
EM267
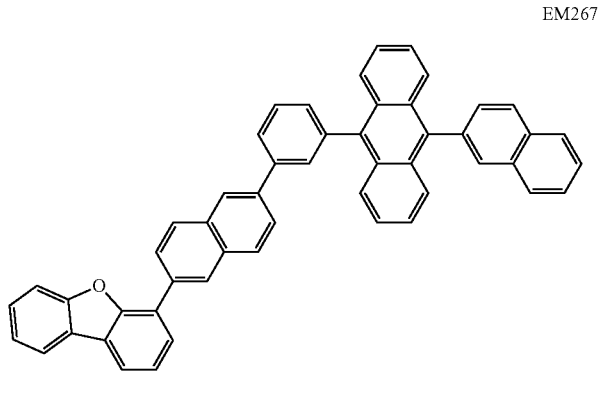
EM268
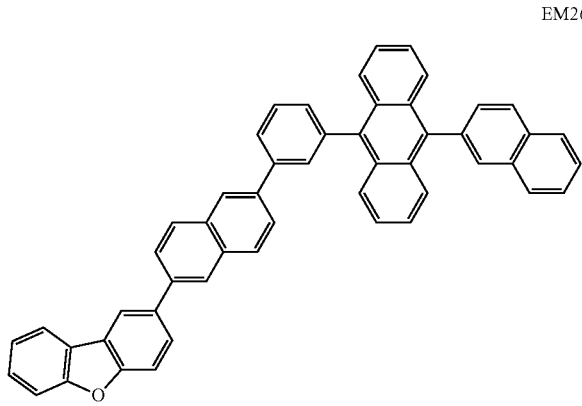

[Formula 65]
EM269
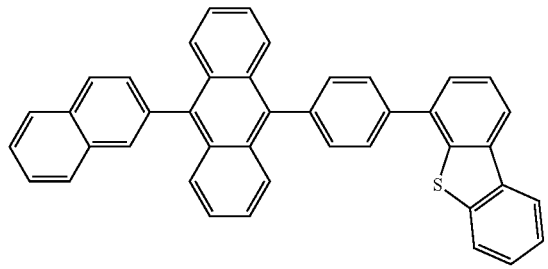
EM270
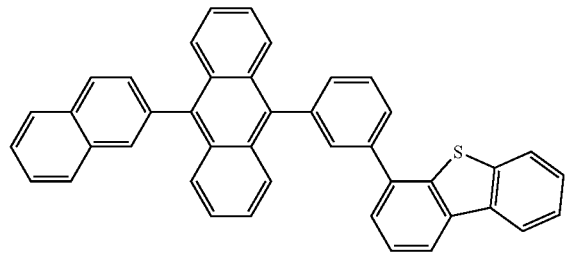
EM271
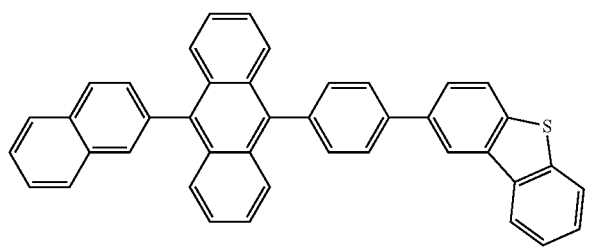
EM272
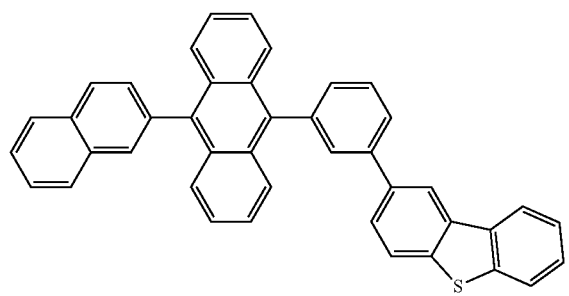
EM273
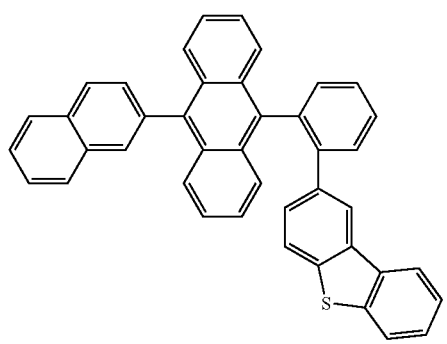
EM274
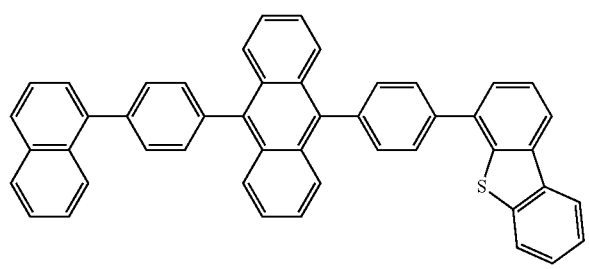
EM275
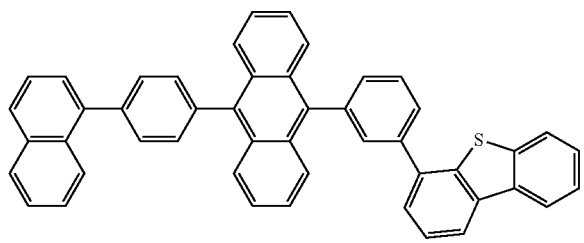
EM276
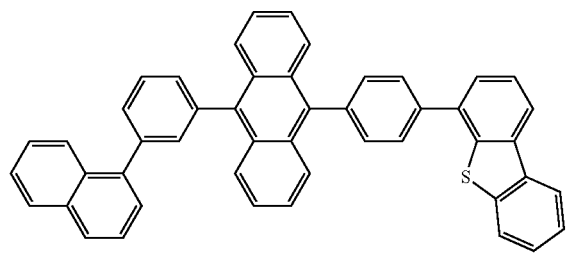
EM277
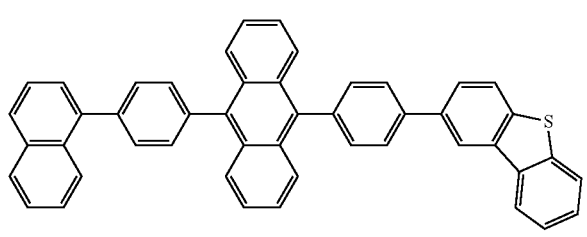
EM278
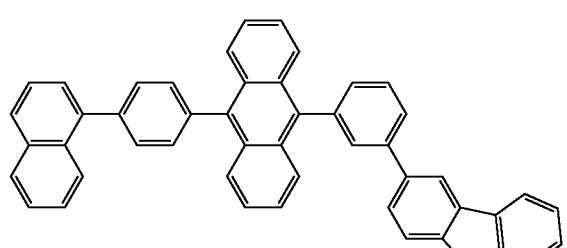

EM279
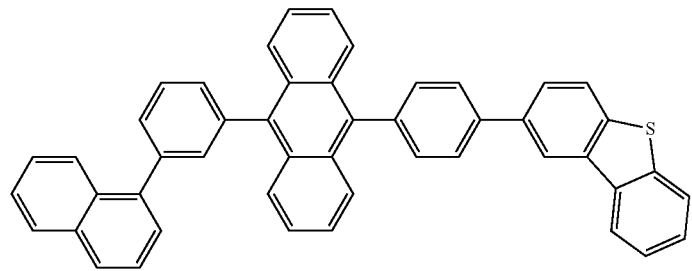
[Formula 66]
EM280　　　　　　　　　　　　EM281
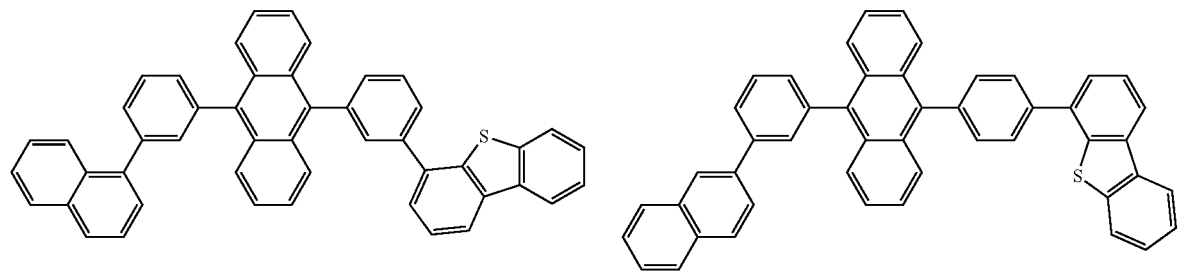
EM282　　　　　　　　　　　　EM283
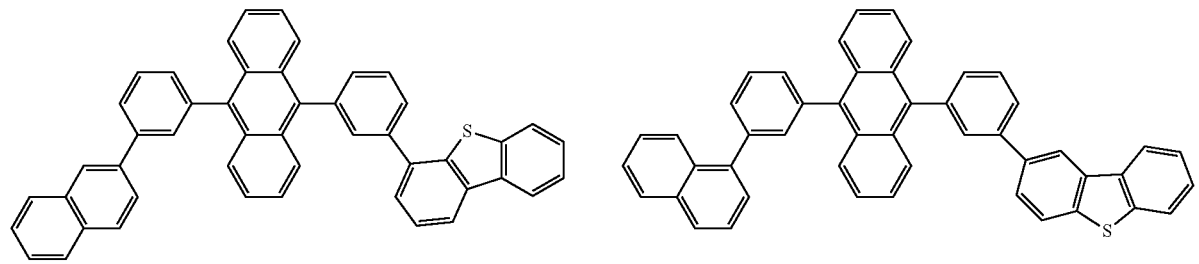
EM284　　　　　　　　　　　　EM285
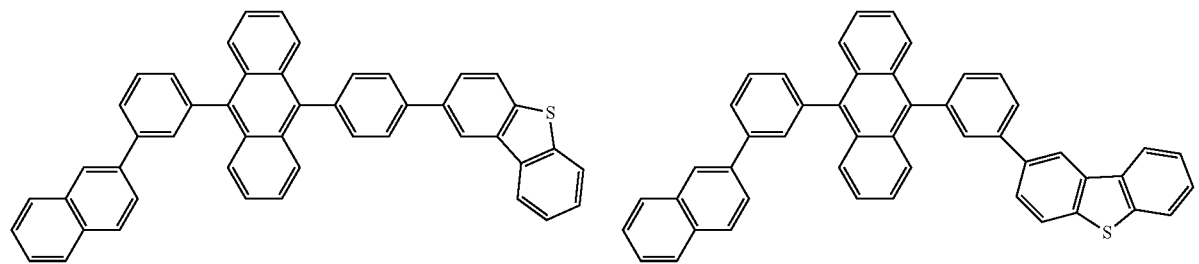
EM286　　　　　　　　　　　　EM287
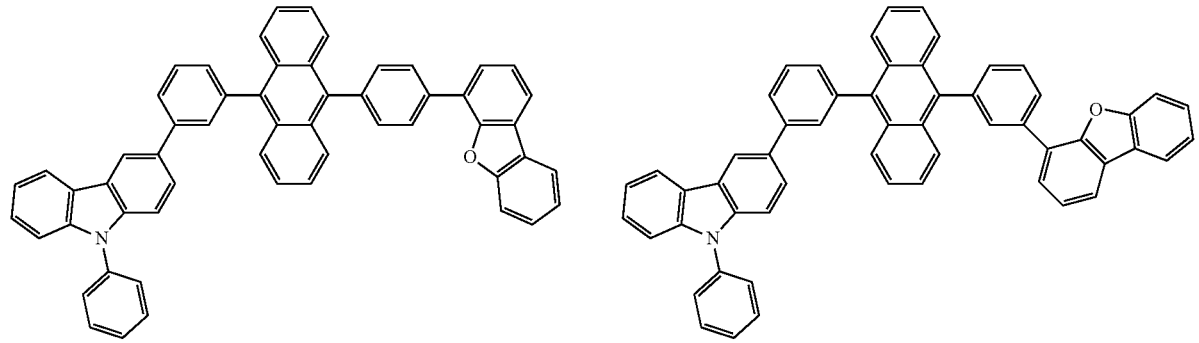

-continued
EM288
EM289
EM290
EM291
[Formula 67]
EM292
EM293
EM294
EM295
EM296
EM297
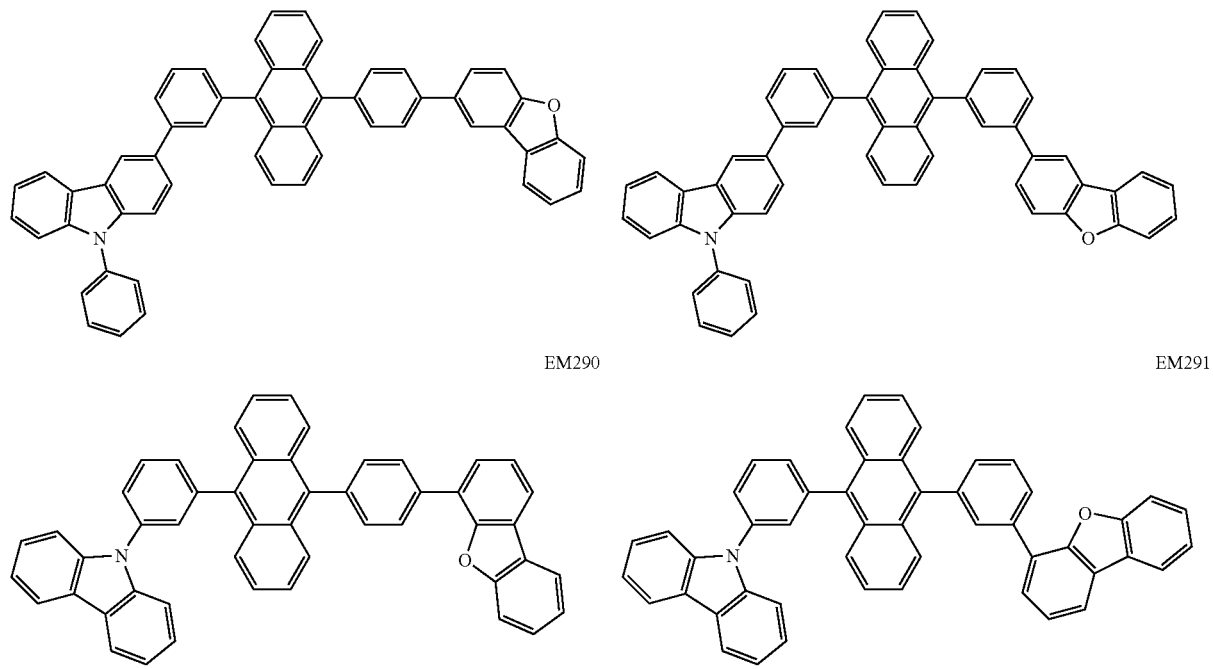
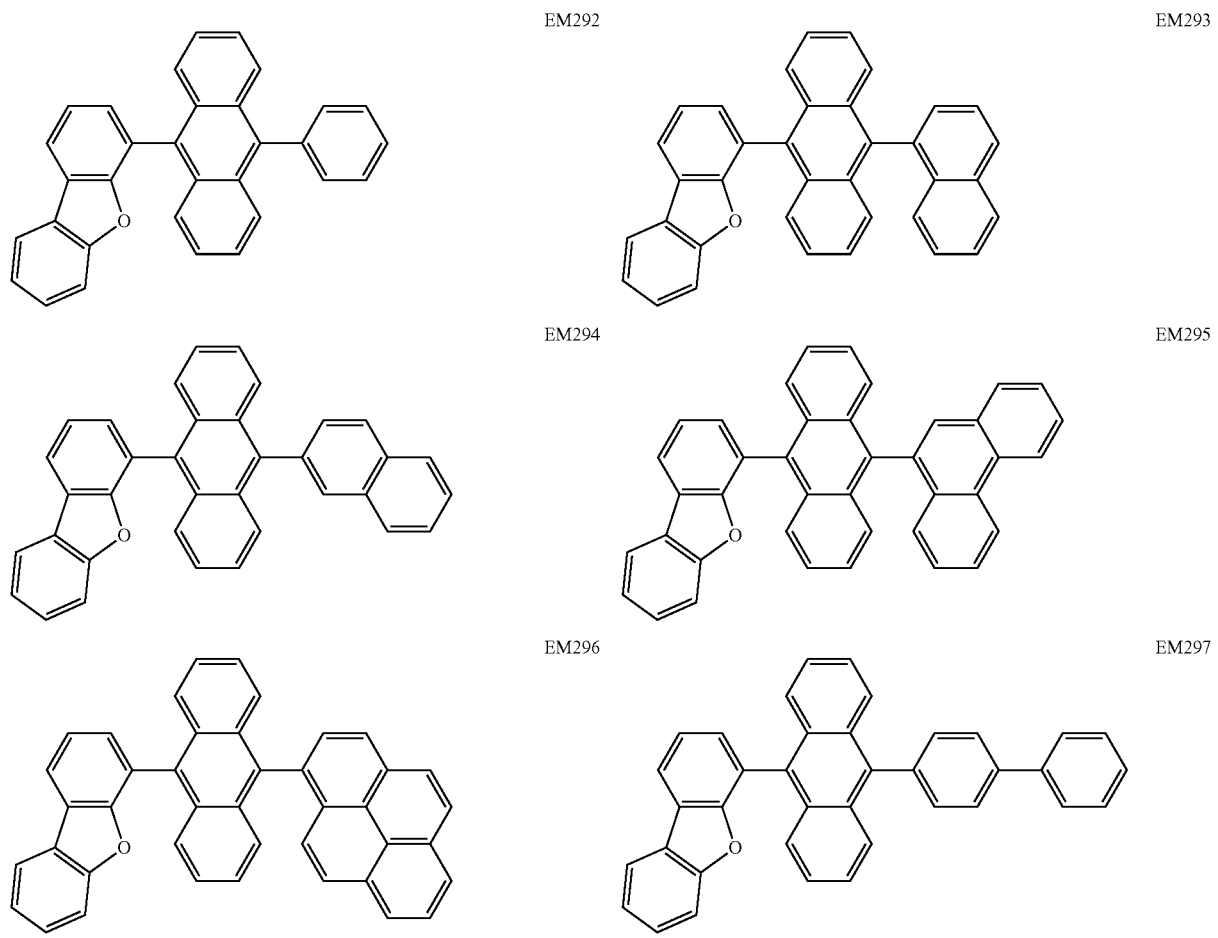

[Formula 68]
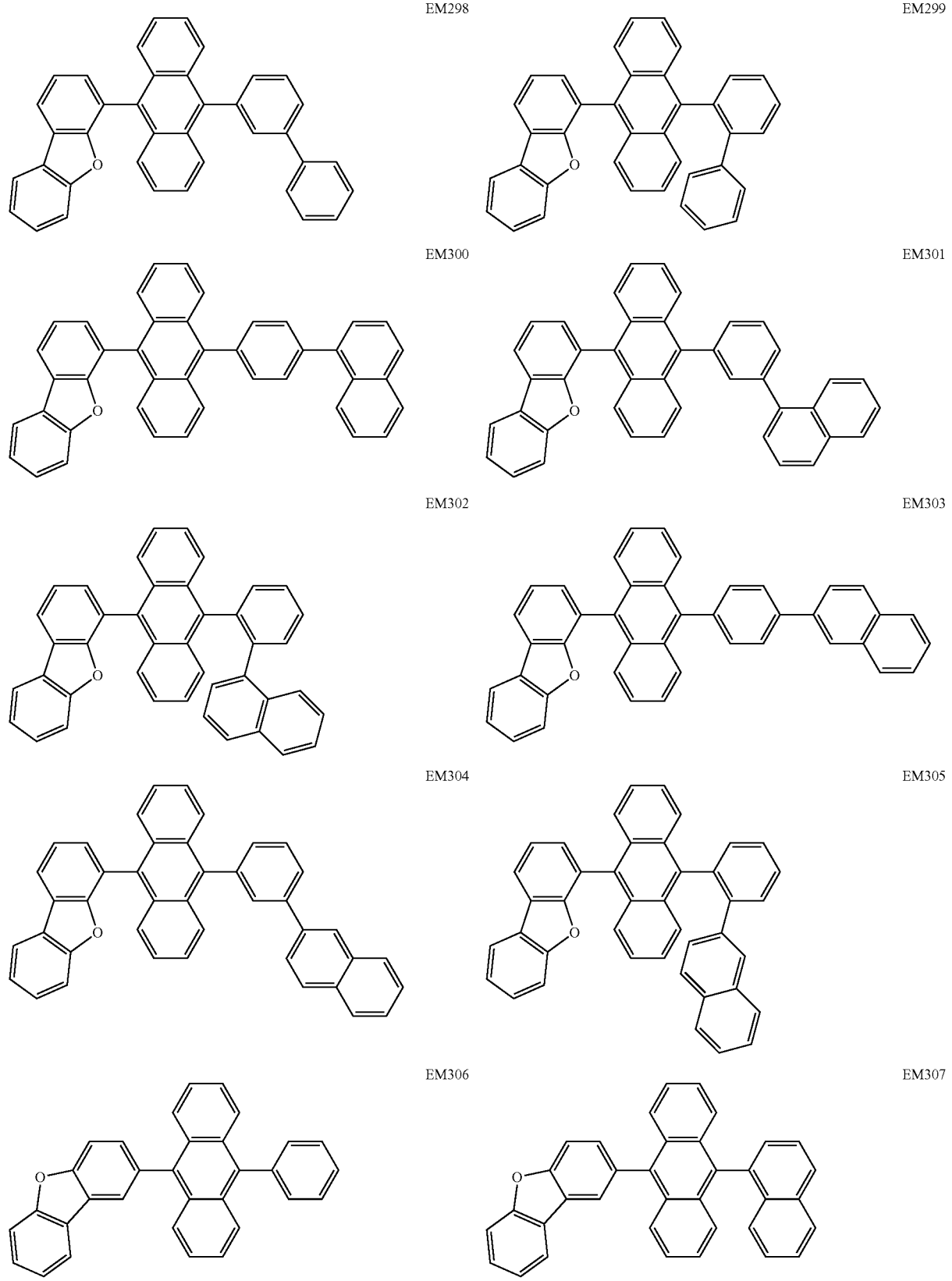

EM308
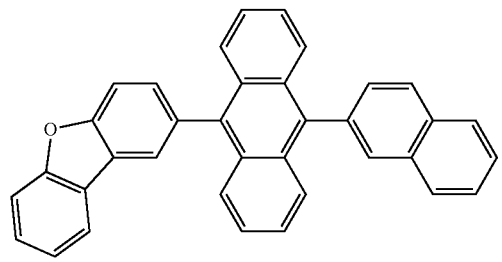
[Formula 69]
EM309
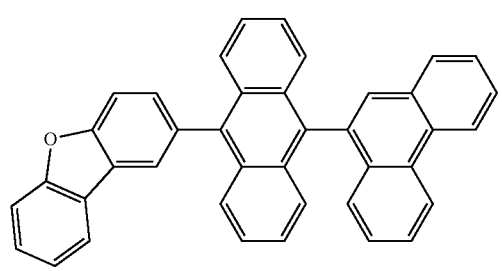
EM310
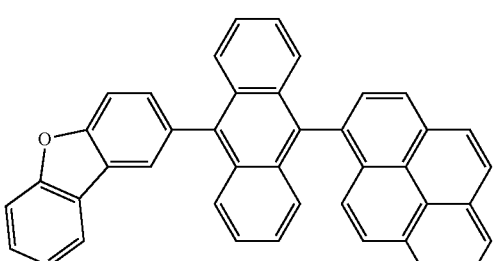
EM311
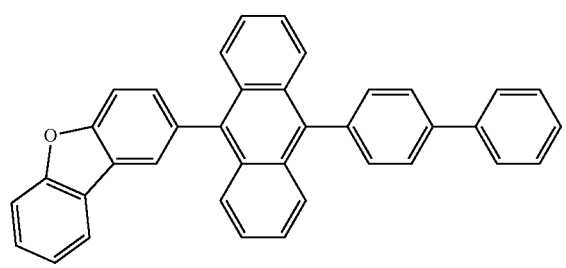
EM312
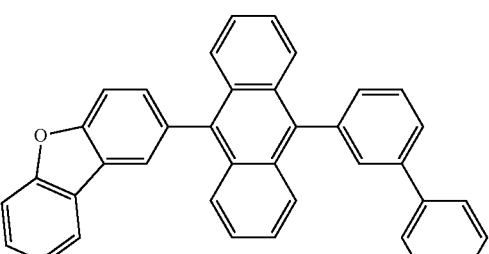
EM313
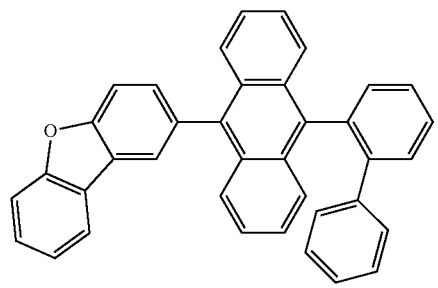
EM314
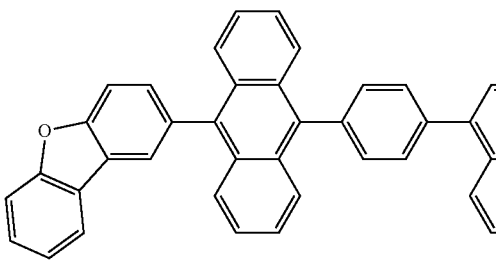
EM315
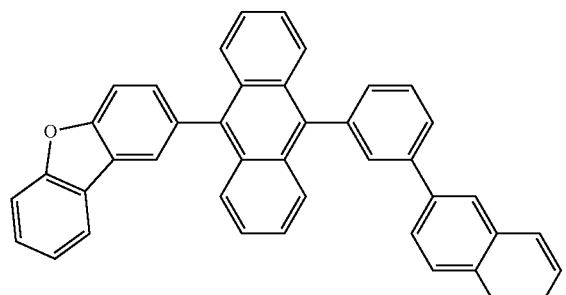
EM316
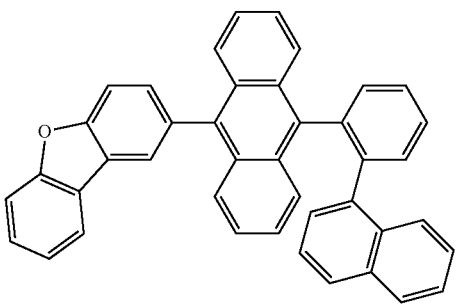

-continued
EM317
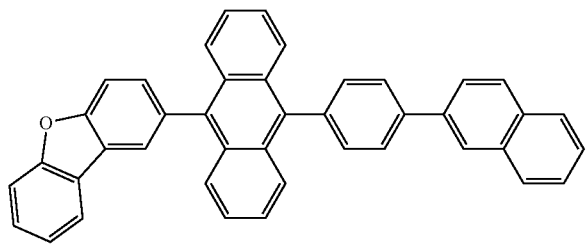
EM318
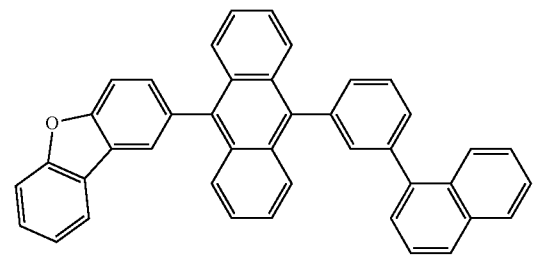
EM319
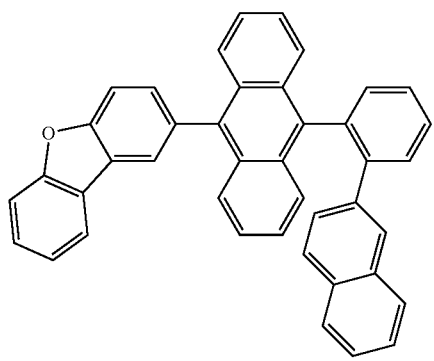
EM320
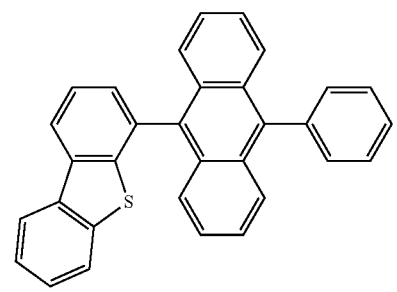
EM321
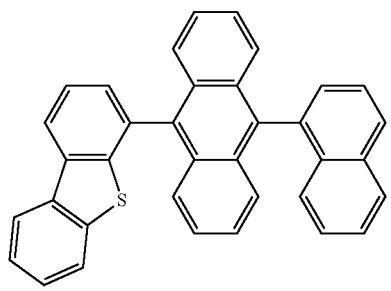
EM322
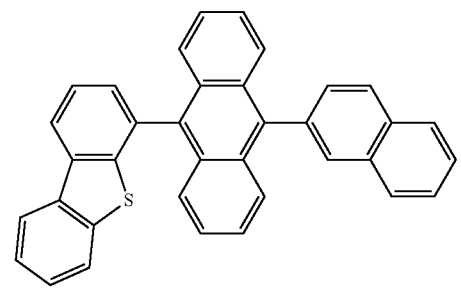
EM323
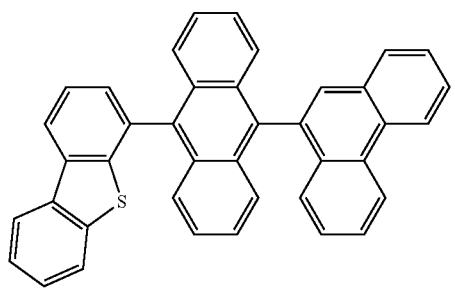
[Formula 70]
EM324
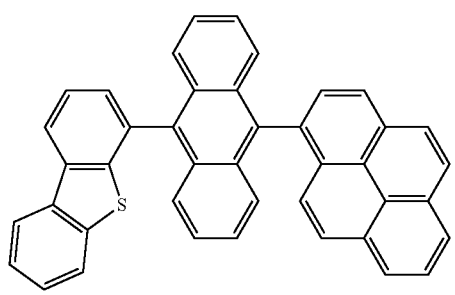
EM325
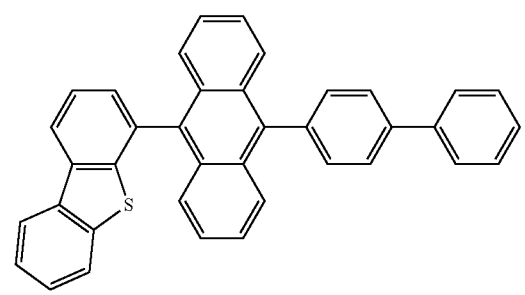

-continued
EM326
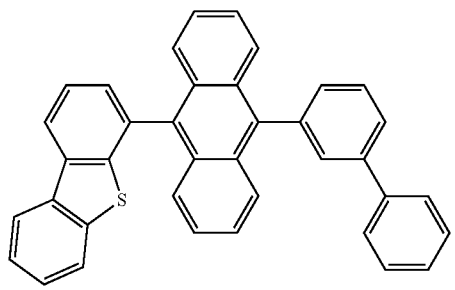
EM327
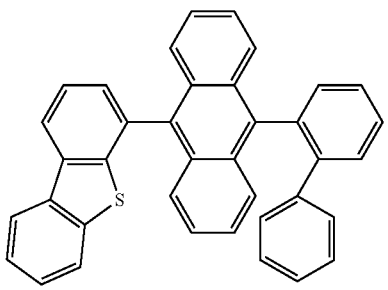
EM328
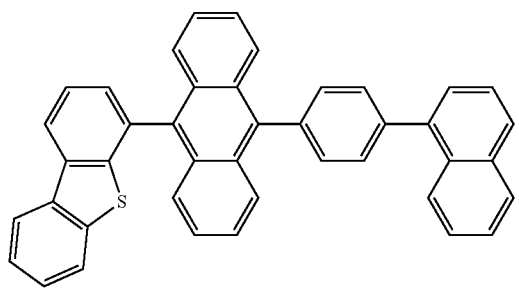
EM329
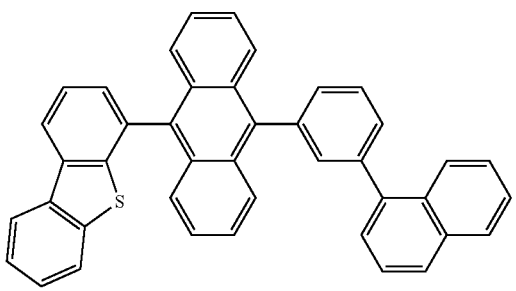
EM330
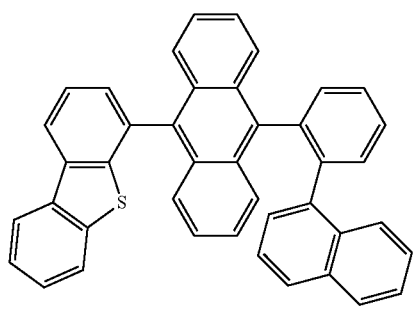
EM331
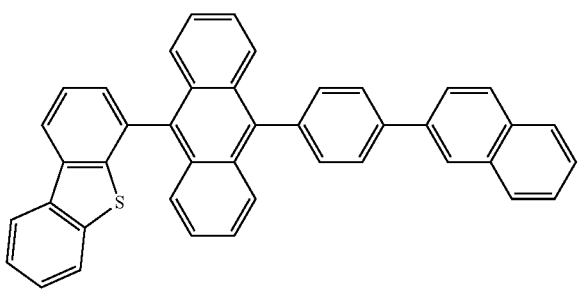
EM332
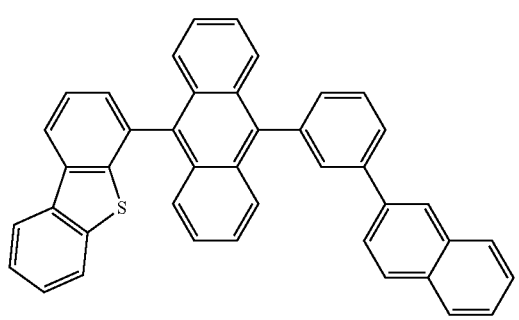
EM333
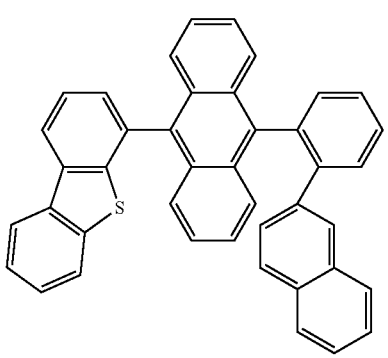
EM334
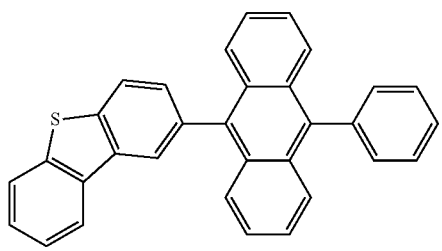
EM335
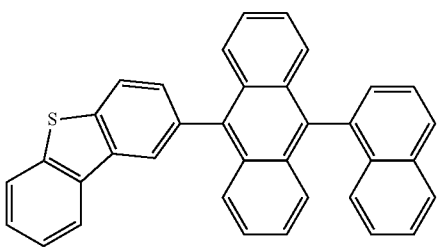

-continued
EM336
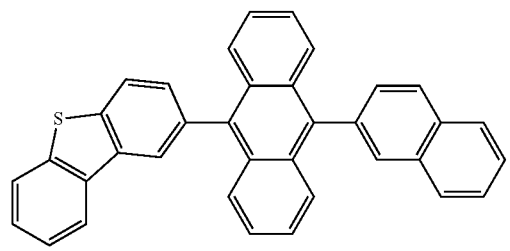
EM337
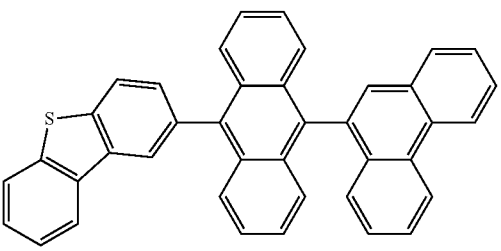
EM338
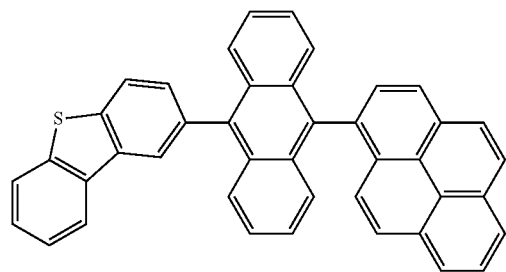
EM339
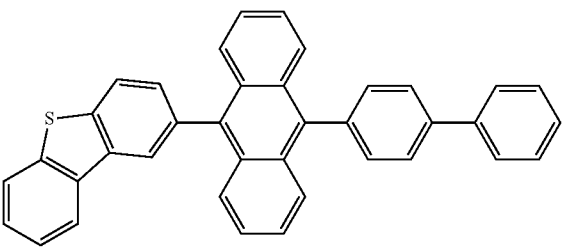
EM340
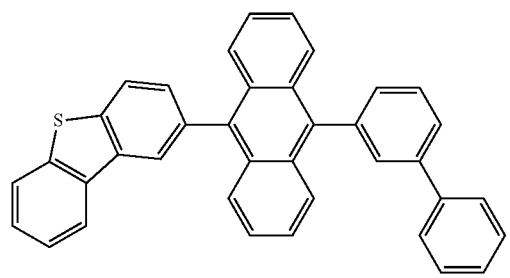
EM341
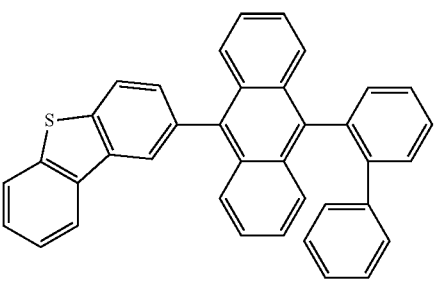
EM342
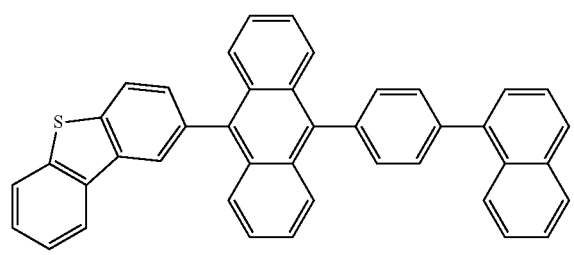
EM343
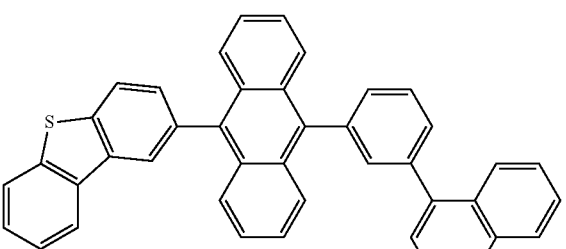
EM344
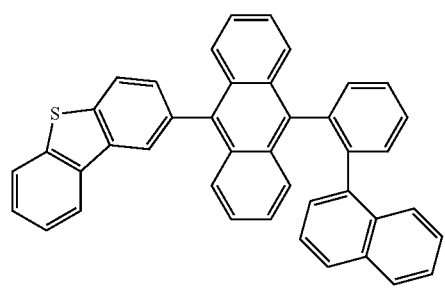
EM345
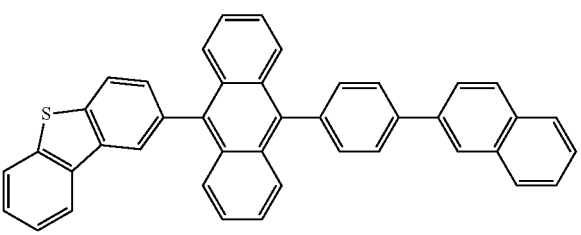

-continued
EM346
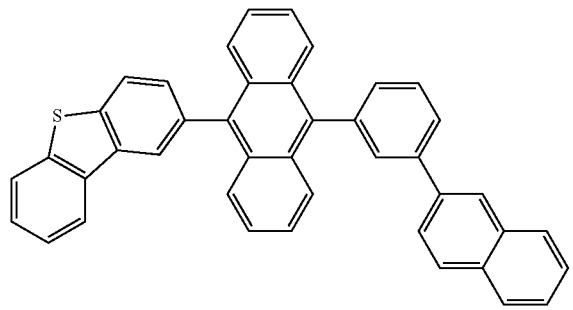
EM347
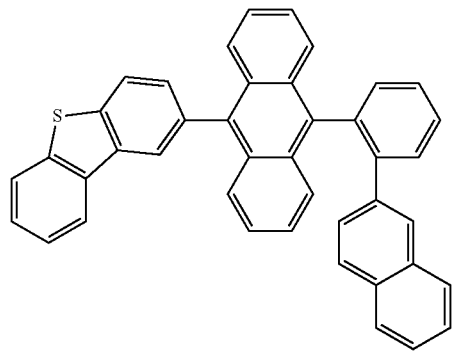
[Formula 71]
EM348
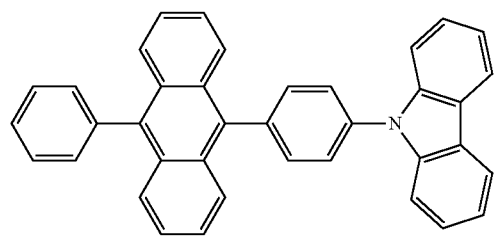
EM349
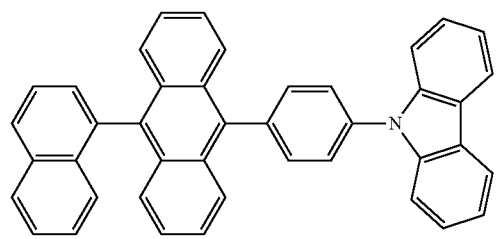
EM350
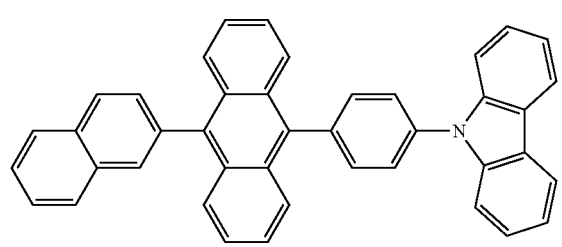
EM351
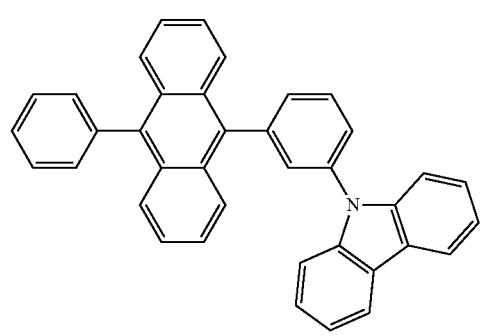
EM352
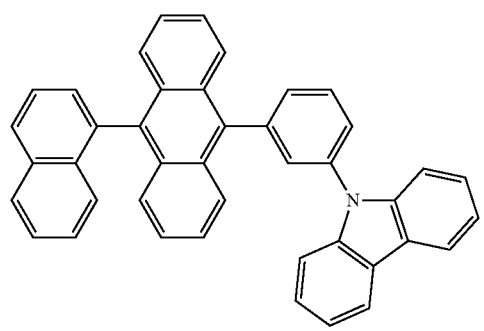
EM353
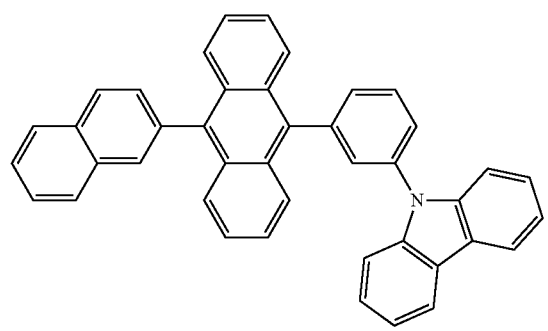
EM354
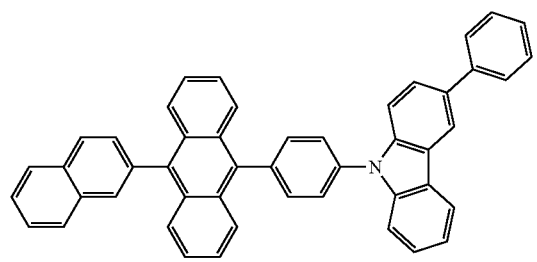
EM355
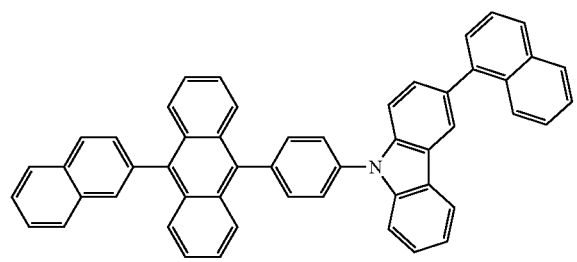

-continued
EM356
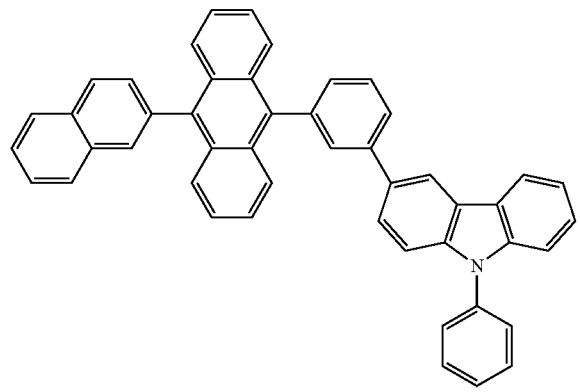
EM357
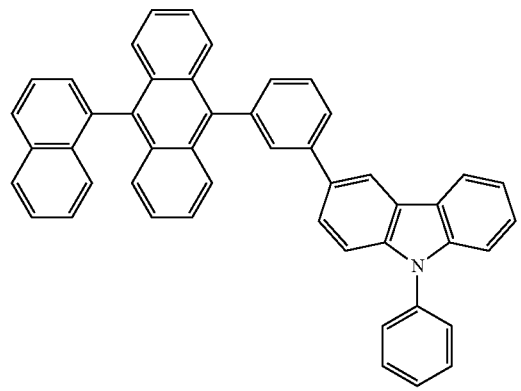
[Formula 72]
EM358
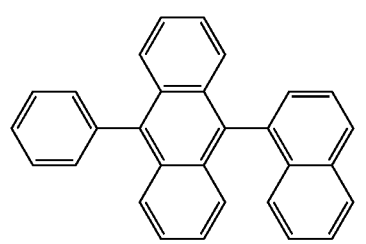
EM359
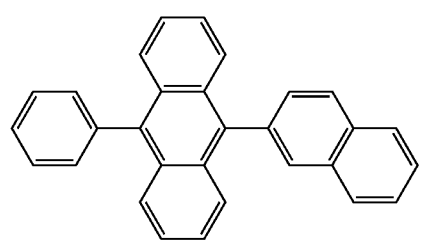
EM360
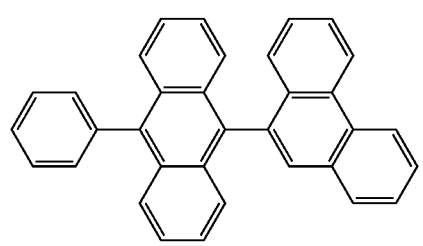
EM361
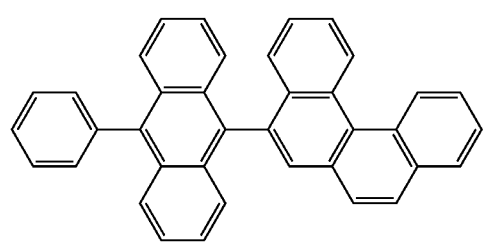
EM362
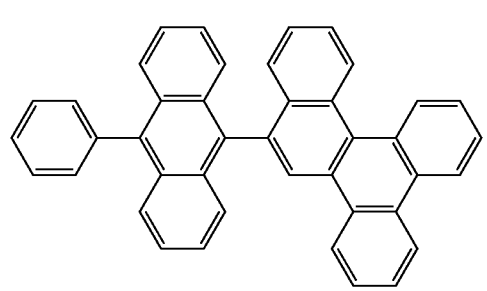
EM363
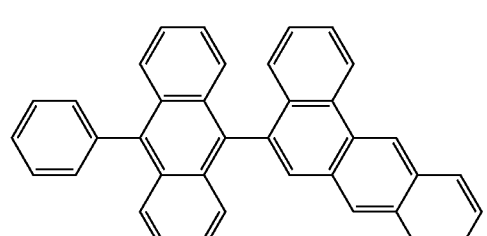
EM364
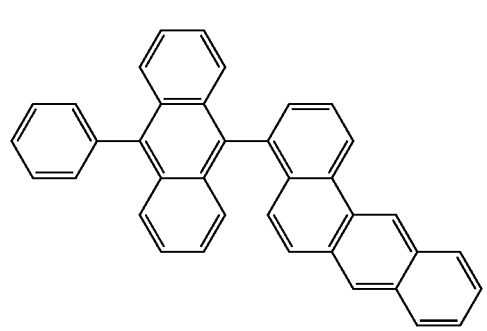
EM365
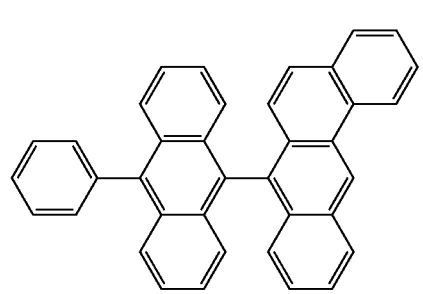

-continued
EM366
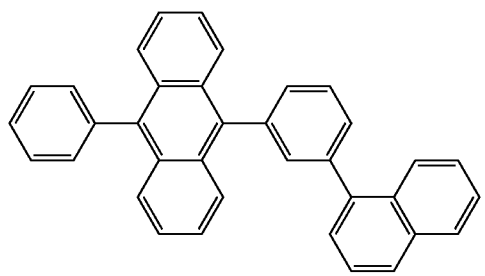
EM367
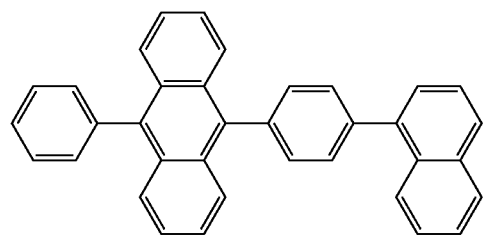
EM368
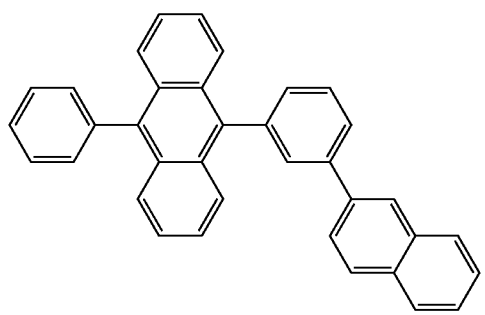
EM369
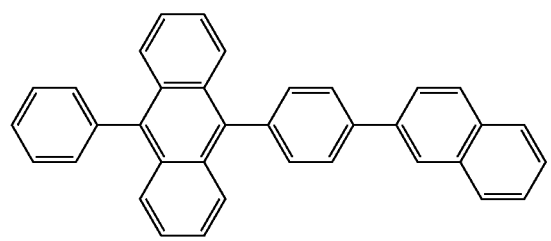
EM370
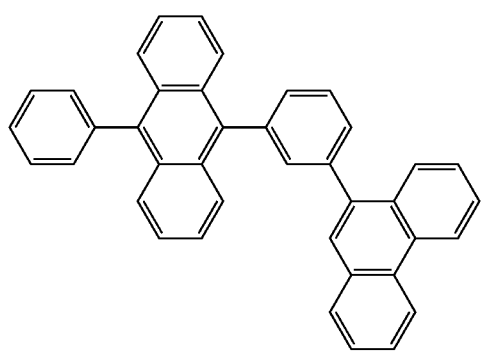
EM371
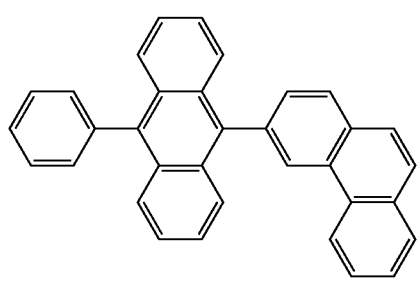
EM372
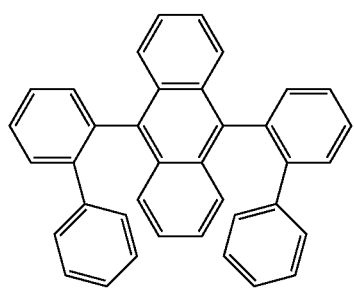
[Formula 73]
EM373
EM374
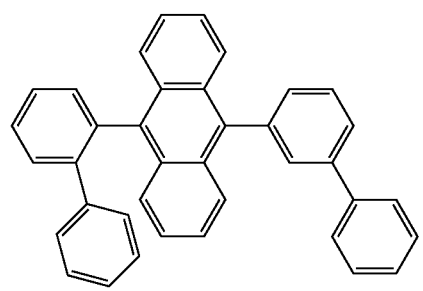

-continued
EM375
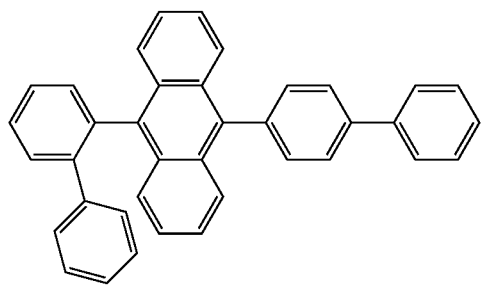
EM376
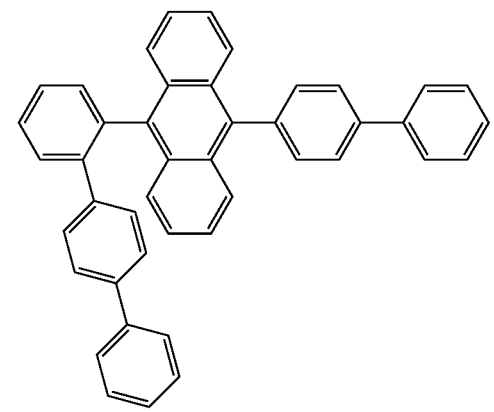
EM377
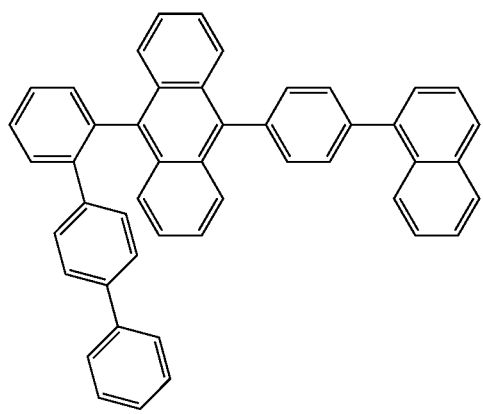
EM378
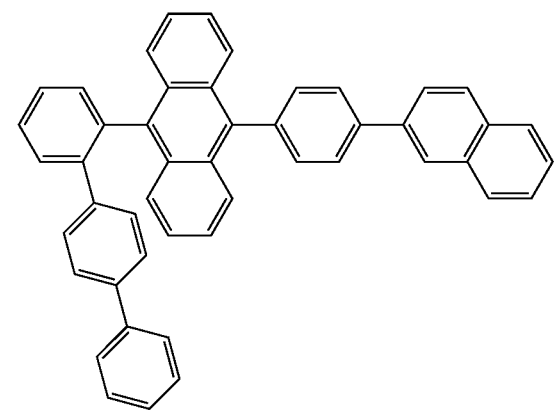
EM379
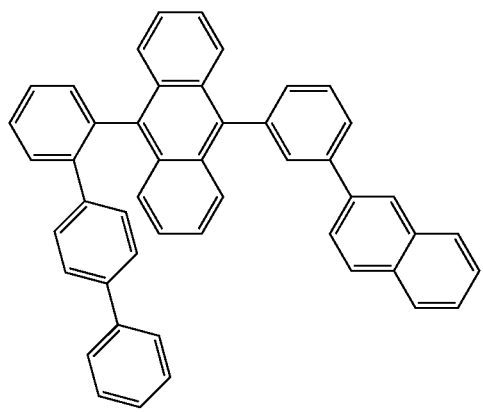
EM380
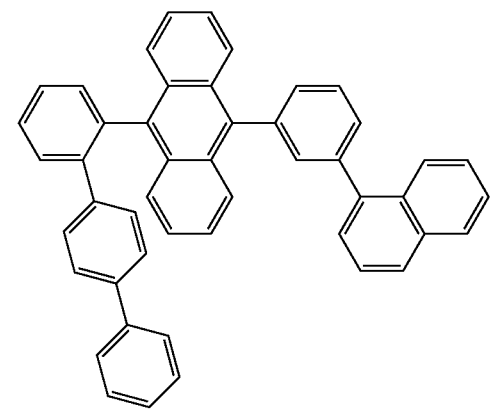
[Formula 74]
EM381
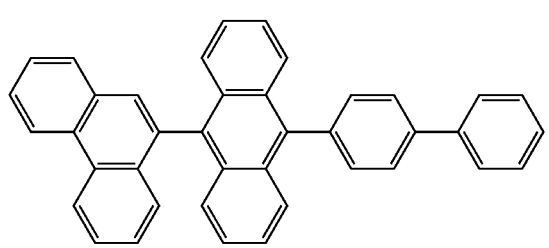
EM382
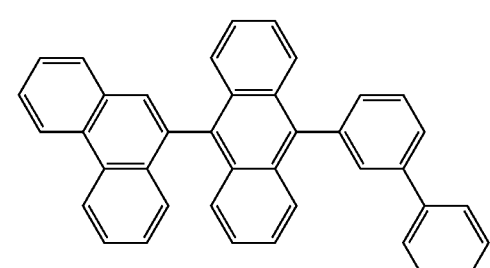

-continued
EM383
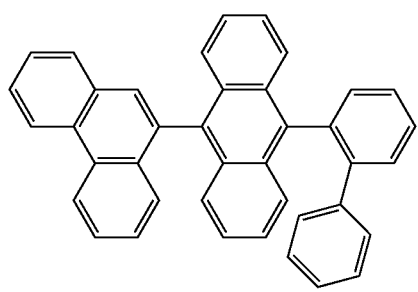
EM384
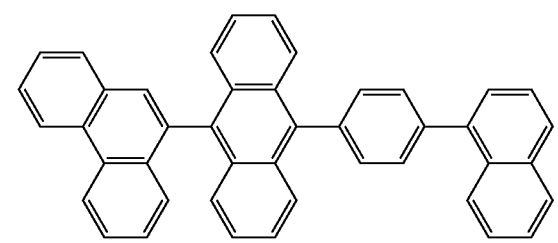
EM385
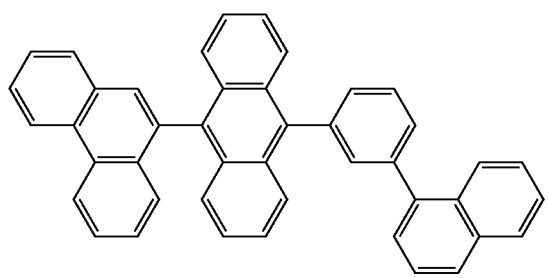
EM386
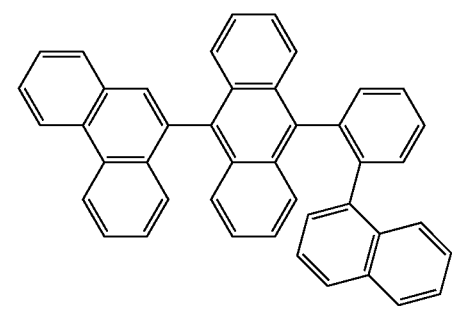
EM387
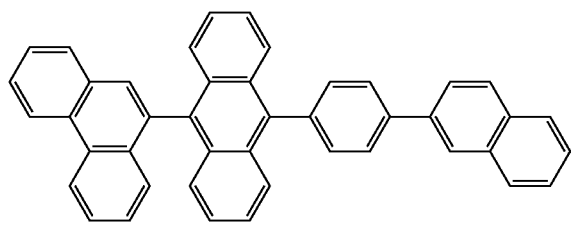
EM388
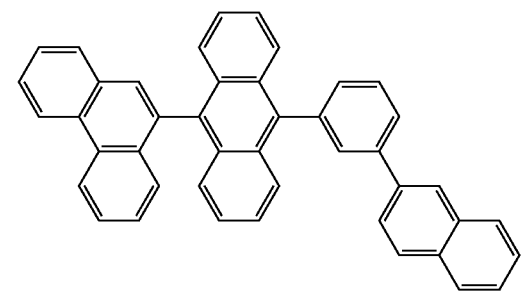
EM389
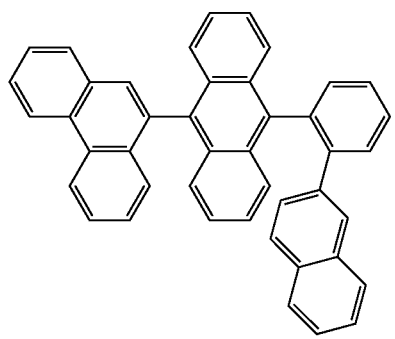
EM390
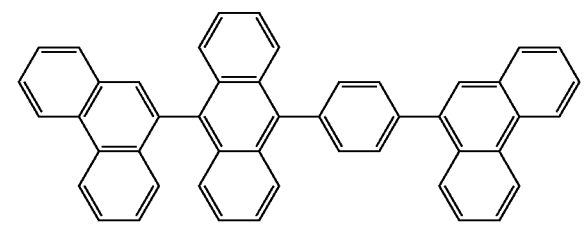

-continued
EM391

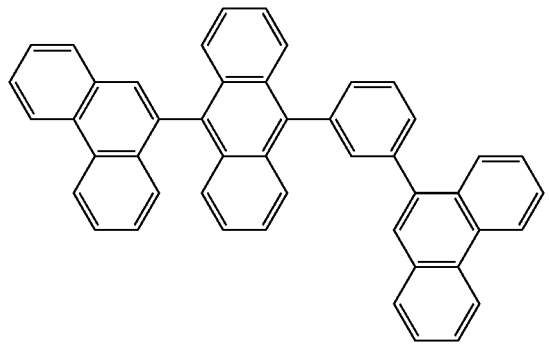

EM392

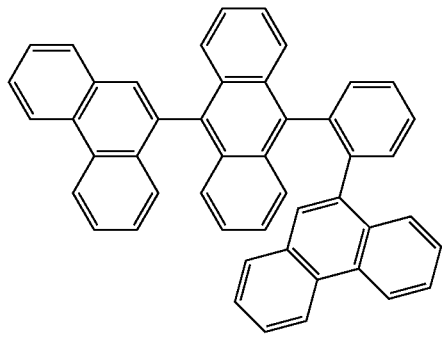

Pyrene Derivative

In the organic EL device according to the exemplary embodiment, at least one layer forming the organic thin-film layer may contain the aromatic amine derivative represented by the formula (1) and a pyrene derivative represented by the following formula (30). The emitting layer preferably contains the aromatic amine derivative as a dopant material and the pyrene derivative as a host material.

[Formula 75]

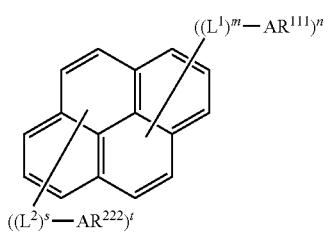

(30)

In the formula (30), $Ar^{111}$ and are each independently a substituted or unsubstituted aryl group having 6 to 30 ring carbon atoms.

In the formula (30), $L^1$ and $L^2$ are each independently a substituted or unsubstituted divalent aryl group having 6 to 30 ring carbon atoms or a heterocyclic group.

In the formula (30), m is an integer of 0 to 1, n is an integer of 1 to 4, s is an integer of 0 to 1 and t is an integer of 0 to 3.

In the formula (30), $L^1$ or $Ar^{111}$ is bonded to any one of the 1- to 5-positions of pyrene while $L^2$ or $Ar^{222}$ is bonded to any one of the 6- to 10-positions of pyrene.

The above explanation of the expression "substituted or unsubstituted" is also applicable to the substituents for the $Ar^{111}$, $Ar^{222}$, $L^1$ and $L^2$ in the formula (30).

In the formula (30), $L^1$ and $L^2$ are each selected from among a substituted or unsubstituted phenylene group, a substituted or unsubstituted biphenylene group, a substituted or unsubstituted naphtylene group, a substituted or unsubstituted terphenylene group, a substituted or unsubstituted fluorenylene group and a divalent aryl group formed by combining the above groups.

In the formula (30), m is preferably an integer of 0 to 1.
In the formula (30), n is preferably an integer of 1 to 2.
In the formula (30), s is preferably an integer of 0 to 1.
In the formula (30), t is preferably an integer of 0 to 2.

Examples, of the aryl group for $Ar^{111}$ and $Ar^{222}$ in the formula (30) are the same as ones listed for $R_2$, $R_3$, $R_4$, $R_5$, $R_7$, $R_8$, $R_9$ and $R_{10}$ in the formula (1). The aryl group is preferably a substituted or unsubstituted aryl group having 6 to 20 ring carbon atoms, more preferably a substituted or unsubstituted aryl group having 6 to 16 ring carbon atoms. Specific preferable examples of the aryl group are a phenyl group, naphthyl group, phenanthryl group, fluorenyl group, biphenyl group, anthryl group and pyrenyl group.

Other Applications of Compounds

The aromatic amine derivative, the anthracene derivative of the formula (20) and the pyrene derivative of the formula (30) according to the invention are also usable for the hole injecting layer, the hole transporting layer, the election injecting layer and the electron transporting layer as well as for the emitting layer.

Other Materials Usable for Emitting Layer

Examples of a material usable for the emitting layer in combination with the aromatic amine derivative according to the invention in place of the materials of the formulae (20) and (30) are fused polycyclic aromatic compounds such as naphthalene, phenanthrene, anthracene, tetracene, pyrene, perylene, chrysene, decacyclene, coronene, tetraphenylcyclopentadiene, pentaphenycyclopentadiene, fluorene and spirofluorene and derivatives thereof, organic metal complexes such as tris(8-quinolinolate)aluminum, triaryl amine derivative, styrylamine derivative, stilbene derivative, coumarin derivative, pyrane derivative, oxazone derivative, benzothiazole derivative, benzoxazole derivative, benzimidazole derivative, pyrazine derivative, cinnamic acid ester derivative, diketopyrolopyrrol derivative, acridone derivative, and quinacridone derivative. Incidentally, these examples are not exhaustive.

Content

When the organic thin-film layer contains the aromatic amine derivative according to the invention as a dopant material, the content of the aromatic amine derivative is preferably in a range from 0.1 mass % to 20 mass %, more preferably from 1 mass % to 10 mass %.

Substrate

The organic EL device according to the exemplary embodiment is made on a light-transmissive substrate. The light-transmissive substrate, which is designed to support the organic EL device, is preferably provided by a smoothly shaped substrate that transmits 50% or more of light in a visible region of 400 nm to 700 nm. Further, the substrate preferably has a mechanical and thermal strength.

Specifically, a glass plate, a polymer plate and the like are preferable.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used. Incidentally, polymer film may be used as the substrate.

Anode and Cathode

An electrically conductive material with a work function more than 4 eV is favorably usable as a material for the anode of the organic EL device according to the exemplary embodiment. Specific examples of the usable electrically conductive material are carbon, aluminum, vanadium, iron, cobalt, nickel, tungsten, silver, gold, platinum and palladium and alloys thereof, metal oxides such as tin oxide and indium oxide that are usable for ITO substrate and NESA substrate, and organic electrically conductive resins such as polythiophene and polypyrrole. The anode can be made by forming a thin film from these electrically conductive materials by vapor deposition, sputtering or the like.

When light from the emitting layer is to be emitted through the anode, the anode preferably transmits more than 10% of the light in the visible region. The sheet resistance of the anode is preferably several hundreds Ω/square or lower. Although depending on the material of the anode, the thickness of the anode is typically in a range from 10 nm to 1 µm, preferably in a range from 10 nm to 200 nm.

An electrically conductive material with a work function less than 4 eV is favorably usable as a material for the cathode of the organic EL device according to the exemplary embodiment. Specific examples of the usable electrically conductive material are magnesium, calcium, tin, zinc, titanium, yttrium, lithium, ruthenium, manganese, aluminum and lithium fluoride and alloys thereof, which are not exhaustive. Typical examples of the alloys are magnesium and silver, magnesium and indium, and lithium and aluminum, which are not exhaustive. The ratio of the alloys is controlled depending on the temperature of a deposition source, atmosphere, vacuum degree and the like to be appropriately adjusted. Like the anode, the cathode may be made by forming a thin film from the above materials through a method such as vapor deposition or sputtering. In addition, the light may be emitted through the cathode.

When light from the emitting layer is to be emitted through the cathode, the cathode preferably transmits more than 10% of the light in the visible region. The sheet resistance of the cathode is preferably several hundreds Ω per square or lower. Although depending on the material of the cathode, the thickness of the cathode is typically in a range from 10 nm to 1 µm, preferably in a range from 50 nm to 200 nm.

The anode and the cathode may be formed in a multilayer structure including two or more layers as needed.

At least one surface of the organic EL device according to the exemplary embodiment preferably has a sufficient transparency in an emission wavelength range of the device so that the device can efficiently emit light. Further, it is preferable that the substrate is also transparent. A transparent electrode is adjusted to exhibit a predetermined light-transmittance through a method such as vapor deposition and sputtering using the above electrically conductive material.

Hole Injecting/Transporting Layer

For the hole injecting/transporting layer, the following hole injecting material and hole transporting layer are usable.

The hole injecting material is preferably a compound that is capable of transporting holes, has an excellent effect in injecting holes from the anode and in injecting holes into the emitting layer or a light-emitting material, and has an excellent ability to form a thin film. Specific examples of such a compound are a phthalocyanine derivative, naphthalocyanine derivative, porphyrin derivative, benzidine-based triphenylamine, diamine-based triphenylamine and hexacyanohexaazatriphenylene and derivatives thereof as well as polymer materials such as polyvinyl carbazole, polysilane and electrically conductive polymers, which are not exhaustive.

Among hole injecting materials usable for the organic EL device according to the exemplary embodiment, a phthalocyanine derivative is further effective.

Examples of the phthalocyanine (Pc) derivative are phthalocyanine derivatives and naphthalocyanine derivatives such as H2Pc, CuPc, CoPc, NiPc, ZnPc, PdPc, FePc, MnPc, ClAlPc, ClGaPc, ClInPc, ClSnPc, Cl2SiPc, (HO)AlPc, (HO)GaPc, VOPc, TiOPc, MoOPc and GaPc-O—GaPc, which are not exhaustive.

Carrier may be sensitized by adding the hole injecting material with an electron acceptor substance such as a TCNQ derivative.

The hole transporting material usable for the organic EL device according to the exemplary embodiment is preferably an aromatic tertiary amine derivative.

Examples of the aromatic tertiary amine derivative are N,N'-diphenyl-N,N'-dinaphthyl-1,1'-biphenyl-4,4'-diamine, N,N,N',N'-tetrabiphenyl-1,1'-biphenyl-4,4'-diamine, and oligomers and polymers having aromatic tertiary amine skeletons thereof, which are not exhaustive.

Electron Injecting/Transporting Layer

For the electron injecting/transporting layer, the following electron injecting material and the like are usable.

The electron injecting material is preferably a compound that is capable of transporting electrons, has an excellent effect in injecting electrons from the cathode and in injecting electrons into the emitting layer or a light-emitting material, and has an excellent ability to form a thin film.

Further effective electron injecting materials for the organic EL device according to the exemplary embodiment are a metal complex compound and a nitrogen-containing heterocyclic derivative.

Examples of the metal complex compound are 8-hydroxyquinolinate lithium, bis(8-hydroxyquinolinate)zinc, tris(8-hydroxyquinolinate)aluminum, tris(8-hydroxyquinolinate)gallium, bis(10-hydroxybenzo[h]quinolinate)beryllium and bis(10-hydroxybenzo[h]quinolinate)zinc, which are not exhaustive.

Examples of the nitrogen-containing heterocyclic derivative are oxazole, thiazole, oxadiazole, thiadiazole, triazole, pyridine, pyrimidine, triazine, phenanthroline, benzimidazole and imidazopyridine, among which a benzimidazole derivative, a phenanthroline derivative and an imidazopyridine derivative are preferable.

In the organic EL device according to the exemplary embodiment, it is preferable that, for instance, these electron injecting materials are further added with at least one of an electron-donating dopant and an organic metal complex. More preferably, in order to facilitate reception of electrons from the cathode, at least one of the electron-donating dopant and the organic metal complex is doped in the vicinity of an interface between the organic thin-film layer and the cathode.

With this arrangement, the organic EL device can emit light with enhanced luminance intensity and have a longer lifetime.

The electron-donating dopant is exemplified by at least one selected from among alkali metal, alkali metal compound, alkaline earth metal, alkaline earth metal compound, rare earth metal and rare earth metal compound.

The organic metal complex is exemplified by at least one selected from among an organic metal complex containing an alkali metal, an organic metal complex containing an alkaline earth metal, and an organic metal complex containing a rare earth metal.

Examples of, the alkali metal are lithium (Li) (work function: 2.93 eV), sodium (Na) (work function: 2.36 eV), potassium (K) (work function: 2.28 eV) rubidium (Rb) (work function: 2.16 eV) and cesium (Cs) (work function: 1.95 eV), among which a substance having a work function of 2.9 eV or less is particularly preferable. Among the above, the alkali metal is preferably K, Rb or Cs, more preferably Rb or Cs, the most preferably Cs.

Examples of the alkaline earth metal are calcium (Ca) (work function: 2.9 eV), strontium (Sr) (work function: no less than 2.0 eV and no more than 2.5 eV) and barium (Ba)(work function: 2.52 eV), among which a substance having a work function of 2.9 eV or less is particularly preferable.

Examples of the rare earth metal are scandium (Sc), yttrium (Y), cerium (Ce), terbium (Tb) and ytterbium (Yb), among which a substance having a work function of 2.9 eV or less is particularly preferable.

Since the above preferable metals have particularly high reducibility, addition of a relatively small amount of the metals to an electron injecting zone can enhance luminance intensity and lifetime of the organic EL device.

Examples of the alkali metal compound are alkali oxides such as lithium oxide ($Li_2O$), cesium oxide ($Cs_2O$) and potassium oxide ($K_2O$) and alkali halogenides such as lithium fluoride (LiF), sodium fluoride (NaF), cesium fluoride (CsF) and potassium fluoride (KF), among which lithium fluoride (LiF), lithium oxide ($Li_2O$) and sodium fluoride (NaF) are preferable.

Examples of the alkaline earth metal compound are barium oxide (BaO), strontium oxide (SrO) and calcium oxide (CaO) and mixtures thereof such as strontium acid barium ($Ba_xSr_{1-x}O$) (0<x<1) and calcium acid barium ($Ba_xCa_{1-x}O$) (0<x<1), among which BaO, SrO and CaO are preferable.

Examples of the rare earth metal compound are ytterbium fluoride ($YbF_3$), scandium fluoride ($ScF_3$), scandium oxide ($ScO_3$), yttrium oxide ($Y_2O_3$), cerium oxide ($Ce_2O_3$), gadolinium fluoride ($GdF_3$) and terbium fluoride ($TbF_3$), among which $YbF_3$, $ScF_3$ and $TbF_3$ are preferable.

The organic metal complex is not subject to a particular limitation as long as the organic metal complex contains at least one of alkali metal ion, alkaline earth metal ion and rare earth metal ion as a metal ion as described above. Preferable examples of a ligand are quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, β-diketones, azomethines and derivatives thereof, which are not exhaustive.

One of the above examples of the electron-donating dopant and the organic metal complex may be used alone or, alternatively, two or more thereof may be used in combination.

Method of Forming Each Layer in Organic EL Device

Each layer in the organic EL device according to the exemplary embodiment may be formed by any one of dry film-formation methods such as vacuum deposition, sputtering, plasma and ion plating and wet film-formation methods such as dipping, flow coating and ink-jet method.

According to the wet film-formation methods, a material for forming each layer is dissolved or dispersed in an appropriate solvent (e.g., ethanol, chloroform, tetrahydrofuran and dioxane) to form a thin film.

As a solution appropriate for such wet film-formation methods, an organic-EL-material-containing solution that contains the aromatic amine derivative according to the invention as the organic-EL-device material as well as a solvent is usable.

Any appropriate resin and/or additive may be added in each organic thin-film layer in order to improve film-formability and prevent a pin hole or the like from being formed in the film.

Film Thickness of Each Layer in Organic EL Device

The film thickness is not subject to a particular limitation but needs to be appropriately adjusted. An extremely increased film thickness increases an applied voltage required for obtaining a predetermined optical output, thereby deteriorating efficiency. An extremely reduced film thickness results in generation of a pin hole or the like, so that a sufficient luminescence intensity cannot be obtained when an electric field is applied. The film thickness is appropriately set in a range from 5 nm to 10 μm, more preferably from 10 nm to 0.2 μm.

Application of Organic EL Device

The organic EL device according to the exemplary embodiment is usable, for instance, for: a planar light-emitting device such as a flat panel display; a light source for a copier, a printer, a backlight for a liquid crystal display, or meters, gauges or the like; a lighting device; an indicator board; and a marker lamp. The compounds according to the invention are usable not only for an organic EL device but also for any fields such as electrophotographic photoreceptor, photoelectric converter, solar battery and image sensor.

Modifications of Exemplary Embodiment

It should be noted that the invention is not limited to the above exemplary embodiment but may include any modification and improvement as long as such modification and improvement are compatible with the invention.

For instance, in the emitting layer of the organic EL device according to the exemplary embodiment, in addition to one selected from among the aromatic amine derivatives represented by the formula (1), at least one of an light-emitting material, a doping material, a hole injecting material, a hole transporting material and an electron injecting material may also be contained in the same layer as the aromatic amine derivative. Further, in order to improve the stability of the organic EL device according to the exemplary embodiment to temperature, humidity, atmosphere or the like, a protection layer may be provided to a surface of the device or, alternatively, the device may be entirely protected with silicon oil, resin or the like.

The arrangement of the organic EL device is not limited to the exemplary arrangement of the organic EL device 1 shown in the FIGURE. For instance, the organic EL device has such an arrangement that an electron transporting layer is provided to a cathode-side of the blocking layer while an electron blocking layer is provided to an anode-side of the emitting layer.

A single emitting layer may be provided alone or a plurality of emitting layers may be provided in a multilayer structure. When the organic EL device includes the plurality of emitting layers, at least one of the emitting layers preferably contains the aromatic amine derivative according to the invention. In such a case, the other emitting layers may be fluorescent emitting layers that contain a fluorescent material to fluoresce or phosphorescent emitting layers that contain a phosphorescent material to phosphoresce.

When the organic EL device includes the plurality of emitting layers, the emitting layers may be adjacently provided or may be layered on one another via a different layer (e.g., a charge generating layer).

EXAMPLES

Next, the invention will be described in further detail with reference to Example(s) and Comparative(s). However, the invention is not limited by the description of Example(s).

Synthesis of Compound

Synthesis Example 1 (Synthesis of Compound 1)

A synthesis scheme of the compound 1 is shown below.

[Formula 76]

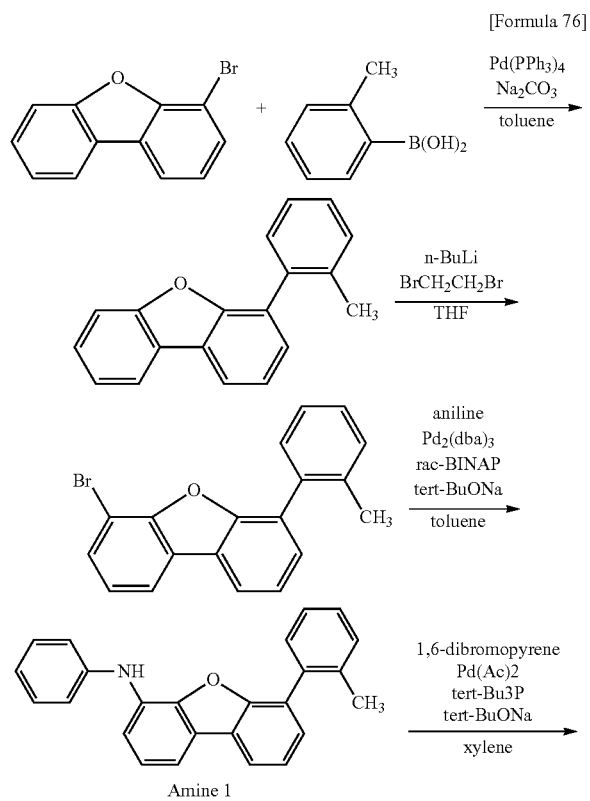

Amine 1

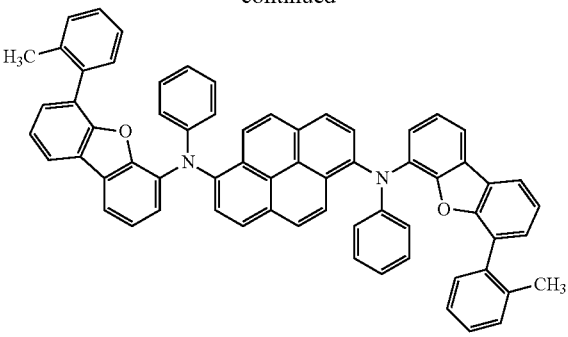

Compound 1

(1-1) Synthesis of 4-(2-Methylphenyl) Dibenzofuran

In a 10-liter recovery flask under an argon gas stream, 199 g (0.81 mol) of 4-bromodibenzofuran, 120 g (0.88 mol) of 2-methylphenyl boronic acid, 18.4 g of Pd(pph$_3$)$_4$, 3.2 L of toluene and 1.2 L of 2M sodium carbonate solution were added and reacted at 85 degrees C. for 15 hours.

After the mixture was cooled down, an organic layer was washed with water and then condensed, thereby obtaining 250 g of a crude product.

The obtained crude product was purified by silica-gel chromatography (eluent: heptane), thereby obtaining 180 g of 4-(2-methylphenyl) dibenzofuran. The obtained compound was identified as a target compound by FD-MS (Field Desorption Mass Spectrometry) analysis.

FDMS,calcd for $C_{19}H_{14}O$=258,found m/z=258(M+).

(1-2) Synthesis of 4-Bromo-6-(2-Methylphenyl) Dibenzofuran

Under an argon gas stream, 180 g (0.70 mol) of 4-(2-methylphenyl) dibenzofuran was dissolved in 2 L of dehydrated THF and 479 ml of 1.6M n-BuLi was dropped therein at 5 degrees C.

After the mixture was stirred at a temperature of from 5 degrees C. to 10 degrees C. for one and half hours, 262 g of dibromoethane was dropped therein at minus 60 degrees C. and the mixture was stirred at room temperature for 16 hours.

After 150 ml of water was added, 1 L of ethyl acetate and 1 L of water were further added and an organic substance was extracted.

The separated ethyl acetate layer was washed with saturated saline and dried with anhydrous sodium sulfate and ethyl acetate was removed by distillation, thereby obtaining 250 g of a crude product. The obtained crude product was purified by silica-gel chromatography and then recrystallized, thereby obtaining 137 g of 4-bromo-6-(2-methylphenyl) dibenzofuran.

(1-3) Synthesis of Amine Compound 1

Under an argon gas stream, a solution was prepared by mixing 2.76 g of Pd$_2$(dba)$_3$, 500 ml of a dehydrated toluene solution of 3.76 g of rac-BINAP (rac-(aS*)-2,2'-bis(diphenylphosphino)-1,1'-binaphthalene), 68 g (0.20 mol) of 4-bromo-6-(2-methylphenyl) dibenzofuran and 500 ml of a dehydrated toluene solution of 3.75 g (0.40 mol) of aniline.

After added with 38.7 g of tert-BuONa at 90 degrees C., the solution was stirred at 105 degrees C. for three hours.

After the solution was cooled down, 500 ml of water was added. After an organic layer was separated, toluene was removed by distillation, thereby obtaining 86.7 g of a crude product. The obtained crude product was purified by silica-gel chromatography, thereby obtaining 60 g of an amine compound. The obtained compound was identified as a target amine compound 1 by FD-MS (Field Desorption Mass Spectrometry) analysis.

FDMS,calcd for $C_{25}H_{19}NO$=349,found m/z=349(M+).

(1-4) Synthesis of Compound 1

Under an argon gas stream, a solution was prepared by mixing 0.57 g of Pd(OAc)$_3$, 500 ml of a dehydrated xylene solution of 1.03 g of tert-Bu$_3$P, 23 g (0.06 mol) of 1,6-dibromopyrene and 220 ml of a dehydrated xylene solution of 49.1 g (0.14 mol) of the amine compound 1.

After added with 14.7 g of tert-BuONa at 90 degrees C., the solution was stirred at 105 degrees C. for one hour.

After being cooled down, the solution was purified by silica-gel chromatography, thereby obtaining 57.3 g of a crude product. The crude product was recrystallized with xylene, thereby obtaining 36.6 g of a compound 1. The obtained compound was identified as a target compound 1 by FD-MS (Field Desorption Mass Spectrometry) analysis.

FDMS,calcd for $C_{66}H_{44}N_2O$=896,found m/z=896(M+).

Synthesis Example 2 (Synthesis of Compound 2)

30 g (0.40 mol) of a compound 2 as obtained in the same manner as in the synthesis example 1 except that 43 g of o-toluidine was used in place of aniline in (1-3) of the synthesis example 1. The obtained compound was identified as as compound 2 by FD-MS analysis.

[Formula 77]

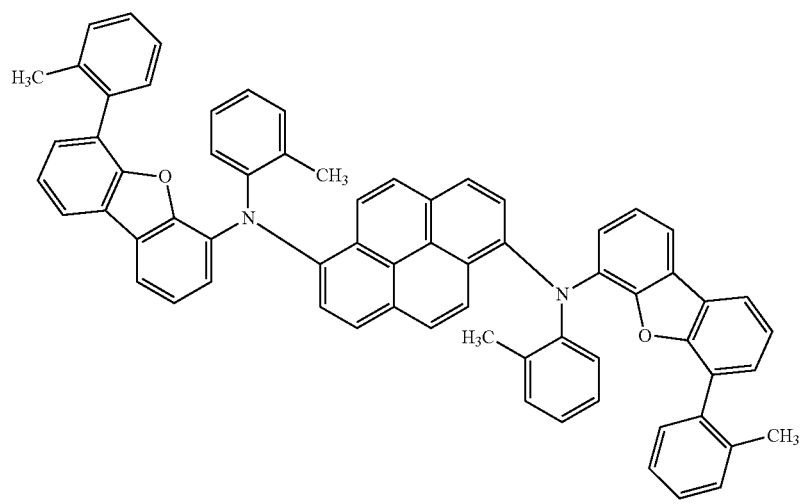

Compound 2

Synthesis Example 3 (Synthesis of Compound 3)

A compound 3 was obtained through synthesis in the same manner as in the synthesis example 1 except that 2,6-dimethylphenyl boronic acid was used in place of 2-methylphenyl boron acid in (1-1) of the synthesis example 1. The obtained compound was identified as a compound 3 by FD-MS analysis. In the FD-MS analysis, m/z=924 was obtained for a molecular weight of 924.37.

[Formula 78]

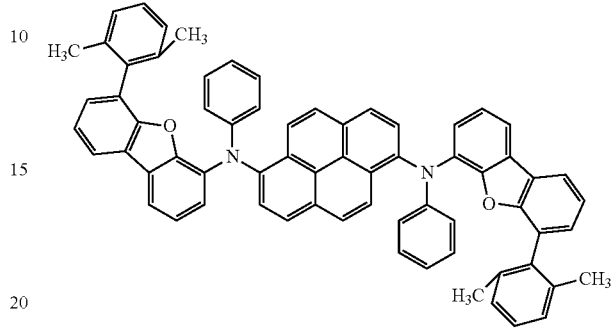

Compound 3

Synthesis Example 4 (Synthesis of Compound 4)

(4-1) Synthesis of 4-(2-Isoproylphenyl) Dibenzofuran

Under an argon gas atmosphere, 5.0 g of bromocumene, 6.4 g of dibenzofuran-4-ylboronic acid, 1.45 g of tetrakis-triphenylphosphinepalladium(0), 50 ml of of 2M sodium carbonate solution, 63 ml of toluene and 63 ml of 1,2-dimethoxyethane (DME) were added in a flask and stirred for eight hours while being refluxed.

After being cooled down, the reactant was extracted with toluene. An organic layer was washed with saturated saline and dried with anhydrous sodium sulfate and a solvent was removed by distillation. The obtained substance was purified by silica-gel chromatography, thereby obtaining 7.37 g of 4-(2-isopropylphenyl) dibenzofuran.

(4-2) Synthesis of Compound 4

4-(2-isopropylphenyl) dibenzofuran was used in place of 4-(2-methylphenyl) dibenzofuran in the synthesis example 1 and the same processes as in (1-2) and subsequent thereto of the synthesis example 1 were performed, thereby obtaining a compound 4. The obtained compound was identified as a compound 4 by FD-MS analysis. In the FD-MS analysts, m/z=952 was obtained for a molecular weight of 952.40.

[Formula 79]

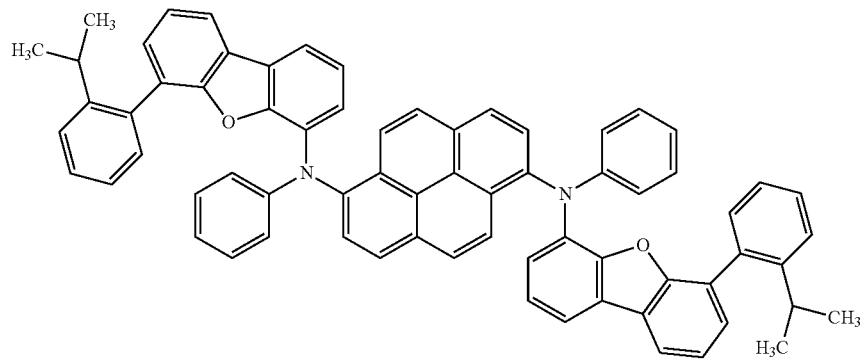

Compound 4

Synthesis Example 5 (Synthesis of Compound 5)

A compound 5 was obtained in the same manner as in the synthesis example 1 except that m-toluidine was used in place of aniline in (1-3) of the synthesis example 1. The obtained compound was identified as a compound 5 by FD-MS analysis. In the FD-MS analysis, m/z=924 was obtained for a molecular weight of 924.37.

[Formula 80]

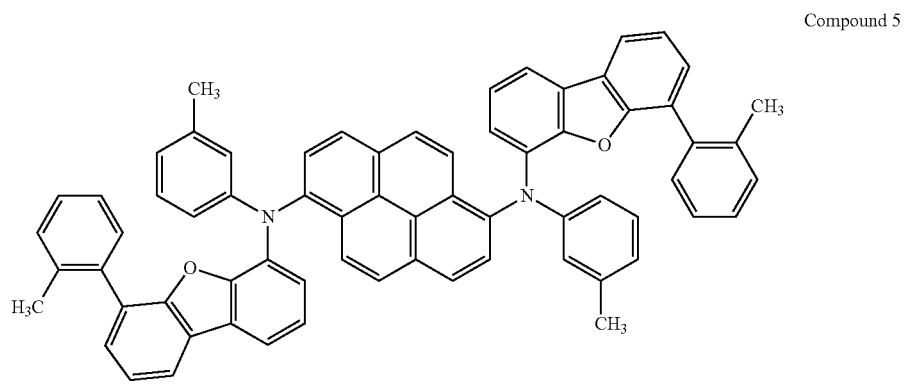

Compound 5

Synthesis Example 6 (Synthesis of Compound 6)

A compound 6 was obtained in the same manner as in the synthesis example 1 except that 4-isopropylaniline was used in place of aniline in (1-3) of the synthesis example 1. The obtained compound was identified as a compound 6 by FD-MS analysis. In the FD-MS analysis, m/z=980 was obtained for a molecular weight of 980.43.

[Formula 81]

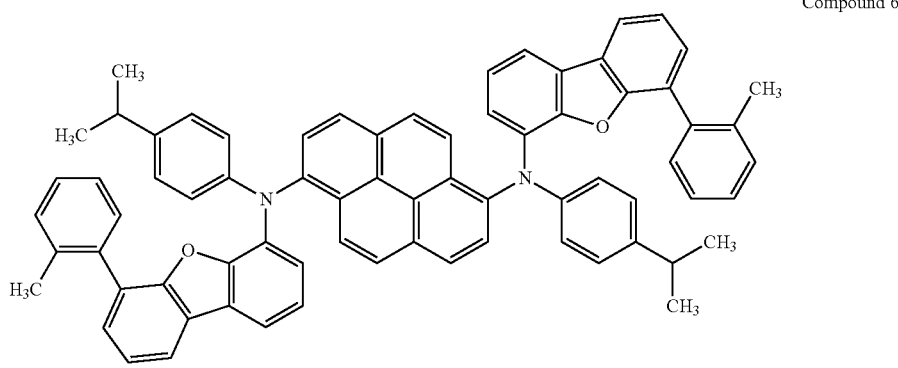

Compound 6

Synthesis Example 7 (Synthesis of Compound 7)

A compound 7 was obtained in the same manner as in the synthesis example 1 except that 3,8-diisopropyl-1,6-dibromopyrene was used in place of 1,6-dibromopyrene in (1-4) of the synthesis example 1. The obtained compound was identified as a compound 7 by FD-MS analysis. In the FD-MS analysis, m/z=980 was obtained for a molecular weight of 980.43.

[Formula 82]

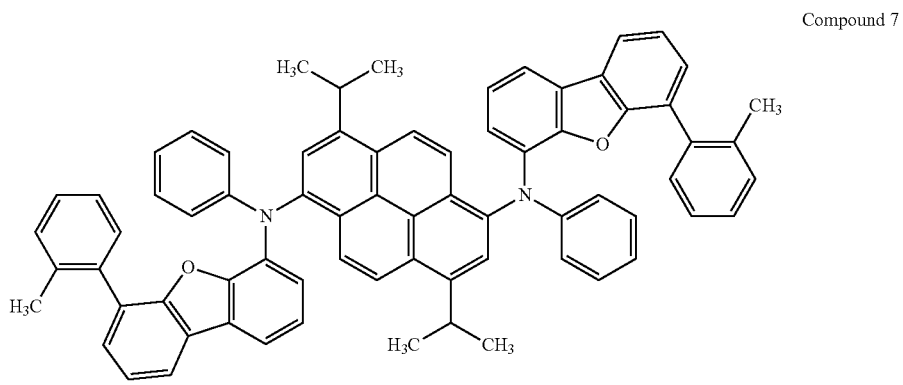

Compound 7

Manufacturing of Organic EL Device

Example 1

A glass substrate (size: 25 mm×75 mm×1.1 mm thick, manufactured by Geomatec Co., Ltd.) having an ITO transparent electrode (anode) was subjected to ultrasonic-cleaning in isopropyl alcohol for five minutes, and UV/ozone-cleaning for 30 minutes.

The cleaned glass substrate with the transparent electrode line was mounted on a substrate holder of a vacuum deposition apparatus. Initially, a compound HT-1 was deposited on a surface of the transparent electrode line formed side of the glass substrate so as to cover the transparent electrode, thereby forming a 5-nm-thick film of the compound HT1. The HT-1 film works as a hole injecting layer.

After the film formation of the HT-1 film, a compound HT-2 was deposited on the HT-1 film to form a 80-nm-thick HT-2 film on the HT-1 film. The HT-2 film works as a first hole transporting layer.

After the film formation of the HT-2 film, a compound HT-3 was deposited on the HT-2 film to form a 15-nm-thick HT-film on the HT-2 film. The HT-3 film works as a second hole transporting layer.

Then, a compound BH-1 (host material) and the compound 1 (dopant material) (mass ratio of BH-1 to compound 1 was 25:5) were co-deposited on the HT-2 film to form a 30-nm-thick emitting layer.

TB-1 was deposited on this emitting layer to form a 20-nm-thick blocking layer.

ET-1 (electron transporting material) was deposited on the blocking layer to form a 5-nm-thick electron injecting layer.

LiF was deposited on the electron injecting layer to form a 1-nm-thick LiF film.

A metal Al was deposited on the LiF film to form an 80-nm-thick metal cathode.

Thus, the organic EL device of Example 1 was manufactured.

Example 2

An organic EL device was manufactured the same manner as in Example 1 except that the compound 1 was replaced by the compound 2.

Example 3
An organic EL device was manufactured in the same manner as in Example 1 except that the compound 1 was replaced by the compound 3.
Comparative Example 1
An organic EL device was manufactured in the same manner as in Example 1 except that the compound 1 was replaced by a comparative compound.
[Formula 83]
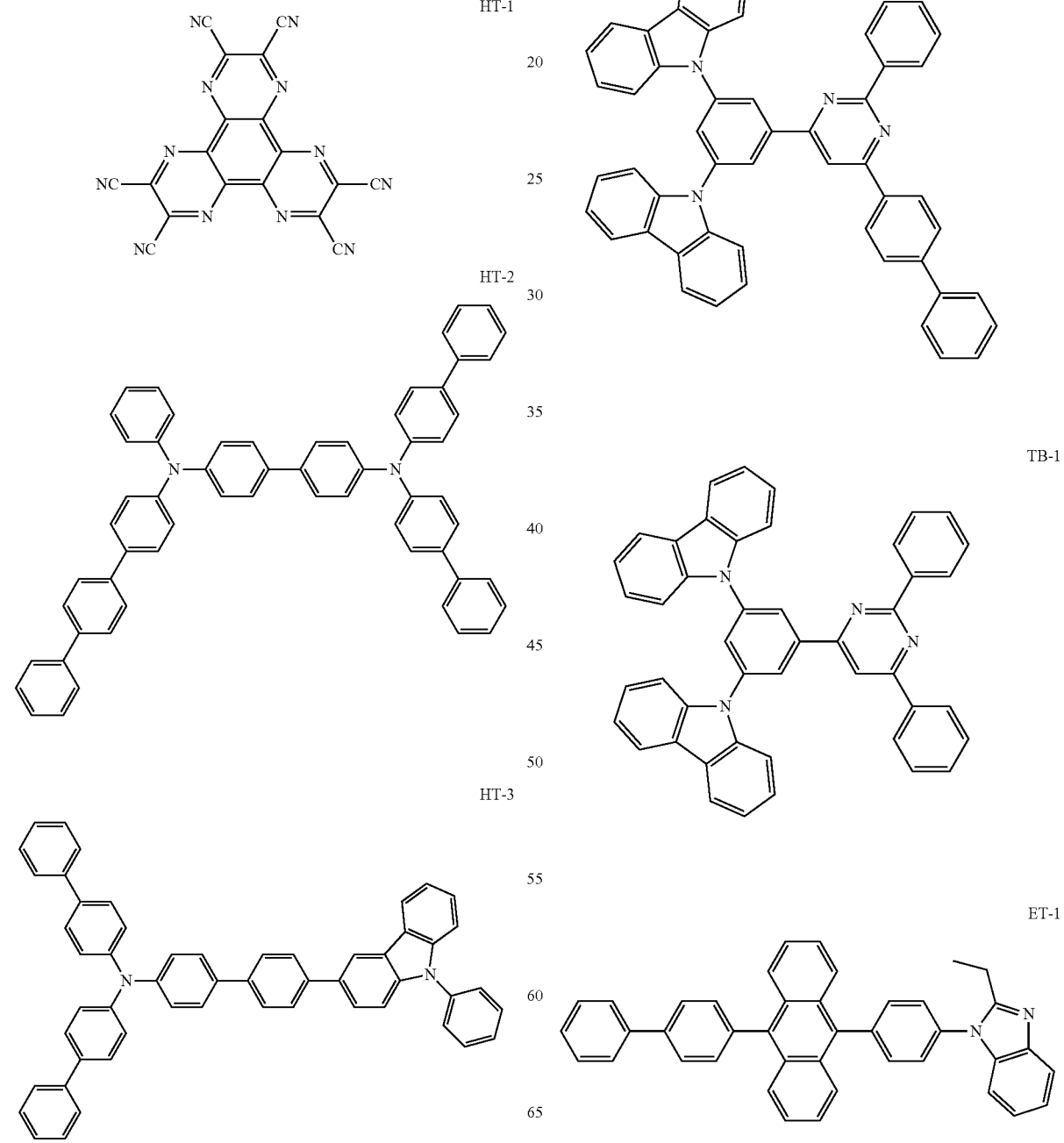

[Formula 84]

Comparative Compound

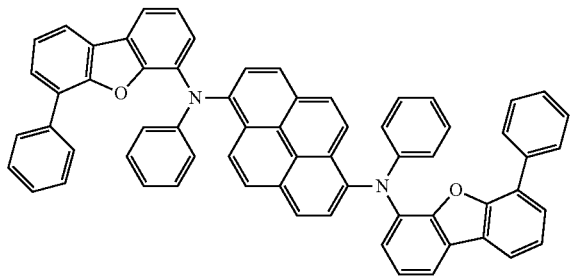

Evaluation of Organic EL Device

The manufactured organic EL devices of Examples 1 to 3 and Comparative Example 1 were evaluated as follows. The results are shown in Table 1.

Initial Performance

Voltage was applied to each of the organic EL devices such that a current density became 10 mA/cm$^2$ and an EL emission spectrum at that time was measured by a spectro-radiometer (CS-1000 manufactured by Konica Minolta Holdings, Inc.). Based on the obtained spectral radiance spectrum, color purity CIEx, CIEy and external quantum efficiency, EQE, (%) were calculated to obtain an emission peak wavelength.

Incidentally, the external quantum efficiency (EQE) was calculated based on the obtained spectral radiance spectrum, assuming that the spectrum was provided under Lambertian radiation.

TABLE 1

| Dopant Material | Color Purity x | y | Emission Peak Wavelength (nm) | EQE (%) |
|---|---|---|---|---|
| Ex. 1 | Compound 1 | 0.141 | 0.079 | 454 | 9.3 |
| Ex. 2 | Compound 2 | 0.142 | 0.083 | 454 | 9.8 |
| Ex. 3 | Compound 3 | 0.140 | 0.079 | 453 | 9.2 |
| Comp. 1 | Comparative Compound | 0.139 | 0.088 | 456 | 8.9 |

Example 4

An organic EL device was manufactured in the same manner as in Example 1 except that TB-1 was replaced by TB-2.

Example 5

An organic EL device was manufactured in the same manner as in Example 4 except that the compound 1 was replaced by the compound 2.

Example 6

An organic EL device was manufactured in the same manner as in Example 4 except that the compound 1 was replaced by the compound 3.

Comparative Example 2

An organic EL device was manufactured in the same manner as in Example 4 except that the compound 1 was replaced by the comparative compound.

The devices manufactured in Examples 4 to 6 and Comparative Example 2 were evaluated in the same manner as the device of Example 1. The results are shown in Table 2.

TABLE 2

| Dopant Material | Color Purity x | y | Emission Peak Wavelength (nm) | EQE (%) |
|---|---|---|---|---|
| Ex. 4 | Compound 1 | 0.141 | 0.080 | 454 | 8.1 |
| Ex. 5 | Compound 2 | 0.141 | 0.084 | 454 | 8.5 |
| Ex. 6 | Compound 3 | 0.139 | 0.082 | 454 | 8.0 |
| Comp. 2 | Comparative Compound | 0.140 | 0.089 | 456 | 7.9 |

Tables 1 and 2 show that the organic EL devices using the compounds 1 to 3, each of which has a phenyl group substituted with an alkyl group as a substituent, have smaller y-values of color purity and peak wavelengths being further at the short-wavelength side as compared with the organic EL device using the comparative compound, which has an unsubstituted phenyl group, so that these devices emit light with a higher color purity.

Further, as compared with the device using the comparative compound, the devices using the compounds 1 to 3 have a higher luminous efficiency. Presumably, this is also because the substituent added to the phenyl group contributes to improving the luminous efficiency.

Example 7

An organic EL device was manufactured in the same manner as in Example 1 except that HT-2, HT-3 and the compound 1 were replaced by HT-4, HT-5 and the compound 4, respectively, and the initial performance thereof was measured. The results are shown in Table 3.

[Formula 85]

HT-4

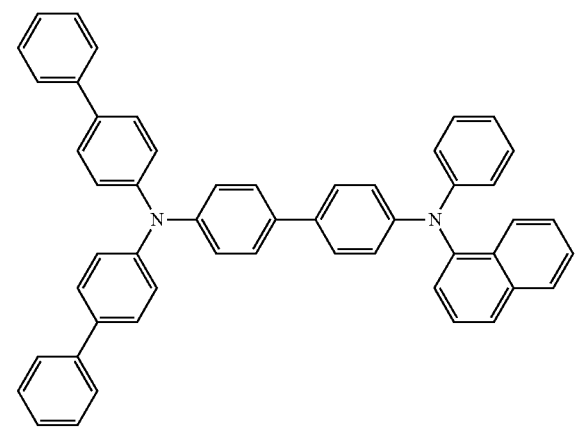

-continued

HT-5

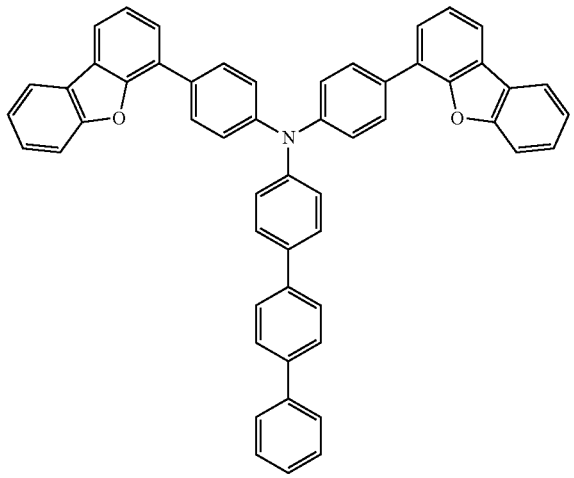

Comparative Example 3

An organic EL device was manufactured in the same manner as in Example 7 except that the compound 4 was replaced by the comparative compound and the initial performance thereof was measured. The results are shown in Table 3.

TABLE 3

| | Dopant Material | Color Purity | | Emission Peak Wavelength (nm) |
|---|---|---|---|---|
| | | CIEx | CIEy | |
| Ex. 7 | Compound 4 | 0.142 | 0.081 | 454 |
| Comp. 3 | Comparative Compound | 0.14 | 0.086 | 456 |

Table 3 shows that a compound having a phenyl group substituted with an isopropyl group also contributes to emitting light with a higher color purity, in view of the above, a variety of groups including a methyl group are usable as a substituent for the phenyl group.

Examples 8 to 10 and Comparative Example 4

An organic EL device was manufactured in the same manner as in Example 1 except that HT-2, HT-3, TB-1 and the compound 1 were replaced by HT-4, HT-5, TB-2 and a dopant material, listed in the Table, respectively, and the initial performance thereof was measured. The results are shown in Table 4.

TABLE 4

| | Dopant Material | Color Purity | | Emission Peak Wavelength (nm) | EQE (%) |
|---|---|---|---|---|---|
| | | x | y | | |
| Ex. 8 | Compound 5 | 0.139 | 0.091 | 456 | 8.9 |
| Ex. 9 | Compound 6 | 0.136 | 0.104 | 458 | 9.0 |
| Ex. 10 | Compound 7 | 0.137 | 0.097 | 457 | 8.9 |
| Comp. 4 | Comparative Compound | 0.140 | 0.091 | 456 | 7.9 |

Table 4 shows that the use of the compounds 5 to 7 results in improvement in external quantum of (EQE). Therefore, it is proven that the aromatic amine derivative according to the invention contributes to providing a highly efficient light-emitting element.

INDUSTRIAL APPLICABILITY

The organic EL device according to the exemplary embodiment is usable, for instance, for: a wall-mountable planar light-emitting device such as a flat panel display; a light source for a copier, a printer, a backlight for a liquid crystal display, or meters, gauges or the like; an indicator board; and a marker lamp.

EXPLANATION OF CODES

1 . . . organic EL device, 3 . . . anode, 4 . . . cathode, 7 . . . emitting layer, 10 . . . organic compound layer

The invention claimed is:
1. An organic electroluminescence device comprising:
a cathode,
an organic compound layer, and
an anode;
the cathode, the organic compound layer and the anode being arranged in this sequence, wherein
the organic compound layer comprises a plurality of organic thin-film layers comprising an emitting layer, and
the emitting layer comprises an aromatic amine derivative of a formula (1) below and an anthracene derivative of a formula (20) below,

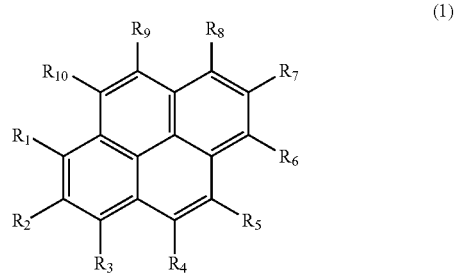
(1)

where:
$R_2$, $R_3$, $R_4$, $R_5$, $R_7$, $R_8$, $R_9$ and $R_{10}$ are each independently a hydrogen atom, or a substituted or unsubstituted alkyl group having 1 to 30 carbon atoms; and
$R_1$ and $R_6$ are each represented by a formula (2) below,

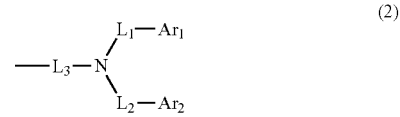
(2)

where:
$L_1$, $L_2$ and $L_3$ are each a single bond; and
$Ar_1$ is a monovalent residue derived from a ring structure of a formula (4) below,

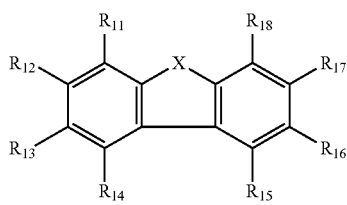

(4)

where:

X is an oxygen atom;

$R_{12}$ to $R_{17}$ are each independently a hydrogen atom, a halogen atom, a cyano group, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted trifluoroalkyl group having 1 to 20 carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms;

$R_{11}$ is a single bond to $L_1$;

combination of $R_{12}$ and $R_{13}$, $R_{13}$ and $R_{14}$, $R_{15}$ and $R_{16}$, $R_{16}$ and $R_{17}$, and $R_{17}$ and $R_{18}$ do not form a saturated or unsaturated ring;

$R_{18}$ is a phenyl group comprising an alkyl group having 1 to 30 carbon atoms as a substituent in an ortho position; and $Ar_2$ in the formula (2) is an unsubstituted phenyl group, or a phenyl group comprising an alkyl group having 1 to 30 carbon atoms as a substituent in an ortho position;

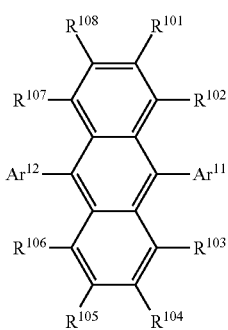

(20)

where:

$Ar^{11}$ is a substituted or unsubstituted dibenzofuranyl group, a substituted or unsubstituted dibenzothiophenyl group, or a substituted phenyl group having at least one of a substituted or unsubstituted dibenzofuranyl group or a substituted or unsubstituted dibenzothiophenyl group;

$Ar^{12}$ is a substituted or unsubstituted phenyl group or a substituted or unsubstituted naphthyl group; and $R^{101}$ to $R^{108}$ are each independently a hydrogen atom, a halogen atom, a cyano group, a substituted or unsubstituted monocyclic group having 5 to 30 ring atoms, a substituted or unsubstituted fused ring group having 10 to 30 ring atoms, a group formed by combining the monocyclic group and the fused ring group, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, or a substituted or unsubstituted silyl group.

2. The organic electroluminescence device according to claim 1, wherein $R_{12}$ to $R_{17}$ are each a hydrogen atom;

$R_2$, $R_3$, $R_4$, $R_5$, $R_7$, $R_8$, $R_9$ and $R_{10}$ are each independently a hydrogen atom, or a substituted or unsubstituted alkyl group having 1 to 6 carbon atoms;

$R_{18}$ is a phenyl group comprising an alkyl group having 1 to 6 carbon atoms as a substituent in an ortho position; and $Ar_2$ in the formula (2) is an unsubstituted phenyl group, or a phenyl group comprising an alkyl group having 1 to 6 carbon atoms as a substituent in an ortho position.

3. The organic electroluminescence device according to claim 2, wherein $Ar_2$ is an unsubstituted phenyl group.

4. The organic electroluminescence device according to claim 2, wherein $Ar_2$ is a phenyl group comprising an alkyl group having 1 to 30 carbon atoms as a substituent in an ortho position.

5. The organic electroluminescence device according to claim 2, wherein $R_{18}$ is a phenyl group comprising a substituent selected from the group consisting of a methyl group, an ethyl group and a propyl group in an ortho position, and $Ar_2$ is an unsubstituted phenyl group.

6. The organic electroluminescence device according to claim 2, wherein $R_{18}$ is a phenyl group comprising a substituent selected from the group consisting of a methyl group, an ethyl group and a propyl group in an ortho position, and $Ar_2$ is a phenyl group comprising an alkyl group having 1 to 30 carbon atoms as a substituent in an ortho position.

7. The organic electroluminescence device according to claim 2, wherein $Ar^{11}$ is a substituted or unsubstituted dibenzofuranyl group, or a substituted or unsubstituted dibenzothiophenyl group, $Ar^{12}$ is a substituted or unsubstituted naphthyl group, and $R^{101}$ to $R^{108}$ are each a hydrogen atom.

8. The organic electroluminescence device according to claim 2, wherein $Ar^{11}$ is a substituted or unsubstituted dibenzofuranyl group, or a substituted or unsubstituted dibenzothiophenyl group, $Ar^{12}$ is a substituted or unsubstituted phenyl group, and $R^{101}$ to $R^{108}$ are each a hydrogen atom.

9. The organic electroluminescence device according to claim 2, wherein $Ar^{11}$ is a substituted phenyl group having at least one of a substituted or unsubstituted dibenzofuranyl group or a substituted or unsubstituted dibenzothiophenyl group, Ar$^{12}$ is a substituted or unsubstituted naphthyl group, and R$^{101}$ to R$^{108}$ are each a hydrogen atom.

10. The organic electroluminescence device according to claim 2, wherein
Ar$^{11}$ is a substituted phenyl group having at least one of a substituted or unsubstituted dibenzofuranyl group or a substituted or unsubstituted dibenzothiophenyl group,
Ar$^{12}$ is a substituted phenyl group having at least one of a substituted or unsubstituted dibenzofuranyl group or a substituted or unsubstituted dibenzothiophenyl group, and
R$^{101}$ to R$^{108}$ are each a hydrogen atom.

11. The organic electroluminescence device according to claim 2, wherein
Ar$^{11}$ is a substituted phenyl group having at least one of a substituted or unsubstituted dibenzofuranyl group or a substituted or unsubstituted dibenzothiophenyl group,
Ar$^{12}$ is a substituted phenyl group having at least one of a substituted or unsubstituted naphthyl group, and
R$^{101}$ to R$^{108}$ are each a hydrogen atom.

12. The organic electroluminescence device according to claim 9, wherein
Ar$^{11}$ is a phenyl group having a single substituent that is a substituted or unsubstituted dibenzofuranyl group or a substituted or unsubstituted dibenzothiophenyl group.

13. The organic electroluminescence device according to claim 10, wherein
Ar$^{11}$ is a phenyl group having a single substituent that a substituted or unsubstituted dibenzofuranyl group or a substituted or unsubstituted dibenzothiophenyl group, and
Ar$^{12}$ is a phenyl group having a single substituent that a substituted or unsubstituted dibenzofuranyl group or a substituted or unsubstituted dibenzothiophenyl group.

14. The organic electroluminescence device according to claim 11, wherein
Ar$^{11}$ is a phenyl group having a single substituent that a substituted or unsubstituted dibenzofuranyl group or a substituted or unsubstituted dibenzothiophenyl group.

15. The organic electroluminescence device according to claim 7, wherein
Ar$^{11}$ is a substituted dibenzofuranyl group or a substituted dibenzothiophenyl group, the dibenzofuranyl group or dibenzothiophenyl group being substituted with an unsubstituted alkyl group having 1 to 6 carbon atoms or an unsubstituted aryl group having 6 to 12 ring carbon atoms, and
Ar$^{12}$ is an unsubstituted naphthyl group.

16. The organic electroluminescence device according to claim 8, wherein
Ar$^{11}$ is a substituted dibenzofuranyl group or a substituted dibenzothiophenyl group, the dibenzofuranyl group or dibenzothiophenyl group being substituted with an unsubstituted alkyl group having 1 to 6 carbon atoms or an unsubstituted aryl group having 6 to 12 ring carbon atoms, and
Ar$^{12}$ is an unsubstituted phenyl group.

17. The organic electroluminescence device according to claim 12, wherein
Ar$^{11}$ is substituted with a substituted dibenzofuranyl group or a substituted dibenzothiophenyl group, the dibenzofuranyl group or dibenzothiophenyl group being substituted with an unsubstituted alkyl group having 1 to 6 carbon atoms or an unsubstituted aryl group having 6 to 12 ring carbon atoms, and
Ar$^{12}$ is an unsubstituted naphthyl group.

18. The organic electroluminescence device according to claim 13, wherein
Ar$^{11}$ is substituted with a substituted dibenzofuranyl group or a substituted dibenzothiophenyl group, the dibenzofuranyl group or dibenzothiophenyl group being substituted with an unsubstituted alkyl group having 1 to 6 carbon atoms or an unsubstituted aryl group having 6 to 12 ring carbon atoms, and
Ar$^{12}$ is substituted with a substituted dibenzofuranyl group or a substituted dibenzothiophenyl group, the dibenzofuranyl group or dibenzothiophenyl group being substituted with an unsubstituted alkyl group having 1 to 6 carbon atoms or an unsubstituted aryl group having 6 to 12 ring carbon atoms.

19. The organic electroluminescence device according to claim 14, wherein
Ar$^{11}$ is substituted with a substituted dibenzofuranyl group or a substituted dibenzothiophenyl group, the dibenzofuranyl group or dibenzothiophenyl group being substituted with an unsubstituted alkyl group having 1 to 6 carbon atoms or an unsubstituted aryl group having 6 to 12 ring carbon atoms, and
Ar$^{12}$ is a phenyl group having only an unsubstituted naphthyl group.

* * * * *